(12) United States Patent
Yamazaki et al.

(10) Patent No.: US 9,112,037 B2
(45) Date of Patent: Aug. 18, 2015

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Atsuo Isobe, Isehara (JP); Yuki Hata, Atsugi (JP); Suguru Hondo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 144 days.

(21) Appl. No.: 13/758,291

(22) Filed: Feb. 4, 2013

(65) Prior Publication Data

US 2013/0207101 A1 Aug. 15, 2013

(30) Foreign Application Priority Data

Feb. 9, 2012 (JP) .................................. 2012-026357
Feb. 9, 2012 (JP) .................................. 2012-026662
Feb. 9, 2012 (JP) .................................. 2012-026671
Feb. 9, 2012 (JP) .................................. 2012-026674

(51) Int. Cl.
*H01L 29/04* (2006.01)
*H01L 29/786* (2006.01)
(Continued)

(52) U.S. Cl.
CPC ...... *H01L 29/7869* (2013.01); *H01L 29/41733* (2013.01); *H01L 29/42384* (2013.01)

(58) Field of Classification Search
CPC ..... H01L 29/24; H01L 29/7869; H01L 21/16; H01L 21/479; H01L 21/76264; H01L 21/76898; H01L 27/1214

USPC .............. 257/43, 59; 438/104, 149, 151, 584, 438/667; 349/41, 42
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Kim, W.-S., Moon, Y.-K., Lee, S., Kang, B.-W., Kwon, T.-S., Kim, K.-T. and Park, J.-W. (2009), Copper source/drain electrode contact resistance effects in amorphous indium—gallium—zinc—oxide thin film transistors. Phys. Status Solidi RRL, 3: 239-241.*
(Continued)

*Primary Examiner* — Matthew Landau
*Assistant Examiner* — Eric Ashbahian
(74) *Attorney, Agent, or Firm* — Eric J. Robinson; Robinson Intellectual Property Law Office, P.C.

(57) ABSTRACT

A transistor including an oxide semiconductor and having favorable operation characteristics is provided. Further, by using the transistor, a semiconductor having improved operation characteristics can be provided. In planar view, one of a source electrode and a drain electrode of the transistor is surrounded by a ring-shaped gate electrode. Further, in planar view, one of the source electrode and the drain electrode of the transistor is surrounded by a channel formation region. Accordingly, the source electrode is not electrically connected to the drain electrode through a parasitic channel generated in an end portion of an island-shaped oxide semiconductor layer.

18 Claims, 61 Drawing Sheets

(51) Int. Cl.
*H01L 29/417* (2006.01)
*H01L 29/423* (2006.01)

(56) References Cited

U.S. PATENT DOCUMENTS

| | | | |
|---|---|---|---|
| 5,847,413 A * | 12/1998 | Yamazaki et al. | 257/69 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,537,976 B2 | 5/2009 | Hirose | |
| 7,674,650 B2 | 3/2010 | Akimoto | |
| 7,732,819 B2 | 6/2010 | Akimoto et al. | |
| 7,791,072 B2 * | 9/2010 | Kumomi et al. | 257/59 |
| 8,207,756 B2 | 6/2012 | Shionoiri et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0255639 A1 * | 11/2005 | Miyasaka | 438/153 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182458 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0121887 A1 | 5/2011 | Kato et al. | |
| 2013/0134422 A1 | 5/2013 | Tsubuku | |
| 2013/0140554 A1 | 6/2013 | Yamazaki et al. | |
| 2013/0200366 A1 | 8/2013 | Koyama et al. | |
| 2013/0200367 A1 | 8/2013 | Yamazaki et al. | |
| 2013/0200375 A1 | 8/2013 | Yamazaki | |
| 2013/0240872 A1 | 9/2013 | Noda | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-160469 | 6/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 | 4/2007 |
| JP | 2007-123861 | 5/2007 |
| WO | WO-2004/114391 | 12/2004 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures

(56) References Cited

OTHER PUBLICATIONS

Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

(56) References Cited

OTHER PUBLICATIONS

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GiZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

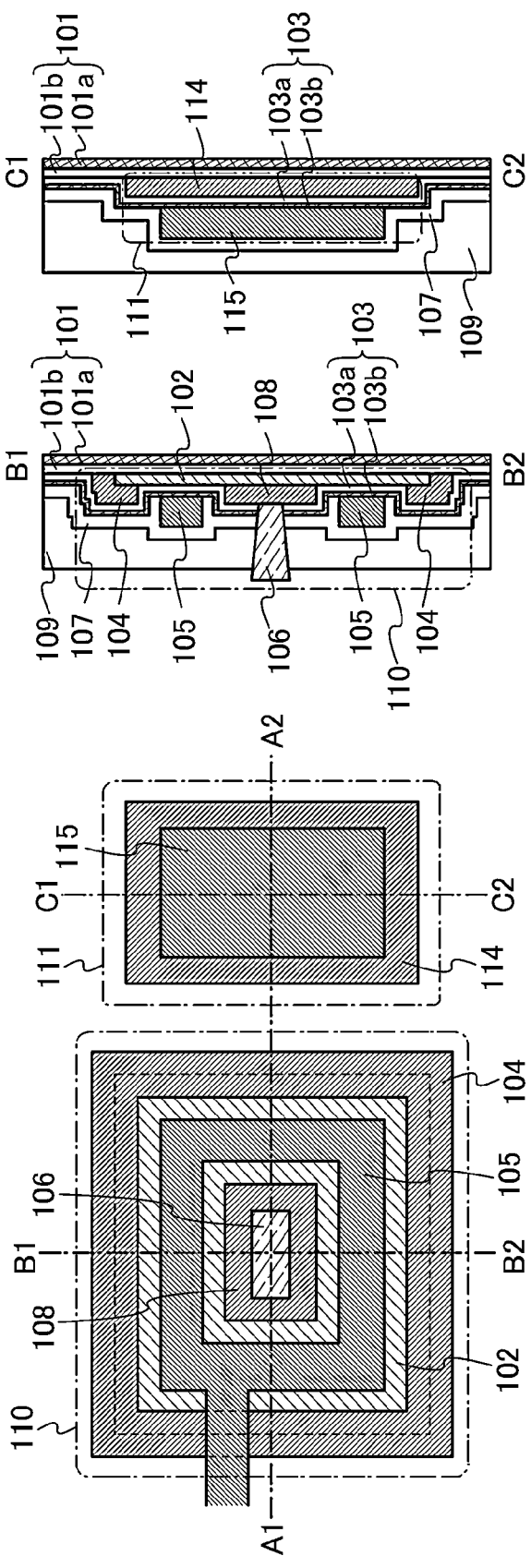

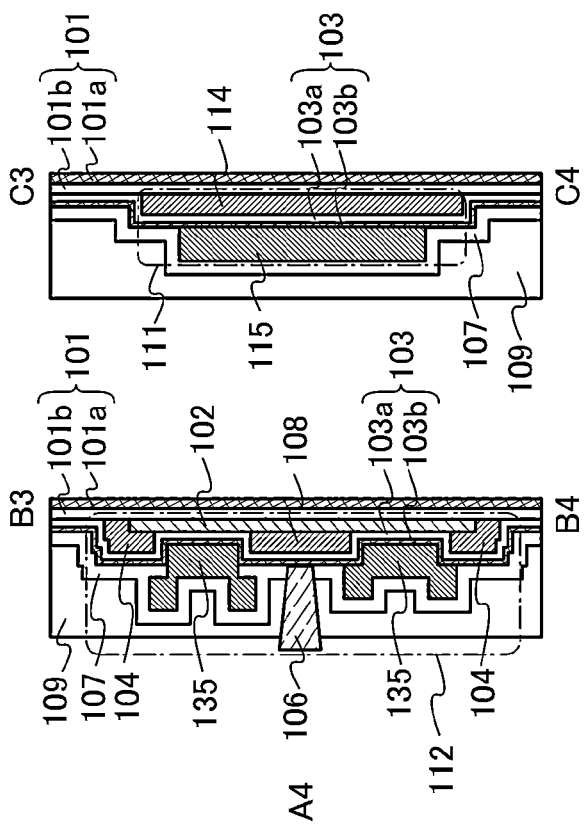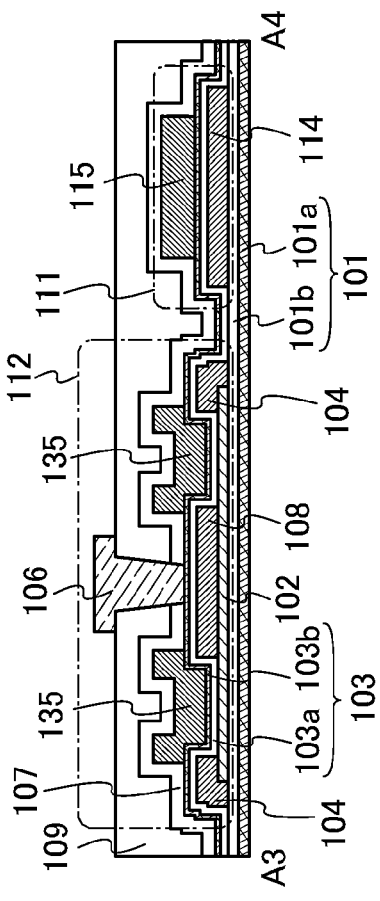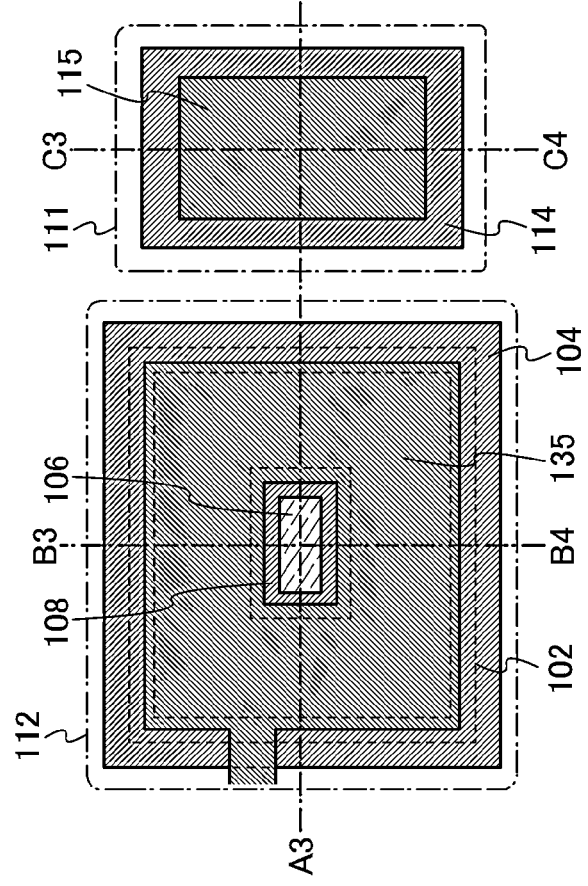

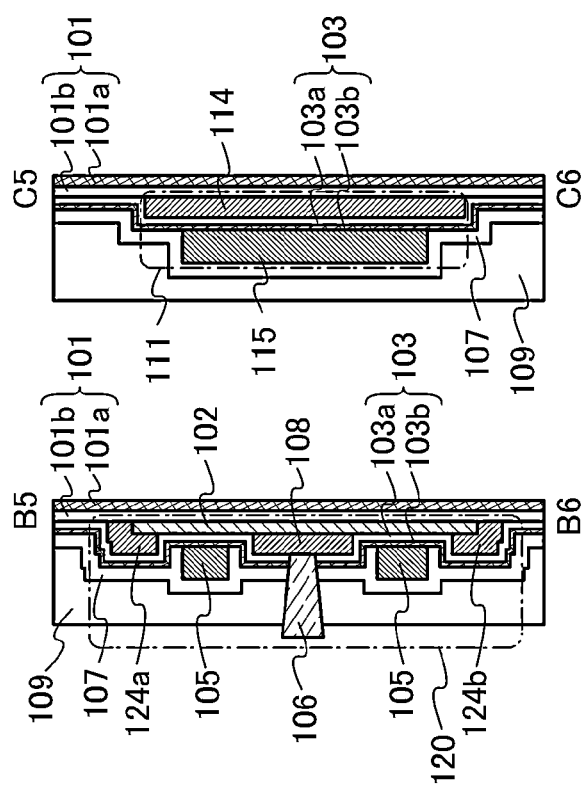
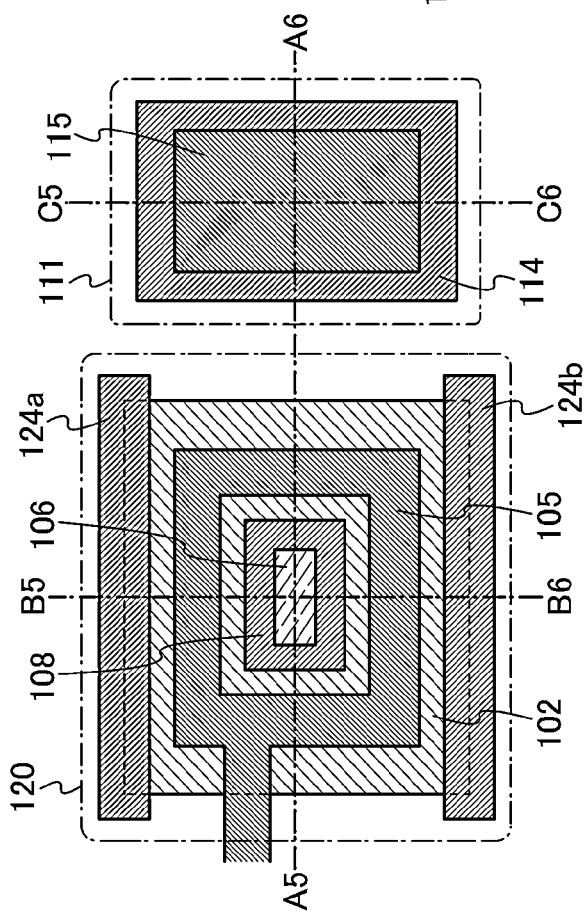
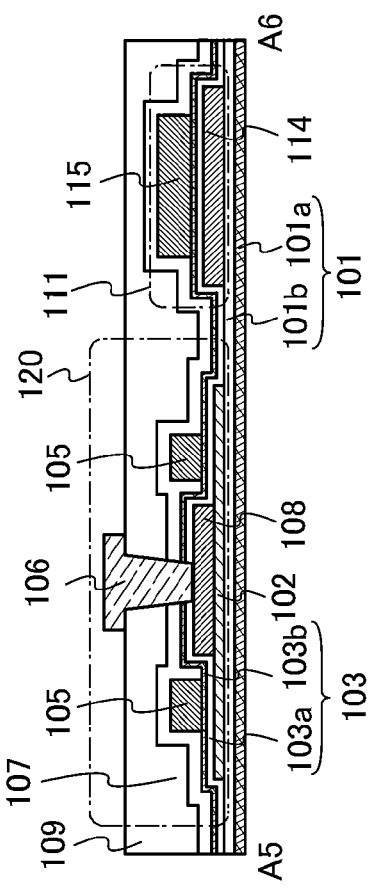

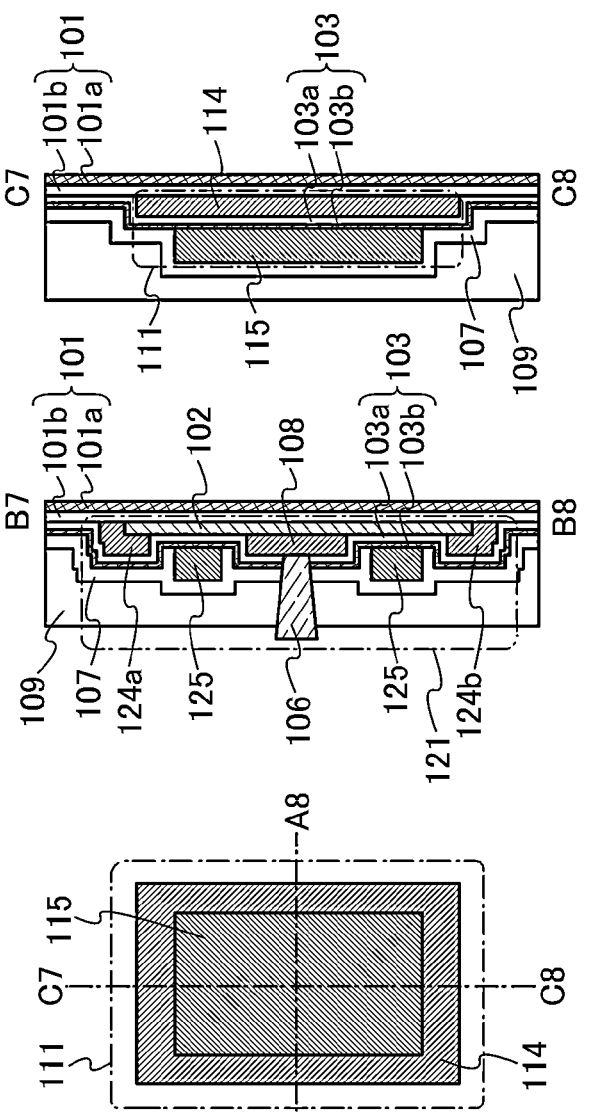
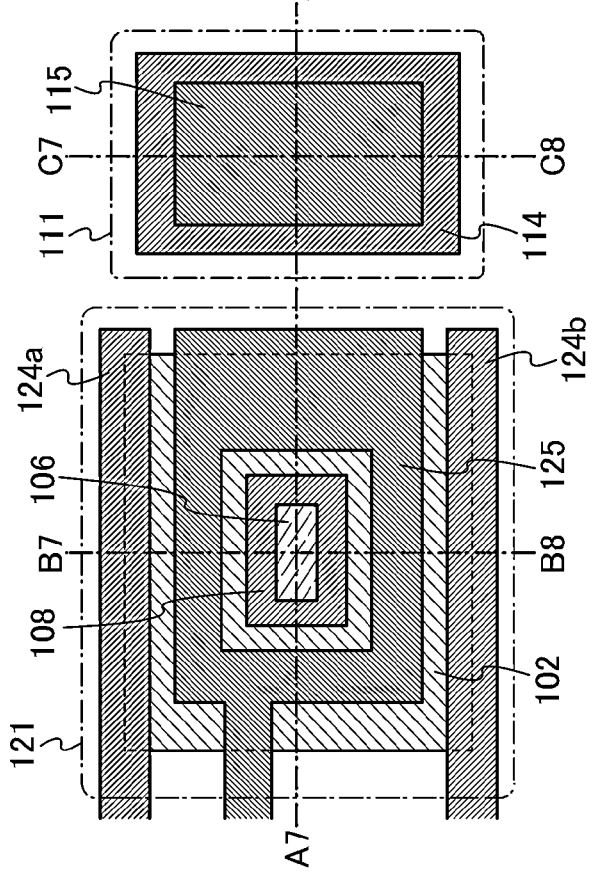
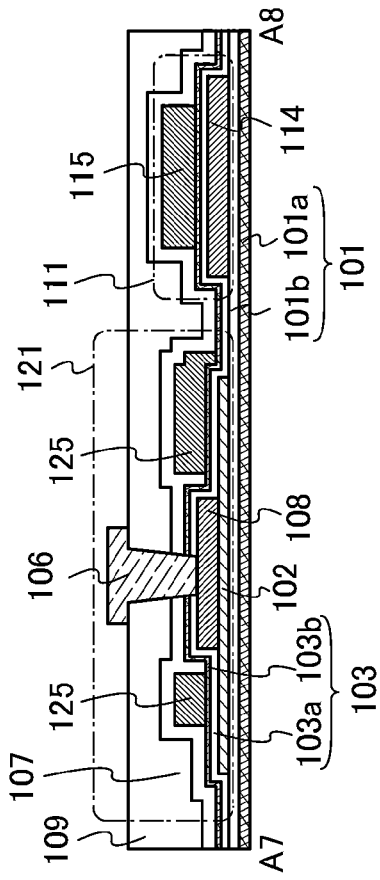
FIG. 9A  FIG. 9B  FIG. 9C  FIG. 9D

FIG. 10A1 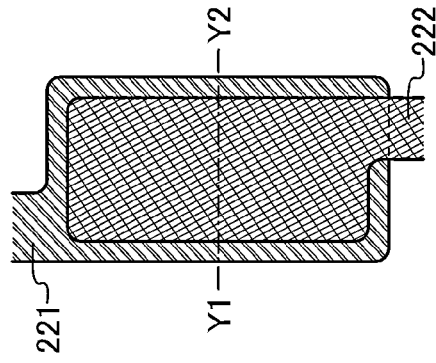
FIG. 10A2 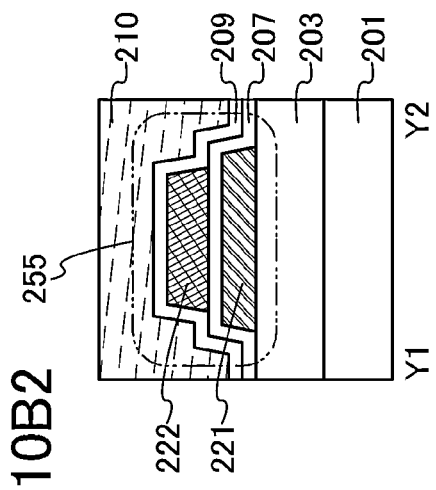
FIG. 10B1 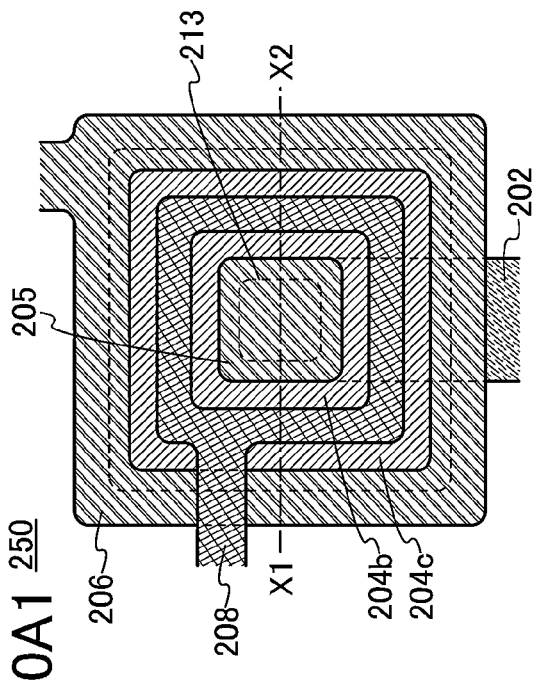
FIG. 10B2 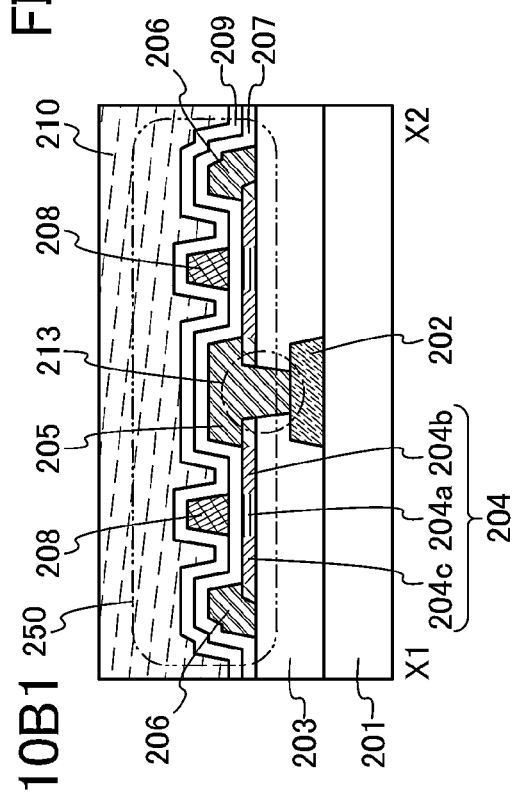

FIG. 15A1 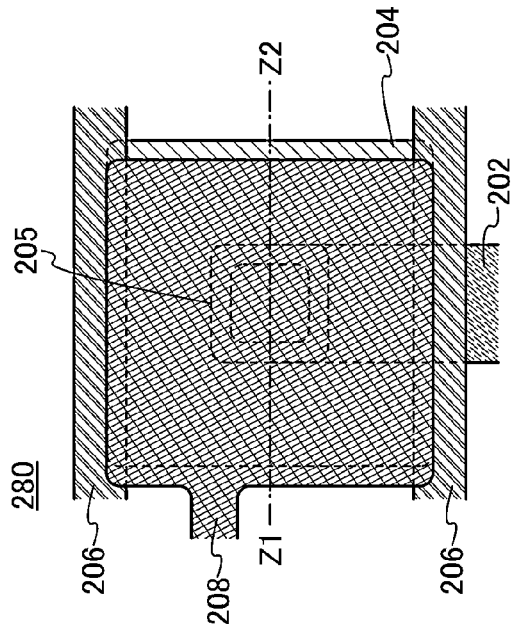
FIG. 15A2 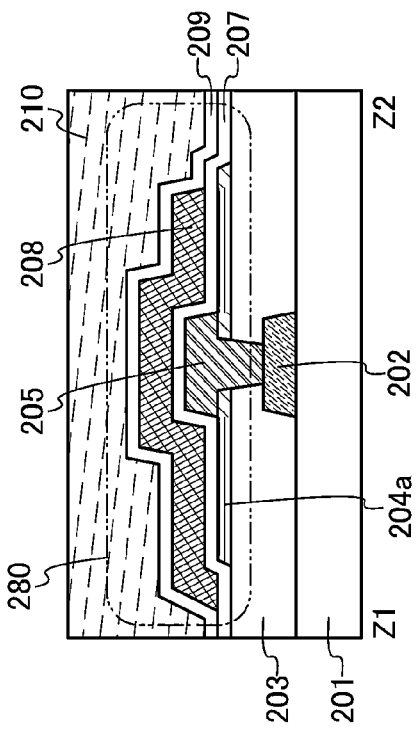
FIG. 15B1 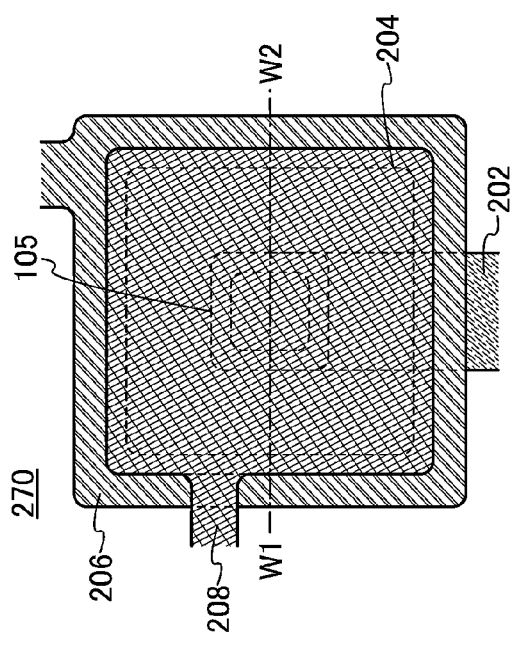
FIG. 15B2 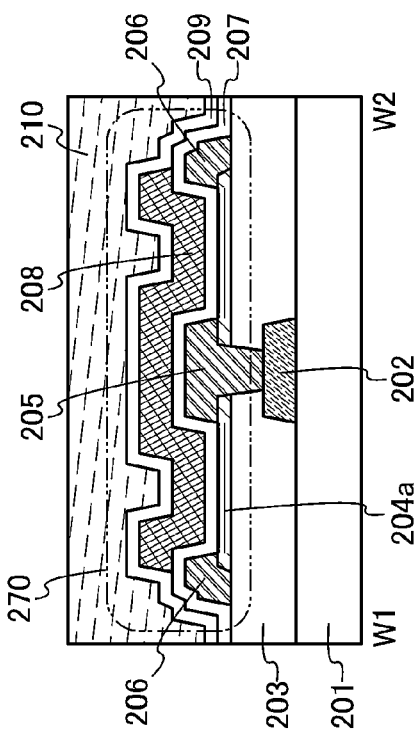

FIG. 27A1
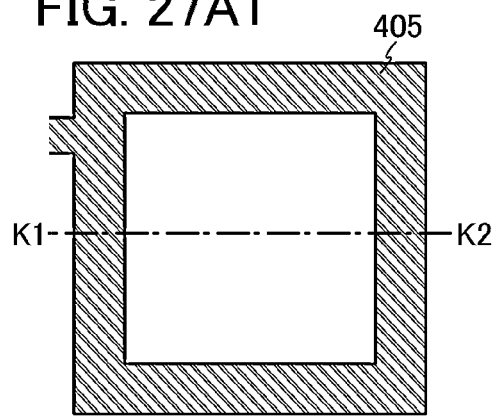
FIG. 27A2
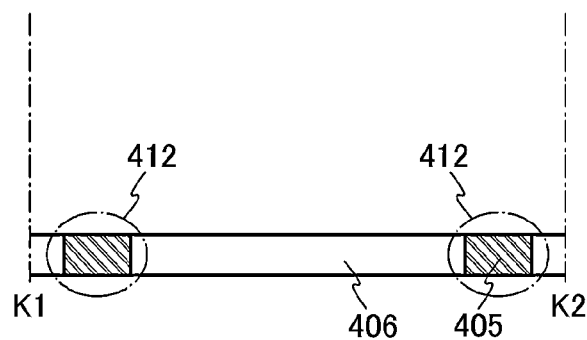
FIG. 27B1
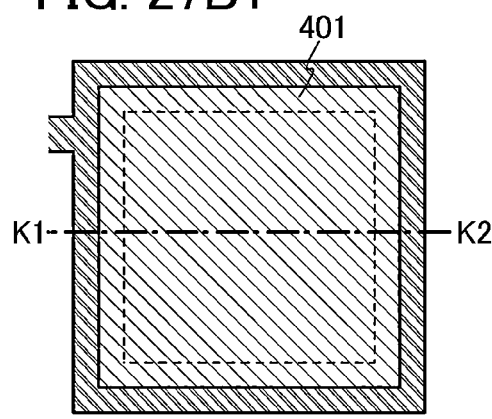
FIG. 27B2
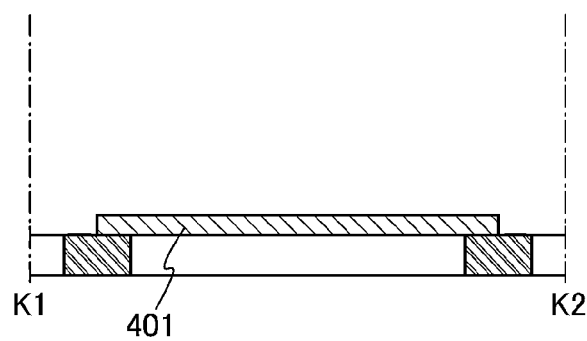
FIG. 27C1
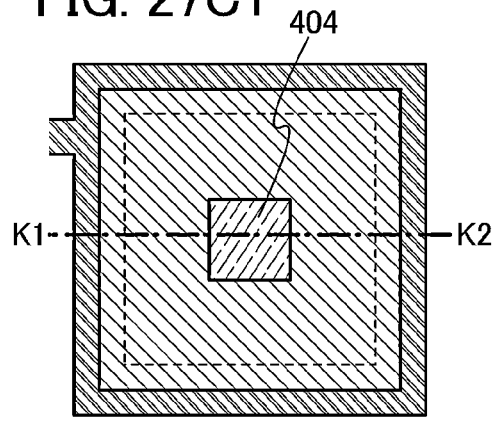
FIG. 27C2
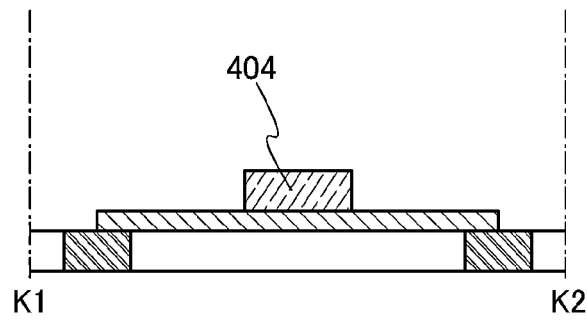

FIG. 28A1 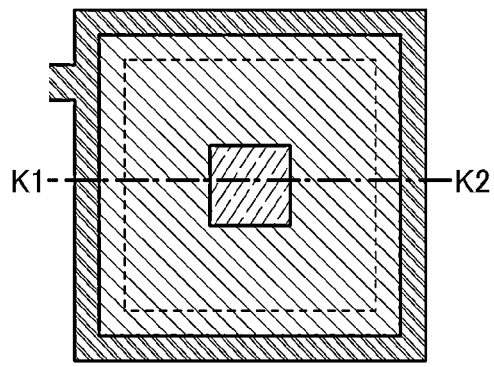
FIG. 28A2 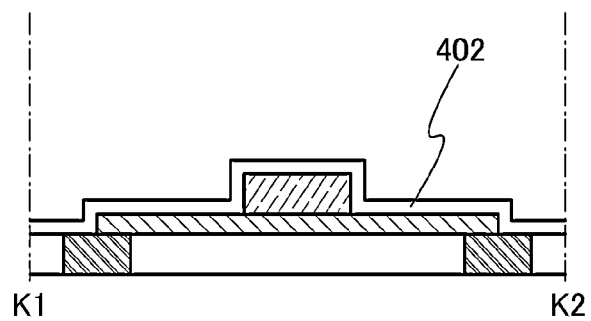
FIG. 28B1 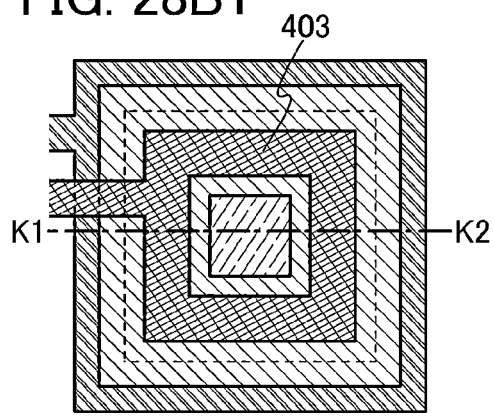
FIG. 28B2 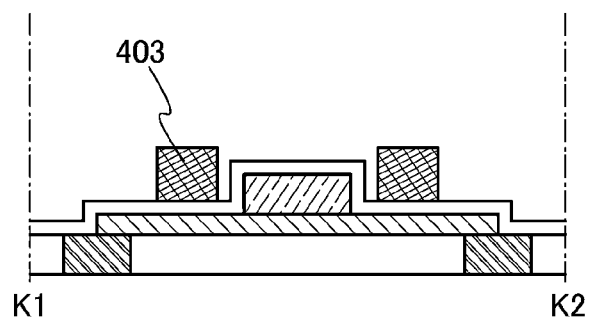
FIG. 28C1 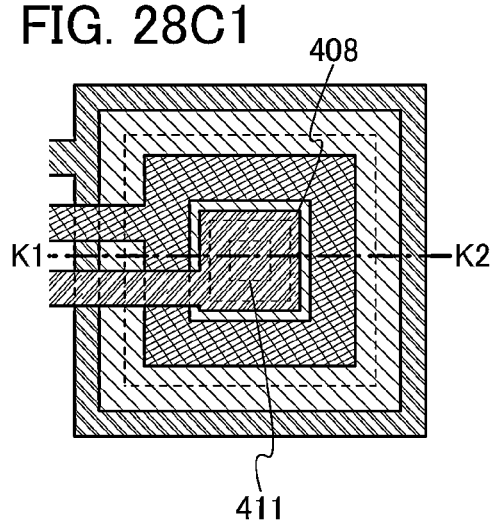
FIG. 28C2 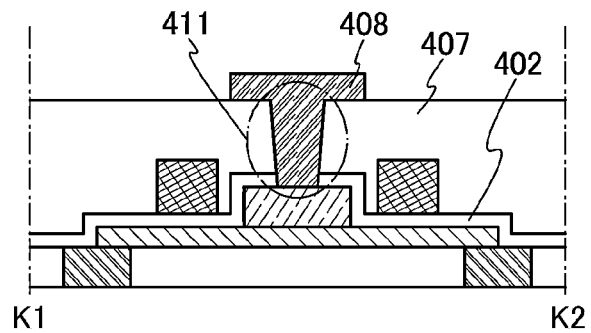

FIG. 56A
Model A
FIG. 56B
Model B
FIG. 56C
Model C
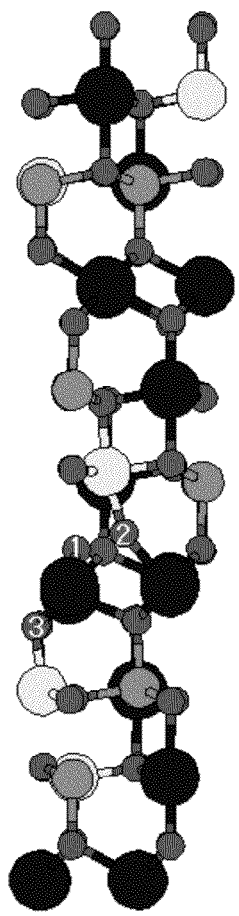
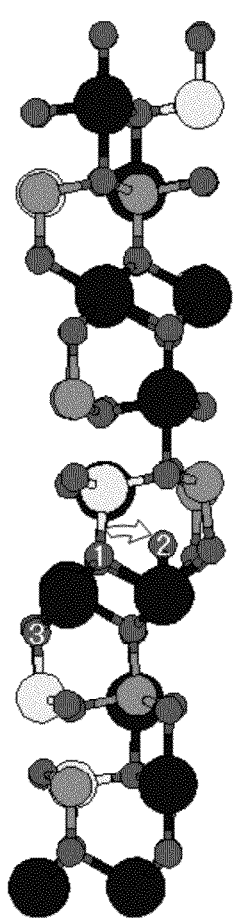
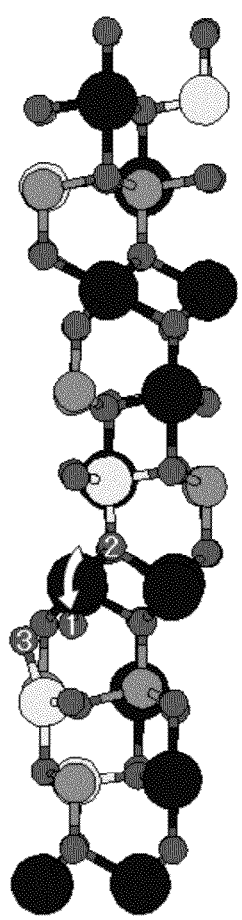
Explanatory Note
In: ● Ga: ○ Zn: ● O: ●

Model A   Model B   Model C

Explanatory Note

In: ● Ga: ○ Zn: ◐ O: •

FIG. 60A1
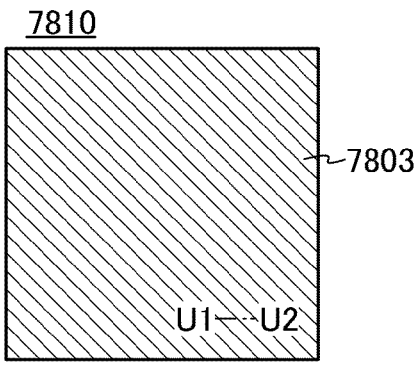
FIG. 60A2
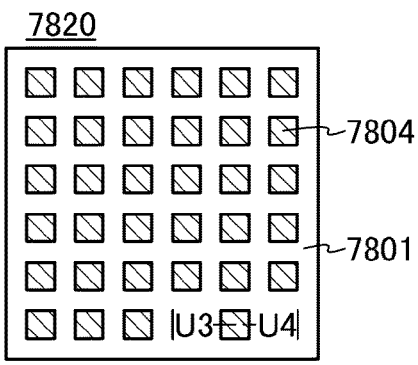
FIG. 60A3
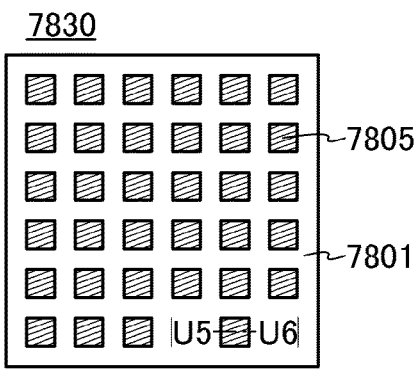
FIG. 60A4
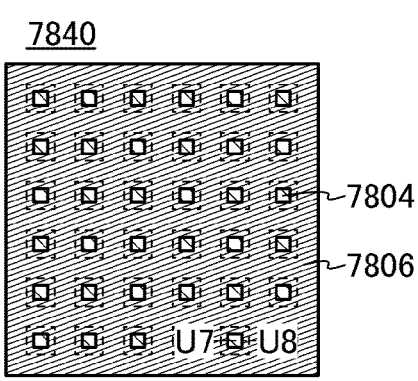
FIG. 60B1
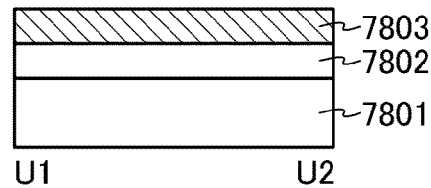
FIG. 60B2
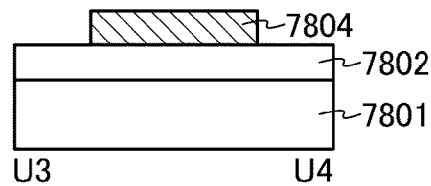
FIG. 60B3
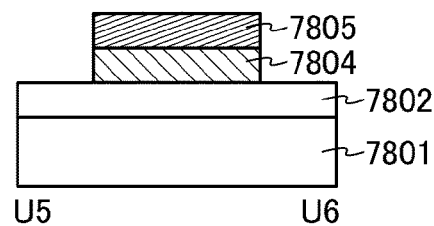
FIG. 60B4
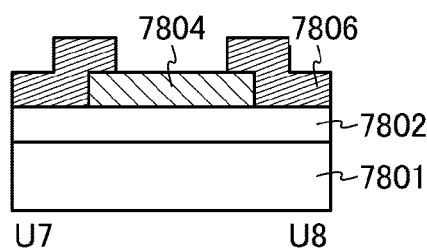

SEMICONDUCTOR DEVICE

BACKGROUND OF THE INVENTION

1. Field of the Invention

The disclosed invention relates to a semiconductor device and a method for manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

In recent years, a metal oxide having semiconductor characteristics, which is called an oxide semiconductor, has attracted attention as a material of a transistor. Various metal oxides are used for a variety of applications. For example, indium oxide is used as a material of a pixel electrode in a display device such as a liquid crystal display device and an EL display device.

Further, attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

Examples of such metal oxides having semiconductor characteristics include tungsten oxide, tin oxide, indium oxide, and zinc oxide, and transistors in each of which a channel is formed using such a metal oxide having semiconductor characteristics have been known. For example, a transistor whose active layer includes an amorphous oxide containing indium (In), gallium (Ga), and zinc (Zn) is disclosed.

REFERENCE

Patent Document

[Patent Document 1] Japanese Published Patent Application No. 2006-165528
[Patent Document 2] Japanese Published Patent Application No. 2007-096055
[Patent Document 3] Japanese Published Patent Application No. 2007-123861

SUMMARY OF THE INVENTION

It is known that an oxygen vacancy in an oxide semiconductor becomes a donor; thus, in the case where the oxide semiconductor is used for a channel formation region of a transistor, an oxide semiconductor layer including as few oxygen vacancies as possible is preferably used. However, oxygen is easily released from an end portion of an oxide semiconductor layer which has been processed into an island shape for forming a transistor.

Further, in a step of forming the island-shaped oxide semiconductor layer, a component such as an etching gas (e.g., chlorine, fluorine, boron, or hydrogen) enters the end portion of the oxide semiconductor layer, and becomes a donor in some cases. Therefore, in the island-shaped oxide semiconductor layer, a low-resistance region is easily formed in the end portion and the vicinity thereof, so that a parasitic channel of the transistor is easily formed in the low-resistance region.

When the parasitic channel is formed in the end portion of the island-shaped oxide semiconductor layer, a source and a drain of the transistor are connected to each other through the parasitic channel, so that an unintended current (also referred to as a "leakage current") flows. Further, the off-state current of the transistor is increased, leading to an increase in power consumption.

As described above, the parasitic channel causes degradation in electric characteristics of the transistor. For example, the parasitic channel may cause defects such as a normally-on transistor, an increase in variations of threshold voltage, and a shift of the threshold voltage by applying stress.

Further, the transistor has a possibility that two kinds of channels are formed in accordance with a voltage between a gate and a source: a channel (also referred to as a first channel) formed in a region of an oxide semiconductor layer, which overlaps with a gate and is on the shortest path between a source and a drain, and a parasitic channel (also referred to as a second channel) are formed.

The transistor in which such two kinds of channels are possibly formed independently has the connection relationship between the source and the drain as illustrated in a circuit in FIG. 54A. Note that in the circuit illustrated in FIG. 54A, a variable resistor 1201 and a resistor 1202 are connected in parallel between a source (S) and a drain (D). Here, the variable resistor 1201 and the resistor 1202 correspond to the first channel and the second channel, respectively. Also, in the circuit illustrated in FIG. 54B, a variable resistor 1201 and resistors 1202A and 1202B are connected in series between a source (S) and a drain (D).

For example, in a digital circuit, a transistor is used as a switch in many cases. Specifically, when a transistor is used as a switch, whether the first channel is formed or not is selected by controlling voltage between the source and the drain. Here, in the transistor in which the second channel is formed as described above, the source can be electrically connected to the drain through the parasitic channel regardless of whether the first channel is formed or not. Therefore, it is difficult to intentionally control the switching of such a transistor.

Further, in a transistor in which a gate electrode overlaps with not only a region where the first channel is formed but also a region where the second channel is formed, the threshold voltage between the gate and the source at which the channel is formed differs between the two channels in many cases. Typically, the threshold voltage at which the former channel is formed is higher than the threshold voltage at which the latter channel is formed. The current drive capability of the former channel is higher than that of the latter channel. Thus, in the case where the voltage between the gate and the source of the transistor in an off state is increased, a current between the source and the drain changes in two stages. Specifically, a change in the first stage (an increase in the current between the source and the drain) is found in the vicinity of the threshold voltage at which the second channel is formed, and further, a change in the second stage (an increase in the current between the source and the drain) is found in the vicinity of the threshold voltage at which the first channel is formed.

When such a transistor is used as a switch of a digital circuit, for example, the switch might change in two stages; therefore, it is difficult to intentionally control the switching.

In view of the above, an object of one embodiment of the present invention is to provide a transistor of which the switching is easily controlled.

Another object of one embodiment of the present invention is to provide a semiconductor device in which generation of a parasitic channel can be suppressed. Still another object of one embodiment of the present invention is to provide a semiconductor device having favorable electric characteristics. A still further object of one embodiment of the present invention is to provide a highly reliable semiconductor device.

A transistor of one embodiment of the disclosed invention includes an oxide semiconductor layer and an outer edge of the oxide semiconductor layer is covered with a first electrode functioning as one of a source electrode and a drain electrode. Accordingly, release of oxygen from the outer edge of the oxide semiconductor layer can be prevented and generation of a parasitic channel can be suppressed.

Moreover, the gate electrode having a ring-shaped plane shape is formed over the oxide semiconductor layer with a gate insulating layer provided therebetween. A second electrode functioning as the other of the source electrode and the drain electrode is surrounded by the ring-shaped gate electrode.

A channel formation region of the transistor is formed in part of a region sandwiched between the source electrode and the drain electrode, which overlaps with the gate electrode with the gate insulating layer provided therebetween. The outer edge of the oxide semiconductor layer is covered with the first electrode functioning as one of the source electrode and the drain electrode; thus, the channel formation region is not provided in the outer edge of the oxide semiconductor layer.

As described above, in one embodiment of the disclosed invention, the outer edge of the oxide semiconductor layer is covered with one of the source electrode and the drain electrode. Accordingly, release of oxygen from the outer edge of the oxide semiconductor layer can be prevented and generation of a parasitic channel can be suppressed. Further, the outer edge of the oxide semiconductor layer is covered with one of the source electrode and the drain electrode, whereby not only release of oxygen from the outer edge of the oxide semiconductor layer but also release of oxygen from inside the oxide semiconductor layer through the outer edge portion can be prevented, so that generation of a parasitic channel can be suppressed.

In addition, in one embodiment of the disclosed invention, by using the transistor, the semiconductor device having improved operation characteristics can be provided.

In one embodiment of the disclosed invention, a semiconductor device includes a base insulating layer, an oxide semiconductor layer provided over the base insulating layer, one of a source electrode and a drain electrode covering at least part of an outer edge of the oxide semiconductor layer, the other of the source electrode and the drain electrode, a gate insulating layer covering the oxide semiconductor layer and one of and the other of the source electrode and the drain electrode, and a gate electrode provided over the oxide semiconductor layer with the gate insulating layer provided therebetween and provided to surround the other of the source electrode and the drain electrode. One of the source electrode and the drain electrode is provided to surround the gate electrode.

In one embodiment of the disclosed invention, the semiconductor device includes a first insulating layer covering the gate insulating layer and the gate electrode, a second insulating layer over the first insulating layer, and an electrode over the second insulating layer, which is electrically connected to the other of the source electrode and the drain electrode.

In one embodiment of the disclosed invention, a planar shape of the oxide semiconductor layer is a rectangle.

In one embodiment of the disclosed invention, a planar shape of the gate electrode is a ring shape.

In one embodiment of the disclosed invention, the semiconductor device includes a capacitor which includes a first electrode provided over the base insulating layer and having the same material as the source electrode and the drain electrode, the gate insulating layer provided over the first electrode, and a second electrode having the same material as the gate electrode.

In planar view, one of the source electrode and the drain electrode of the transistor is surrounded by the gate electrode, whereby the end portion of the island-shaped oxide semiconductor layer does not reach from the source electrode to the drain electrode.

Further, in planar view, one of the source electrode and the drain electrode of the transistor is surrounded by the channel formation region, whereby the end portion of the island-shaped oxide semiconductor layer does not reach from the source electrode to the drain electrode.

With such a structure, the end portion of the island-shaped oxide semiconductor layer where a parasitic channel is likely to be generated can be made not to cross the channel length direction of the transistor. Therefore, it is possible to prevent unintentional electrical connection between the source electrode and the drain electrode through the parasitic channel generated in the end portion of the island-shaped oxide semiconductor layer.

Further, a metal layer covers the end portion of the island-shaped oxide semiconductor layer, whereby release of oxygen from the end portion of the island-shaped oxide semiconductor layer can be reduced and a decrease in the resistance of the oxide semiconductor layer can be suppressed.

The planar shape of the island-shaped oxide semiconductor layer is not particularly limited and may be a shape surrounded by a curve or a shape surrounded by a curve and a straight line other than a polygon and a circle. The same applies to the planar shape of the gate electrode, the source electrode, and the drain electrode.

In planar view, in the case where one of the source electrode and the drain electrode of the transistor is surrounded by the gate electrode, the gate electrode has a ring shape; however, the ring shape is not limited to a circle and a rectangle.

In one embodiment of the present invention, a semiconductor device includes a source electrode and a drain electrode over an island-shaped oxide semiconductor layer, an insulating layer over the island-shaped oxide semiconductor layer, the source electrode, and the drain electrode, and a gate electrode over the insulating layer. One of the source electrode and the drain electrode is surrounded by the gate electrode in the plane view.

In one embodiment of the present invention, a semiconductor device includes a source electrode and a drain electrode over an island-shaped oxide semiconductor layer, an insulating layer over the island-shaped oxide semiconductor layer, the source electrode, and the drain electrode, and a gate electrode over the insulating layer. The island-shaped oxide semiconductor layer has a channel formation region in a region overlapping with the gate electrode, and one of the source electrode and the drain electrode is surrounded by the channel formation region in the plane view.

In one embodiment of the present invention, a semiconductor device includes a first insulating layer over a first wiring, an island-shaped oxide semiconductor layer over the first insulating layer, a source electrode and a drain electrode over the island-shaped oxide semiconductor layer, a second insulating layer over the island-shaped oxide semiconductor layer, the source electrode, and the drain electrode, and a gate electrode over the second insulating layer. One of the source electrode and the drain electrode is electrically connected to the first wiring through an opening formed in the island-shaped oxide semiconductor layer and the first insulating layer, and one of the source electrode and the drain electrode is surrounded by the gate electrode in the plane view.

In one embodiment of the present invention, a semiconductor device includes a first insulating layer over a first wiring, an island-shaped oxide semiconductor layer over the first insulating layer, a source electrode and a drain electrode over the island-shaped oxide semiconductor layer, a second insulating layer over the island-shaped oxide semiconductor layer, the source electrode, and the drain electrode, and a gate electrode over the second insulating layer. One of the source electrode and the drain electrode is electrically connected to the first wiring through an opening formed in the island-shaped oxide semiconductor layer and the first insulating layer, the island-shaped oxide semiconductor layer has a channel formation region in a region overlapping with the gate electrode, and one of the source electrode and the drain electrode is surrounded by the channel formation region in the plane view.

The gate electrode may be formed to overlap with at least one of the source electrode and the drain electrode.

One embodiment of the present invention disclosed in this specification relates to a semiconductor device including a ring-shaped gate electrode, in which one of a source electrode and a drain electrode is surrounded by the gate electrode.

One embodiment of the present invention disclosed in this specification is a semiconductor device including a first electrode embedded in a first insulating layer, an island-shaped oxide semiconductor layer whose one surface is in contact with the first electrode, a second electrode in contact with an end portion of the island-shaped oxide semiconductor layer, a second insulating layer formed to cover the island-shaped oxide semiconductor layer and the second electrode, and a third electrode whose top surface is a ring shape and which is formed over the second insulating layer. The first electrode is formed on an inner side than the third electrode, and the second electrode is formed on an outer side than the third electrode.

Further, an end portion of an island-shaped oxide semiconductor layer in this specification means an outer edge of the island-shaped oxide semiconductor layer in the plane view, and a side surface or an end face means the same.

In the oxide semiconductor layer, a region which does not overlap with the second electrode and the third electrode is preferably a low-resistance region to which impurities are added. Note that the impurities refer to elements which are different from main components of the oxide semiconductor layer and which function as a donor when added to the oxide semiconductor layer.

One embodiment of the present invention disclosed in this specification is a semiconductor device including a first electrode embedded in a first insulating layer, an island-shaped oxide semiconductor layer whose one surface is in contact with the first electrode, a second electrode in contact with an end portion of the island-shaped oxide semiconductor layer, a second insulating layer formed to cover the island-shaped oxide semiconductor layer and the second electrode, and a third electrode whose top surface is a ring shape and which is formed over the second insulating layer. The third electrode overlaps with the first electrode and the second electrode.

Surfaces of the first insulating layer and the first electrode are preferably continuous flat surfaces.

Further, the first electrode is electrically connected to a semiconductor device including a semiconductor layer having a different band gap from the oxide semiconductor layer, whereby a high-functional semiconductor device can be formed.

Furthermore, an insulating layer including an aluminum oxide is preferably formed over the second insulating layer and the third electrode.

Further, one embodiment of the present invention is a transistor including an oxide semiconductor layer having a first surface and a second surface which is opposite to the first surface, an insulating layer in contact with the first surface of the oxide semiconductor layer, a first conductive layer which overlaps with the oxide semiconductor layer with the insulating layer provided therebetween and which includes a ring-shaped portion overlapping with the oxide semiconductor layer, a second conductive layer in contact with the first surface of the oxide semiconductor layer on an inner side than the ring-shaped portion, and a third conductive layer in contact with the second surface of the oxide semiconductor layer on an outer side than the ring-shaped portion. The first conductive layer functions as a gate, the second conductive layer functions as one of a source and a drain, and the third conductive layer functions as the other of the source and the drain.

Note that in this specification, a "ring shape" is not limited to a circular shape such as a circle (an inner edge and an outer edge are circular), and includes a shape having an opening. For example, a polygon in which a circular or elliptical opening is provided (an inner edge is a circle or an ellipse and an outer edge is a polygon), a circle or an ellipse in which a polygonal opening is provided (an inner edge is a polygon and an outer edge is a circle or an ellipse), a polygon in which a polygonal opening is provided (an inner edge and an outer edge are each a polygon), and a shape in which a part of an inner edge is a curve and the other part is a polygonal line, and a part of an outer edge is a curve and the other part is a polygonal line are all referred to as a "ring shape".

According to one embodiment of the present invention, a transistor in which generation of a parasitic channel can be suppressed can be obtained.

According to one embodiment of the present invention, a transistor which is hardly affected by a parasitic channel can be obtained.

According to one embodiment of the present invention, a transistor of which the switching is easily controlled can be provided.

According to one embodiment of the present invention, a transistor which has favorable operation characteristics (electric characteristics) can be provided. Further, by using the transistor, a semiconductor device having improved operation characteristics can be provided.

In accordance with an embodiment of the present invention, a highly reliable semiconductor device can be provided.

BRIEF DESCRIPTION OF THE DRAWINGS

In the accompanying drawings:

FIGS. 1A to 1D are a top view and cross-sectional views illustrating one embodiment of a semiconductor device;

FIGS. 2A to 2D are a top view and cross-sectional views illustrating one embodiment of a semiconductor device;

FIGS. 8A to 8D are a top view and cross-sectional views illustrating one embodiment of a semiconductor device;

FIGS. 9A to 9D are a top view and cross-sectional views illustrating one embodiment of a semiconductor device;

FIGS. 10A1, 10A2, 10B1, and 10B2 are top views and cross-sectional views illustrating one embodiment of a semiconductor device;

FIGS. 15A1, 15A2, 15B1, and 15B2 are top views and cross-sectional views illustrating embodiments of a semiconductor device;

FIGS. 27A1, 27A2, 27B1, 27B2, 27C1, and 27C2 are top views and cross-sectional views illustrating steps for manufacturing a semiconductor device;

FIGS. 28A1, 28A2, 28B1, 28B2, 28C1, and 28C2 are top views and cross-sectional views illustrating steps for manufacturing a semiconductor device;

FIGS. 56A to 56C are model diagrams used for calculation of excessive oxygen transfer;

FIGS. 60A1 to 60A4 and 60B1 to 60B4 are top views and cross-sectional views illustrating structures of analytical samples.

DETAILED DESCRIPTION OF THE INVENTION

Figure 3A:
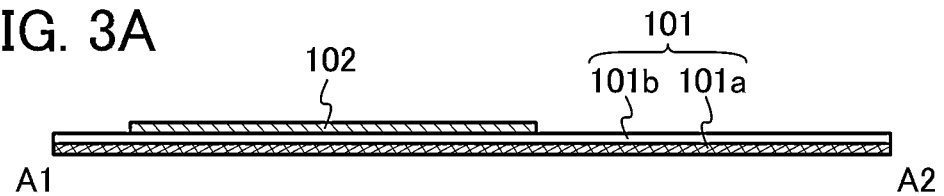
FIGS. 3A to 3E are cross-sectional views illustrating steps for manufacturing a semiconductor device.
Figure 3B:
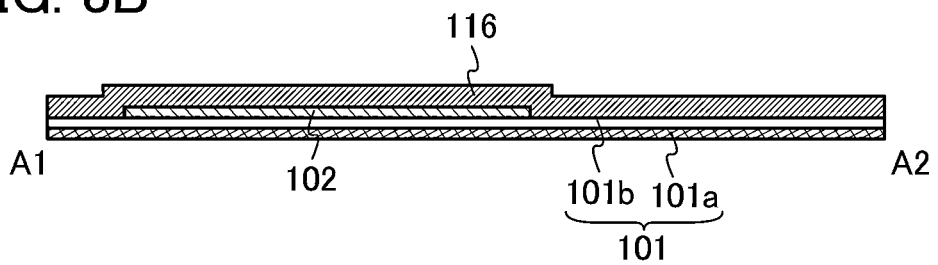
Figure 3C:
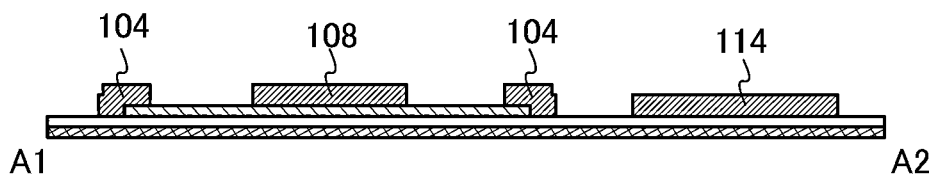
Figure 3D:
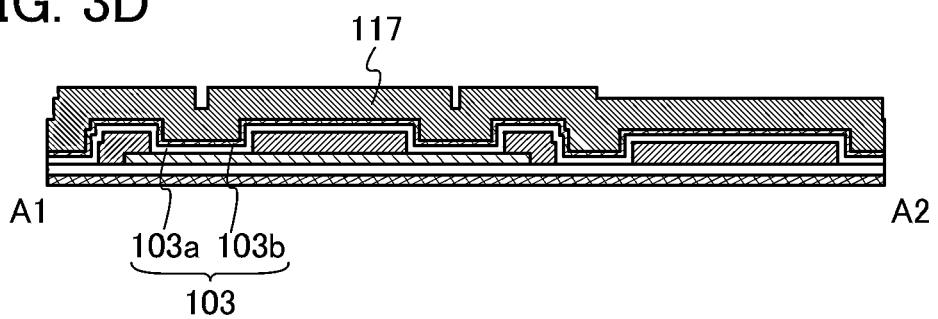
Figure 3E:
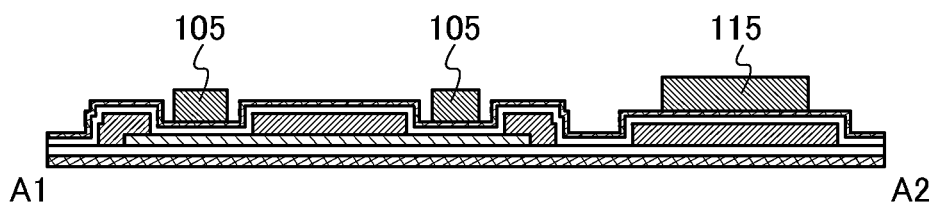
Figure 4A:
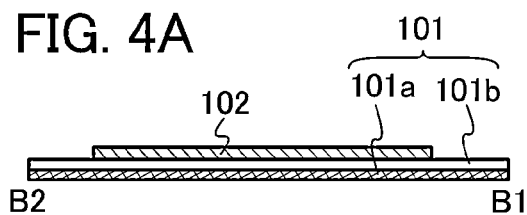
FIGS. 4A to 4J are cross-sectional views illustrating steps for manufacturing a semiconductor device.
Figure 4B:
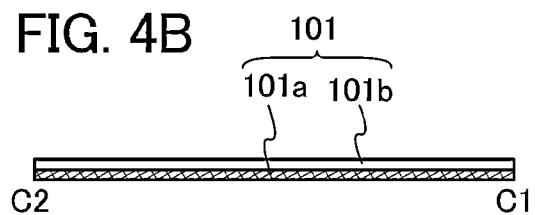
Figure 4C:
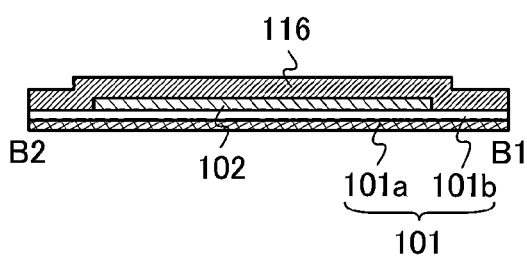
Figure 4D:
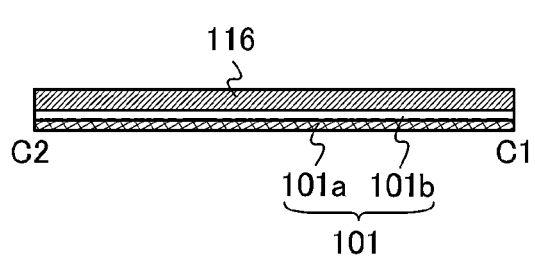
Figure 4E:
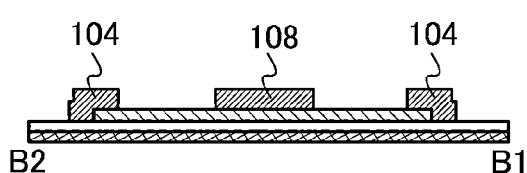
Figure 4F:
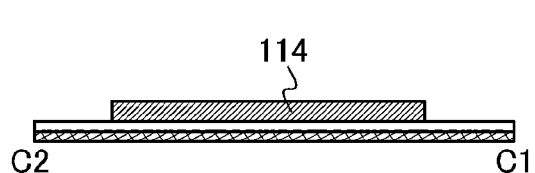
Figure 4G:
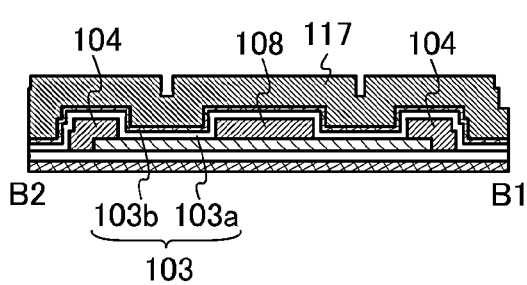
Figure 4H:
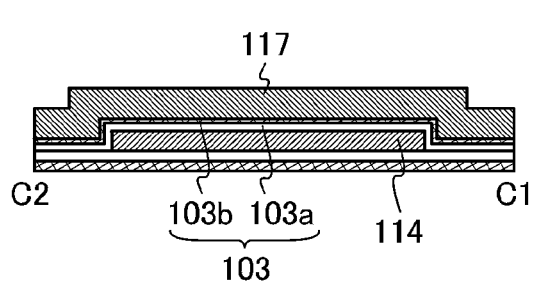
Figure 4I:
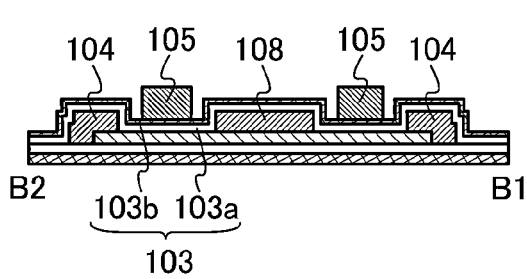
Figure 4J:
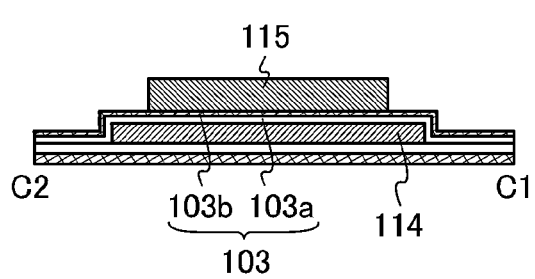

Embodiments are described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Further, an end portion of an island-shaped oxide semiconductor layer in this specification means an outer edge in the plane view, and a side surface or an end face means the same.

In addition, in this specification and the like, ordinal numbers such as "first", "second", and "third" are used in order to avoid confusion among components, and the terms do not limit the components numerically.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

Functions of a "source" and a "drain" of a transistor might interchange when a transistor of opposite polarity is used or the direction of current flow is changed in circuit operation, for example. Therefore, in this specification, the terms including "source" and "drain" can interchange.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Further, for easy understanding, description of some components in a top view is omitted in some cases.

Figure 55A:
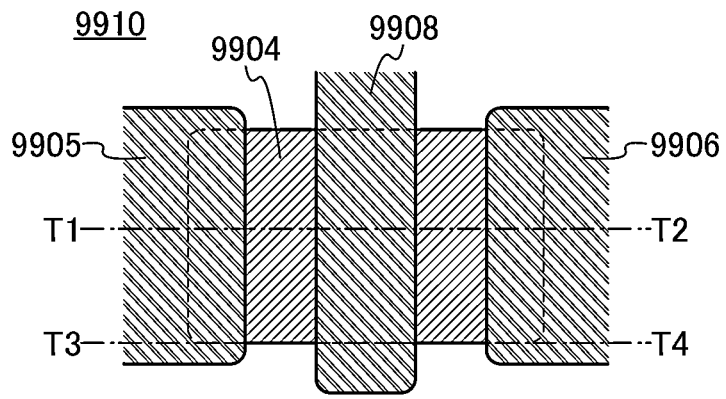
FIGS. 55A to 55C are a top view and cross-sectional views illustrating a conventional example.
Figure 55B:
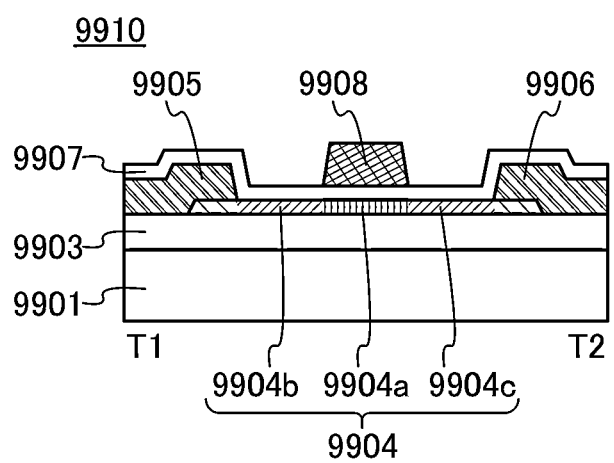
Figure 55C:
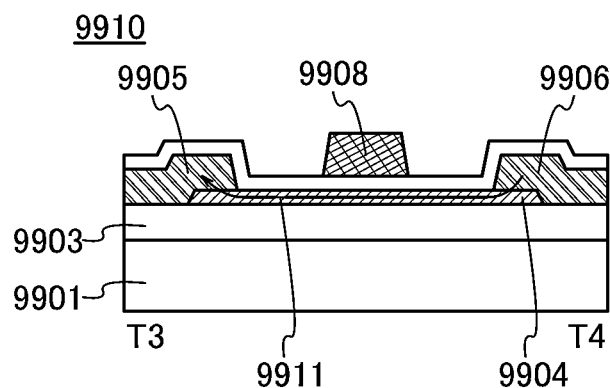

First, a structure of a conventional transistor 9910 is described with reference to FIGS. 55A to 55C. FIG. 55A is a plane view (a top view) of the conventional transistor 9910. FIG. 55B is a cross-sectional view of a portion indicated by chain line T1-T2 in FIG. 55A, and FIG. 55C is a diagram showing a cross section of a portion indicated by chain line T3-T4 in FIG. 55A. FIG. 55C shows a cross section of a portion along an end portion of an oxide semiconductor layer 9904.

The conventional transistor 9910 shown in FIGS. 55A to 55C has a structure in which an insulating layer 9903 is formed over a substrate 9901, an oxide semiconductor layer 9904 is formed over the insulating layer 9903, a source electrode 9905 and a drain electrode 9906 are formed over the oxide semiconductor layer 9904, an insulating layer 9907 is formed over the oxide semiconductor layer 9904, the source electrode 9905, and the drain electrode 9906, and a gate electrode 9908 is formed over the insulating layer 9907 and so as to overlap with the oxide semiconductor layer 9904. Further, the oxide semiconductor layer 9904 includes a channel formation region 9904a, a low-resistance region 9904b, and a low-resistance region 9904c. A region in the oxide semiconductor layer 9904, which overlaps with the gate electrode 9908, becomes the channel formation region 9904a.

FIGS. 55B and 55C show a cross section along a channel length direction of the conventional transistor 9910: FIG. 55B shows a cross section in the vicinity of the center of the conventional transistor 9910, and FIG. 55C shows a cross section of the end portion of the oxide semiconductor layer 9904 from the source electrode 9905 to the drain electrode 9906 of the conventional transistor 9910.

When the transistor 9910 is off, a channel is not formed in the channel formation region 9904a, so that the source electrode 9905 and the drain electrode 9906 are electrically separated. However, when a parasitic channel due to oxygen vacancies is generated in the end portion of the oxide semiconductor layer 9904, as illustrated in FIG. 55C, the source electrode 9905 is electrically connected to the drain electrode 9906 through the parasitic channel, so that a leakage current 9911 flows between the source electrode 9905 and the drain electrode 9906.

The leakage current 9911 causes an increase in power consumption and deterioration of electric characteristics of the transistor such as a negative shift of the threshold voltage. Further, the size of the parasitic channel changes depending on the amount of oxygen vacancies, which causes an increase in variations of electric characteristics of the transistor. Further, the oxygen vacancies generated in the end portion of the oxide semiconductor layer 9904 can cause a decrease in the reliability of the transistor.

Embodiment 1

A structural example of a semiconductor device of this embodiment is described with reference to drawings. FIG. 1A is a top view of a transistor 110 and a capacitor 111 of this embodiment, and FIG. 1B is a cross-sectional view taken along line A1-A2 of the top view in FIG. 1A. FIG. 1C is a cross-sectional view taken along line B1-B2 of the top view in FIG. 1A. FIG. 1D is a cross-sectional view taken along line C1-C2 of the top view in FIG. 1A.

The transistor 110 illustrated in FIGS. 1A to 1C includes an oxide semiconductor layer 102 over a base insulating layer 101, an electrode 104 covering an outer edge of the oxide semiconductor layer 102 and functioning as one of a source electrode and a drain electrode, and an electrode 108 functioning as the other of the source electrode and the drain electrode. Further, the transistor 110 includes a gate insulating layer 103 covering the oxide semiconductor layer 102, the electrode 104, and the electrode 108. Further, the transistor 110 includes a gate electrode 105 over the oxide semiconductor layer 102 with the gate insulating layer 103 provided therebetween. A first insulating layer 107 and a second insulating layer 109 are stacked to cover the gate insulating layer 103 and the gate electrode 105. In addition, an electrode 106 is formed over the second insulating layer 109, and electrically connected to the electrode 108 through an opening provided in the second insulating layer 109, the first insulating layer 107, and the gate insulating layer 103.

As illustrated in FIG. 1A, in the transistor 110, the outer edge of the oxide semiconductor layer 102 is covered with the electrode 104 functioning as one of the source electrode and the drain electrode. Moreover, the gate electrode 105 having a ring-shaped plane shape is formed over the oxide semiconductor layer 102 with the gate insulating layer 103 provided therebetween. An external side of the electrode 108 functioning as the other of the source electrode and the drain electrode is surrounded by the ring-shaped gate electrode 105. Further, an external side of the ring-shaped gate electrode 105 is surrounded by the electrode 104 functioning as one of the source electrode and the drain electrode.

A channel formation region of the transistor 110 is formed in part of a region sandwiched between the electrode 104 and the electrode 108 which are the source electrode and the drain electrode, which overlaps with the gate electrode 105 with the gate insulating layer 103 provided therebetween. The outer edge of the oxide semiconductor layer 102 is covered with the electrode 104 functioning as one of the source electrode and the drain electrode; thus, the channel formation region is not provided in the outer edge of the oxide semiconductor layer 102.

Therefore, in this embodiment, the outer edge of the oxide semiconductor layer in which the parasitic channel is formed is covered with one of the source electrode and the drain electrode, whereby a transistor in which generation of the parasitic channel can be suppressed can be obtained.

The capacitor 111 illustrated in FIGS. 1A, 1B, and 1D includes an electrode 114 formed over the base insulating layer 101 and using a material and a step similar to those of the electrode 104 and the electrode 108, and the gate insulating layer 103 formed over the electrode 114. The capacitor 111 includes an electrode 115 formed over the electrode 114 with the gate insulating layer 103 provided therebetween. The electrode 115 is formed using a material and a step similar to those of the gate electrode 105. The electrode 114 and the electrode 115 function as a pair of electrodes of the capacitor 111 and the gate insulating layer 103 functions as a dielectric. The first insulating layer 107 and the second insulating layer 109 are stacked to cover the gate insulating layer 103 and the electrode 115.

As described above, the electrode 114 which is one of the pair of electrodes of the capacitor 111 is formed using a material and a step similar to those of the electrode 104 and the electrode 108. The dielectric of the capacitor 111 is the gate insulating layer 103. Further, the electrode 115 which is one of the pair of electrodes of the capacitor 111 is formed using a material and a step similar to those of the gate electrode 105. Thus, the transistor 110 and the capacitor 111 can be manufactured over the same plane. When the transistor 110 and the capacitor 111 are manufactured over the same plane, the number of manufacturing steps of the semiconductor device can be reduced and productivity of the semiconductor device can be enhanced.

Note that as illustrated in FIG. 1A, in this embodiment, the planar shape of the oxide semiconductor layer 102 is a rectangle; however, the shape is not limited thereto. The planar shape of the oxide semiconductor layer 102 may be not only a rectangle, but also other polygons (e.g., a triangle) or a round. In addition, the term "rectangle" also includes a square.

Further, a region of the oxide semiconductor layer 102 which overlaps with the electrode 104 functioning as one of a source electrode and a drain electrode functions as one of the source region and the drain region. Further, a region of the oxide semiconductor layer 102 which overlaps with the electrode 108 functioning as the other of the source electrode and the drain electrode functions as the other of the source region and the drain region.

In the manufacturing process described below, in the case where an impurity element which changes the conductivity of an oxide semiconductor is not added to the oxide semiconductor layer 102, offset regions are provided between the source region and the channel formation region and between the drain region and the channel formation region. In other words, the channel formation region, the source region, the drain region, and the offset regions are formed in a self-aligned manner. By providing the offset regions, parasitic capacitance generated between the gate electrode and the source electrode can be reduced. Further, parasitic capacitance generated between the gate electrode and the drain electrode can be reduced. Note that the length of the channel formation region, which is the distance within which carriers flow (also referred to as channel length), is preferably less than 60 nm.

Since the channel formation region is formed in a self-aligned manner, miniaturization of the transistor can be easily achieved, the transistor has excellent on-state characteristics (for example, on-state current and field-effect mobility) and can operate at high speed.

On the other hand, in the manufacturing process described below, in the case where the impurity element which changes the conductivity of an oxide semiconductor is added to the oxide semiconductor layer 102 using the gate electrode 105 as a mask, low-resistance regions are formed in a self-aligned manner between the source region and the channel formation region and between the drain region and the channel formation region. When the low-resistance regions are formed, the on-resistance of the transistor 110 can be reduced and the operation speed thereof can be improved.

As in a transistor 112 illustrated in FIGS. 2A to 2C, in the case where a gate electrode 135 overlaps with the electrode 104 and the electrode 108 which function as the source electrode and the drain electrode, the offset region is not formed. Further, in the transistor 112 illustrated in FIGS. 2A to 2C, the impurity element cannot be added in a self-aligned manner between the source region and the channel formation region and between the drain region and the channel formation region; thus, low-resistance regions are not formed.

FIG. 2A is a top view of the transistor 112 and the capacitor 111 of this embodiment, and FIG. 2B is a cross-sectional view taken along line A3-A4 of the top view in FIG. 2A. FIG. 2C is a cross-sectional view taken along line B3-B4 of the top view in FIG. 2A. FIG. 2D is a cross-sectional view taken along line C3-C4 of the top view in FIG. 2A. Note that in FIG. 2A, some components are omitted for easy understanding.

Although not illustrated in this embodiment, a semiconductor device which is different from the transistor 110, for example, a transistor including a semiconductor layer having a width of a forbidden band different from that of an oxide semiconductor layer may be included below the base insulating layer 101.

In the base insulating layer 101, a first base insulating layer 101a and a second base insulating layer 101b are stacked in this order from the side farthest from the oxide semiconductor layer 102. The first base insulating layer 101a is provided so as to prevent an element included in the semiconductor device provided below the base insulating layer 101 entering into the oxide semiconductor layer 102 formed later.

Further, the first base insulating layer 101a functions as a blocking layer for suppressing release of oxygen from the oxide semiconductor layer 102.

For the first base insulating layer 101a, a material having a barrier property against oxygen or an impurity such as hydrogen, moisture, hydride, or hydroxide is preferably used. By applying a material having a barrier property to the first base insulating layer 101a, entry of impurities from the outside can be prevented and release of oxygen from the oxide semiconductor layer 102 can be prevented.

The first base insulating layer 101a can have a single-layer structure or a stacked-layer structure including one or more films selected from those containing silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these materials.

Note that silicon oxynitride refers to a substance which contains more oxygen than nitrogen and contains oxygen, nitrogen, silicon, and hydrogen at given concentrations ranging from 55 atomic % to 65 atomic %, 1 atomic % to 20 atomic %, 25 atomic % to 35 atomic %, and 0.1 atomic % to 10 atomic %, respectively, where the total percentage of atoms is 100 atomic %. Further, the silicon nitride oxide film refers to a film which contains more nitrogen than oxygen and contains oxygen, nitrogen, silicon, and hydrogen at given concentrations ranging from 15 to 30 atomic %, 20 to 35 atomic %, 25 to 35 atomic %, and 15 to 25 atomic %, respectively, where the total percentage of atoms is 100 atomic %.

The second base insulating layer 101b may be formed using the same material as the first base insulating layer 101a. The second base insulating layer 101b includes a region containing oxygen in excess of the stoichiometric composition (hereinafter also referred to as an oxygen-excess region). The second base insulating layer 101b preferably contains oxygen in excess of the stoichiometric composition because oxygen vacancies in the oxide semiconductor layer 102 to be formed later can be filled with the excess oxygen contained in the second base insulating layer 101b. In the case of having a stacked-layer structure, the second base insulating layer 101b preferably includes an oxygen-excess region at least in a layer in contact with the oxide semiconductor layer 102. In order to provide the oxygen-excess region in the second base insulating layer 101b, for example, the second base insulating layer 101b may be formed in an oxygen atmosphere. Alternatively, the oxygen-excess region may be formed by implanting oxygen (including at least one of oxygen radicals, oxygen atoms, and oxygen ions) into the second base insulating layer 101b after its formation. Oxygen can be implanted by an ion implantation method, an ion doping method, a plasma immersion ion implantation method, plasma treatment, or the like.

The oxide semiconductor layer 102 may have either a single-layer structure or a layered structure. In addition, the oxide semiconductor layer 102 may have an amorphous structure or a crystalline structure. In the case where the oxide semiconductor layer 102 has an amorphous structure, a heat treatment may be performed on the formed oxide semiconductor layer in a manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., more preferably higher than or equal to 500° C., and still more preferably higher than or equal to 550° C. Note that the heat treatment can also serve as another heat treatment in the manufacturing process.

The oxide semiconductor layer 102 may be formed by forming an oxide semiconductor film over the base insulating layer 101, and processing the formed oxide semiconductor film into an appropriate shape.

The oxide semiconductor film can be formed by a sputtering method, a molecular beam epitaxy (MBE) method, a CVD method, a pulse laser deposition method, an atomic layer deposition (ALD) method, or the like as appropriate. Further, the oxide semiconductor film may be formed using a sputtering apparatus in which film formation is performed in the state where surfaces of a plurality of substrates are substantially perpendicular to a surface of a sputtering target.

In the formation of the oxide semiconductor film, the hydrogen concentration in the oxide semiconductor film is preferably reduced as much as possible. In order to reduce the hydrogen concentration, for example, in the case where the oxide semiconductor layer is formed by a sputtering method, a high-purity rare gas (typically argon), high-purity oxygen, or a high-purity mixed gas of a rare gas and oxygen, from which impurities such as hydrogen, water, a hydroxyl group, and hydride have been removed, is used as appropriate as an atmosphere gas supplied to a deposition chamber of a sputtering apparatus.

The oxide semiconductor film is formed in such a manner that a sputtering gas from which hydrogen and moisture have been removed is introduced into the deposition chamber while moisture remaining therein is removed, whereby the hydrogen concentration in the formed oxide semiconductor film can be reduced. In order to remove moisture remaining in the deposition chamber, an entrapment vacuum pump such as a cryopump, an ion pump, or a titanium sublimation pump is preferably used. A turbo molecular pump provided with a cold trap may be used. The cryopump has a high capability in removing a hydrogen molecule, a compound containing a hydrogen atom such as water ($H_2O$) (further preferably, also a compound containing a carbon atom), and the like; thus, the impurity concentration in the oxide semiconductor film formed in the deposition chamber which is evacuated with the cryopump can be reduced.

Further, in the case where the oxide semiconductor film is formed by a sputtering method, the relative density (the fill rate) of the metal oxide target which is used for forming the oxide semiconductor film is greater than or equal to 90% and less than or equal to 100%, preferably greater than or equal to 95% and less than or equal to 99.9%. With the use of a metal oxide target with a high relative density, the formed oxide semiconductor film can have high density.

In order to reduce the impurity concentration in the oxide semiconductor film, it is also effective to form the oxide semiconductor film while the base insulating layer 101 is kept at high temperature if possible. The temperature at which the base insulating layer 101 is heated may be higher than or equal to 150° C. and lower than or equal to 450° C.; the heating temperature is preferably higher than or equal to 200° C. and lower than or equal to 350° C. By heating the base insulating layer 101 at high temperature during the film formation, a crystalline oxide semiconductor film can be formed.

An oxide semiconductor used for the oxide semiconductor film preferably contains at least indium (In) or zinc (Zn). In particular, In and Zn are preferably contained. As a stabilizer for reducing a variation in electric characteristics among transistors including the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Here, for example, an "In—Ga—Zn-based oxide" means an oxide containing indium (In), gallium (Ga), and zinc (Zn)

and there is no particular limitation on the ratio of In, Ga, and Zn. The In—Ga—Zn-based oxide may contain a metal element other than the In, Ga, and Zn.

In addition, as the oxide semiconductor film, a thin film of a material represented by the chemical expression, $InMO_3(ZnO)_m$ (m>0), can be used. Here, M represents one or more metal elements selected from Sn, Zn, Ga, Al, Mn, and Co. Alternatively, a material represented by $In_2SnO_5(ZnO)_n$ (n>0) may be used as the oxide semiconductor.

For example, an In—Ga—Zn-based oxide with an atomic ratio of In:Ga:Zn=1:1:1 or In:Ga:Zn=2:2:1, or an oxide with an atomic ratio close to the above atomic ratios can be used. Alternatively, an In—Sn—Zn-based oxide with an atomic ratio of In:Sn:Zn=1:1:1, In:Sn:Zn=2:1:3, or In:Sn:Zn=2:1:5, or an oxide with an atomic ratio close to the above atomic ratios may be used.

However, the present invention is not limited to the above compositions, and an oxide having an appropriate composition may be used depending on necessary electric characteristics of a transistor (e.g., field-effect mobility, threshold voltage, or variation). In order to obtain the needed electric characteristics, it is preferable that the carrier density, the impurity concentration, the defect density, the atomic ratio between a metal element and oxygen, the interatomic distance, the density, and the like be set to appropriate values.

For example, high field-effect mobility can be obtained relatively easily in the case of using an In—Sn—Zn oxide. However, field-effect mobility can be increased by reducing the defect density in a bulk also in the case of using an In—Ga—Zn-based oxide.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

Note that it is preferable that the oxide semiconductor film be formed under conditions that much oxygen is contained during film formation (e.g., deposited by a sputtering method under a 100% oxygen atmosphere), so that a film containing much oxygen (preferably including a region containing oxygen in excess of the stoichiometric composition of an oxide semiconductor in a crystalline state) is formed.

It is preferable that a high-purity gas from which an impurity such as hydrogen, water, a hydroxyl group, or hydride is removed be used as a sputtering gas for the formation of the oxide semiconductor film.

The oxide semiconductor film is in a single crystal state, a polycrystalline (also referred to as polycrystal) state, a microcrystalline state, an amorphous state, or the like.

In the case of an oxide semiconductor in an amorphous state, a flat surface can be obtained with relative ease, so that interface scattering of a transistor including such an oxide semiconductor at the time of operation can be reduced, and relatively high field-effect mobility can be obtained with relative ease.

In an oxide semiconductor having crystallinity, defects in the bulk can be reduced and when the surface flatness of the oxide semiconductor is improved, field-effect mobility of a transistor including the oxide semiconductor having crystallinity can be higher than that of a transistor including an oxide semiconductor in an amorphous state. In order to improve the surface flatness, the oxide semiconductor is preferably formed over a flat surface. Specifically, the oxide semiconductor is formed over a surface with the average surface roughness (Ra) less than or equal to 0.15 nm, preferably less than or equal to 0.1 nm.

Note that an average surface roughness Ra is obtained by expanding arithmetic mean surface roughness, which is defined by JIS B0601: 2001 (ISO4287: 1997), into three dimensions so as to be applicable to a curved surface. Moreover, an average surface roughness Ra can be expressed as "the average value of the absolute values of deviations from a reference surface to a specific surface" and is defined by the following formula 1.

[FORMULA 1]

$$Ra = \frac{1}{S_0} \int_{y_1}^{y_2} \int_{x_1}^{x_2} |f(x,y) - Z_0| dx dy \quad (1)$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. The area of a rectangle which is obtained by projecting the specific surface on the xy plane is represented by $S_0$, and the height of the reference surface (the average height of the specific surface) is represented by $Z_0$. The average surface roughness Ra can be measured using an atomic force microscope (AFM).

In the case where an In—Zn-based oxide material is used for the oxide semiconductor, any of the following is employed: In/Zn is 0.5 to 50 in an atomic ratio, preferably In/Zn is 1 to 20 in an atomic ratio, or further preferably In/Zn is 1.5 to 15 in an atomic ratio. When the atomic ratio of Zn is in the above preferred range, the field-effect mobility of a transistor can be improved. Here, when the atomic ratio of the compound is In:Zn:O=X:Y:Z, the relation Z>1.5X+Y is satisfied.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

Nitrogen may be substituted for part of constituent oxygen of the oxide semiconductor.

Before the oxide semiconductor film is deposited, planarization treatment may be performed on the surface where the oxide semiconductor film is deposited. As the planarization treatment, polishing treatment (e.g., a chemical mechanical polishing method), dry-etching treatment, or plasma treatment can be used, although there is no particular limitation on the planarization treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface where the oxide semiconductor film is deposited.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface where the oxide semiconductor film is deposited.

Further, the oxide semiconductor film is preferably subjected to heat treatment for removing excess hydrogen (including water and a hydroxyl group) contained in the oxide semiconductor film (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an n-type impurity, can be removed from the oxide semiconductor by the heat treatment. For example, the hydrogen concentration in the oxide semiconductor film after the dehydration or dehydrogenation treatment can be $5\times10^{19}/cm^3$ or lower, preferably $5\times10^{18}/cm^3$ or lower.

Note that the heat treatment for the dehydration or dehydrogenation may be performed at any timing in the process of manufacturing the transistor 110 as long as it is performed after the deposition of the oxide semiconductor film. In the case where an aluminum oxide film is formed as the gate insulating layer 103 or the first insulating layer 107, the heat treatment is preferably performed before the aluminum oxide film is formed. The heat treatment for the dehydration or dehydrogenation may be performed plural times, and may double as another heat treatment.

Note that in the heat treatment, it is preferable that water, hydrogen, and the like be not contained in nitrogen or a rare gas such as helium, neon, or argon. The purity of nitrogen or a rare gas such as helium, neon, or argon introduced into the heat treatment apparatus is preferably 6N (99.9999%) or more, more preferably 7N (99.99999%) or more (i.e., the impurity concentration is preferably 1 ppm or lower, more preferably 0.1 ppm or lower).

In addition, after the oxide semiconductor film is heated by the heat treatment, a high-purity oxygen gas, a high-purity dinitrogen monoxide gas, or ultra dry air (the moisture amount is 20 ppm or lower (−55° C. by conversion into a dew point), preferably 1 ppm or lower, more preferably 10 ppb or lower, in the measurement with the use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that is reduced by the step for removing an impurity for the dehydration or dehydrogenation, so that the oxide semiconductor film can be a highly purified, i-type (intrinsic) oxide semiconductor film.

Further, oxygen (which includes at least one of an oxygen radical, an oxygen atom, and an oxygen ion) may be added to the oxide semiconductor film after being subjected to the dehydration or dehydrogenation treatment to supply oxygen to the oxide semiconductor film.

In the transistor described in this embodiment, oxygen is added to the dehydrated or dehydrogenated oxide semiconductor film to be supplied thereto, so that the oxide semiconductor film can be highly purified and be i-type (intrinsic). Variation in electrical characteristics of a field-effect transistor having a highly-purified and i-type (intrinsic) oxide semiconductor film is suppressed, and the transistor is electrically stable.

In the step of introducing oxygen, oxygen may be directly introduced into the oxide semiconductor film or may be introduced into the oxide semiconductor layer having an appropriate shape through another film such as the gate insulating layer 103 or the first insulating layer 107 formed later. An ion implantation method, an ion doping method, a plasma immersion ion implantation method, or the like may be employed for the addition of oxygen through another film, whereas a plasma treatment or the like can also be employed in addition to the above methods for the direct addition of oxygen to the exposed oxide semiconductor film.

The addition of oxygen into the oxide semiconductor film can be performed anytime after dehydration or dehydrogenation treatment is performed thereon. Further, oxygen may be introduced plural times into the dehydrated or dehydrogenated oxide semiconductor layer. Further, dehydration or dehydrogenation treatment and introduction of oxygen may be alternately performed plural times.

Note that the introduction of oxygen into the oxide semiconductor film may be performed before or after the oxide semiconductor film is processed into the appropriate shape.

As described above, an i-type oxide semiconductor is obtained by removal of an impurity such as water or hydrogen and supply of oxygen that is a component of an oxide semiconductor. In this respect, it can be said that an embodiment of the disclosed invention includes a novel technical idea which is far from an idea that an i-type semiconductor is obtained by adding an impurity in the case of silicon and the like.

Note that a single layer of a single crystal oxide semiconductor, a polycrystalline oxide semiconductor, a microcrystalline oxide semiconductor, an amorphous oxide semiconductor, or a CAAC-OS film, or a stack of at least two layers selected from these materials may be used as the oxide semiconductor film. Further, as the stack of the oxide semiconductor, layers having the same crystallinity may be stacked or layers having different crystallinities may be stacked.

Next, a method for manufacturing the transistor 110 and the capacitor 111 is described with reference to cross-sectional views in FIGS. 3A to 3E and FIGS. 4A to 4J, and top views in FIGS. 5A to 5C and FIGS. 6A and 6B. Note that the transistor 112 can be manufactured by the same method as the transistor 110.

First, over the base insulating layer 101, the oxide semiconductor film is processed into an appropriate shape, so that the oxide semiconductor layer 102 is formed (see FIGS. 3A, 4A, 4B, and 5A).

Next, a first conductive film 116 is formed to cover the base insulating layer 101 and the oxide semiconductor layer 102 (see FIGS. 3B, 4C, 4D, and 5B).

The first conductive film 116 is formed of a material that can withstand heat treatment performed later. For example, a metal film containing an element selected from aluminum (Al), chromium (Cr), copper (Cu), tantalum (Ta), titanium (Ti), molybdenum (Mo), tungsten (W), neodymium (Nd), scandium (Sc), and the like, a metal nitride film containing any of the above elements as its component (e.g., a titanium nitride film, a molybdenum nitride film, or a tungsten nitride film), or the like can be used. A film of a high-melting-point metal such as titanium (Ti), molybdenum (Mo), tungsten (W), or tantalum (Ta), or a metal nitride film thereof (e.g., a titanium nitride film, a molybdenum nitride film, or a tungsten nitride film) may be stacked on one or both of a bottom side and a top side of a low-resistant metal film of aluminum (Al), copper (Cu), or the like. When the film of a high-melting-point metal or a metal nitride film thereof is stacked on one or both of a lower side and an upper side of a low-resistance metal film, transition (diffusion) of metal of the low-resistance metal film can be prevented, which is preferable. That is, the first conductive film 116 is a stacked layer of a first conductive layer, a metal film which is a second conductive layer, and a third conductive layer, and a low-resistance conductive layer is used as the second conductive layer. For at least one of the first conductive layer and the third conductive layer, a material which can prevent the metal of the second conductive layer from moving is used. Further, when the third conductive layer over the second conductive layer covers an end portion of the second conductive layer, movement of metal from the end portion of the second conductive layer can be prevented, which is preferable.

For example, as the first conductive film 116, a stacked layer of tungsten (W), copper (Cu), and tantalum nitride (TaN) is used, and copper (Cu), which has low resistance, is preferably sandwiched between tungsten (W) and tantalum nitride (TaN) which prevent copper from moving. Alternatively, the first conductive film 116 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials in which silicon oxide is contained can be used.

A resist mask is formed over the first conductive film 116 and part of the first conductive film 116 is selectively removed using the resist mask as a mask, so that the electrode 104 which is one of the source electrode and the drain electrode covering an outer edge of the oxide semiconductor layer 102, the electrode 108 which is the other of the source electrode and the drain electrode, and the electrode 114 functioning as one of the pair of electrodes of the capacitor 111 are formed (see FIGS. 3C, 4E, 4F, and 5C).

Figure 5A:
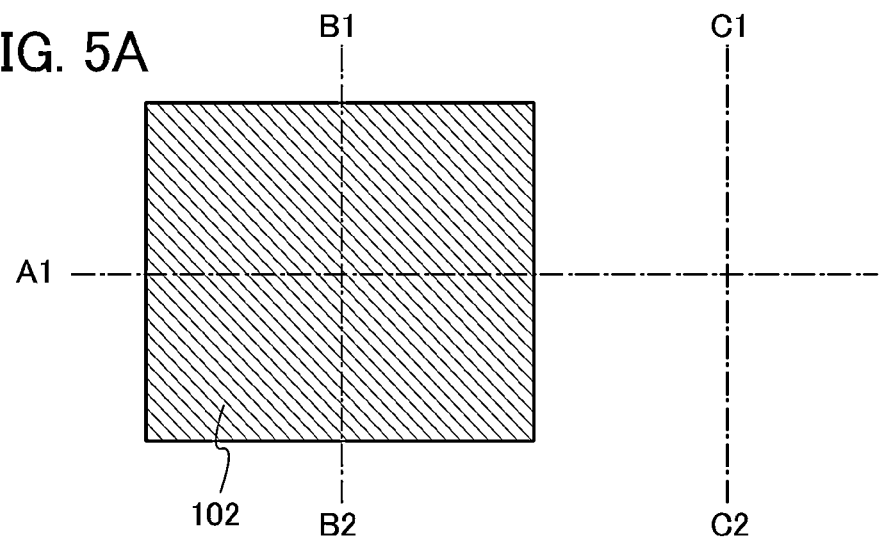
FIGS. 5A to 5C are top views illustrating steps for manufacturing a semiconductor device.
Figure 5B:
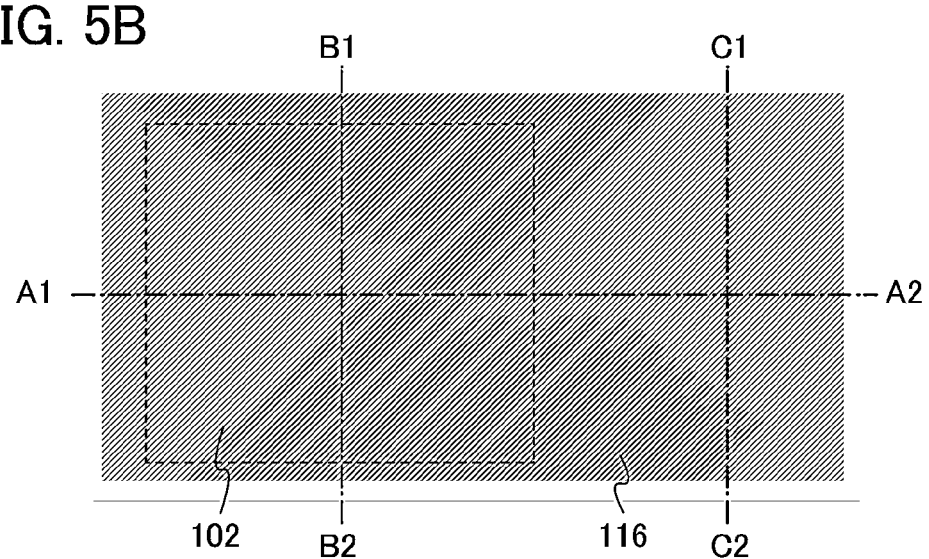
Figure 5C:
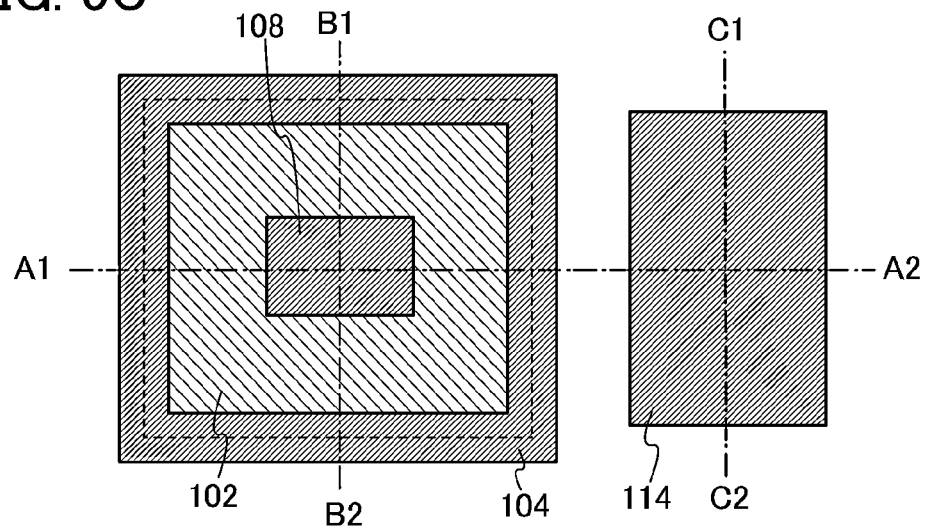

In particular, as illustrated in FIG. 5C, the electrode 108 which is the other of the source electrode and the drain electrode is placed to be surrounded by the electrode 104 which is one of the source electrode and the drain electrode.

A dry etching method or a wet etching method can be used for the etching of the first conductive film 116. Further, that etching of the first conductive film 116 may be conducted by a combination of a dry etching method and a wet etching method. The resist mask formed over the first conductive film 116 can be formed by a photolithography method, a printing method, an inkjet method, or the like. Formation of the resist mask by an inkjet method needs no photomask; thus, manufacturing cost can be reduced.

In the case of etching the first conductive film 116 by a dry etching method, a gas including a halogen element can be used as an etching gas. As an example of a gas containing a halogen element, a chlorine-based gas such as chlorine ($Cl_2$), boron trichloride ($BCl_3$), silicon tetrachloride ($SiCl_4$), or carbon tetrachloride ($CCl_4$)); a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr), or oxygen can be given. Further, an inert gas may be added to an etching gas. As the dry etching method, a reactive ion etching (RIE) method can be used.

As a plasma source, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated. In the case of the etching according to the dry etching method (hereinafter also referred to as a "dry etching treatment"), the etching conditions (the amount of electric power applied to a coil-shaped electrode, the amount of electric power applied to an electrode on a substrate side, the temperature of the electrode on the substrate side, and the like) are adjusted as appropriate so that the film can be etched into a desired shape.

The formed electrode 104, electrode 108, and electrode 114 preferably have tapered edges because coverage with an insulating layer or a conductive layer that is later to be stacked thereover can be improved.

Specifically, the end portions of the electrode 104, the electrode 108, and the electrode 114 are processed into a tapered shape so that the cross-sectional shapes of the electrode 104, the electrode 108, and the electrode 114 are trapezoidal or triangular. Here, the end portions of the electrode 104, the electrode 108, and the electrode 114 each have a taper angle θ of 60° or less, preferably 45° or less, further preferably 30° or less. Note that the taper angle θ refers to an inclination angle formed by a side surface and a bottom surface of a layer with a tapered shape when the layer is observed from the direction perpendicular to the cross section of the layer (i.e., the plane perpendicular to the surface of the substrate). A taper angle smaller than 90° is called forward tapered angle and a taper angle of larger than or equal to 90° is called inverse tapered angle. By making the angle of an end portion of not only the electrodes 104, 108, 114, but also a layer to be a forward tapered angle, a phenomenon in that a layer formed over the end of the layer is separated (disconnection) can be prevented; thus, the coverage with the layer can be improved.

Further, the end portions of the electrode 104, the electrode 108, and the electrode 114 may each have a step shape. When the end portions of the electrode 104, the electrode 108, and the electrode 114 each have a step shape, disconnection of a layer formed over the end portions can be prevented, leading to an improvement in coverage. The same applies to any other layer; by providing a forward taper shape or a step shape for the end portion of the layer, disconnection of a layer covering the layer (disconnection caused by a step) can be prevented, so that the coverage becomes good.

Note that on the surface of the oxide semiconductor layer 102 which is exposed by formation of the electrode 104 and the electrode 108, a constituent element of the electrode 104 and the electrode 108, an element existing in a deposition chamber, or a constituent element of an etching gas used for the etching may be attached as impurities.

Such attachment of the impurities tends to bring an increase in off-state current of the transistor or deterioration of the electric characteristics of the transistor. In addition, a parasitic channel is likely to be generated in the oxide semiconductor layer 102, and thus electrodes which should be electrically isolated might be electrically connected through the oxide semiconductor layer 102.

Thus, after the etching for forming the electrode 104 and the electrode 108 is finished, cleaning treatment for removing the impurities attached on the surface and side surface of the oxide semiconductor layer 102 (impurity-removing treatment) may be performed.

The impurity-removing treatment can be performed by plasma treatment or treatment using a solution. As the plasma treatment, oxygen plasma treatment, dinitrogen monoxide plasma treatment, or the like can be used. In addition, a rare gas (typically argon) may be used in the plasma treatment.

Further, for the cleaning treatment using a solution, an alkaline solution such as a TMAH solution, water, or an acidic solution such as phosphate and diluted hydrofluoric acid can be used. For example, in the case where a diluted hydrofluoric acid solution is used, 50 wt % hydrofluoric acid is diluted with water 100 times to 100000 times, preferably 1000 times to 100000 times. That is, diluted hydrofluoric acid having a concentration of 0.5 wt % to $5\times10^{-4}$ wt %, preferably $5\times10^{-2}$ wt % to $5\times10^{-4}$ wt %, is used for the cleaning treatment. By the cleaning treatment, the above-described impurities attached on the surface of the exposed oxide semiconductor layer 102 can be removed.

Further, by the impurity-removing treatment using a diluted hydrofluoric acid solution, the exposed surface of the oxide semiconductor layer 102 can be etched. In other words, impurities attached on the exposed surface of the oxide semiconductor layer 102 or impurities taken inside and in the vicinity of the surface of the oxide semiconductor layer 102 can be removed with part of the oxide semiconductor layer 102. Thus, regions in the oxide semiconductor layer 102 overlapping with the electrode 104 and the electrode 108 have a larger thickness than a region in the oxide semiconductor layer 102 overlapping with neither the electrode 104 nor the electrode 108.

By performing the impurity-removing treatment, the chlorine concentration at the surface of the oxide semiconductor layer, at a concentration peak obtained by secondary ion mass spectrometry (SIMS), can be reduced to be lower than or equal to $1\times10^{19}/cm^3$ (preferably lower than or equal to $5\times10^{18}/cm^3$, further preferably lower than or equal to $1\times10^{18}/cm^3$). The boron concentration can be reduced to be lower than or equal to $1\times10^{19}/cm^3$ (preferably lower than or equal to $5\times10^{18}/cm^3$, further preferably lower than or equal to $1\times10^{18}/cm^3$). The aluminum concentration can be reduced to be lower than or equal to $1\times10^{19}/cm^3$ (preferably lower than or equal to $5\times10^{18}/cm^3$, further preferably lower than or equal to $1\times10^{18}/cm^3$).

The treatment for removing an impurity enables the highly reliable transistor 110 having stable electric characteristics to be provided.

Next, the gate insulating layer 103 covering the oxide semiconductor layer 102, the electrode 104, the electrode 108, and the electrode 114 is formed.

The gate insulating layer 103 (a stack of the first gate insulating layer 103a and the second gate insulating layer 103b) has a thickness greater than or equal to 1 nm and less than or equal to 20 nm and can be formed by a sputtering method, a MBE method, a CVD method, a pulse laser deposition method, an ALD method, or the like as appropriate. The gate insulating layer 103 may be formed with a sputtering apparatus which performs deposition in the state where top surfaces of a plurality of substrates are substantially perpendicular to a top surface of a sputtering target.

The gate insulating layer 103 can be formed using silicon oxide, gallium oxide, aluminum oxide, silicon nitride, silicon oxynitride, aluminum oxynitride, silicon nitride oxide, or the like. The first gate insulating layer 103a, which is in contact with the oxide semiconductor layer 102, of the gate insulating layer 103 preferably contains oxygen. In particular, the first gate insulating layer 103a preferably includes an oxygen-excess region in a region in contact with the oxide semiconductor layer 102, as in the case of the second base insulating layer 101b. In particular, it is preferable that the oxygen content of the first gate insulating layer 103a in (a bulk of) the film be in excess of that in the stoichiometric composition. For example, in the case where silicon oxide is used for the first gate insulating layer 103a, the composition formula thereof is preferably $SiO_{2+\alpha}$ ($\alpha>0$). In this embodiment, silicon oxide of $SiO_{2+\alpha}$ ($\alpha>0$) is used for the gate insulating layer 103. By using the silicon oxide for the gate insulating layer 103, oxygen can be supplied to the oxide semiconductor layer 102, leading to good characteristics. Further, the gate insulating layer 103 is preferably formed in consideration of the size of a transistor to be formed and the step coverage with the gate insulating layer 103.

The second gate insulating layer 103b, which is in contact with the gate electrode 105 formed in a layer step, of the gate insulating layer 103 has a function of preventing entry of an element contained in the gate electrode 105 to the oxide semiconductor layer 102, and also functions as a blocking layer for suppressing release of oxygen from the oxide semiconductor layer 102.

The gate insulating layer 103 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, whereby gate leakage current can be reduced. Furthermore, each of the first gate insulating layer 103a and the second gate insulating layer 103b may have either a single-layer structure or a stacked-layer structure.

Then, the gate electrode 105 is formed over the oxide semiconductor layer 102 with the gate insulating layer 103 provided therebetween. First, a second conductive film 117 is formed over the gate insulating layer 103 (see FIGS. 3D, 4G, 4H, and 6A).

The second conductive film 117 is formed over the gate insulating layer 103 by a plasma CVD method, a sputtering method, or the like.

The second conductive film 117 can be formed using a metal film containing an element selected from molybdenum (Mo), titanium (Ti), tantalum (Ta), tungsten (W), aluminum (Al), copper (Cu), chromium (Cr), neodymium (Nd), and scandium (Sc); a metal nitride film containing any of the above elements as its component (e.g., a titanium nitride film, a molybdenum nitride film, or a tungsten nitride film); or the like. Further, like in the first conductive film 116, when a metal film having a high melting point such as titanium (Ti), molybdenum (Mo), tungsten (W), or tantalum (Ta), or a metal nitride film of any of these elements is stacked on one or both of a lower side and an upper side of a low-resistance metal film of aluminum (Al), copper (Cu), or the like, transition (diffusion) of metal of the low-resistance metal film can be prevented, which is preferable. That is, like the first conductive film 116, the second conductive film 117 is a stacked layer of a first conductive layer, a metal film which is a second conductive layer, and a third conductive layer, and a low-resistance conductive layer is used as the second conductive layer. For at least one of the first conductive layer and the third conductive layer, a material which can prevent the metal of the second conductive layer from moving is used. Further, when the third conductive layer over the second conductive layer covers an end portion of the second conductive layer, movement of metal from the end portion of the second conductive layer can be prevented, which is preferable.

For example, as the second conductive film 117, a stacked layer of tungsten (W), copper (Cu), and tantalum nitride is used, and copper (Cu), which has low resistance, is preferably sandwiched between tungsten (W) and tantalum nitride which prevent copper from moving. Alternatively, a semiconductor typified by polycrystalline silicon doped with an impurity element such as phosphorus, or a silicide such as a nickel silicide may be used for the second conductive film 117. The second conductive film 117 may have a single-layer structure or a stacked-layer structure.

The second conductive film 117 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

As one layer of the second conductive film 117 which is in contact with the gate insulating layer 103, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (e.g., InN or SnN) film can be used. These films each have a work function of 5 eV (electron volts) or higher, preferably 5.5 eV or higher, which enables the threshold voltage of a transistor to be positive when used as the gate electrode. Thus, a normally-off switching element can be obtained.

Note that the gate electrode 105 and the electrode 115 can be formed by processing the second conductive film 117 provided over the gate insulating layer 103 with the use of a resist mask. Here, as the resist mask used for the processing, a mask having a finer pattern which is formed by performing a slimming process on a resist mask formed by a photolithography method or the like is preferably used.

As the slimming process, an ashing process in which oxygen in a radical state (an oxygen radical) or the like is used can be employed, for example. However, the slimming process is not limited to the ashing process as long as the mask formed by a photolithography method or the like can be processed into a finer pattern. Note that the channel length (L) of a transistor is determined by the mask formed by the slimming process. Therefore, it can be preferable to employ a process with high controllability as the slimming process.

As a result of the slimming process, the line width of the resist mask formed by a photolithography method or the like can be reduced to a length shorter than or equal to the resolution limit of a light exposure apparatus, preferably less than or equal to half of the resolution limit of a light exposure apparatus, more preferably less than or equal to one third of the resolution limit of the light exposure apparatus. For example, the line width can be greater than or equal to 30 nm and less than or equal to 2000 nm, preferably greater than or equal to 50 nm and less than or equal to 350 nm. This enables further miniaturization of the transistor.

As described above, part of the second conductive film 117 is selectively removed, whereby the ring-shaped gate electrode 105 and the electrode 115 which is the other of the pair of electrodes of the capacitor 111 can be formed (see FIGS. 3E, 4I, 4J, and 6B).

Figure 6A:
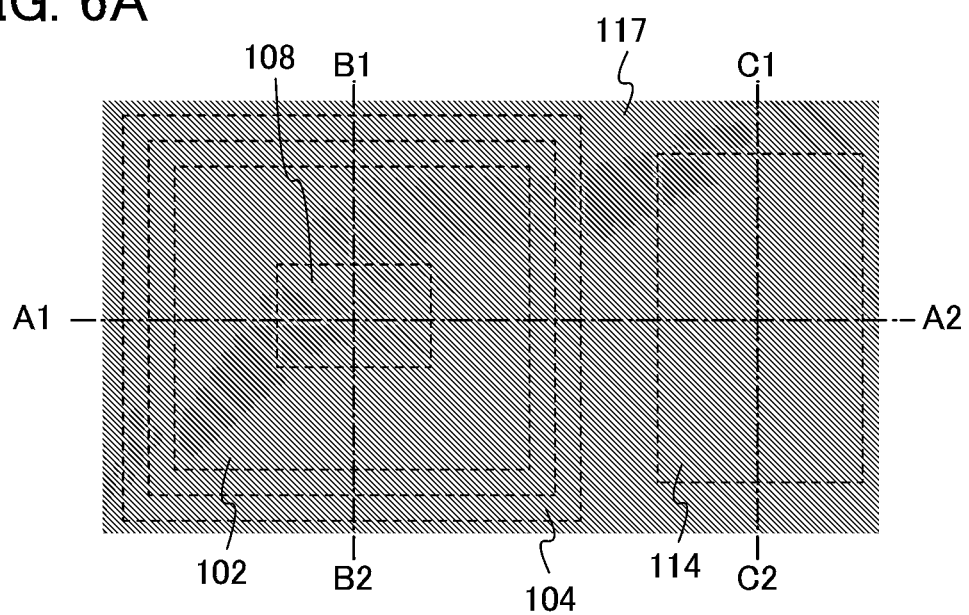
FIGS. 6A and 6B are top views illustrating steps for manufacturing a semiconductor device.
Figure 6B:
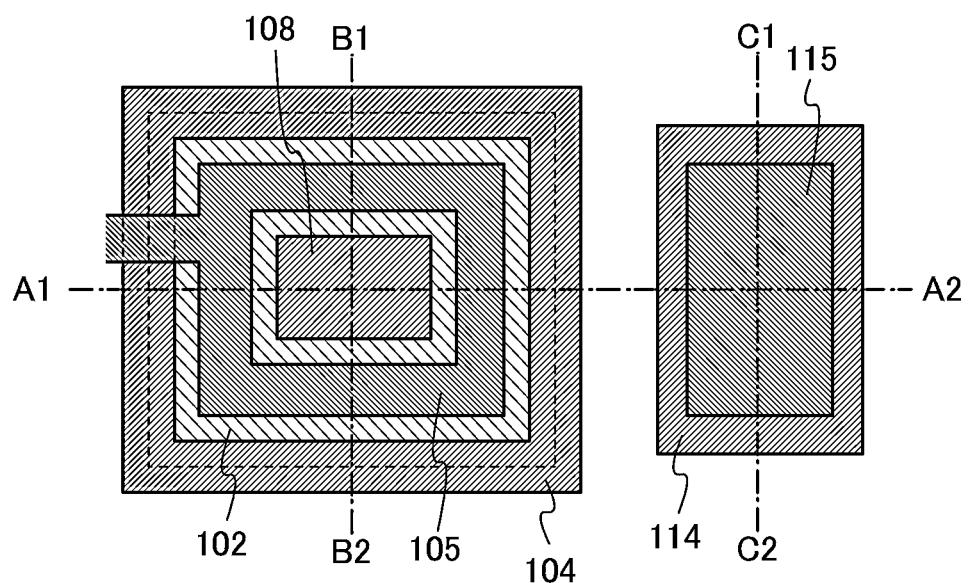

In particular, as illustrated in FIG. 6B, the ring-shaped gate electrode 105 is provided outside the electrode 108 which is the other of the source electrode and the drain electrode so as to surround the electrode 108. Moreover, the electrode 104 which is one of the source electrode and the drain electrode is provided outside the ring-shaped gate electrode 105 so as to surround the ring-shaped gate electrode 105.

The formed gate electrode 105 and electrode 115 preferably have tapered edges because coverage with an insulating layer or a conductive layer that is later to be stacked thereover can be improved.

Note that after the gate electrode 105 is formed, when the impurity element which changes the conductivity of an oxide semiconductor is added to the oxide semiconductor layer 102 using the gate electrode 105 as a mask, low-resistance regions are formed in a self-aligned manner between the source region and the channel formation region and between the drain region and the channel formation region. When the low-resistance regions are formed, the on-resistance of the transistor 110 can be reduced and the operation speed thereof can be improved.

For the addition of the impurity element, an ion implantation method, an ion doping method, a plasma immersion ion implantation method, or the like can be employed.

The impurity element is an impurity by which the electrical conductivity of the oxide semiconductor layer is changed. One or more selected from the following can be used as the impurity element: Group 15 elements (typified by phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

In the case where the impurity element is not added to the oxide semiconductor layer 102, offset regions are provided between the source region and the channel formation region and between the drain region and the channel formation region in a self-aligned manner. By providing the offset regions, parasitic capacitance generated between the gate electrode and the source electrode can be reduced. Further, parasitic capacitance generated between the gate electrode and the drain electrode can be reduced.

Note that the gate electrode 135 included in the transistor 112 can be formed by changing the shape of the gate electrode 105 so that part of the gate electrode 105 overlaps with the electrode 104 and the electrode 108.

As in a transistor 112, in the case where part of a gate electrode 135 overlaps with the electrode 104 and the electrode 108 which function as the source electrode and the drain electrode, the offset region is not formed as described above. Further, in the transistor 112, as described above, the impurity element cannot be added in a self-aligned manner between the source region and the channel formation region and between the drain region and the channel formation region; thus, low-resistance regions are not formed.

Then, the first insulating layer 107 is formed to cover the gate insulating layer 103, the gate electrode 105, and the electrode 115.

The first insulating layer 107 can be formed by a plasma CVD method, a sputtering method, an evaporation method, or the like. For the first insulating layer 107, an inorganic insulating material such as silicon oxide, silicon oxynitride, aluminum oxynitride, or gallium oxide, or the like can be typically used.

Alternatively, for the first insulating layer 107, aluminum oxide, hafnium oxide, magnesium oxide, zirconium oxide, lanthanum oxide, barium oxide, or a metal nitride (e.g., aluminum nitride) can be used.

The first insulating layer 107 may be either a single layer or a stacked layer. The first insulating layer 107 can be a stack of a silicon oxide and an aluminum oxide, for example. The aluminum oxide can be suitably used because it has a high shielding effect (blocking effect) which prevents penetration of both oxygen and impurities such as hydrogen and moisture, and, in and after the manufacturing process, the aluminum oxide layer functions as a blocking layer for suppressing entry of an impurity such as hydrogen or moisture, which causes a change in characteristics, into the oxide semiconductor layer 102 and release of oxygen, which is a main component material of the oxide semiconductor, from the oxide semiconductor layer 102.

For example, in the case where an aluminum oxide is used for the first insulating layer 107, an aluminum oxide which is formed by depositing aluminum and performing oxygen doping treatment on the aluminum may be used.

The "oxygen doping treatment" means that oxygen (which includes at least one of an oxygen radical, an oxygen atom, an oxygen molecule, ozone, an oxygen ion (oxygen molecule ion), and an oxygen cluster ion) is introduced to a bulk. Note that the term "bulk" is used in order to clarify that oxygen is added not only to a surface of a thin film but also to the inside of the thin film. The "oxygen doping treatment" encompasses an "oxygen plasma doping treatment" in which plasmatized oxygen is added to the bulk. For the oxygen doping treatment, heat treatment under an oxygen atmosphere, an ion implantation method, an ion doping method, a plasma immersion ion implantation method, plasma treatment performed under an atmosphere containing oxygen, or the like can be employed. In the case of performing plasma treatment under an atmosphere containing oxygen, an ashing apparatus can be used, for example. Note that as an ion implantation method, a gas cluster ion beam may be used.

As a supply gas for the oxygen doping treatment, a gas containing oxygen, such as oxygen, dinitrogen monoxide, nitrogen dioxide, carbon dioxide, or carbon monoxide can be used. Further, a rare gas may be included in the gas containing oxygen.

Further, the oxygen doping treatment may be performed on the entire surface of the film to which oxygen is introduced at a time; alternatively, for example, a linear ion beam may be used for the oxygen doping treatment. In the case of using the linear ion beam, at least one of the film to which oxygen is introduced and the ion beam is relatively moved (scanned), whereby the oxygen can be introduced into the entire surface of the film to which oxygen is introduced.

The first insulating layer 107 is preferably formed using, as appropriate, a method such as a sputtering method, in which an impurity such as water or hydrogen does not enter the first insulating layer 107.

As in the case of formation of the oxide semiconductor film, an entrapment vacuum pump (e.g., a cryopump) is preferably used in order to remove moisture remaining in a deposition chamber of the first insulating layer 107. The first insulating layer 107 is formed in the deposition chamber evacuated using a cryopump, whereby the concentration of impurities in the first insulating layer 107 can be reduced. As an evacuation unit for removing moisture remaining in the deposition chamber of the first insulating layer 107, a turbo molecular pump provided with a cold trap may be used.

In this embodiment, the first insulating layer 107 has a stacked-layer structure in which silicon oxide and aluminum oxide are stacked in this order on the side in contact with the oxide semiconductor layer 102. When the density of the aluminum oxide film is set to high (the film density is higher than or equal to 3.2 g/cm$^3$, preferably higher than or equal to 3.6 g/cm$^3$), the transistor 110 can have stable electrical characteristics. The film density can be measured by Rutherford backscattering spectrometry (RBS) or X-ray reflection (XRR).

Then, the second insulating layer 109 is formed over the first insulating layer 107. The second insulating layer 109 preferably functions as a planarization insulating film for suppressing surface unevenness due to the transistor. For the second insulating layer 109, a material appropriately selected from the above-mentioned materials for the first insulating layer 107 can be used. Besides those materials, an organic material such as polyimide, an acrylic resin, or a benzocyclobutene-based resin can be used for the second insulating layer 109. Other than such organic materials, it is also possible to use a low-dielectric constant material (a low-k material) or the like. Note that the planarization insulating film may be formed by stacking a plurality of insulating films formed using any of these materials. It is also possible to employ a structure in which the first insulating layer 107 is provided but the second insulating layer 109 is not provided.

As described above, in order that the oxide semiconductor layer 102 is supersaturated with oxygen by sufficient supply of oxygen, an insulating layer containing excess oxygen is preferably provided so as to surround and be in contact with the oxide semiconductor layer 102. As described above, an insulating layer containing excess oxygen or an insulating layer including an oxygen-excess region in a region in contact with the oxide semiconductor layer 102 is used as each of the second base insulating layer 101b and the first gate insulating layer 103a, which are in contact with the oxide semiconductor layer 102.

In addition, a blocking layer for suppressing release of oxygen from the oxide semiconductor layer 102 is preferably provided so as to be positioned outside the insulating layer containing excess oxygen. In this embodiment, the first base insulating layer 101a, the second gate insulating layer 103b, and the first insulating layer 107 function as blocking layers.

The insulating layers containing excess oxygen and the blocking layers for suppressing release of oxygen are provided over and below the oxide semiconductor layer 102, so that the oxide semiconductor layer 102 can contain oxygen in a proportion which is substantially the same as that in the stoichiometric composition, or in a proportion higher than that in the stoichiometric composition i.e., the oxide semiconductor layer 102 can be supersaturated with oxygen. For example, when the stoichiometric composition of the oxide semiconductor layer is In:Ga:Zn:O=1:1:1:4 [atomic ratio], the atomic ratio of oxygen in the oxide semiconductor layer 102 can be greater than or equal to four.

Then, a mask is formed over the second insulating layer 109 (not illustrated), part of each of the second insulating layer 109, the first insulating layer 107, and the gate insulating layer 103 is removed with the mask, so that an opening reaching the electrode 108 is formed. In the case where the second insulating layer 109 is not provided, the opening reaching the electrode 108 is formed by etching of the first insulating layer 107 and the gate insulating layer 103.

Next, a third conductive film to be the electrode 106 is formed over the second insulating layer 109 to be embedded in the opening. Part of the third conductive film is removed by an etching or the like, so that the electrode 106 electrically connected to the electrode 108 is formed (see FIGS. 1A to 1D). For the third conductive film, a material similar to that of the first conductive film 116 or the second conductive film 117 can be used. Further, like in the first conductive film 116, when a metal film having a high melting point such as titanium (Ti), molybdenum (Mo), tungsten (W), or tantalum (Ta), or a metal nitride film of any of these elements is stacked on one or both of a lower side and an upper side of a low-resistance metal film of aluminum (Al), copper (Cu), or the like, transition (diffusion) of metal of the low-resistance metal film can be prevented, which is preferable. For example, as the third conductive film, a stacked layer of tungsten (W), copper (Cu), and tantalum nitride is used, and copper (Cu), which has low resistance, is preferably sandwiched between tungsten (W) and tantalum nitride which is a barrier metal. That is, like the first conductive film 116, the third conductive film is a stacked layer of a first conductive layer, a metal film which is a second conductive layer, and a third conductive layer, and a low-resistance conductive layer is used as the second conductive layer. For at least one of the first conductive layer and the third conductive layer, a material which can prevent the metal of the second conductive layer from moving is used. Further, when the third conductive layer over the second conductive layer covers an end portion of the second conductive layer, movement of metal from the end portion of the second conductive layer can be prevented, which is preferable.

The formed electrode 106 preferably has tapered edges because coverage with an insulating layer or a conductive layer that is later to be stacked thereover can be improved.

Figure 7A:
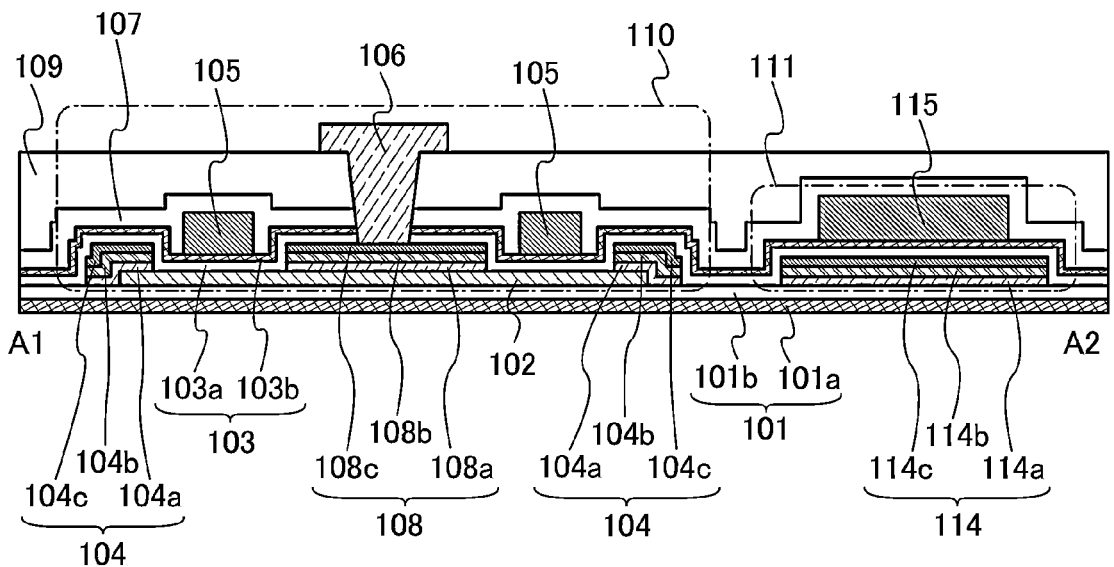
FIGS. 7A and 7B are cross-sectional views each illustrating one embodiment of a semiconductor device.

Here, FIG. 7A illustrates a cross-sectional view of a semiconductor device in which the electrode 104, the electrode 108, and the electrode 114 are formed in the following manner: the above-described first conductive film 116 is a stacked layer of the first conductive layer, the metal film which is the second conductive layer, and the third conductive layer; a low-resistance conductive layer is used as the second conductive layer; and the material which prevents the metal of the second conductive layer from moving is used for the first conductive layer and the third conductive layer.

The electrode 104 illustrated in FIG. 7A is a stacked layer of the first electrode 104a, the second electrode 104b, and the third electrode 104c. Further, the electrode 108 is a stacked layer of the first electrode 108a, the second electrode 108b, and the third electrode 108c. Further, the electrode 114 is a stacked layer of the first electrode 114a, the second electrode 114b, and the third electrode 114c.

In FIG. 7A, copper is used for a material of the second electrode 104b, the second electrode 108b, and the second electrode 114b of the electrode 104, the electrode 108, and the electrode 114, respectively, for example. Further, tungsten (W) which suppresses transmission (diffusion) of the copper is used for a material of the first electrode 104a, the first electrode 108a, and the first electrode 114a of the electrode 104, the electrode 108, and the electrode 114, respectively, for example. Further, tantalum nitride is used for a material of the third electrode 104c, the third electrode 108c, and the third electrode 114c of the electrode 104, the electrode 108, and the electrode 114, respectively, for example. In the electrode structure in FIG. 7A, the number of photolithography steps and etching steps increases in order to prevent copper from diffusing; however, the structure has an extremely high effect of suppressing the diffusion of copper which is the material of the second electrode, so that reliability of the semiconductor device can be increased.

Figure 7B:
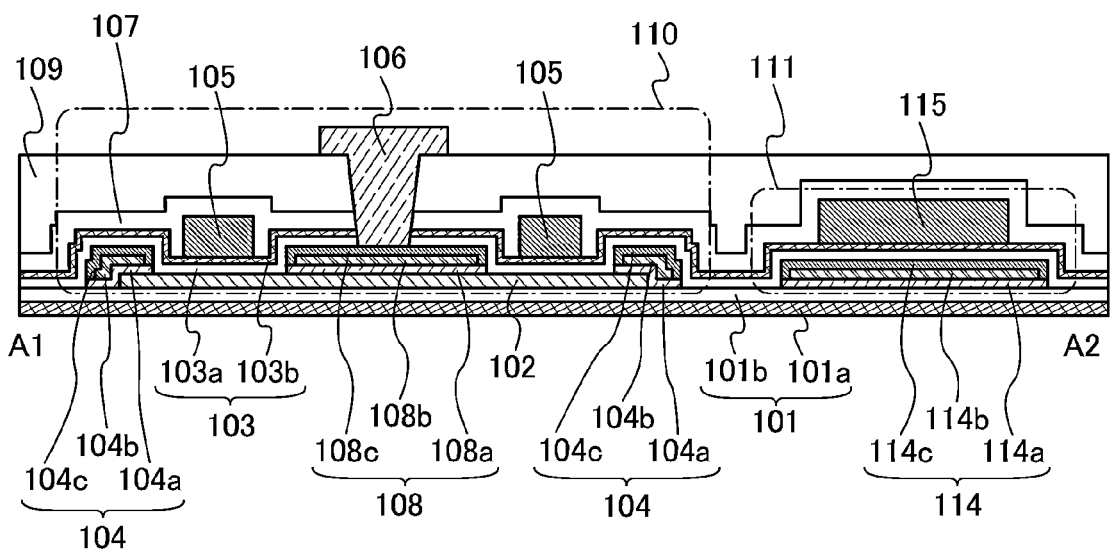

Further, FIG. 7B illustrates a cross-sectional view of a semiconductor device in which the third electrode over the second electrode covers an end portion of the second electrode is illustrated in FIG. 7B. As illustrated in FIG. 7B, when the third electrode 104c, the third electrode 108c, and the third electrode 114c cover an end portion of the second electrode 104b, the second electrode 108b, and the second electrode 114b, respectively, effect of suppressing transmission of the metal of the second electrode, for example, copper, is further increased, which is preferable. In the electrode structure in FIG. 7B, the number of photolithography steps and etching steps increases in order to prevent copper from diffusing; however, the structure has an extremely high effect of suppressing the diffusion of copper which is the material of the second electrode, so that reliability of the semiconductor device can be increased.

Note that the oxide semiconductor layer 102 may have a structure in which a plurality of oxide semiconductor layers is stacked. For example, the oxide semiconductor layer 102 may have a stacked-layer structure of a first oxide semiconductor layer and a second oxide semiconductor layer which are formed using metal oxides with different compositions. For example, the first oxide semiconductor layer may be formed using a three-component metal oxide, and the second oxide semiconductor layer may be formed using a two-component metal oxide. Alternatively, for example, both the first oxide semiconductor layer and the second oxide semiconductor layer may be formed using a three-component metal oxide.

Further, the constituent elements of the first oxide semiconductor layer and the second oxide semiconductor layer may be the same and the composition ratios of the constituent elements of the first oxide semiconductor layer and the second oxide semiconductor layer may be different. For example, the first oxide semiconductor layer may have an atomic ratio of In:Ga:Zn=1:1:1, and the second oxide semiconductor layer may have an atomic ratio of In:Ga:Zn=3:1:2. Alternatively, the first oxide semiconductor layer may have an atomic ratio of In:Ga:Zn=1:3:2, and the second oxide semiconductor layer may have an atomic ratio of In:Ga:Zn=2:1:3. Alternatively, the first oxide semiconductor layer or the second oxide semiconductor layer may have an atomic ratio of In:Ga:Zn=1:6:4, an atomic ratio of In:Ga:Zn=1:9:6, or an atomic ratio of In:Ga:Zn=1:9:0.

In this case, one of the first oxide semiconductor layer and the second oxide semiconductor layer which is closer to the gate electrode (on a channel side) preferably contains In and Ga at a proportion satisfying In>Ga. The other which is farther from the gate electrode (on a back channel side) preferably contains In and Ga at a proportion satisfying In≤Ga.

In an oxide semiconductor, the s orbital of heavy metal mainly contributes to carrier transfer, and when the In content in the oxide semiconductor is increased, overlap of the s orbital is likely to be increased. Therefore, an oxide having a composition of In>Ga has higher mobility than an oxide having a composition of In Ga. Further, in Ga, the formation energy of oxygen vacancies is larger and thus oxygen vacancies are less likely to occur, than in In; therefore, the oxide having a composition of In≤Ga has more stable characteristics than the oxide having a composition of In>Ga.

An oxide semiconductor containing In and Ga at a proportion satisfying In>Ga is used on a channel side, and an oxide semiconductor containing In and Ga at a proportion satisfying In≤Ga is used on a back channel side, so that field-effect mobility and reliability of a transistor can be further improved.

Further, oxide semiconductor films having different crystallinities may be used for the first oxide semiconductor film and the second oxide semiconductor film. That is, the oxide semiconductor layer 102 may be formed using any of a single crystal oxide semiconductor film, a polycrystalline oxide semiconductor film, a microcrystalline oxide semiconductor film, an amorphous oxide semiconductor film, and a CAAC-OS film, as appropriate. When an amorphous oxide semiconductor is used for at least one of the first oxide semiconductor film and the second oxide semiconductor film, internal stress or external stress of the oxide semiconductor layer 102 is relieved, variation in characteristics of a transistor is reduced, and reliability of the transistor can be further improved.

On the other hand, an amorphous oxide semiconductor is likely to absorb an impurity which serves as a donor, such as hydrogen, and to generate an oxygen vacancy, and thus easily becomes an n-type. Thus, the oxide semiconductor film on the channel side is preferably formed using a crystalline oxide semiconductor such as a CAAC-OS.

Further, the oxide semiconductor layer 102 may have a stacked-layer structure including three or more layers in which an amorphous oxide semiconductor layer is interposed between a plurality of oxide semiconductor layers having crystallinity. Furthermore, a structure in which an oxide semiconductor layer having crystallinity and an amorphous oxide semiconductor layer are alternately stacked may be employed.

These two structures used so that the oxide semiconductor layer 102 has a stacked-layer structure including a plurality of layers can be combined as appropriate.

Note that in the case where the oxide semiconductor layer 102 has a stacked-layer structure including a plurality of layers, oxygen may be introduced each time the oxide semiconductor layer is formed. For the introduction of oxygen, heat treatment performed in an oxygen atmosphere, an ion implantation method, an ion doping method, a plasma immersion ion implantation method, plasma treatment performed in an atmosphere containing oxygen, or the like can be employed.

Oxygen is introduced each time the oxide semiconductor layer is formed, whereby the effect of reducing oxygen vacancies in the oxide semiconductor can be improved.

The structure of the transistor described in this embodiment is effective particularly when a CAAC-OS is used for the oxide semiconductor layer 102. This is because oxygen is easily released from an outer edge (an end surface) of an oxide semiconductor layer formed using a CAAC-OS. Note that this point is described below in detail in reference example As described above, according to this embodiment, a transistor which can suppress generation of a parasitic channel can be obtained. Further, by using the transistor, a semiconductor device having improved operation characteristics can be provided.

This embodiment can be implemented in appropriate combination with the structures described in the other embodiments.

Embodiment 2

In this embodiment, examples of transistors having structures different from those of the transistors disclosed in the above embodiment are described.

A transistor and a capacitor of this embodiment are illustrated in FIGS. 8A to 8D. A transistor 120 illustrated in FIGS. 8A to 8C has a structure substantially the same as that of the transistor 110 illustrated in FIGS. 1A to 1C; however, the transistor 120 differs from the transistor 110 in that an electrode 124 (electrodes 124a and 124b) functioning as one of a source electrode and a drain electrode covers only part of an outer edge of an oxide semiconductor layer 102.

FIG. 8A is a top view of the transistor 120 and the capacitor 111 of this embodiment, and FIG. 8B is a cross-sectional view taken along line A5-A6 of the top view in FIG. 8A. FIG. 8C is a cross-sectional view taken along line B5-B6 of the top view in FIG. 8A. FIG. 8D is a cross-sectional view taken along line C5-C6 of the top view in FIG. 8A.

The same potential is applied to the electrodes 124a and 124b functioning as one of a source electrode and a drain electrode of the transistor 120; thus, the electrodes 124a and 124b electrically function as the same electrode. The electrodes 124a and 124b each cover only part of the outer edge of the oxide semiconductor layer 102.

With the structure shown in the transistor 120, the area occupied by the transistor can be small. Further, in the transistor 120, the outer edge of the oxide semiconductor layer 102 is in contact with only the electrode 124 (the electrodes 124a and 124b) functioning as one of the source electrode and the drain electrode; therefore, the electrode 108 functioning as the other of the source electrode and the drain electrode is not electrically connected to the electrode 124 through a parasitic channel. The outer edge of the oxide semiconductor layer 102 does not reach from the source electrode to the drain electrode, whereby a transistor which can suppress generation of the parasitic channel can be obtained.

Further, as illustrated in FIGS. 9A to 9C, in a transistor 121 in which a gate electrode 125 extends beyond the outer edge of the oxide semiconductor layer 102, a low-resistance region might be formed at the outer edge of the oxide semiconductor layer 102 beyond which the gate electrode 125 extends. However, as in the transistor 120, the outer edge of the oxide semiconductor layer 102 is in contact with only the electrode 124 (the electrodes 124a and 124b) functioning as one of the source electrode and the drain electrode; therefore, the parasitic channel is not generated and electric characteristics of the transistor 121 is not deteriorated.

FIG. 9A is a top view of the transistor 120 and the capacitor 111 of this embodiment, and FIG. 9B is a cross-sectional view taken along line A7-A8 of the top view in FIG. 9A. FIG. 9C is a cross-sectional view taken along line B7-B8 of the top view in FIG. 9A. FIG. 9D is a cross-sectional view taken along line C7-C8 of the top view in FIG. 9A.

Note that in FIGS. 9A to 9C, the gate electrode 125 extends beyond one side of the outer edge of the oxide semiconductor layer 102 which is not covered with the electrodes 124a and 124b; however, the present invention is not limited thereto. Even in the case where the gate electrode 125 extends beyond both sides of the outer edge of the oxide semiconductor layer 102 which are not covered with the electrodes 124a and 124b, the parasitic channel is not generated and electric characteristics of the transistor 121 is not deteriorated.

As described above, according to this embodiment, a transistor which can suppress generation of a parasitic channel can be obtained. Further, by using the transistor, a semiconductor device having improved operation characteristics can be provided.

This embodiment can be implemented in appropriate combination with the structures described in the other embodiments.

Embodiment 3

In this embodiment, structures and manufacturing methods of a transistor 250 having a structure which is different from those of the transistors disclosed in the above embodiments and a capacitor which can be manufactured at the same time as the transistor 250 are described.

FIG. 10A1 is a top view of the transistor 250 and FIG. 10A2 is a top view of a capacitor 255. Further, FIG. 10B1 is a cross-sectional view of a portion indicated by chain line X1-X2 in FIG. 10A1, and FIG. 10B2 is a cross-sectional view of a portion indicated by chain line Y1-Y2 in FIG. 10A2.

A structure of the transistor 250 is described with reference to FIGS. 10A1 and 10B1. In the top view illustrated in FIG. 10A1, the transistor 250 has a structure in which a source electrode 205 is formed on an inner side than a ring-shaped gate electrode 208, and a drain electrode 206 is formed on an outer side than a ring-shaped gate electrode 208. Note that in this specification, names of portions which correspond to the source electrode 205 and the drain electrode 206 are defined for convenience; however, the source and the drain of the transistor might be interchanged with each other in an actual circuit operation in some cases. Thus, in other words, the transistor 250 has a structure in which one of the source electrode 205 and the drain electrode 206 is formed on an inner side than the ring-shaped gate electrode 208, and the other of the source electrode 205 and the drain electrode 206 is formed on an outer side than the ring-shaped gate electrode 208. That is, the transistor 250, in planar view, has a structure in which one of the source electrode 205 and the drain electrode 206 is surrounded by the gate electrode 208.

Further, in the oxide semiconductor layer 204, a region overlapping with the ring-shaped gate electrode 208 becomes a channel formation region 204a; thus, the channel formation region 204a has a ring shape. In other words, the transistor 250 has a structure in which one of the source electrode 205 and the drain electrode 206 is formed on an inner side than the ring-shaped channel formation region 204a, and the other of the source electrode 205 and the drain electrode 206 is formed on an outer side than the ring-shaped channel formation region 204a. That is, the transistor 250, in planar view, has a structure in which one of the source electrode 205 and the drain electrode 206 is surrounded by the channel formation region 204a.

Further, in FIG. 10B1, a wiring 202 is formed over a substrate 201 and an insulating layer 203 is formed over the wiring 202. Further, the oxide semiconductor layer 204 is formed over the insulating layer 203, and the source electrode 205 and the drain electrode 206 are formed over the oxide semiconductor layer 204. The oxide semiconductor layer 204 includes the channel formation region 204a, a low-resistance region 204b, and a low-resistance region 204c. In the oxide semiconductor layer, a low-resistance region is provided between a channel formation region and a region in contact with the source electrode 205 or the drain electrode 206, whereby on-state current and field-effect mobility of the transistor can be increased.

The source electrode 205 is electrically connected to the wiring 202 through an opening 213 formed in the insulating layer 203. Further, an insulating layer 207 is formed over the oxide semiconductor layer 204, the source electrode 205, and the drain electrode 206, and the gate electrode 208 is formed over the insulating layer 207. Furthermore, an insulating layer 209 is formed over the gate electrode 208, and a planarization insulating layer 210 is formed over the insulating layer 209. The insulating layer 207 can function as a gate insulating layer.

The insulating layer 203, the insulating layer 207, and the insulating layer 209 may be each a single layer or a stacked layer including a plurality of layers. In particular, in the case where the insulating layer 203 and the insulating layer 207 are each a stacked layer including a plurality of layers, a layer containing much oxygen is preferably used as a layer in contact with the oxide semiconductor layer 204.

Further, the drain electrode 206 covers the end portion of the oxide semiconductor layer 204, whereby release of oxygen from the end portion of the oxide semiconductor layer 204 can be reduced and generation of the parasitic channel can be suppressed. The transistor 250 includes at least the gate electrode 208, the source electrode 205, the drain electrode 206, the insulating layer 207, and the oxide semiconductor layer 204. Note that the transistor 250 disclosed in this embodiment is a top-gate transistor.

Moreover, a structure of the capacitor 255 is described with reference to FIGS. 10A2 and 10B2. The capacitor 255 has a structure in which the insulating layer 207 is sandwiched between capacitor electrodes 221 and 222. In FIG. 10B2, the insulating layer 203 is formed over the substrate 201, and the capacitor electrode 221 is formed over the insulating layer 203. The capacitor electrode 221 can be formed using the same layer as the source electrode 205 and the drain electrode 206. Further, the insulating layer 207 is formed over the capacitor electrode 221, and a capacitor electrode 222 is formed over the insulating layer 207. The capacitor electrode 222 can be formed using the same layer as the gate electrode 208. Further, the insulating layer 209 is formed over the capacitor electrode 222, and the planarization insulating layer 210 is formed over the insulating layer 209.

The transistor 250 and the capacitor 255 can be manufactured over the same plane.

Figure 11A:
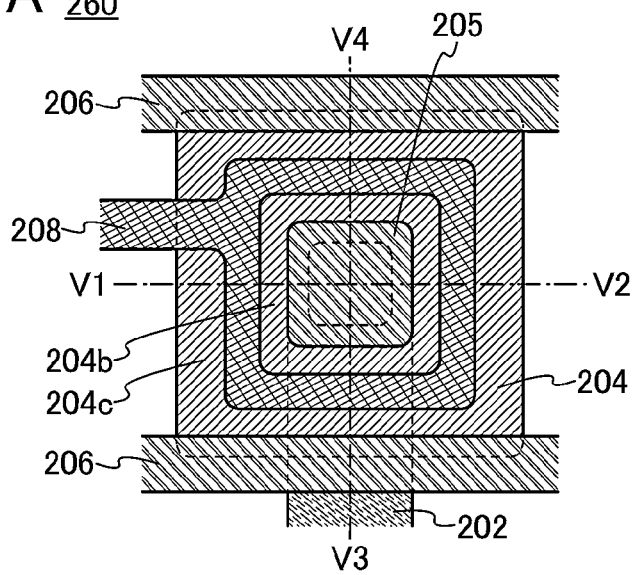
FIGS. 11A to 11C are a top view and cross-sectional views illustrating one embodiment of a semiconductor device.
Figure 11B:
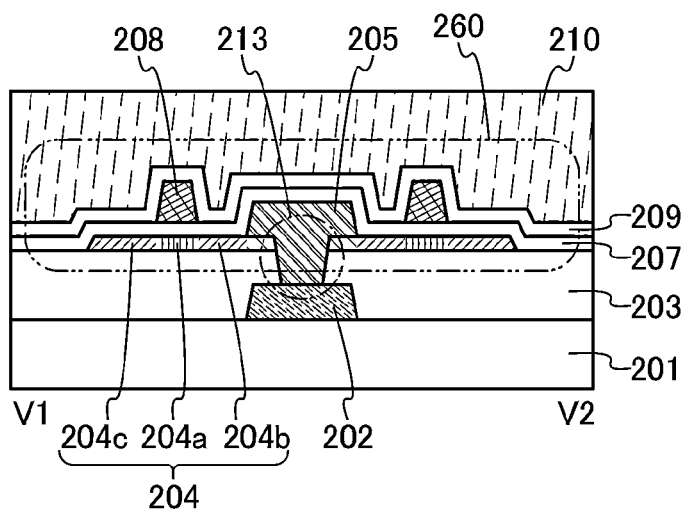
Figure 11C:
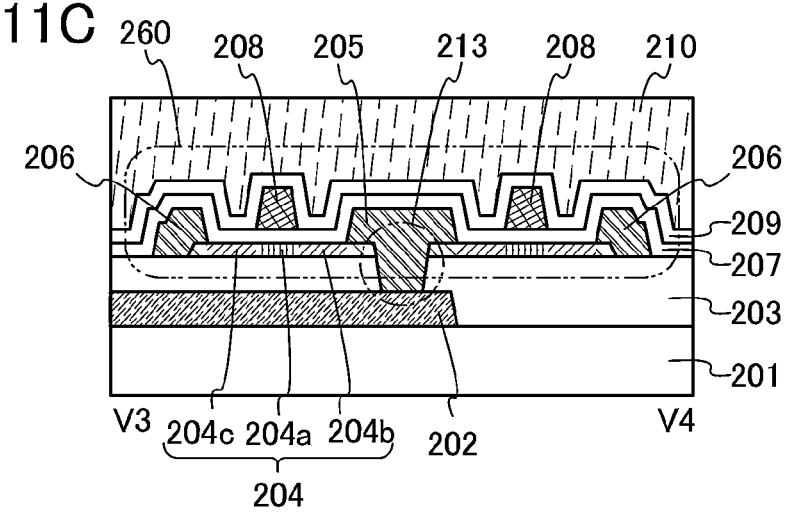

Next, a transistor 260 which has a structure different from that of the transistor 250 is described with reference to FIGS. 11A to 11C. FIG. 11A is a top view of the transistor 260 using an oxide semiconductor for its semiconductor layer in which a channel is formed and FIG. 11B is a cross-sectional view of a portion taken along chain line V1-V2 in FIG. 11A. Further, FIG. 11C is a cross-sectional view of a portion taken along chain line V3-V4 in FIG. 11A.

A structure of the drain electrode 206 of the transistor 260 differs from that of the transistor 250. The transistor 250 has a structure in which the drain electrode 206 entirely covers the end portion of the oxide semiconductor layer 204. On the other hand, the transistor 260 has a structure in which the drain electrode 206 covers only part of the end portion of the oxide semiconductor layer 204. Note that in planar view, the transistor 260 has a structure in which one of the source electrode 205 and the drain electrode 206 is surrounded by the gate electrode 208 or the channel formation region 204a, which is the same as the transistor 250.

With the structure shown in the transistor 260, the area occupied by the transistor can be small. Further, the transistor 260 also has a structure in which the end portion of the oxide semiconductor layer 204 is in contact with only the drain electrode 206; therefore, the source electrode 205 and the drain electrode 206 are not electrically connected to each other through the parasitic channel. The end portion of the oxide semiconductor layer 204 does not reach from the source electrode 205 to the drain electrode 206, whereby a transistor with low power consumption and favorable electric characteristics can be achieved.

Next, an example of methods for manufacturing the transistor 250 and the capacitor 255 is described with reference to FIGS. 12A to 12F, FIGS. 13A to 13E, and FIGS. 14A to 14D. FIGS. 12A to 12F are top views illustrating a method for manufacturing the transistor 250, and FIGS. 13A to 13E and FIGS. 14A to 14D are cross-sectional views illustrating methods for manufacturing the transistor 250 and the capacitor 255.

Figure 12A:
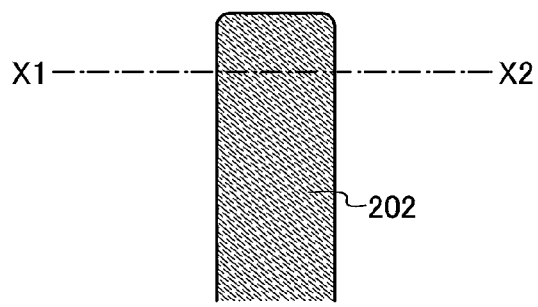
FIGS. 12A to 12F are top views illustrating a method for manufacturing a semiconductor device.
Figure 13A:
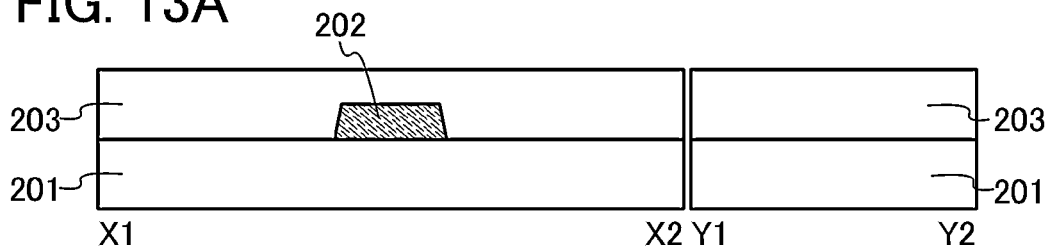
FIGS. 13A to 13E are cross-sectional views illustrating a method for manufacturing a semiconductor device.

First, the wiring 202 is formed over the substrate 201 and the insulating layer 203 is formed over the wiring 202 (see FIGS. 12A and 13A). Although there is no particular limitation on a substrate that can be used as the substrate 201, it is necessary that the substrate have heat resistance to withstand at least heat treatment performed later. For example, a plastic substrate having heat resistance to withstand the treatment temperature in the manufacturing process can be used as well as a glass substrate, a ceramic substrate, a single-crystal semiconductor substrate or a polycrystalline semiconductor substrate of silicon, silicon carbide, or the like, a compound semiconductor substrate made of silicon germanium or the like, and an SOI substrate. Alternatively, any of these substrates over which a semiconductor element is provided may be used as the substrate 201.

As the glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. Alternatively, a flexible substrate may be used as the substrate 201. In the case where a flexible substrate is used, the transistor 250 may be directly formed over a flexible substrate. Alternatively, the transistor 250 may be formed over a manufacturing substrate, and then, the transistor 250 may be separated from the manufacturing substrate and transferred to a flexible substrate. Note that in order to separate the transistor from the manufacturing substrate and transfer it to the flexible substrate, a separation layer may be provided between the manufacturing substrate and the transistor. In this embodiment, aluminoborosilicate glass is used for the substrate 201.

A conductive layer which is to be the wiring 202 later is formed over the substrate 201 by a sputtering method, a vacuum evaporation method, or a plating method. The conductive layer can be formed using a metal material selected from aluminum (Al), chromium (Cr), copper (Cu), tantalum (Ta), titanium (Ti), molybdenum (Mo), tungsten (W), neodymium (Nd), or scandium (Sc); an alloy material containing the above metal element; a nitride material of the above metal element; or the like. Further, a material containing one or more metal elements selected from manganese (Mn), magnesium (Mg), zirconium (Zr), and beryllium (Be) may be used. Alternatively, a semiconductor typified by polycrystalline silicon including an impurity element such as phosphorus, or silicide such as nickel silicide may be used.

The conductive layer to be the wiring 202 may have a single-layer structure or a stacked structure of two or more layers. Examples thereof are a single-layer structure using aluminum containing silicon, a two-layer structure in which titanium is stacked over aluminum, a two-layer structure in which titanium is stacked over a titanium nitride, a two-layer structure in which tungsten is stacked over a titanium nitride, a two-layer structure in which tungsten is stacked over a tantalum nitride, a two-layer structure in which copper is stacked over a Cu—Mg—Al alloy, a three-layer structure in which a titanium nitride, copper, and tungsten are stacked in this order, and a three-layer structure in which tungsten, copper, and a titanium nitride are stacked in this order. With use of copper for the conductive layer which is to be the wiring 202, wiring resistance of the wiring 202 can be reduced. Alternatively, copper is stacked with a refractory metal such as tungsten, molybdenum, and tantalum, or a nitride of the metal, whereby diffusion of copper to another layer can be prevented.

For the conductive layer to be the wiring 202, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. Alternatively, a stacked structure of the above light-transmitting conductive material and a material containing the above metal element may be employed.

In this embodiment, a 100-nm-thick tungsten is formed by a sputtering method for the conductive layer to be the wiring 202.

Next, part of the conductive layer to be the wiring 202 is selectively etched to form the wiring 202 (and another wiring which is formed of the same layer as the wiring 202). In the case of etching part of the conductive layer selectively, a resist mask may be formed over the conductive layer, and an unnecessary portion in the conductive layer may be removed by a dry etching method or a wet etching method. Further, that etching may be conducted by a combination of a dry etching method and a wet etching method. The resist mask formed over the conductive layer can be formed by a photolithography method, a printing method, an inkjet method, or the like. Formation of the resist mask by an inkjet method needs no photomask; thus, manufacturing cost can be reduced.

In the case where the conductive layer is etched by the dry etching method, a gas containing a halogen element can be used as the etching gas. As an example of the gas containing a halogen element, a chlorine-based gas such as chlorine ($Cl_2$), boron trichloride ($BCl_3$), silicon tetrachloride ($SiCl_4$), or carbon tetrachloride ($CCl_4$)); a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr), or oxygen can be used as appropriate. An inert gas may be added to the etching gas. As the dry etching method, a reactive ion etching (RIE) method can be used.

As a plasma source, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated. In the case of the etching according to the dry etching method (hereinafter also referred to as a "dry etching treatment"), the etching conditions (the amount of electric power applied to a coil-shaped electrode, the amount of electric power applied to an electrode on a substrate side, the temperature of the electrode on the substrate side, and the like) are adjusted as appropriate so that the film can be etched into a desired shape.

Note that a process in which a resist mask having an appropriate shape is formed over a conductive layer or an insulating layer by a photolithography method is referred to as a photolithography process; in general, after the formation of the resist mask, an etching step and a separation step of the resist mask are performed in many cases. Thus, a photolithography process in this specification may include a step of forming a resist mask, a step of etching a conductive layer or an insulating layer, and a step of removing the resist mask.

Next, the insulating layer 203 is formed over the wiring 202 (see FIG. 13A).

The insulating layer 203 can be formed by a sputtering method, an MBE method, a CVD method, a pulsed laser deposition method, an ALD method, or the like as appropriate. A high-density plasma CVD method using a microwave (e.g., microwaves with a frequency of 2.45 GHz) or the like can also be applied. The insulating layer 203 may be formed using a sputtering apparatus which performs film formation with surfaces of a plurality of substrates set substantially perpendicular to a surface of a sputtering target.

The insulating layer 203 can be formed using a single layer or a stacked layer using one or more of materials selected from aluminum nitride, aluminum oxide, aluminum nitride oxide, aluminum oxynitride, gallium oxide, silicon nitride, silicon oxide, silicon nitride oxide, and silicon oxynitride.

The insulating layer 203 preferably contains oxygen in a portion which is in contact with the oxide semiconductor layer 204 formed later. Moreover, the insulating layer 203, which is in contact with the oxide semiconductor layer 204, preferably contains a large amount of oxygen which exceeds at least the stoichiometric amount of oxygen in the layer (bulk). For example, in the case where the insulating layer 203 is formed using silicon oxide, the composition formula is $SiO_{2+\alpha}$ ($\alpha>0$). In this embodiment, silicon oxide of $SiO_{2+\alpha}$ ($\alpha>0$) is used for the insulating layer 203. This silicon oxide is in contact with the oxide semiconductor layer 204, whereby oxygen can be supplied to the oxide semiconductor layer 204 and favorable electric characteristics can be obtained.

Further, the insulating layer 203 may be a stacked layer of the above-described insulating layer containing excess oxygen and an insulating layer formed using a material (e.g., silicon nitride or aluminum oxide) having a barrier property (hereinafter, also referred to as a barrier layer) against oxygen and an impurity such as hydrogen, water, hydride, or hydroxide. By forming the insulating layer 203 with use of the material having barrier properties, not only entrance of the above-described impurities from the substrate side but also diffusion of oxygen contained in the insulating layer which contains a large amount of oxygen into the substrate side can be prevented.

In this embodiment, as the insulating layer 203 over the substrate 201, a silicon oxynitride with a thickness of 200 nm is formed by a plasma CVD method. Further, the temperature in the formation of the insulating layer 203 is preferably high as much as possible but is lower than or equal to the temperature that the substrate 201 and the wiring 202 can withstand. For example, the insulating layer 203 is formed while the substrate 201 is heated to a temperature higher than or equal to 350° C. and lower than or equal to 450° C. The temperature in the formation of the insulating layer 203 is preferably constant. For example, the insulating layer 203 is formed while the substrate is heated at 350° C.

After the insulating layer 203 is formed, a heat treatment may be performed thereon under reduced pressure, a nitrogen atmosphere, a rare gas atmosphere, or a nitrogen atmosphere with the ultra-dry air. By the heat treatment, the concentration of hydrogen, water, hydride, hydroxide, or the like contained in the insulating layer 203 can be reduced. It is preferable that the temperature of the heat treatment be as high as possible among temperatures that the substrate 201 and the wiring 202 can withstand. Specifically, the heat treatment is preferably performed at a temperature higher than or equal to the temperature in the formation of the insulating layer 203 and lower than the strain point of the substrate 201.

Further, after the insulating layer 203 is formed, an oxygen doping treatment may be performed on the insulating layer 203 to make the insulating layer 203 an oxygen-excess state. The oxygen doping treatment on the insulating layer 203 is preferably performed after the above-described heat treatment. The heat treatment and the oxygen doping treatment may be performed plural times. Further, the heat treatment and the oxygen doping treatment may be performed alternately plural times.

Next, an oxide semiconductor layer 214 (not illustrated) to be the oxide semiconductor layer 204 is formed over the insulating layer 203 by a sputtering method.

Note that the oxide semiconductor layer 214 can be formed using a material and a method similar to those of the oxide semiconductor disclosed in the above-described embodiments.

The oxide semiconductor layer 214 is preferably formed under a condition that much oxygen is contained so as to contain much or oversaturated oxygen (preferably include a region containing oxygen in excess of the stoichiometric composition of the oxide semiconductor in a crystalline state).

For example, in the case where an oxide semiconductor layer is formed by a sputtering method, it is preferably performed under conditions where the proportion of oxygen in the sputtering gas is large; it is preferable that the sputtering gas contains an oxygen gas at 100%. The deposition under the conditions where the proportion of oxygen in the sputtering gas is large, in particular, in an atmosphere containing an oxygen gas at 100% enables release of Zn from the oxide semiconductor layer to be suppressed even when the deposition temperature is, for example, higher than or equal to 300° C.

A planarization treatment may be performed on a region of the insulating layer 203 with which the oxide semiconductor layer 214 is formed in contact before the formation of the oxide semiconductor layer 214.

It is preferable that the oxide semiconductor layer 214 be highly purified so as to contain impurities such as copper, aluminum, or chlorine as little as possible. In a process for manufacturing the transistor, a step which has no risk that such impurities enter the oxide semiconductor layer or adhere to the surface of the oxide semiconductor layer is preferably selected as appropriate. Specifically, the copper concentration in the oxide semiconductor layer is less than or equal to $1 \times 10^{18}$ atoms/cm$^3$, preferably less than or equal to $1 \times 10^{17}$ atoms/cm$^3$. In addition, the aluminum concentration in the oxide semiconductor layer is less than or equal to $1 \times 10^{18}$ atoms/cm$^3$. Further, the chlorine concentration in the oxide semiconductor layer is less than or equal to $2 \times 10^{18}$ atoms/cm$^3$.

The concentrations of alkali metals such as sodium (Na), lithium (Li), and potassium (K) in the oxide semiconductor layer 214 are as follows: the concentration of Na is $5 \times 10^{16}$ atoms/cm$^3$ or less, preferably $1 \times 10^{16}$ atoms/cm$^3$ or less, further preferably $1 \times 10^{15}$ atoms/cm$^3$ or less; the concentration of Li is $5 \times 10^{15}$ atoms/cm$^3$ or less, preferably $1 \times 10^{15}$ atoms/cm$^3$ or less; and the concentration of K is $5 \times 10^{15}$ atoms/cm$^3$ or less, preferably $1 \times 10^{15}$ atoms/cm$^3$ or less.

In this embodiment, as the oxide semiconductor layer 214, a 35-nm-thick In—Ga—Zn-based oxide (IGZO) film is formed by a sputtering method using a sputtering apparatus including an AC power supply device. As a target in the sputtering method, a metal oxide target whose composition is In:Ga:Zn=1:1:1 (atomic ratio) is used.

First, the substrate 201 is held in a deposition chamber kept under reduced pressure. Then, a sputtering gas from which hydrogen and moisture are removed is introduced into the deposition chamber while moisture remaining therein is removed, and the oxide semiconductor layer 214 is formed over the gate insulating layer 203 with use of the above target. To remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. A hydrogen atom, a compound containing a hydrogen atom, such as water ($H_2O$), (preferably a compound containing a carbon atom), or the like is removed from the deposition chamber which is evacuated with the cryopump, whereby the concentration of impurities in the oxide semiconductor layer 214 formed in the deposition chamber can be reduced.

Further, the insulating layer 203 and the oxide semiconductor layer 214 may be formed continuously without exposure to the air. Such continuous formation of the insulating layer 203 and the oxide semiconductor layer 214 without exposure to the air can prevent impurities such as hydrogen and water from being attached to a surface of the insulating layer 203.

Figure 12B:
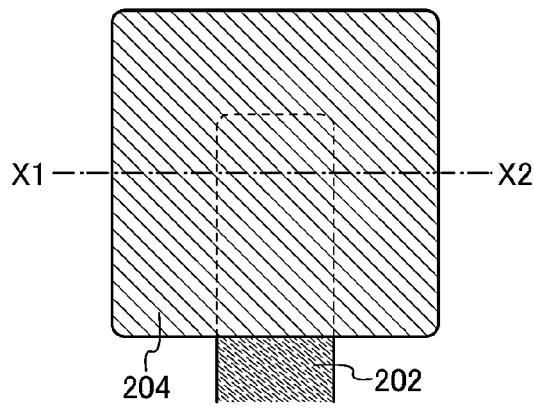
Figure 13B:
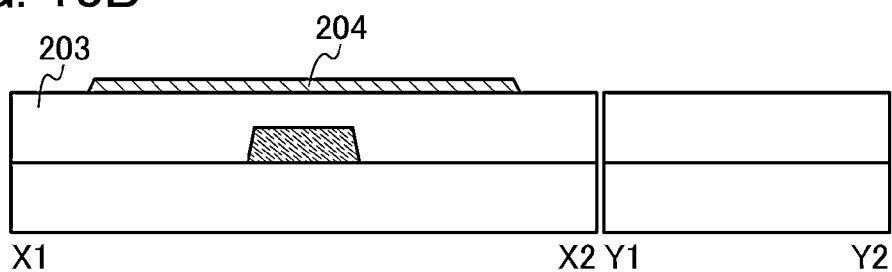

Next, a part of the oxide semiconductor layer 214 is selectively etched by a photolithography process to form the island-shaped oxide semiconductor layer 204 (see FIGS. 12B and 13B). A resist mask used for forming the island-shaped oxide semiconductor layer 204 may be formed by an inkjet method. Formation of the resist mask by an inkjet method needs no photomask; thus, manufacturing cost can be reduced.

Note that the etching of the oxide semiconductor layer 214 may be conducted by a dry etching method, a wet etching method, or both of them. In the case where the oxide semiconductor layer 214 is etched by a wet etching method, a solution obtained by mixing phosphoric acid, acetic acid, and nitric acid, a solution containing oxalic acid, or the like can be used as the etchant. Alternatively, ITO-07N (produced by KANTO CHEMICAL CO., INC.) may be used. In the case where the oxide semiconductor layer is etched by a dry etching method, for example, a dry etching method using a high-density plasma source such as an ECR source or an ICP source can be used. As a dry etching method by which uniform electric discharge can be performed over a large area, there is a dry etching method using an enhanced capacitively coupled plasma (ECCP) mode. This dry etching method can be applied even to the case where a substrate of the tenth generation or above, the size of which exceeds 3 m, is used as the substrate, for example.

Further, a heat treatment may be performed in order to remove excess hydrogen (including water or a hydroxyl group) from the oxide semiconductor layer 204 (to perform dehydration or dehydrogenation) after formation of the oxide semiconductor layer 204. The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate may be put in an electric furnace which is a kind of heat treatment apparatus, and the oxide semiconductor layer 204 may be subjected to a heat treatment at 450° C. for one hour in a nitrogen atmosphere.

The heat treatment apparatus is not limited to the electric furnace; a device for heating an object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the high-temperature gas, an inert gas which does not react with an object to be processed by a heat treatment, such as nitrogen or a rare gas like argon, is used.

For example, as the heat treatment, GRTA may be performed as follows; the substrate is put in an inert gas heated at a high temperature of 650° C. to 700° C., is heated for several minutes, and is taken out of the inert gas.

In the heat treatment, it is preferable that moisture, hydrogen, and the like be contained as less as possible in the nitrogen or the rare gas such as helium, neon, or argon. The purity of the nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or less, further preferably 0.1 ppm or less).

After the semiconductor layer 204 is heated by the heat treatment, a high-purity oxygen gas, a high-purity dinitrogen monoxide gas, or ultra-dry air (air with a moisture amount of less than or equal to 20 ppm (−55° C. by conversion into a dew point), preferably less than or equal to 1 ppm, or further preferably less than or equal to 10 ppb according to the measurement with use of a dew point meter of a cavity ring down laser spectroscopy (CRDS) system) may be introduced into the same furnace. It is preferable that water, hydrogen, or the like be contained as less as possible in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or less, further preferably 0.1 ppm or less). By the effect of the oxygen gas or the dinitrogen monoxide gas, oxygen which is a main component of the oxide semiconductor and which has been reduced at the same time as the step for removing impurities by dehydration or dehydrogenation is supplied, so that oxygen vacancies in the oxide semiconductor can be reduced, whereby the oxide semiconductor layer 204 can be made an i-type (intrinsic) or substantially i-type oxide semiconductor layer.

The timing of performing the heat treatment for dehydration or dehydrogenation is either before or after the island-shaped oxide semiconductor layer 204 is formed as long as it is after formation of the oxide semiconductor layer. The heat treatment for dehydration or dehydrogenation may be performed plural times and may also serve as another heat treatment.

By the dehydration or dehydrogenation treatment, oxygen which is a main component of the oxide semiconductor might be eliminated and thus reduced. There is an oxygen vacancy in a portion where oxygen is eliminated in the oxide semiconductor layer, which causes a donor level which causes a change in the electric characteristics of the transistor owing to the oxygen vacancy.

For the above reason, an oxygen doping treatment may be performed on the oxide semiconductor layer 204 after the dehydration or dehydrogenation treatment is performed, so that oxygen can be supplied to the oxide semiconductor layer 204.

Such supply of oxygen by introduction of oxygen into the oxide semiconductor layer 204 after the dehydration or dehydrogenation treatment is performed enables a reduction in oxygen vacancies generated in the oxide semiconductor by the step of removing impurities by the dehydration or dehydrogenation treatment, so that the oxide semiconductor layer 204 can be made an i-type (intrinsic). The change in electric characteristics of the transistor including the i-type (intrinsic) oxide semiconductor layer 204 is suppressed, and thus the transistor is electrically stable.

In the case where oxygen is introduced into the oxide semiconductor layer 204, the oxygen doping treatment is performed either directly or through another layer into the oxide semiconductor layer 204.

By the oxygen doping treatment, the bond of a constituent element of the oxide semiconductor layer 204 and hydrogen or the bond of the constituent element and a hydroxy group is cut, and that hydrogen or that hydroxy group reacts to oxygen, so that water is generated. Therefore, hydrogen or a hydroxy group, which is an impurity, is more likely to be eliminated in the form of water by performing a heat treatment after the oxygen doping treatment. From the reason above, a heat treatment may be performed after oxygen is introduced into the oxide semiconductor layer 204. After that, oxygen may be further introduced into the oxide semiconductor layer 204 to make the oxide semiconductor layer 204 an oxygen-excess state. The oxygen doping treatment and the heat treatment on the oxide semiconductor layer 204 may be performed alternately a plurality of times. The oxygen doping treatment and the heat treatment may be performed at the same time.

As described above, it is preferable that the oxide semiconductor layer 204 be highly purified by sufficiently removing impurities such as hydrogen and be made an i-type (intrinsic) or substantially i-type (intrinsic) oxide semiconductor layer by reducing oxygen vacancies in the oxide semiconductor layer 204 by sufficiently supplying oxygen thereto.

Note that an oxide semiconductor which is highly purified (purified OS) by reduction of an impurity such as water or hydrogen which serves as an electron donor (donor) can be made to be an i-type (intrinsic) oxide semiconductor or an oxide semiconductor extremely close to an i-type semiconductor (a substantially i-type oxide semiconductor) by then supplying oxygen to the oxide semiconductor to reduce oxygen vacancies in the oxide semiconductor. A transistor using the i-type or substantially i-type oxide semiconductor for its semiconductor layer where a channel is formed features extremely small off-state current.

Specifically, the hydrogen concentration in the highly purified oxide semiconductor layer is $5 \times 10^{19}$ atoms/cm$^3$ or less, preferably $5 \times 10^{18}$ atoms/cm$^3$ or less, further preferably $5 \times 10^{17}$ atoms/cm$^3$ or less according to the measurement with SIMS. In order that the oxide semiconductor layer 204 is supersaturated with oxygen by sufficient supply of oxygen, it is preferable that insulating layers each containing much oxygen be provided so as to sandwich and be in contact with the oxide semiconductor layer 204.

Here, the hydrogen concentration in the insulating layer containing much oxygen is also important because it has effect upon the characteristics of the transistor. In the case where the hydrogen concentration in the insulating layer containing much oxygen is greater than or equal to $7.2 \times 10^{20}$ atoms/cm$^3$, variation in initial characteristics of the transistor is increased, the channel length dependence of electric characteristics of the transistor is increased, and the transistor is significantly degraded by a BT stress test; therefore, the hydrogen concentration in the insulating layer containing much oxygen is less than $7.2\times10^{20}$ atoms/cm$^3$. That is, it is preferable that the hydrogen concentration in the oxide semiconductor layer be less than or equal to $5\times10^{19}$ atoms/cm$^3$ and the hydrogen concentration in the insulating layer containing excessive oxygen is less than $7.2\times10^{20}$ atoms/cm$^3$.

The SIMS analysis of the hydrogen concentration is mentioned here. It is known that it is difficult to precisely obtain data in the proximity of a surface of a sample or in the proximity of an interface between stacked layers formed of different materials by the SIMS analysis in the principle. Thus, in the case where the distribution of the concentration of hydrogen in the layer in a thickness direction is analyzed by SIMS, an average value in a region of the layer in which the value is not greatly changed and substantially the same value can be obtained is employed as the hydrogen concentration. Further, in the case where the thickness of the layer is small, such a region with an almost constant value can sometimes not be obtained due to the influence of the hydrogen concentration in the adjacent layer. In that case, the maximum value or the minimum value of the hydrogen concentration of a region where the layer is positioned is adopted as the hydrogen concentration of the layer. Furthermore, in the case where a mountain-shaped peak having the maximum value or a valley-shaped peak having the minimum value do not exist in the region where the layer is positioned, the value of the inflection point is adopted as the hydrogen concentration.

Figure 12C:
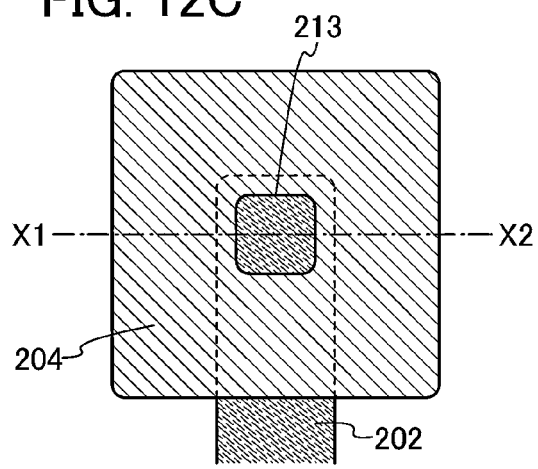
Figure 13C:
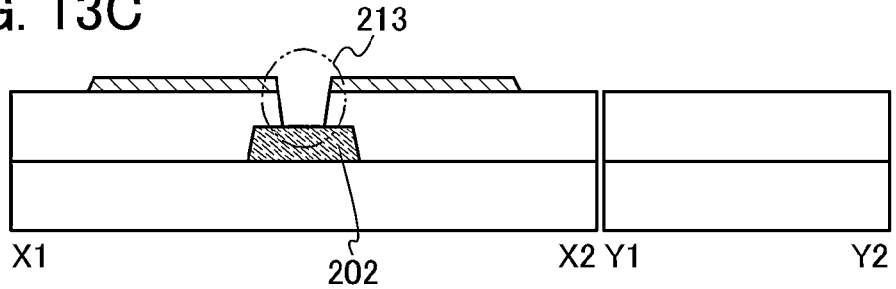

Next, part of the oxide semiconductor layer 204 and part of the insulating layer 203 overlapping with the wiring 202 are selectively etched by a photolithography process, so that an opening 213 reaching the wiring 202 is formed (see FIGS. 12C and 13C). A resist mask used for forming the opening 213 may be formed by an inkjet method. Formation of the resist mask by an inkjet method needs no photomask; thus, manufacturing cost can be reduced. Note that the etching of the oxide semiconductor layer 204 and the insulating layer 203 may be conducted by a dry etching method, a wet etching method, or both of them.

Figure 12D:
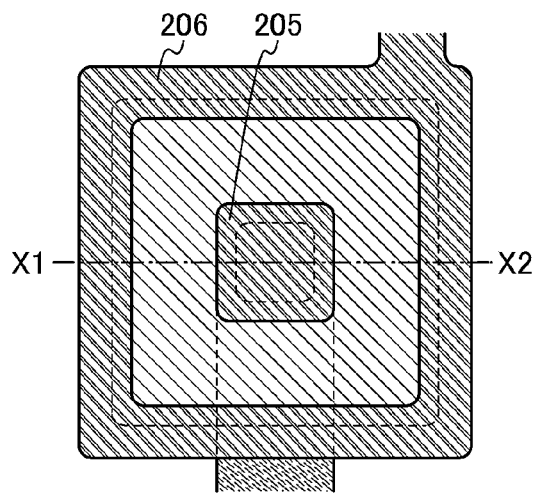
Figure 12E:
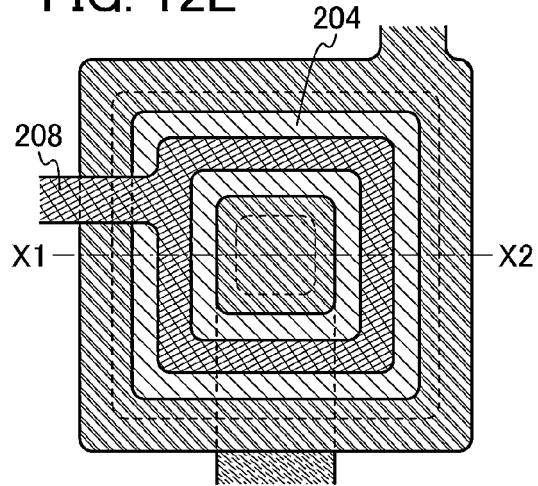
Figure 12F:
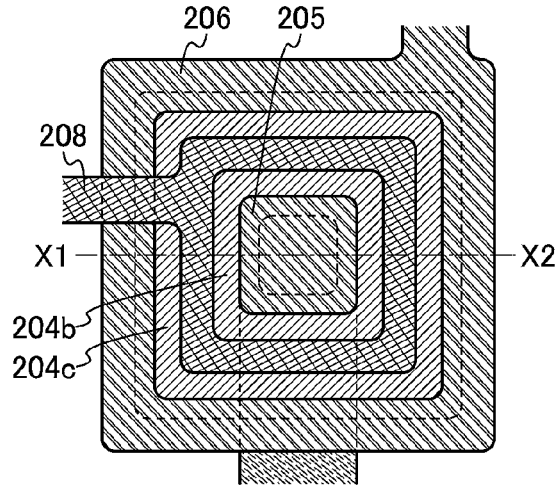
Figure 13D:
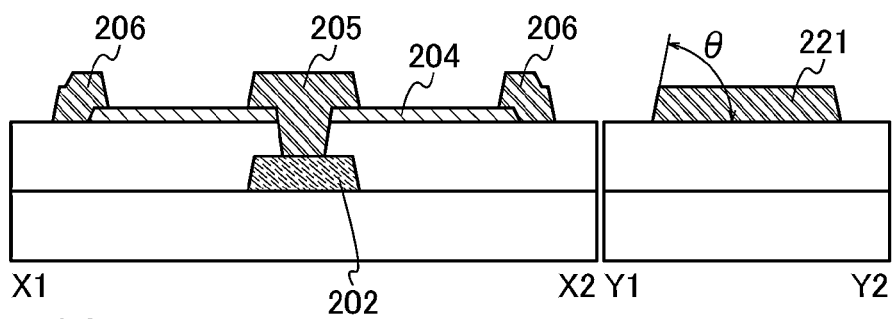

Then, by a photolithography process, the source electrode 205, the drain electrode 206, and the capacitor electrode 221 which is not illustrated in FIGS. 12A to 12F (including a wiring formed using the same layer as the source electrode 205, the drain electrode 206, and the capacitor electrode 221) are formed over the oxide semiconductor layer 204 (see FIGS. 12D and 13D). The source electrode 205, the drain electrode 206, and the capacitor electrode 221 can be formed using a material and a method similar to those of the wiring 202.

In this embodiment, as a conductive layer for forming the source electrode 205, the drain electrode 206, and the capacitor electrode 221, a titanium film having a thickness of 200 nm is formed by a sputtering method. For example, an etching of the conductive layer can be performed by an ICP etching method under conditions in which the etching gas is BCl$_3$: Cl$_2$=750 sccm:150 sccm, the bias power is 1500 W, the ICP power source is 0 W, and the pressure is 2.0 Pa.

Further, cleaning treatment for removing impurities (treatment for removing impurities) which are attached to the surfaces of the oxide semiconductor layer 204 is preferably performed after the etching for forming the source electrode 205 and the drain electrode 206 is performed.

The treatment for removing impurities enables the highly reliable transistor having stable electric characteristics to be achieved.

Figure 13E:
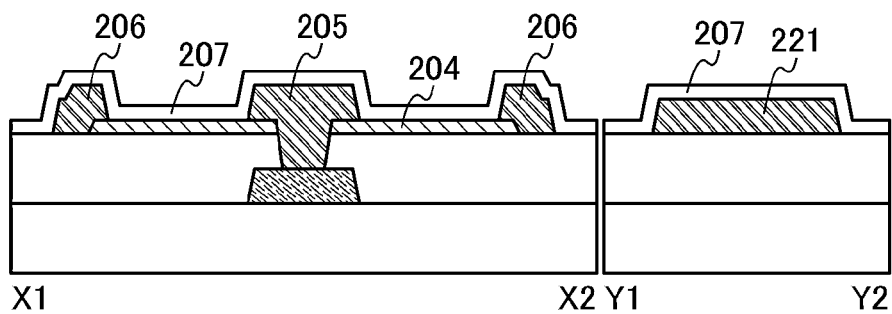

Next, the insulating layer 207 is formed over the source electrode 205 and the drain electrode 206 to be in contact with part of the oxide semiconductor layer 204 (see FIG. 13E). The insulating layer 207 can be formed using a material and a method similar to those of the insulating layer 203. The insulating layer 207 functions as a gate insulating layer of the transistor 250. Further, the insulating layer 207 functions as a dielectric of the capacitor 255.

A capacitor has such a structure that a dielectric is sandwiched between two electrodes that face to each other, and as the thickness of the dielectric is smaller (as the distance between the two facing electrodes is shorter) or as the dielectric constant of the dielectric is higher, the capacitance becomes higher. However, if the thickness of the dielectric is reduced in order to increase the capacitance of the capacitor, leakage current flowing between the two electrodes tends to increase and the withstand voltage of the capacitor tends to lower.

A portion where a gate electrode, a gate insulating layer, and a semiconductor layer of a transistor overlap with each other functions as the capacitor (hereinafter also referred to as "gate capacitor"). A channel is formed in a region in the semiconductor layer, which overlaps with the gate electrode with the gate insulating layer provided therebetween. In other words, the gate electrode and the channel formation region function as two electrodes of the capacitor, and the gate insulating layer functions as a dielectric of the capacitor. Although it is preferable that the capacitance of the gate capacitor be as high as possible, a reduction in the thickness of the gate insulating layer for the purpose of increasing the capacitance increases the probability of occurrence of an increase in the leakage current or a reduction in the withstand voltage.

In the case where a high-k material such as a hafnium silicate (HfSi$_x$O$_y$ (x>0, y>0)), a hafnium silicate to which nitrogen is added (HfSi$_x$O$_y$N$_z$ (x>0, y>0, z>0)), a hafnium aluminate to which nitrogen is added (HfAl$_x$O$_y$N$_z$ (x>0, y>0, z>0)), a hafnium oxide, or an yttrium oxide is used for the insulating layer 207, even if the thickness of the insulating layer 207 is made thick, sufficient capacitance between the gate electrode 208 and the oxide semiconductor layer 204 can be ensured.

For example, in the case where a high-k material with a high dielectric constant is used for the insulating layer 207, even if the insulating layer 207 is made thick, a capacitance equivalent to that in the case of using a silicon oxide for the insulating layer 207 can be obtained, thereby reducing the leakage current between the gate electrode 208 and the oxide semiconductor layer 204. Moreover, leakage current between the capacitor electrode 222 and the capacitor electrode 221 can be reduced. Further, leakage current between the wiring formed of the same layer as the gate electrode 208 and another wiring that overlaps with the wiring can also be reduced. The insulating layer 207 may have a stacked-layer structure of the high-k material and another insulating material.

Note that the insulating layer 207 preferably includes oxygen in a portion which is in contact with the oxide semiconductor layer 204. In this embodiment, the insulating layer 207 in contact with the oxide semiconductor layer 204 preferably contains in its layer (bulk), oxygen the amount of which exceeds at least the stoichiometric composition. For example, in the case where the insulating layer 207 is formed using silicon oxide, the composition formula is SiO$_{2+\alpha}$ ($\alpha$>0). In this embodiment, silicon oxide of SiO$_{2+\alpha}$ ($\alpha$>0) is used for the insulating layer 207. With the use of the silicon oxide for the insulating layer 207, oxygen can be supplied to the oxide semiconductor layer 204 and favorable characteristics can be obtained.

Further, the insulating layer 207 is preferably a stacked layer of the above-described insulating layer containing excess oxygen and an insulating layer formed using a material (e.g., silicon nitride or aluminum oxide) having a barrier property against oxygen and an impurity such as hydrogen, water, hydride, or hydroxide. The insulating layer containing excess oxygen is formed in contact with the oxide semiconductor layer 204, and the insulating layer having a barrier property is stacked on the insulating layer containing excess oxygen, whereby entry of impurities to the oxide semiconductor layer 204 can be prevented and oxygen contained in the insulating layer containing excess oxygen can be effectively supplied to the oxide semiconductor layer 204.

Further, before the gate insulating layer 207 is formed, an impurity such as moisture or an organic substance which is attached to the surface of a plane on which the layer is formed is preferably removed by a plasma treatment using oxygen, dinitrogen monoxide, a rare gas (a typical example thereof is argon), or the like.

Further, after the insulating layer 207 is formed, an oxygen doping treatment may be performed on the insulating layer 207 to make the insulating layer 207 an oxygen-excess state. After the insulating layer 207 is formed and before the oxygen doping treatment is performed, a heat treatment may be performed thereon under reduced pressure, a nitrogen atmosphere, a rare gas atmosphere, or a nitrogen atmosphere with the ultra-dry air. By the heat treatment, the concentration of hydrogen, water, hydride, hydroxide, or the like contained in the insulating layer 207 can be reduced. It is preferable that the temperature of the heat treatment be as high as possible among temperatures that the substrate 201 can withstand. Specifically, the heat treatment is preferably performed at a temperature higher than or equal to the temperature in the formation of the insulating layer 207 and lower than the strain point of the substrate 201.

Further, an insulating layer 207 containing much (excessive) oxygen, which serves as an oxygen supply source, is provided so as to be in contact with the oxide semiconductor layer 204, and the above-described heat treatment is performed thereon, whereby oxygen can be supplied to the oxide semiconductor layer 204 from the insulating layer 207.

By supply of oxygen to the oxide semiconductor layer 204, oxygen vacancies in the oxide semiconductor layer 204 can be filled. The thickness of the insulating layer 207 is preferably greater than or equal to 1 nm and less than or equal to 50 mm. The thickness of the insulating layer 207 is preferably determined in consideration of the size of the transistor to be manufactured and the step coverage of the source electrode 205, the drain electrode 206, and the capacitor electrode 221.

Figure 14A:
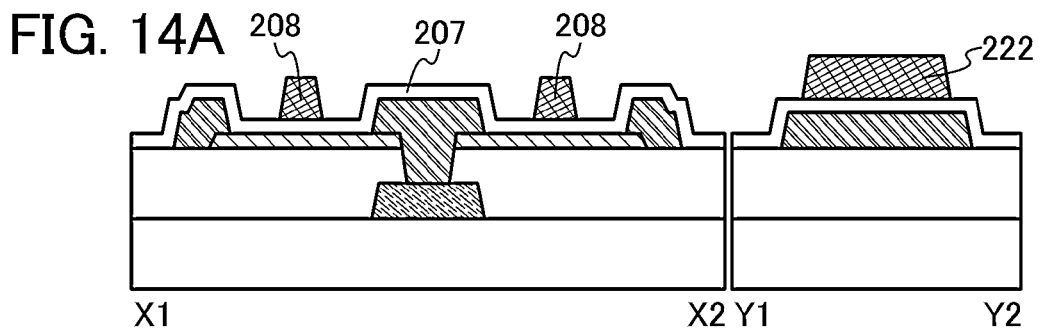
FIGS. 14A to 14D are cross-sectional views illustrating a method for manufacturing a semiconductor device.

Next, the gate electrode 208 and the capacitor electrode 222 (including a wiring formed using the same layer as the gate electrode 208 and the capacitor electrode 222) are formed (see FIGS. 12E and 14A). The gate electrode 208 and the capacitor electrode 222 can be formed using a material and a method similar to those of the wiring 202, the source electrode 205, the drain electrode 206, and the capacitor electrode 221.

In this embodiment, the gate electrode 208 and the capacitor electrode 222 are formed using a 100-nm-thick tungsten film.

Figure 14B:
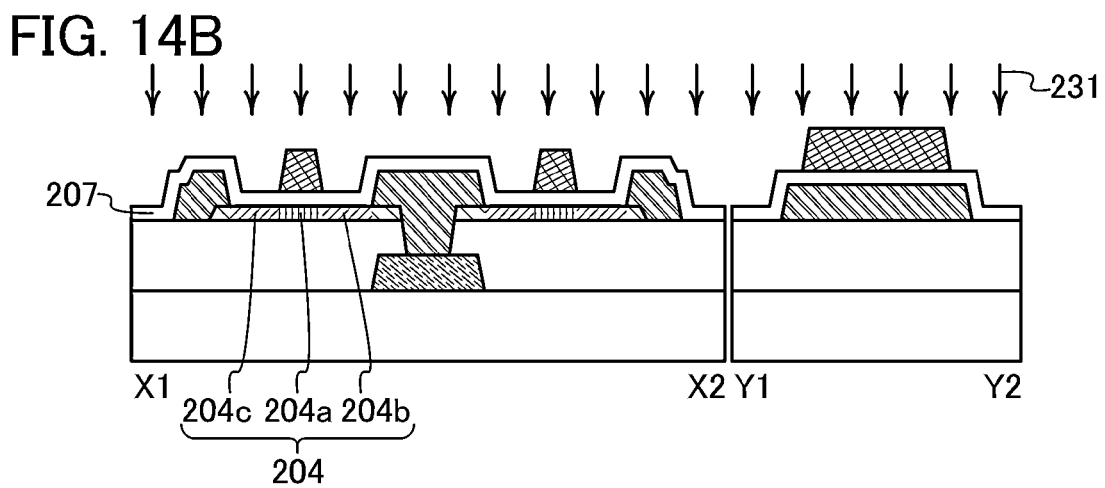

Next, a dopant 231 is introduced into the oxide semiconductor layer 204 using the gate electrode 208 as a mask, so that the low-resistance region 204b and the low-resistance region 204c are formed (see FIGS. 12F and 14B).

The dopant 231 is an impurity element by which the electrical conductivity of the oxide semiconductor layer 204 is changed. One or more selected from the following can be used as the dopant 231: Group 15 elements (typical examples thereof are phosphorus (P), arsenic (As), and antimony (Sb)), boron (B), aluminum (Al), tungsten (W), molybdenum (Mo), nitrogen (N), argon (Ar), helium (He), neon (Ne), indium (In), gallium (G), fluorine (F), chlorine (CO), titanium (Ti), and zinc (Zn).

As the method for adding the dopant 231, an ion implantation method, an ion doping method, a plasma immersion ion implantation method, or the like can be used. In the case where the above method is used, it is preferable to use a single ion of the dopant 231, or a fluoride ion or a chloride ion thereof.

In this embodiment, the dopant 231 is introduced into the oxide semiconductor layer 204 through the insulating layer 207 by an ion implantation method. The introduction of the dopant 231 may be performed by setting as appropriate the acceleration voltage and the dosage in consideration of the thickness of the film through which the dopant passes. In this embodiment, phosphorus is used as the dopant 231, whose ion is added by an ion implantation method. The dosage of the dopant 231 is preferably set to be greater than or equal to $1 \times 10^{13}$ ions/cm$^2$ and less than or equal to $5 \times 10^{16}$ ions/cm$^2$.

The concentration of the dopant 231 in the low-resistance regions is preferably higher than or equal to $5 \times 10^{18}$/cm$^3$ and lower than or equal to $1 \times 10^{22}$/cm$^3$.

The dopant 231 be introduced with the substrate 201 heated.

The process of introducing the dopant 231 into the oxide semiconductor layer 204 may be performed plural times, and the number of kinds of dopant 231 may be plural.

Further, a heat treatment may be performed thereon after the introduction of the dopant 231. The heat treatment is performed at a temperature higher than or equal to 300° C. and lower than or equal to 700° C., preferably higher than or equal to 300° C. and lower than or equal to 450° C. for one hour under an oxygen atmosphere. The heat treatment may be performed under a nitrogen atmosphere, reduced pressure, or the air (ultra-dry air).

In this embodiment, phosphorus (P) ions are implanted into the oxide semiconductor layer 204 by an ion implantation method. Note that the conditions of the phosphorus (P) ion implantation are as follows: the acceleration voltage is 30 kV and the dosage is $1.0 \times 10^{15}$ ions/cm$^2$.

Note that in the case where an oxide semiconductor having crystallinity is used as the oxide semiconductor layer 204, part of the oxide semiconductor layer 204 may be amorphous due to the introduction of the dopant 231 in some cases.

The oxide semiconductor layer 204 in which the pair of low-resistance regions 204b and 204c is formed with the channel formation region 204a provided therebetween is formed by the introduction of the dopant 231.

Figure 14C:
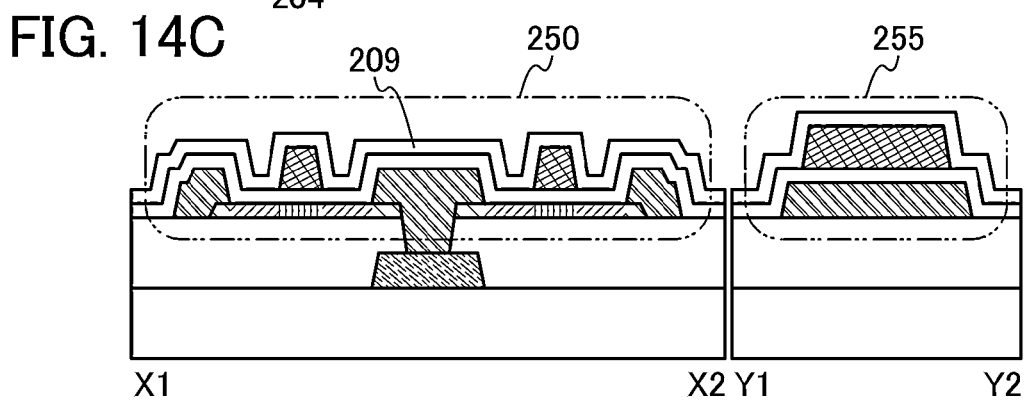
Figure 14D:
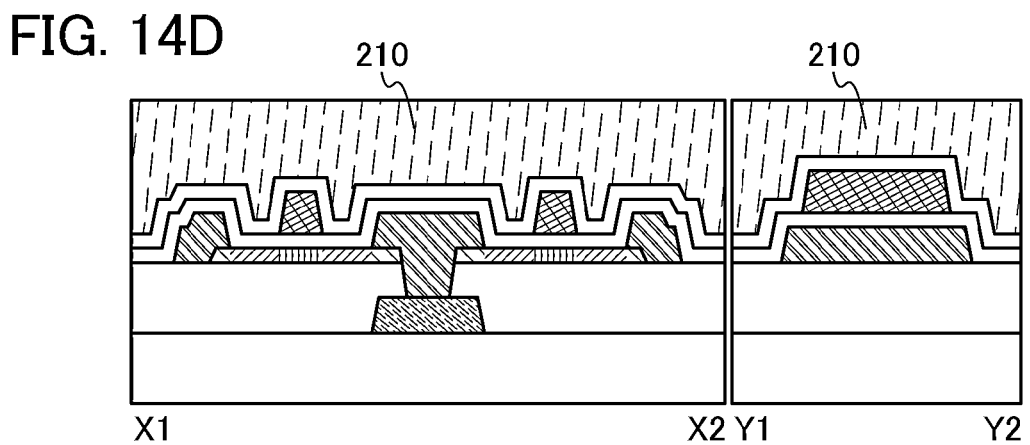

Then, the insulating layer 209 is formed over the insulating layer 207, the gate electrode 208, and the capacitor electrode 222 (see FIG. 14C). The insulating layer 209 can be formed using a material and a method similar to those of the insulating layer 203 or the insulating layer 207. For example, a silicon oxide or a silicon oxynitride can be formed to be the insulating layer 209 by a sputtering method or a CVD method. Alternatively, oxygen doping treatment is performed on the insulating layer 209, whereby an insulating layer containing excess oxygen may be formed.

Further, the insulating layer 209 may be a layer formed using a material having barrier properties (hereinafter, the layer is also referred to as a barrier layer), i.e., having a high shielding effect (blocking effect) of preventing penetration of both oxygen and impurities such as hydrogen or water into the transistor. Furthermore, the insulating layer 209 may be a stacked layer of the above-described insulating layer and the barrier layer.

The barrier layer, for example, can also be formed by forming a metal layer which is to be metal oxide by introducing oxygen thereto and performing oxygen doping treatment on the metal layer. As a metal material used for the metal oxide layer, as well as aluminum, aluminum to which magnesium is added, aluminum to which titanium is added, a stack of aluminum in contact with the insulating layer 207 and magnesium in contact with the aluminum, a stack of aluminum in contact with the insulating layer 207 and titanium in contact with the aluminum, or the like can be used.

Heat treatment may be performed after the insulating layer 209 is formed. The temperature of heat treatment can be, for example, higher than or equal to 250° C. and lower than or equal to 600° C., preferably higher than or equal to 300° C. and lower than or equal to 600° C.

Through the above process, the transistor 250 is formed. An insulating layer may be further formed over the transistor 250. In this embodiment, an example in which the planarization insulating layer 210 is formed over the transistor 260 is described (see FIG. 14D).

The planarization insulating layer 210 can be formed using, for example, an organic insulating material having heat resistance such as polyimide, an acrylic resin, a benzocyclobutene resin, polyamide, or an epoxy resin. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

Further, the planarization insulating layer 210 may be formed by performing planarization treatment such as chemical mechanical polishing (CMP) treatment after the insulating layer is formed.

The structure of the transistor described in this embodiment is effective particularly when a CAAC-OS film is used for the oxide semiconductor layer 204. This is because oxygen is easily released from an end portion of the CAAC-OS film.

This embodiment can be implemented in appropriate combination with the structures described in the other embodiments.

Embodiment 4

In this embodiment, a transistor which has a structure different from that of the transistors 250 and 260 disclosed in Embodiment 3 is described with reference to FIGS. 15A1, 15A2, 15B1, and 15B2, and FIGS. 16A and 16B. FIG. 15A1 is a plane view (a top view) of a transistor 270 using an oxide semiconductor for a semiconductor layer in which a channel is formed and FIG. 15B1 is a cross-sectional view (a cross-sectional view) of a portion taken along chain line W1-W2 in FIG. 15A1. Further, FIG. 15A2 is a plane view (a top view) of a transistor 280 using an oxide semiconductor for a semiconductor layer in which a channel is formed and FIG. 15B2 is a cross-sectional view of a portion indicated by chain line Z1-Z2 in FIG. 15A2. For easy understanding, some of the components are not shown in FIGS. 15A1 and 15A2.

A shape of the gate electrode 208 of the transistor 270 differs from that of the transistor 250. Further, a shape of the gate electrode 208 of the transistor 280 differs from that of the transistor 260. Specifically, the gate electrodes 208 of the transistors 270 and 280 are formed to overlap with the source electrode 205 and the drain electrode 206. Note that in planar view, the transistors 270 and 280 also have a structure in which one of the source electrode 205 and the drain electrode 206 is surrounded by the channel formation region 204a, which is the same as the transistors 250 and 260.

With such a structure, a region from a region where the source electrode 205 is in contact with the oxide semiconductor layer 204 to a region where the drain electrode 206 is in contact with the oxide semiconductor layer 204 becomes a channel formation region; therefore, steps for forming the low-resistance regions 204b and 204c can be omitted and a productivity of the semiconductor device can be improved.

Further, the gate electrode 208 overlaps with one of the source electrode 205 and the drain electrode 206 and an offset region may be formed in the oxide semiconductor layer 204 positioned between the other of the source electrode 205 and the drain electrode 206 and the gate electrode 208. By providing the offset region, concentration of electric field between the gate electrode 208 and the other of the source electrode 205 and the drain electrode 206 can be relaxed and reliability of the transistor can be improved.

Note that in the transistor 280, the gate electrode 208 does not need to entirely cover the end portion of the oxide semiconductor layer 204.

Figure 16A:
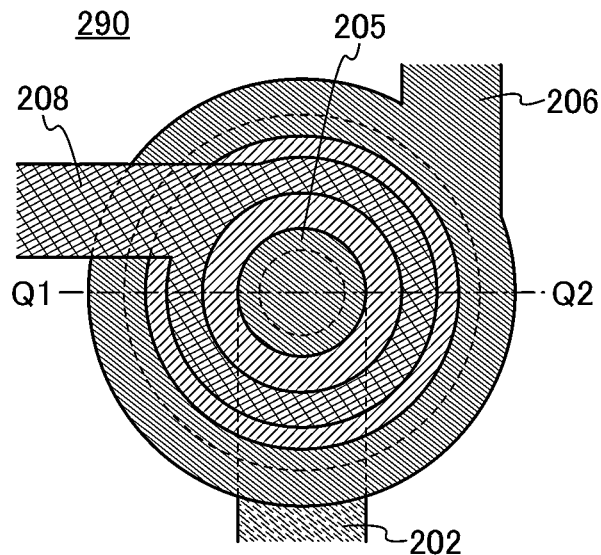
FIGS. 16A and 16B are a top view and a cross-sectional view illustrating one embodiment of a semiconductor device.
Figure 16B:
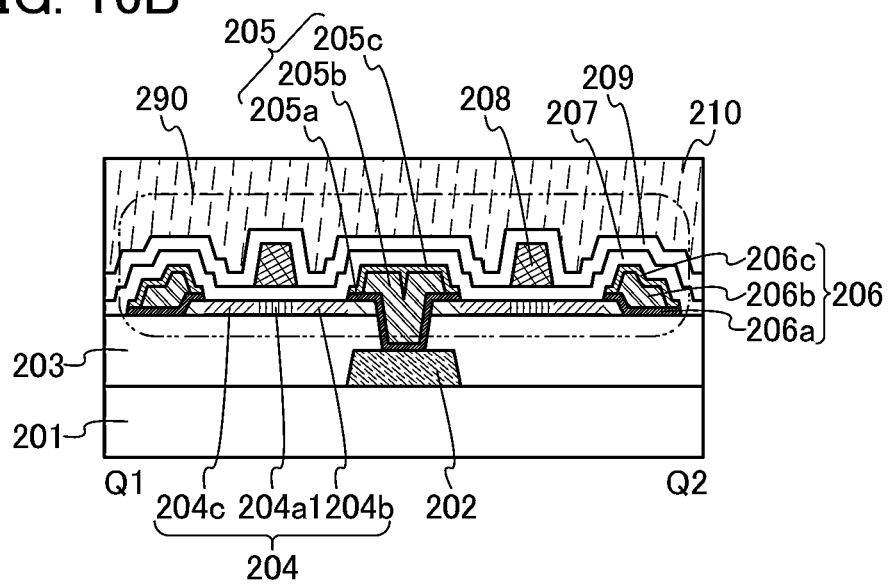

FIG. 16A is a plane view (a top view) of the transistor 290 using an oxide semiconductor for a semiconductor layer in which a channel is formed and FIG. 16B is a cross-sectional view (a cross-sectional view) of a portion taken along chain line Q1-Q2 in FIG. 16A. For easy understanding, some of the components are not shown in FIG. 16A.

A planar shape of the transistor 290 differs from that of the transistor 250. The transistor 290 includes the circular gate electrode 208, the circular source electrode 205, and the circular drain electrode 206. The gate electrode 208, the source electrode 205, and the drain electrode 206 are provided in a circular shape, whereby a distance between the source electrode 205 and the drain electrode 206 at any portion can be the same distance and current can efficiently flow through the oxide semiconductor layer 204. Therefore, a transistor which has further favorable electric characteristics can be achieved.

Further, FIGS. 16A and 16B show an example in which the source electrode 205 is a stacked layer of the source electrodes 205a, 205b, and 205c, and the drain electrode 206 is a stacked layer of the drain electrodes 206a, 206b, and 206c. For example, by a sputtering method, a 50-nm-thick tungsten film is formed as the source electrode 205a and the drain electrode 206a, a 400-nm-thick copper film is formed as the source electrode 205b and the drain electrode 206b, and a 100-nm-thick tantalum nitride film is formed as the source electrode 205c and the drain electrode 206c.

Copper is used for the source electrode and the drain electrode, whereby wiring resistance can be reduced. Further, the source electrode 205a and the drain electrode 206a are formed using tungsten, the source electrode 205b and the drain electrode 206b are formed using copper, and the source electrode 205b and the drain electrode 206b are covered with the source electrode 205c and the drain electrode 206c formed using tantalum nitride, whereby diffusion of the copper used for the source electrode 205 and the drain electrode 206 to another layer can be prevented. Note that for example, the source electrode 205a and the drain electrode 206a may be a tungsten nitride film or a stacked layer of tungsten and tungsten nitride.

Further, the wiring 202 and the gate electrode 208 may be a stacked layer described above.

Note that in planar view, the transistors 270, 280, and 290 each have a structure in which one of the source electrode 205 and the drain electrode 206 is surrounded by the channel formation region 204a, which is the same as the transistors 250 and 260. Further, the transistors 270, 280, and 290 each have a structure in which the end portion of the oxide semiconductor layer 204 does not reach from the source electrode 205 to the drain electrode 206, which is the same as the transistors 250 and 260.

Thus, in the transistors 270, 280, and 290, as in the transistors 250 and 260, the source electrode 205 and the drain electrode 206 are not electrically connected to each other through the parasitic channel; therefore, a transistor with low power consumption and favorable electric characteristics can be achieved.

This embodiment can be implemented in appropriate combination with the structures described in the other embodiments.

Embodiment 5

In this embodiment, structures and manufacturing methods of a transistor having a structure which is different from that of the transistor disclosed in the above embodiments and a capacitor which can be manufactured at the same time as the transistor are described.

Figure 17A:
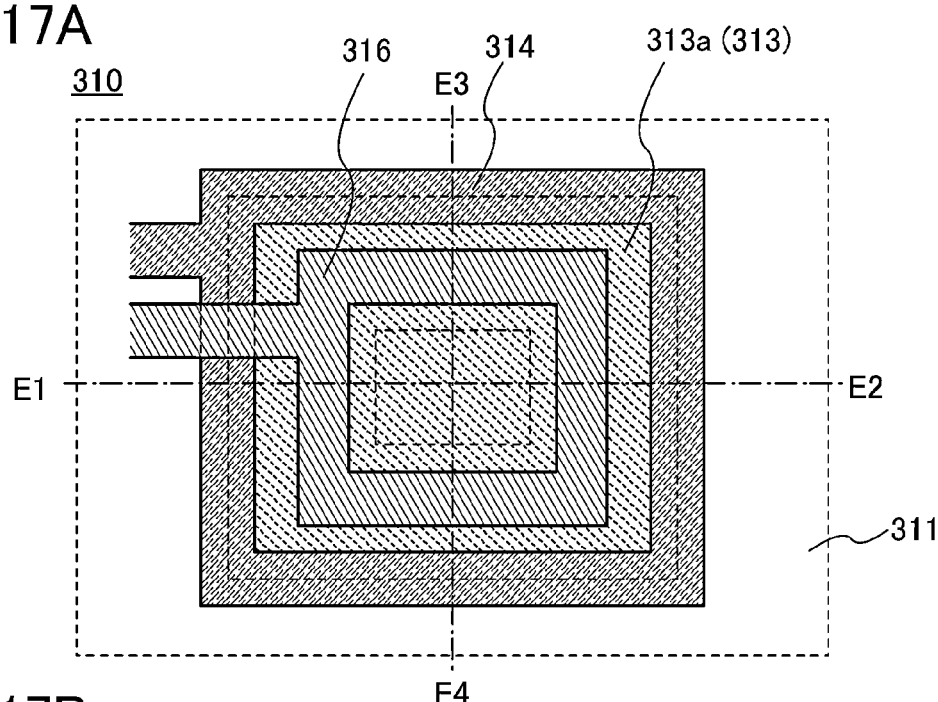
FIGS. 17A to 17C are a top view and cross-sectional views illustrating one embodiment of a semiconductor device.
Figure 17B:
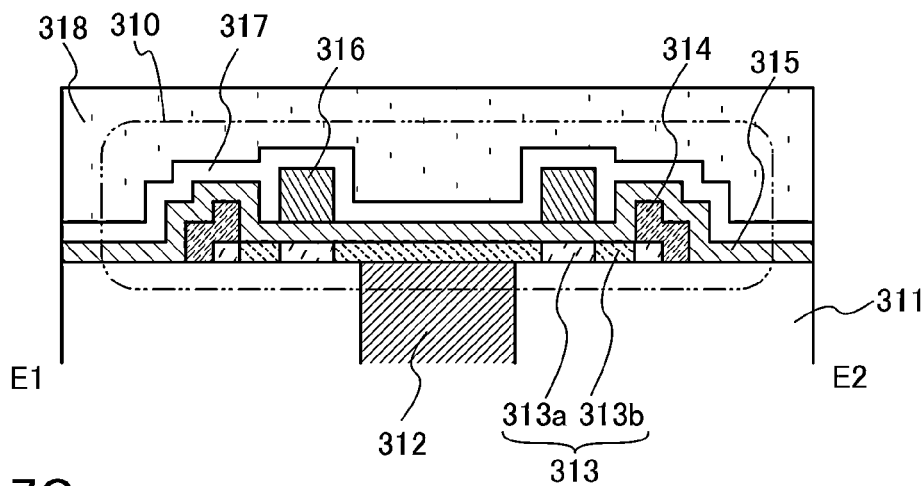
Figure 17C:
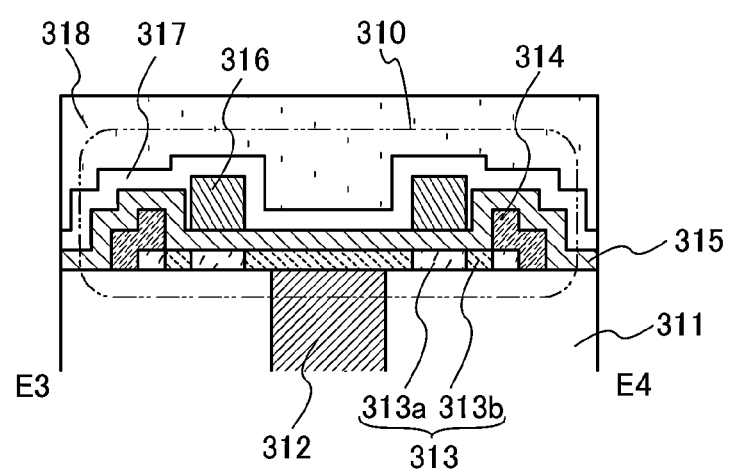

FIG. 17A is a top view of a transistor 310 according to one embodiment of the present invention, FIG. 17B is a cross-sectional view taken along line E1-E2 in FIG. 17A, and FIG. 17C is a cross-sectional view taken along line E3-E4 in FIG. 17A.

A transistor illustrated in FIGS. 17A to 17C includes a first electrode 312 embedded in a first insulating layer 311, an oxide semiconductor layer 313 in contact with the first electrode, a second electrode 314 in contact with an end portion of the oxide semiconductor layer, a second insulating layer 315 covering the oxide semiconductor layer and the second electrode, and a third electrode 316 formed over the second insulating layer. Further, a third insulating layer 317 is preferably formed as a protective film over the second insulating layer and the third electrode. Moreover, a planarization film 318 may be provided as necessary.

The transistor illustrated in FIGS. 17A to 17C is a field-effect transistor, the first electrode 312 functions as a source electrode, the second electrode 314 functions as a drain electrode, and the third electrode 316 functions as a gate electrode. Further, the second insulating layer 315 functions as a gate insulating layer, and the third insulating layer 317 functions as a protective film which suppresses release of oxygen from the oxide semiconductor layer 313 and entry of hydrogen or moisture to the oxide semiconductor layer.

The first electrode 312 is embedded in the first insulating layer 311, and one end portion of the first electrode 312 can be electrically connected to a wiring such as a power supply line and a signal line or another transistor. Further, the other end portion of the first electrode 312 is planarized so as to have a plane on the same level of a surface of the first insulating layer 311 and is electrically connected to one surface of the oxide semiconductor layer 313.

The oxide semiconductor layer 313 is processed into an island shape, and the second electrode 314 is formed to cover the end portion. By covering the end portion of the oxide semiconductor layer 313 with the second electrode 314, the effect of suppressing release of oxygen from the end portion can be given.

The third electrode 316 is formed over the oxide semiconductor layer 313 with the second insulating layer 315 provided therebetween. The top surface of the third electrode is a ring shape, and the first electrode 312 is positioned on an inner side than the third electrode and the second electrode 314 is positioned on an outer side than the third electrode.

Here, in the oxide semiconductor layer 313, a region which does not overlap with the third electrode 316 or the second electrode 314 has high resistance, in order to suppress reduction in on current of the transistor; thus, the region is preferably set to have low resistance by adding impurities. Therefore, a high-resistance region 313a to which impurities are not added and a low-resistance region 313b to which impurities are added are provided in the oxide semiconductor layer 313.

With the above-described structure of the transistor, the above-mentioned end portion of the oxide semiconductor layer 313 which easily becomes the parasitic channel does not overlap with the third electrode 316 functioning as a gate electrode; therefore, the end portion of the oxide semiconductor layer 313 can be prevented from functioning as the parasitic channel, and the electric characteristics and the reliability of the transistor can be improved.

Figure 18A:
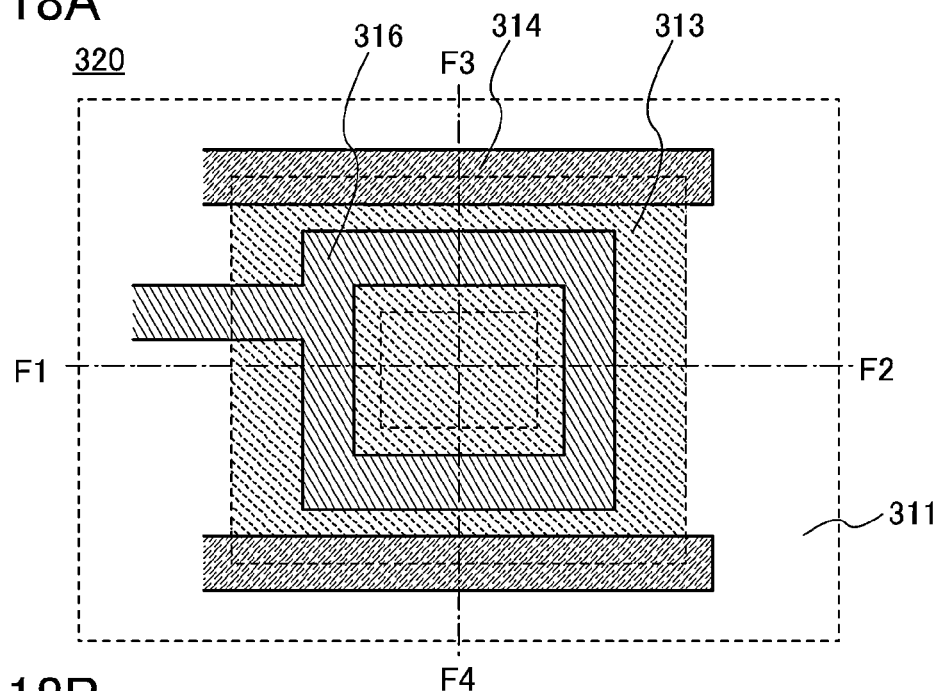
FIGS. 18A to 18C are a top view and cross-sectional views illustrating one embodiment of a semiconductor device.
Figure 18B:
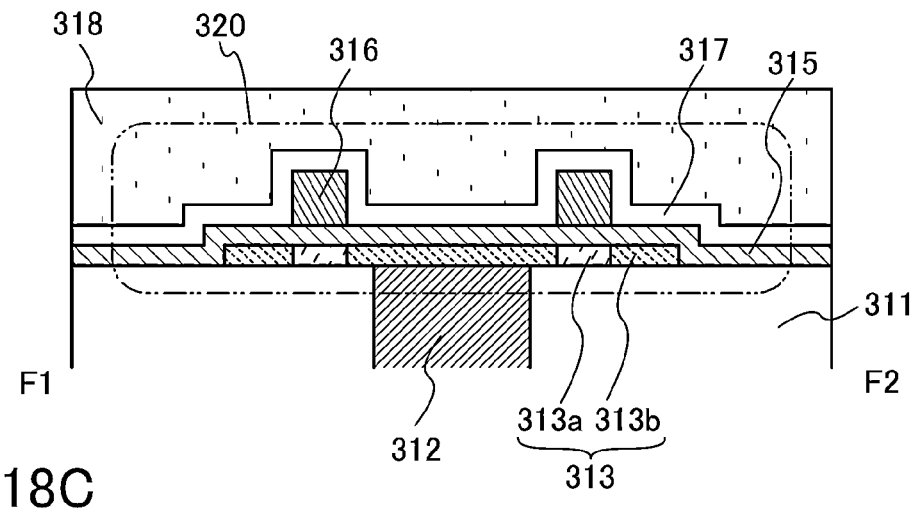
Figure 18C:
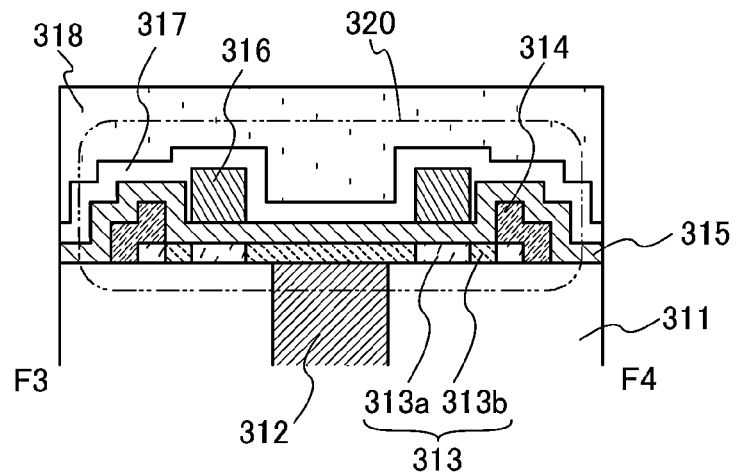

Note that the transistor of one embodiment of the present invention is not limited to the structure exemplified in FIGS. 17A to 17C, and the transistor may have a structure in which the second electrode 314 covers part of the end portion of the oxide semiconductor layer 313 as illustrated in FIGS. 18A to 18C. FIG. 18A is a top view of a transistor 320 according to one embodiment of the present invention, FIG. 18B is a cross-sectional view taken along line F1-F2 in FIG. 18A, and FIG. 18C is a cross-sectional view taken along line F3-F4 in FIG. 18A. Note that in FIGS. 18A to 18C, the second electrode 314 covers two opposite sides of the oxide semiconductor layer 313 having a rectangular shape; however, the present invention is not limited thereto, and any part of the end portion of the oxide semiconductor layer 313 may be covered with the second electrode 314.

Figure 19A:
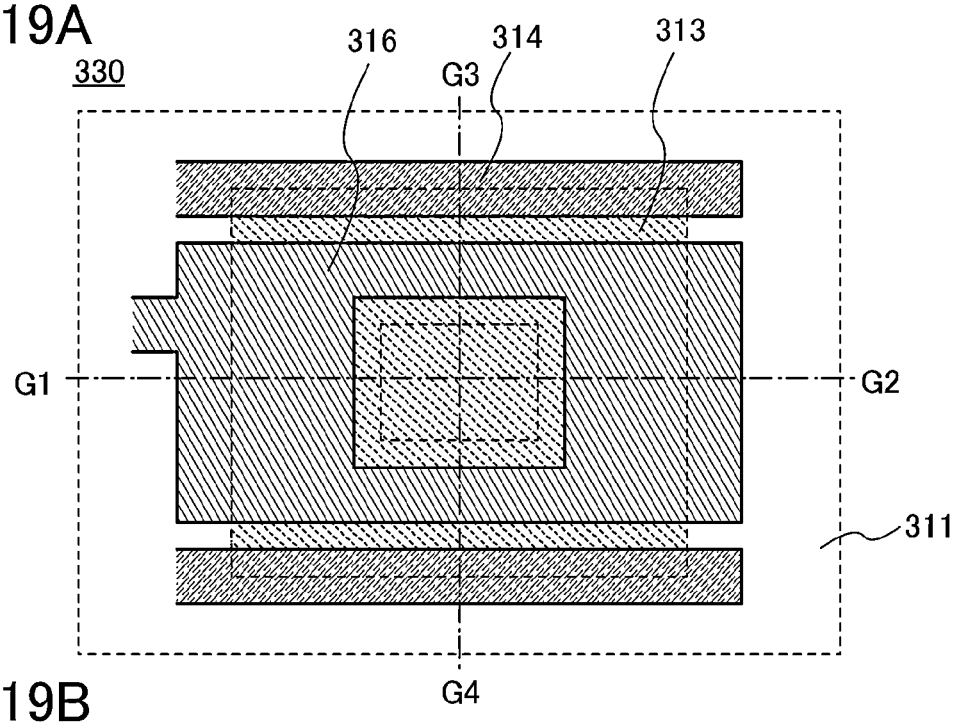
FIGS. 19A to 19C are a top view and cross-sectional views illustrating one embodiment of a semiconductor device.
Figure 19B:
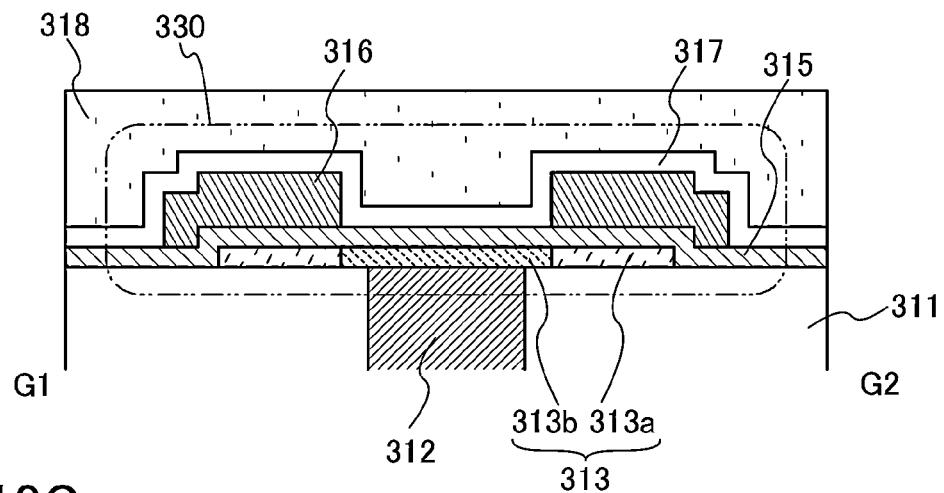
Figure 19C:
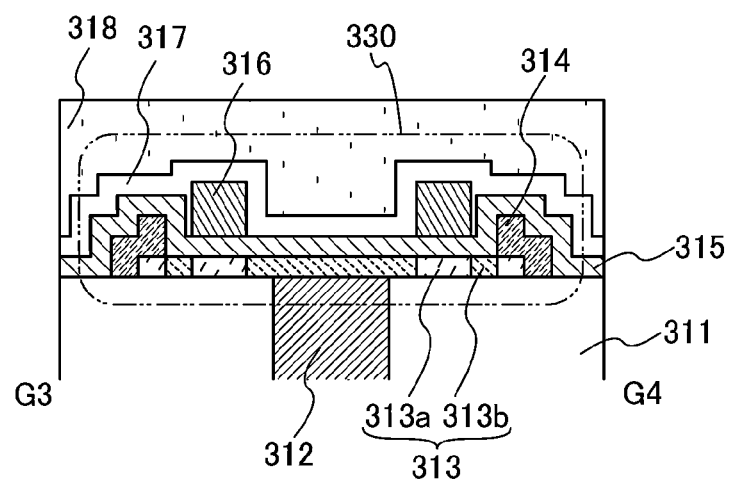

Further, as illustrated in FIGS. 19A to 19C, part of the end portion of the oxide semiconductor layer 313 may be covered with the third electrode 316. FIG. 19A is a top view of a transistor 330 according to one embodiment of the present invention, FIG. 19B is a cross-sectional view taken along line G1-G2 in FIG. 19A, and FIG. 19C is a cross-sectional view taken along line G3-G4 in FIG. 19A. Note that in FIGS. 19A to 19C, the third electrode 316 covers two opposite sides of the oxide semiconductor layer 313 having a rectangular shape; however, the present invention is not limited thereto, and any part of the end portion of the oxide semiconductor layer 313 may be covered with the third electrode 316.

Figure 20A:
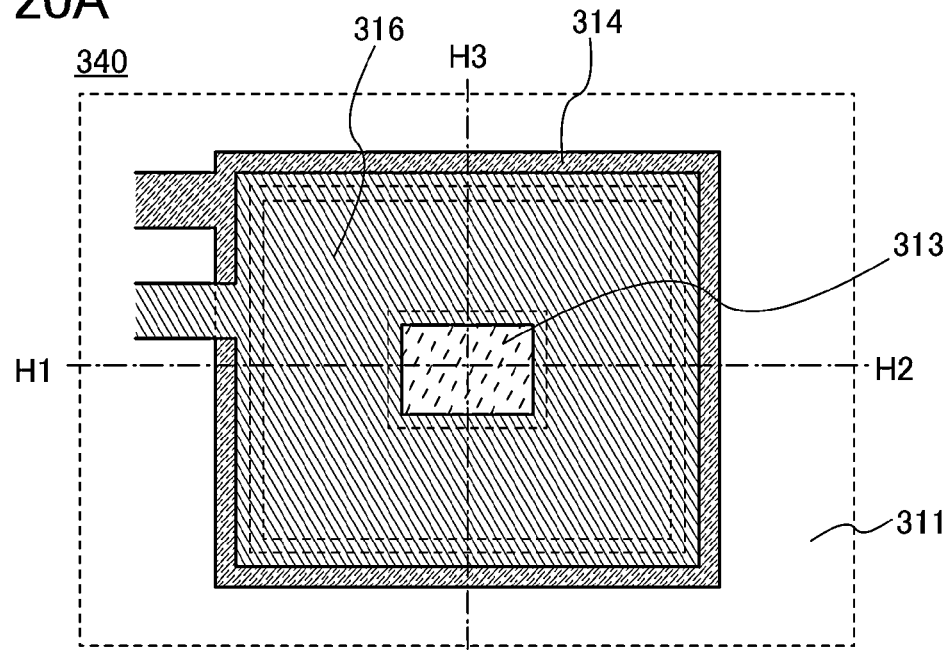
FIGS. 20A to 20C are a top view and cross-sectional views illustrating one embodiment of a semiconductor device.
Figure 20B:
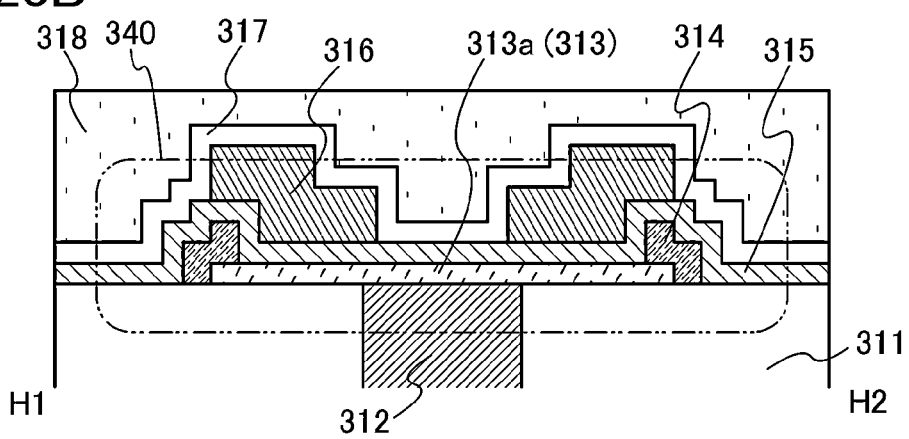
Figure 20C:
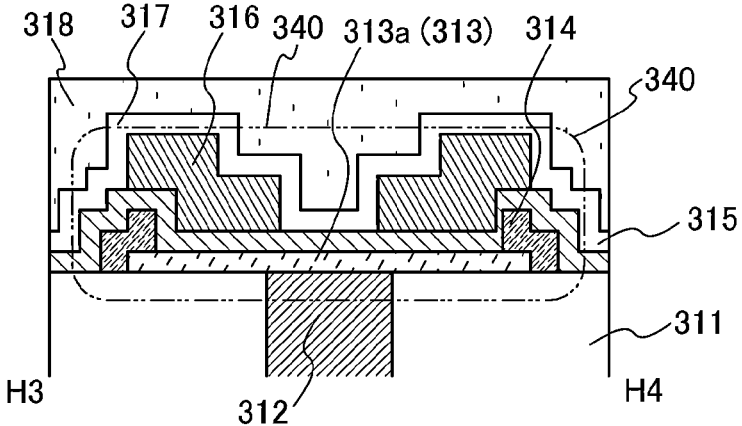

Further, as illustrated in FIGS. 20A to 20C, the third electrode 316 may overlap with part of the first electrode 312 and part of the second electrode 314. With such a structure, a region of the oxide semiconductor layer 313, which is between the first electrode 312 and the second electrode 314 and overlaps with the third electrode 316 entirely becomes a channel formation region; therefore, a step for adding impurities to the oxide semiconductor layer 313 is not needed. FIG. 20A is a top view of a transistor 340 according to one embodiment of the present invention, FIG. 20B is a cross-sectional view taken along line H1-H2 in FIG. 20A, and FIG. 20C is a cross-sectional view taken along line H3-H4 in FIG. 20A.

Figure 21A:
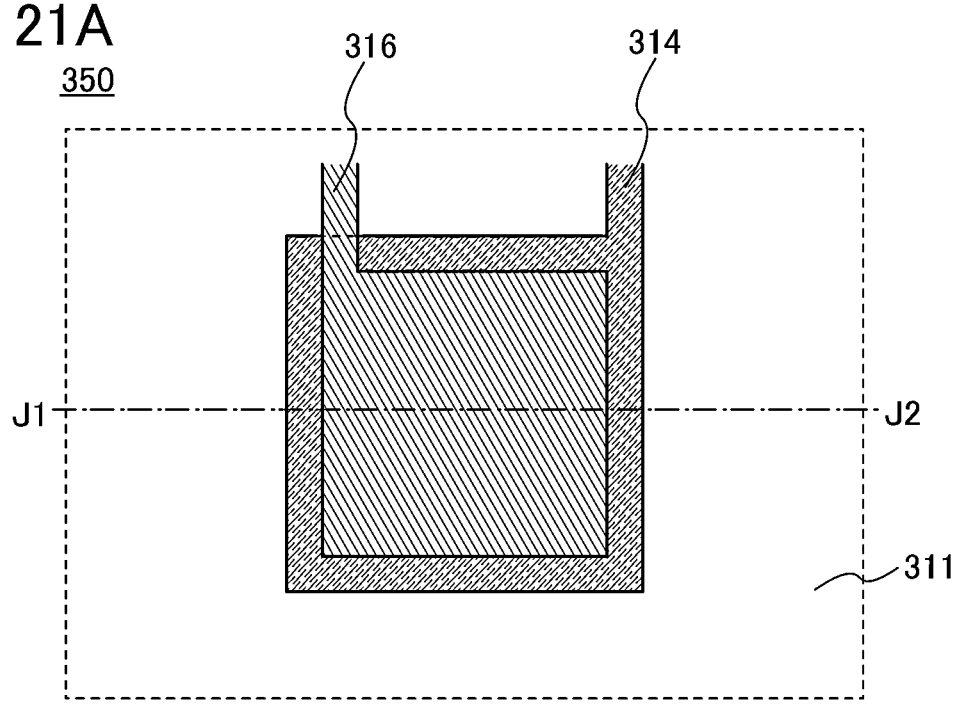
FIGS. 21A and 21B are a top view and a cross-sectional view illustrating one embodiment of a semiconductor device.
Figure 21B:
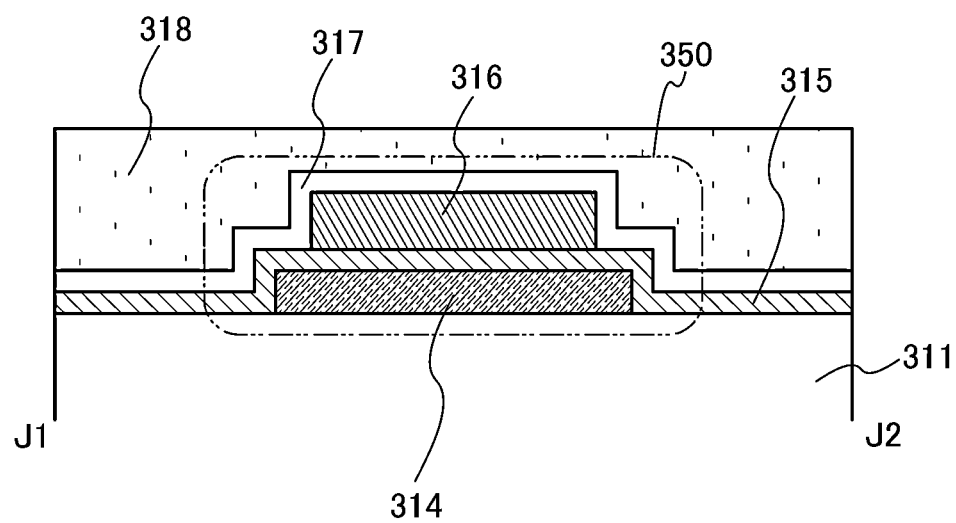

Note that in a manufacturing process of the transistor of one embodiment of the present invention, a capacitor 350 exemplified in FIGS. 21A and 21B can be manufactured together on the same surface. The capacitor 350 can be used, for example, as a charge storage element of a memory device and the like. FIG. 21A is a top view of the capacitor 350, and FIG. 21B is a cross-sectional view taken along line J1-J2 in FIG. 21A.

Figure 22A:
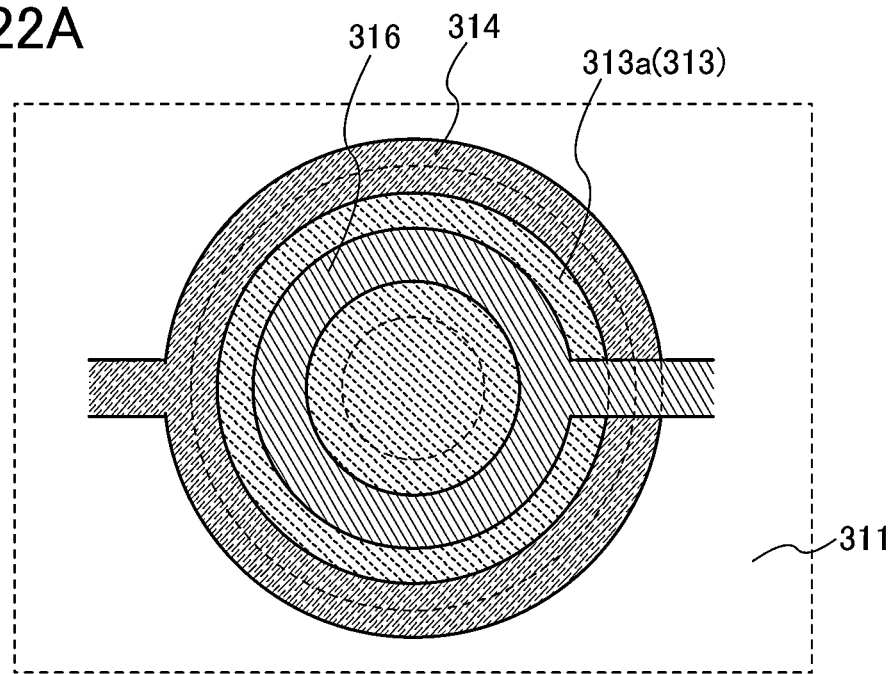
FIGS. 22A and 22B are top views each illustrating one embodiment of a semiconductor device.
Figure 22B:
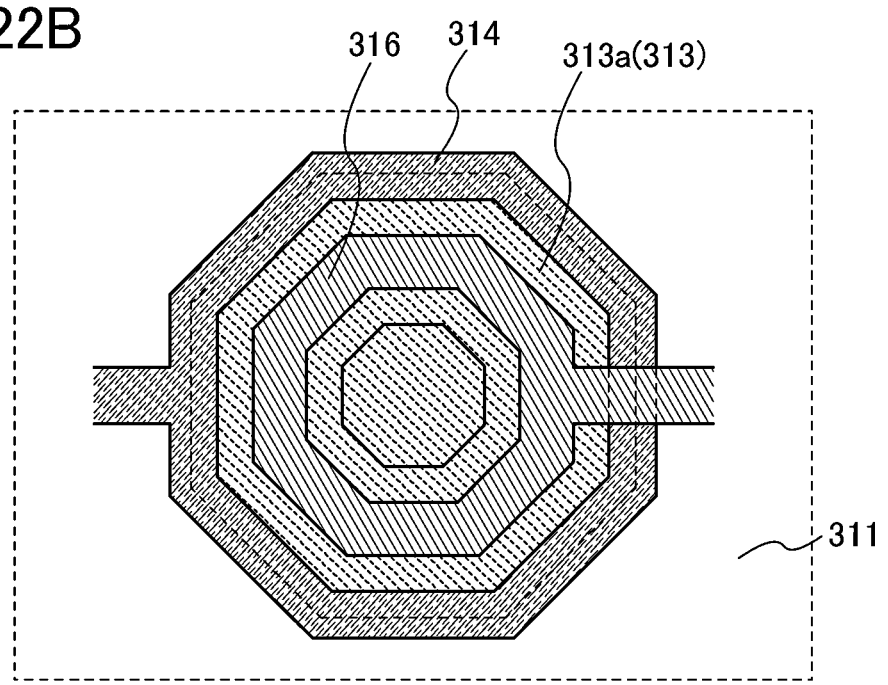

Further, in FIGS. 17A to 17C, FIGS. 18A to 18C, FIGS. 19A to 19C, and FIGS. 20A to 20C, outer peripheral shapes of the oxide semiconductor layer 313, the first electrode 312, the second electrode 314, and the third electrode 316, which are viewed from above, are substantially rectangles; however, the present invention is not limited thereto, the top surface may be a circle or a polygon as illustrated in FIGS. 22A and 22B. Note that the second electrode 314 or the third electrode 316 and a wiring can be electrically connected to each other in a given position and the connection position is not limited.

Next, an example of a method for manufacturing the transistor 310 of one embodiment of the present invention illustrated in FIGS. 17A to 17C is described with reference to FIGS. 23A to 23C and FIGS. 24A to 24C. Note that in FIGS. 23A to 23C and FIGS. 24A to 24C, diagrams on the left side are top views and diagrams on the right side are cross-sectional views.

As described above, one end portion of the first electrode 312 which is not illustrated can be electrically connected to a wiring such as a power supply line and a signal line or another transistor. Therefore, for the first electrode 312, a contact plug electrically connected to a wiring such as a power supply line and a signal line or another transistor, or a conductive layer electrically connected to the contact plug can be used.

First, the first insulating layer 311 is formed as an interlayer insulating film over a power supply line, a signal line, or another transistor formed over a substrate.

The first insulating layer 311 can be formed by a plasma CVD method, a sputtering method, or the like using an oxide insulating film such as a silicon oxide, a silicon oxynitride, an aluminum oxide, an aluminum oxynitride, a hafnium oxide, or a gallium oxide; a nitride insulating film such as a silicon nitride, a silicon nitride oxide, an aluminum nitride, or an aluminum nitride oxide; or a mixed material thereof. Further, the above-described materials may be stacked, and at least an upper layer which is in contact with the oxide semiconductor layer 313 is preferably formed using any of the material containing oxygen so as to supply oxygen to the oxide semiconductor layer 313.

Next, a contact hole reaching a wiring such as a power supply line and a signal line or an electrode of another transistor is formed. The contact hole may be formed by a photolithography process.

Then, a conductive film is formed by a sputtering method or the like to fill the contact hole. As a material of the conductive film, an element selected from aluminum, chromium, copper, tantalum, titanium, molybdenum, tungsten, and the like; an alloy containing any of these elements as a component; an alloy containing any of these elements in combination; or the like can be used. Further, the conductive film may have a single-layer structure or a stacked-layer structure of two or more layers. Alternatively, a structure may be employed in which a film of a high-melting-point metal such as chromium, tantalum, titanium, molybdenum, or tungsten, or a conductive nitride film thereof is stacked over and/or below a metal film of aluminum, copper, or the like. Further, one or more materials selected from manganese, magnesium, zirconium, beryllium, neodymium, and scandium may be used.

Then, unnecessary part of conductive film on a surface is removed by performing planarization treatment by CMP or the like, and a contact plug which fills the contact hole is formed. The contact plug is used as the first electrode 312 illustrated in FIG. 23A which is to be a source electrode of the transistor.

Further, the first electrode 312 whose top surface is different from the contact plug may be obtained by the following methods: a conductive film is formed over the contact plug; the conductive film is processed into the island shape; an insulating film covering the conductive film is formed; planarization is performed thereon by a CMP method again. A material of the conductive film can be the same material as the above-described conductive film.

Note that in addition to the planarization treatment by CMP or the like, dry etching treatment or plasma treatment may be performed. As the plasma treatment, a reverse sputtering in which an argon gas is introduced and plasma is produced can be performed. The reverse sputtering is a method in which voltage is applied to a substrate side in an argon atmosphere by using an RF power source and plasma is generated in the vicinity of the substrate to modify a surface. Note that instead of argon, nitrogen, helium, oxygen or the like may be used. The reverse sputtering can remove particle substances (also referred to as particles or dust) attached to the surface on which the oxide semiconductor layer is to be formed.

Figure 23A:
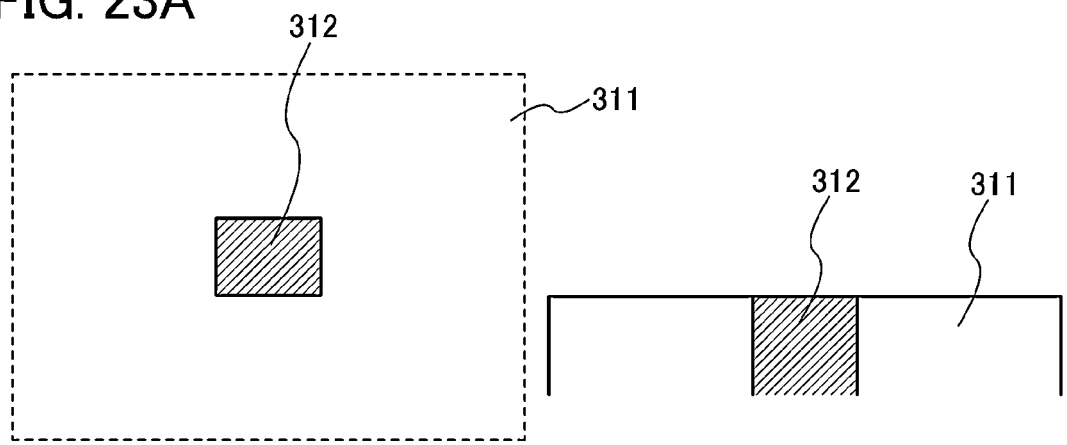
FIGS. 23A to 23C are top views and cross-sectional views illustrating steps for manufacturing a semiconductor device.
Figure 23B:
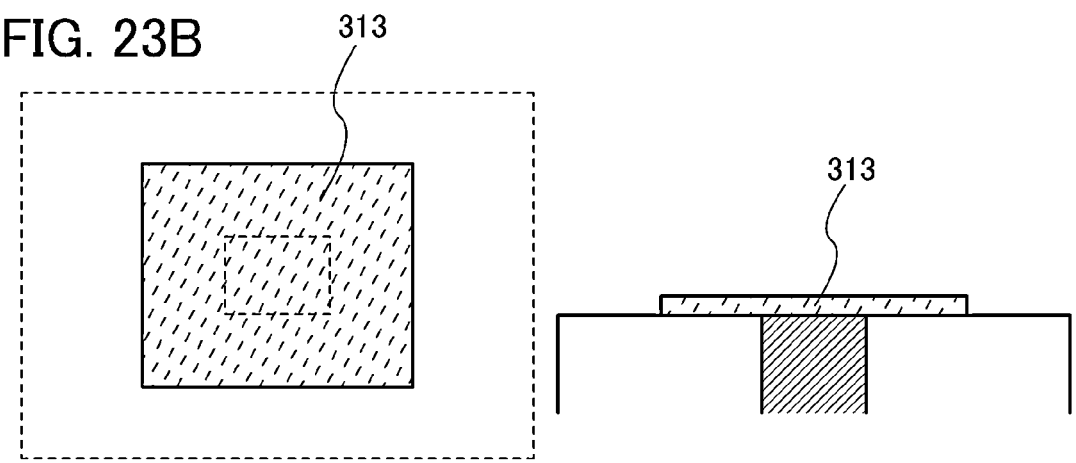
Figure 23C:
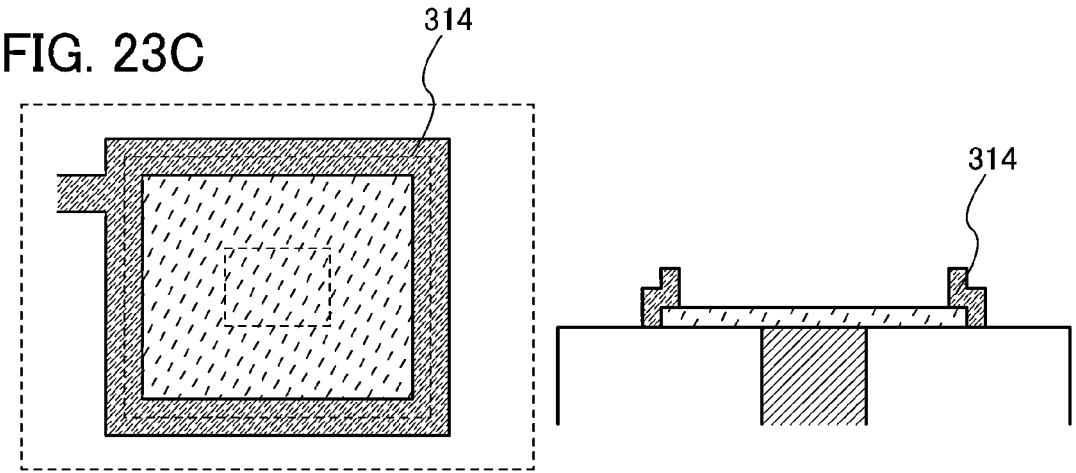

Next, an oxide semiconductor film is formed over the first insulating layer 311 and the first electrode 312 and processed into the island shape by a photolithography method and an etching method, so that the oxide semiconductor layer 313 is formed (see FIG. 23B).

Note that the oxide semiconductor included in the oxide semiconductor layer 313 can be formed using a material and a method similar to those of the oxide semiconductor disclosed in the above-described embodiments.

After the oxide semiconductor film is formed, the oxide semiconductor film is preferably subjected to heat treatment for reducing or removing excess hydrogen (including water and a hydroxyl group) contained in the oxide semiconductor film (dehydration or dehydrogenation). The temperature of the heat treatment is higher than or equal to 300° C. and lower than or equal to 700° C., or lower than the strain point of the substrate in the case where a glass substrate is used as the substrate. The heat treatment is preferably performed in reduced pressure, a nitrogen atmosphere, or the like.

The heat treatment enables hydrogen, which is an impurity imparting n-type conductivity, in the oxide semiconductor film to be reduced or removed. Further, in the case where an insulating layer containing oxygen is employed as the first insulating layer 311, by this heat treatment, oxygen contained in the first insulating layer 311 can be supplied to the oxide semiconductor film. While oxygen is released from the oxide semiconductor film by the dehydration or dehydrogenation treatment, oxygen is supplied from the first insulating film 311 to the oxide semiconductor film, whereby oxygen vacancies in the oxide semiconductor film can be filled.

Note that the heat treatment for dehydration or dehydrogenation may be performed after the island-shaped oxide semiconductor layer 313 is formed or may serve as another heat treatment in a manufacturing process of the transistor.

Note that in the heat treatment, it is preferable that water, hydrogen, and the like be not contained in nitrogen or a rare gas such as helium, neon, or argon. The purity of nitrogen or a rare gas such as helium, neon, or argon introduced into the heat treatment apparatus is preferably 6N (99.9999%) or more, more preferably 7N (99.99999%) or more (i.e., the impurity concentration is preferably 1 ppm or lower, more preferably 0.1 ppm or lower).

In addition, after the oxide semiconductor film is heated by the heat treatment, a high-purity oxygen gas, a high-purity dinitrogen monoxide gas, or ultra dry air (the moisture amount is 20 ppm or lower (−55° C. by conversion into a dew point), preferably 1 ppm or lower, more preferably 10 ppb or lower, in the measurement with the use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor film and that is reduced by the step for removing an impurity for the dehydration or dehydrogenation, so that the oxide semiconductor film can be a highly purified, i-type (intrinsic) oxide semiconductor film.

Alternatively, as a method for supplying oxygen to the oxide semiconductor film, an ion implantation method, an ion doping method, a plasma immersion ion implantation method, a plasma treatment method, or the like can be used. In that case, in addition to the case where oxygen is directly supplied to the oxide semiconductor film, oxygen may be supplied through the second insulating layer 315 formed later.

As long as the introduction of oxygen into the oxide semiconductor film is performed after dehydration or dehydrogenation treatment is performed thereon, there is no limitation on the order of the steps. Further, oxygen may be added plural times into the dehydrated or dehydrogenated oxide semiconductor film. Alternatively, the dehydration or dehydrogenation treatment and the introduction of oxygen may be alternately performed plural times.

Next, a conductive film which is to be the second electrode 314 (including a wiring formed using the same layer as the second electrode 314) is formed over the end portion of the oxide semiconductor layer 313. For the conductive film, the material similar to that of the first electrode 312 can be used. Then, the second electrode 314 which is to be the drain electrode of the transistor is formed by a photolithography method and an etching method (see FIG. 23C).

Note that on the surface of the oxide semiconductor layer 313 which is exposed by formation of the second electrode 314 (the drain electrode), a constituent element of the second electrode 314, an element existing in a deposition chamber, or a constituent element of an etching gas used for the etching may be attached as impurities.

Thus, after the etching for forming the second electrode 314 is finished, cleaning treatment for removing the impurities attached on the surface of the oxide semiconductor layer 313 (impurity-removing treatment) is preferably performed.

Next, the second insulating layer 315 is formed to cover the oxide semiconductor layer 313 and the second electrode 314 is formed by a plasma CVD method, a sputtering method, or the like.

The second insulating layer 315 serves as a gate insulating layer, and can be formed using a silicon oxide film, a gallium oxide film, an aluminum oxide film, a silicon nitride film, a silicon oxynitride film, an aluminum oxynitride film, or a silicon nitride oxide film.

The second insulating layer 315 can be formed using a high-k material such as hafnium oxide, yttrium oxide, hafnium silicate ($HfSi_xO_y$ (x>0, y>0)), hafnium silicate to which nitrogen is added, hafnium aluminate ($HfAl_xO_y$ (x>0, y>0)), or lanthanum oxide, whereby gate leakage current can be reduced. Furthermore, the second insulating layer 315 may have either a single-layer structure or a stacked-layer structure.

Note that since the second insulating layer 315 is an insulating layer in contact with the oxide semiconductor layer 313, it is preferable to contain oxygen and also preferable to contain impurities such as water or hydrogen as little as possible. In the case of using a plasma CVD method, it is more difficult to reduce the concentration of hydrogen in the film than the case of using a sputtering method. Therefore, in the case where the second insulating layer 315 is formed by a plasma CVD method, heat treatment for reducing or removing hydrogen atoms (dehydration or dehydrogenation treatment) is preferably performed after the formation of the second insulating layer 315.

The heat treatment is performed at a temperature higher than or equal to 250° C. and lower than or equal to 650° C., preferably higher than or equal to 450° C. and lower than or equal to 600° C. In the case where a glass substrate is used, the heat treatment is performed at a temperature lower than the strain point of the glass substrate. For example, the substrate is introduced into an electric furnace which is one of heat treatment apparatuses, and heat treatment is performed on the second insulating layer 315 at 650° C. for one hour in vacuum (under reduced pressure).

Through the heat treatment, the second insulating layer 315 can be dehydrated or dehydrogenated. Thus, the second insulating layer 315 from which an impurity such as hydrogen or water causing a change in characteristics of the transistor is eliminated can be formed.

In the heat treatment for dehydration or dehydrogenation treatment, it is preferable that a surface of the second insulating layer 315 be not in a state where hydrogen, water, or the like is prevented from being released (for example, in a state where a film or the like which is not permeable to hydrogen, water, or the like is provided), but in a state where the surface of the second insulating layer 315 is exposed.

The heat treatment for dehydration or dehydrogenation may be performed plural times, and may also serve as another heat treatment.

Further, oxygen doping treatment may be performed on the second insulating layer 315 on which dehydration or dehydrogenation treatment has been performed. In this treatment, oxygen may be supplied to the oxide semiconductor layer 313 at the same time.

Figure 24A:
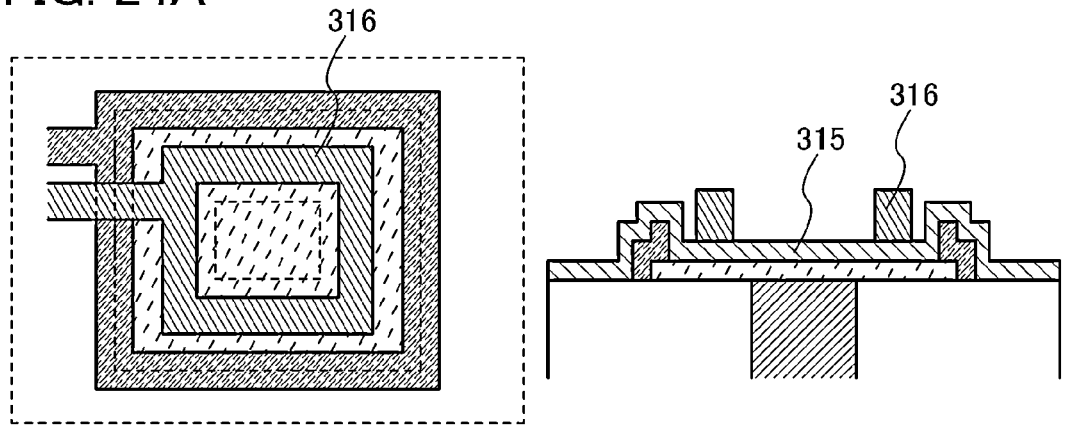
FIGS. 24A to 24C are top views and cross-sectional views illustrating steps for manufacturing a semiconductor device.

Next, a conductive film is formed over the second insulating layer 315 by a sputtering method or the like, and the third electrode 316 whose top surface is a ring shape is formed by a photolithography method and an etching method (see FIG. 24A). The third electrode 316 serving as a gate electrode of the transistor is formed, as illustrated, at a position which does not overlap with the first electrode 312 or the second electrode 314, whereby the amount of parasitic capacitance can be reduced. However, part of a wiring connected to the third electrode 316 overlaps with the second electrode 314.

The third electrode 316 can be formed using a material and a method similar to those of the gate electrode described in the above-described embodiments.

Figure 25:
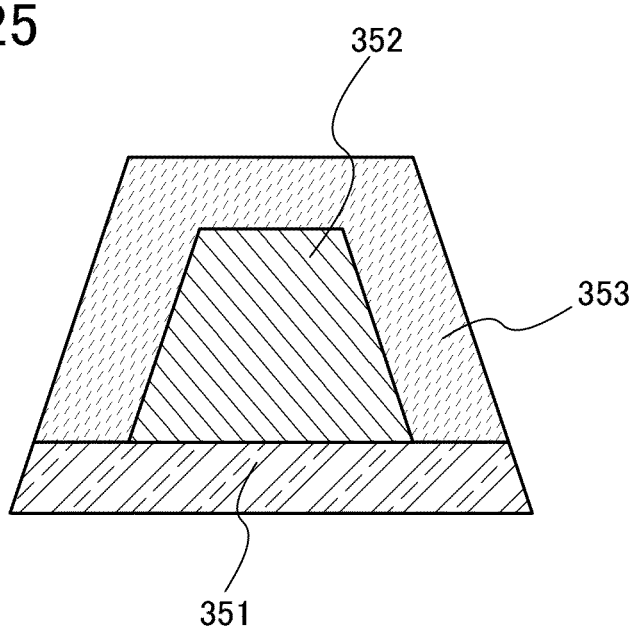
FIG. 25 illustrates an electrode structure of a semiconductor device.

For example, as illustrated in FIG. 25, a conductive layer having three layers in which copper 352 is formed in an intermediate layer, tungsten nitride 351 which prevents diffusion of the copper is formed in one of an upper layer and a lower layer, and tantalum nitride 353 is formed in the other of the upper layer and the lower layer can be used as the third electrode 316. Note that the conductive layer having the three layers can be applied to the first electrode 312 and the second electrode 314. In an electrode structure in FIG. 25, the number of photolithography steps is increased in order to prevent copper from diffusing; however, an effect of suppressing diffusion of copper is very high and the reliability of the transistor can be improved.

Heat treatment may be performed after the third electrode 316 is formed. For example, the heat treatment may be performed with a GRTA apparatus at 650° C. for 1 minute to 5 minutes. Alternatively, the heat treatment may be performed with an electric furnace at 500° C. for 30 minutes to 1 hour.

Figure 24B:
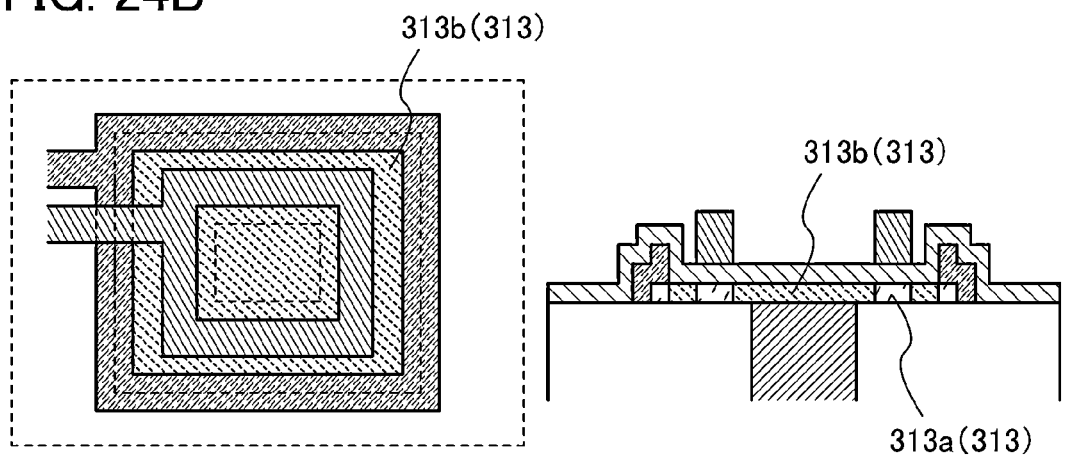
Figure 24C:
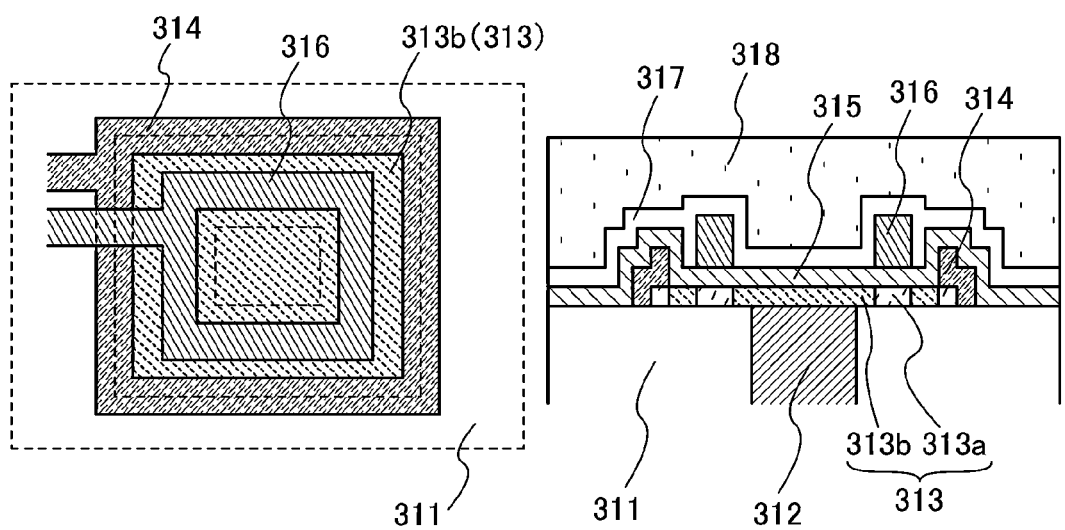

Next, in the oxide semiconductor layer 313, in order to reduce resistance of a region which does not overlap with the second electrode 314 or the third electrode 316, impurities are added to the region and a low-resistance region 313b is formed (see FIG. 24B).

As an impurity by which the conductivity of the oxide semiconductor layer 313 improves, for example, any one or more of phosphorus (P), arsenic (As), antimony (Sb), boron (B), aluminum (Al), nitrogen (N), argon (Ar), helium (He), neon (Ne), indium (In), fluorine (F), chlorine (Cl), titanium (Ti), and zinc (Zn) can be used.

By using the third electrode 316 as a mask, the impurities can be locally added to the oxide semiconductor layer 313 through the second insulating film. Examples of the method for adding the impurities are an ion implantation method, an ion doping method, and a plasma immersion ion implantation method. In that case, it is preferable to use a single ion, fluoride ion, or chloride ion of the impurities.

The addition of the impurities may be controlled by setting the addition conditions such as the accelerated voltage and the dose, or the thickness of the films through which the dopant passes as appropriate. For example, in the case where phosphorus is used as an impurity which is added to the oxide semiconductor layer 313, the concentration of the impurity in the regions to which impurity is added is preferably higher than or equal to $5 \times 10^{18}/cm^3$ and lower than or equal to $1 \times 10^{22}/cm^3$.

Note that impurities may be added while the substrate is heated. Further, the treatment of adding the impurities to the oxide semiconductor layer 313 may be performed plural times, and plural kinds of impurities may be used.

Further, heat treatment may be performed after the treatment of adding the impurities. For example, the heat treatment is preferably performed at a temperature higher than or equal to 300° C. and lower than or equal to 700° C., more preferably higher than or equal to 300° C. and lower than or equal to 450° C. under an oxygen atmosphere for an hour. The heat treatment may be performed under a nitrogen atmosphere, reduced pressure, or the air (ultra-dry air).

Next, the third insulating layer 317 is preferably formed as a protective film over the second insulating layer 315 and the third electrode 316. The third insulating layer 317 can be formed using an insulating film such as a silicon oxide film, a gallium oxide film, an aluminum oxide film, a silicon nitride film, a silicon oxynitride film, an aluminum oxynitride film, or a silicon nitride oxide film.

Note that it is preferable that an aluminum oxide film be used as the third insulating layer 317. The aluminum oxide film has a high shielding effect (blocking effect) of preventing penetration of both oxygen and impurities such as hydrogen and moisture. Therefore, during the manufacturing process and after the manufacture, the aluminum oxide film functions as a protective film for preventing entry of an impurity such as hydrogen or moisture, which can cause a change, into the oxide semiconductor layer and release of oxygen, which is a main component material of the oxide semiconductor layer, from the oxide semiconductor layer. For formation of the aluminum oxide film, the aluminum oxide film can be directly formed by a sputtering method or the like. Alternatively, an aluminum (Al) film is formed by a sputtering method or the like, and then, performing an oxygen plasma treatment, an ion implantation of oxygen, an ion doping of oxygen, or the like thereon.

Note that the third insulating layer 317 may be a stacked layer of an aluminum oxide film and one or more insulating films of a silicon oxide film, a gallium oxide film, a silicon nitride film, a silicon oxynitride film, an aluminum oxynitride film, and a silicon nitride oxide film.

Further, treatment for supplying oxygen may be performed on the third insulating layer 317. For example, oxygen can be supplied to the third insulating layer 317 by an ion implantation method, an ion doping method, a plasma immersion ion implantation method, a plasma treatment, or the like.

Note that after the third insulating layer 317 is formed, heat treatment may be performed at a temperature higher than or equal to 100° C. and lower than or equal to 400° C. This heat treatment may be performed at a fixed heating temperature; alternatively, the following change in the heating temperature may be conducted plural times: the heating temperature is increased from room temperature to a temperature higher than or equal to 100° C. and lower than or equal to 400° C. and then decreased to room temperature. Further, this heat treatment may be performed under a reduced pressure. The heat treatment time can be shortened under the reduced pressure. This heat treatment can supply oxygen contained in each of the insulating layers to the oxide semiconductor layer 313, which enables improvement in the reliability of the transistor.

Next, the planarization film 318 is formed over the third insulating layer 317 as necessary. Further, the planarization film can be formed using, in addition to an insulating film which can serve as the third insulating layer 317, an organic material having heat resistance, such as a polyimide-based resin, an acrylic-based resin, a polyimide amide-based resin, a benzocyclobutene-based resin, a polyamide-based resin, or an epoxy-based resin. In addition to such organic materials, a low-dielectric constant material (a low-k material), a siloxane-based resin, PSG (phosphosilicate glass), BPSG (borophosphosilicate glass), or the like can be used. The planarization insulating layer may be formed by stacking a plurality of insulating films formed of any of these materials.

For example, a 1500-nm-thick acrylic resin film may be formed as the planarization film 318. The acrylic resin film can be formed by coating using a coating method and then baking (e.g., at 250° C. under a nitrogen atmosphere for an hour).

The transistors having structures illustrated in FIGS. 18A to 18C, FIGS. 19A to 19C, and FIGS. 20A to 20C can be manufactured by changing the shapes of the second electrode 314 and the third electrode 316 as appropriate in the manufacturing method of the above-described transistor 310. Further, in the manufacturing process of the transistor having structures illustrated in FIGS. 20A to 20C, a step of adding impurities for forming the low-resistance region 313b can be omitted.

Further, the capacitor illustrated in FIGS. 21A and 21B can be manufactured at the same time as the transistor 310 without increasing the number of steps by using a mask whose shape is different from the component elements of the transistor 310 in a photolithography process in the above-described manufacturing method of the transistor 310.

Thus, a transistor in which generation of a parasitic channel is suppressed, which is one embodiment of the present invention, can be manufactured.

This embodiment can be implemented in appropriate combination with the structures described in the other embodiments.

Embodiment 6

In this embodiment, a transistor having a different structure from that of the transistor disclosed in the above embodiments and a manufacturing method thereof are described. In addition, a structure of a capacitor which can be manufactured at the same time as the transistor and a manufacturing method thereof are described.

Figure 26A:
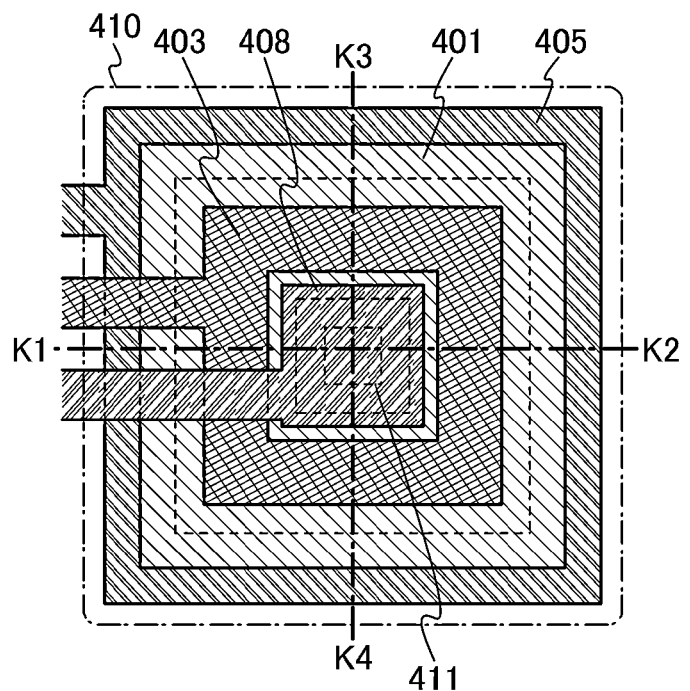
FIGS. 26A to 26C are a top view and cross-sectional views illustrating one embodiment of a semiconductor device.
Figure 26C:
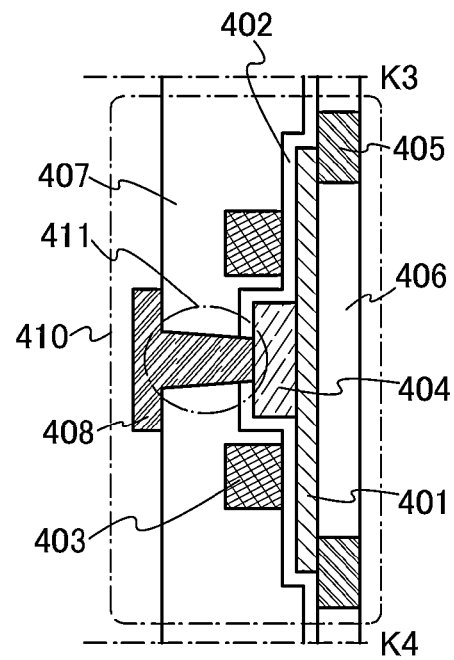
Figure 26B:
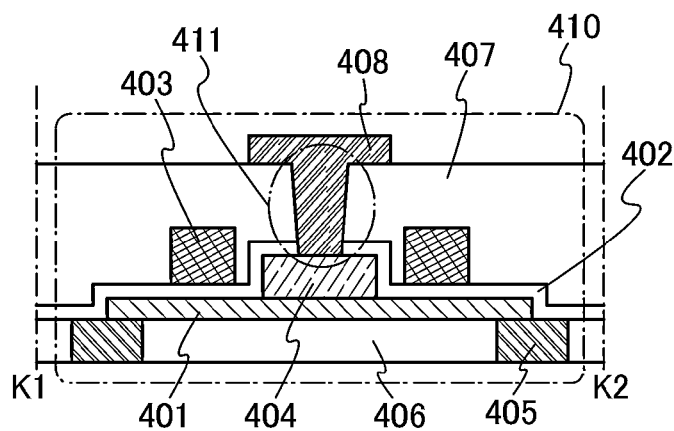

FIGS. 26A to 26C illustrate the structural example of the transistor 410 according to one embodiment of the present invention. Specifically, FIG. 26A is a top view of the transistor, FIG. 26B is a cross-sectional view taken along line K1-K2 in FIG. 26A, and FIG. 26C is a cross-sectional view taken along line K3-K4 in FIG. 26A.

The transistor 410 in FIGS. 26A to 26C includes an oxide semiconductor layer 401, an insulating layer 402 in contact with the oxide semiconductor layer 401, a conductive layer 403 having a ring-shaped portion overlapping with the oxide semiconductor layer 401 with the insulating layer 402 provided therebetween, a conductive layer 404 in contact with the oxide semiconductor layer 401 in a region on an inner side than the ring-shaped portion, and a conductive layer 405 in contact with the oxide semiconductor layer 401 in a region on an outer side than the ring-shaped portion. In the transistor 410 in FIGS. 26A to 26C, the conductive layer 403 functions as a gate, the conductive layer 404 functions as one of a source and a drain, and the conductive layer 405 functions as the other of the source and the drain. Moreover, in the transistor 410 in FIGS. 26A to 26C, the insulating layer 402, the conductive layer 403, and the conductive layer 404 are provided on the top surface side of the oxide semiconductor layer 401 and the conductive layer 405 is provided on the bottom surface side of the oxide semiconductor layer 401.

Note that the conductive layer 405 in FIGS. 26A to 26C has a ring-shaped portion in contact with the oxide semiconductor layer 401 is provided. Further, the top surface of the conductive layer 405 is provided in substantially the same plane as the top surface of the insulating layer 406, and the top surface of the conductive layer 405 is in contact with the oxide semiconductor layer 401. Further, over the transistor 410 in FIGS. 26A to 26C, an insulating layer 407 and a conductive layer 408 which extends over the insulating layer 407 are provided. Note that the conductive layer 408 is in contact with the conductive layer 404 through an opening 411 provided in the insulating layer 402 and the insulating layer 407.

In the transistor 410 in FIGS. 26A to 26C, in the case where the conductive layer 404 (one of the source and the drain) is electrically connected to the end portion of the oxide semiconductor layer 401, the oxide semiconductor layer 401 in a region overlapping with the conductive layer 403 (gate) at least exists therebetween. Here, a region overlapping with the conductive layer 403 (gate) is a region where a channel (inherent channel) is formed depending on voltage between the conductive layer 403 (gate) and the conductive layer 404 or the conductive layer 405 (source) of the transistor 410. Therefore, in the transistor 410, whether or not the conductive layer 404 and the conductive layer 405 (a source and a drain) are electrically connected to each other can be selected depending on whether the inherent channel is formed or not regardless of whether the resistance of the end portion of the oxide semiconductor layer 401 is reduced or not. As a result, switching of the transistor 410 can be easily controlled.

Note that the oxide semiconductor included in the oxide semiconductor layer 401 can be formed using a material and a method similar to those of the oxide semiconductor disclosed in the above-described embodiments.

For the insulating layer 402, an inorganic insulating material such as silicon oxide, silicon nitride, silicon oxynitride, silicon nitride oxide, aluminum oxide, aluminum oxynitride, or gallium oxide can be used. Alternatively, a stack of layers of these materials can also be used. Note that an aluminum oxide film has a high shielding (blocking) effect of preventing penetration of oxygen and an impurity such as hydrogen. Therefore, when the layer including an aluminum oxide is used as the insulating layer 402, it is possible to prevent release of oxygen from the oxide semiconductor layer 401 and entry of an impurity such as hydrogen to the oxide semiconductor layer 401.

The insulating layer 402 can be formed using a film including a hafnium oxide film, a yttrium oxide film, a hafnium silicate ($HfSi_xO_y$ (x>0, y>0)), a hafnium silicate to which nitrogen is added, a hafnium aluminate ($HfAl_xO_y$ (x>0, y>0)) film, or a lanthanum oxide film (i.e., a film formed of what is called a high-k material). By using such a film, gate leakage current can be reduced.

A film containing an element selected from aluminum, copper, titanium, tantalum, tungsten, molybdenum, chrome, neodymium, and scandium or a film of an alloy containing any of these elements as its component can be used for the conductive layer 403. As the conductive layer 403, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (e.g., InN or SnN) can be used. These nitride films each have a work function of 5 eV (electron volts) or higher, preferably 5.5 eV (electron volts) or higher, which enables the threshold voltage of the transistor to be positive when used as the gate, so that what is called a normally-off switching element can be achieved. Alternatively, the conductive layer 403 can be formed with a stack of these films.

For the conductive layer 404 and the conductive layer 405, a film containing an element selected from aluminum, copper, titanium, tantalum, tungsten, molybdenum, chromium, neodymium, and scandium; a film of an alloy containing any of these elements; a film of a nitride containing any of these elements; or the like can be used. Alternatively, the conductive layer 404 and the conductive layer 405 can be formed with a stack of these films.

For the insulating layer 406, an inorganic insulating material such as silicon oxide, silicon nitride, silicon oxynitride, silicon nitride oxide, aluminum oxide, aluminum oxynitride, or gallium oxide can be used. Alternatively, a stack of layers of these materials can also be used. Note that an aluminum oxide film has a high shielding (blocking) effect of preventing penetration of oxygen and an impurity such as hydrogen. Therefore, when the layer including an aluminum oxide is used as the insulating layer 402, it is possible to prevent release of oxygen from the oxide semiconductor layer 401 and entry of an impurity such as hydrogen to the oxide semiconductor layer 401.

For the insulating layer 407, an inorganic insulating material such as silicon oxide, silicon nitride, silicon oxynitride, silicon nitride oxide, aluminum oxide, aluminum oxynitride, or gallium oxide can be used. Alternatively, the insulating layer 407 can be formed using an organic insulating material such as polyimide or acrylic. Alternatively, a stack of layers of these materials can also be used.

For the conductive layer 408, a film containing an element selected from aluminum, copper, titanium, tantalum, tungsten, molybdenum, chromium, neodymium, and scandium; a film of an alloy containing any of these elements; a film of a nitride containing any of these elements; or the like can be used. Alternatively, the conductive layer 408 can be formed with a stack of these films.

FIGS. 27A1 to 27C2 and FIGS. 28A1 to 28C2 illustrate an example of a manufacturing process of the transistor 410 illustrated in FIGS. 26A to 26C. Specifically, FIGS. 27A1, 27B1, and 27C1 and FIGS. 28A1, 28B1, and 28C1 are top views of manufacturing process of the transistor 410, FIGS. 27A2, 27B2, and 27C2 and FIGS. 28A2, 28B2, and 28C2 are cross-sectional views taken along line K1-K2 in FIGS. 27A1, 27B1, and 27C1 and FIGS. 28A1, 28B1, and 28C1.

First, the insulating layer 406 is formed. As a film formation method, a plasma CVD method, a sputtering method, or the like can be used. Heat treatment for reducing the content of water or hydrogen may be performed after the formation of the insulating film. For example, the heat treatment may be performed at a temperature higher than or equal to 300° C. and lower than or equal to 700° C. for a time shorter than or equal to one hour under reduced pressure or in an inert atmosphere. This heat treatment makes it possible to prevent the entry of hydrogen to the oxide semiconductor layer 401 formed later. Moreover, in the case where the insulating film includes an aluminum oxide film, the aluminum oxide film can be directly formed, or an aluminum film is formed and then subjected to oxidation treatment. Examples of the oxidation treatment include oxygen plasma treatment, oxygen doping treatment, and the like.

Next, an opening 412 is formed in the insulating layer 406. For example, a mask is formed over the insulating layer 406 by a photolithography method and the insulating layer 406 is partly etched, so that the opening 412 is formed.

Next, a conductive film is formed. As a film formation method, a sputtering method or the like can be used.

Then, the conductive film provided over the insulating layer 406 is removed by cutting (grounding or polishing). As a method for the cutting, a CMP method or the like can be used. Thus, the insulating layer 406 and the conductive layer 405 whose top surface is provided in substantially the same plane as the top surface of the insulating layer 406 are formed.

Then, an oxide semiconductor film is deposited. As a film formation method, a sputtering method or the like can be used. Note that the formation of the oxide semiconductor film is preferably performed in conditions such that the oxide semiconductor film contains a large amount of oxygen (e.g., the formation is performed by a sputtering method in an atmosphere containing oxygen higher than or equal to 95% and lower than or equal to 100%). Accordingly, the amount of oxygen contained in the oxide semiconductor film can be increased (preferably, the oxide semiconductor includes a region which contains oxygen in a proportion higher than that of oxygen in the stoichiometric composition of an oxide semiconductor in a crystal state).

Further, as described in the above embodiments, heat treatment may be performed after the oxide semiconductor film is formed or the oxide semiconductor layer 401 is formed. Further, in the case where the insulating layer 406 is an insulating layer containing oxygen, oxygen contained in the insulating layer 406 can be supplied to the oxide semiconductor film or the oxide semiconductor layer 401 by this heat treatment. Therefore, even when oxygen vacancies are generated in the oxide semiconductor film or the oxide semiconductor layer 401, the oxygen vacancies can be filled by the supply of oxygen from the insulating layer 406 by this heat treatment.

Next, the oxide semiconductor film is partly removed. For example, a mask is formed over the oxide semiconductor film by a photolithography method and the oxide semiconductor film is partly etched, so that the oxide semiconductor film is partly removed. As a result, the oxide semiconductor layer 401 is formed.

Next, a conductive film is formed. As a film formation method, a sputtering method or the like can be used. Heat treatment may be performed after the conductive film is formed or the conductive layer 404 is formed. For example, the heat treatment may be performed at 650° C. for one minute to five minutes with a GRTA apparatus which performs heat treatment using a high-temperature gas. Note that a rare gas such as argon or an inert gas such as nitrogen is used as the high-temperature gas in the GRTA. Alternatively, the heat treatment may be performed with an electric furnace at 500° C. for 30 minutes to 1 hour.

Next, the conductive film is partly removed. For example, a mask is formed over the conductive film by a photolithography method and the conductive film is partly etched, so that the conductive film is partly removed. As a result, the conductive layer 404 is formed.

Next, the insulating layer 402 is formed. As a film formation method, a plasma CVD method, a sputtering method, or the like can be used.

Moreover, in the case where the insulating layer 402 includes an aluminum oxide film, the aluminum oxide film can be directly formed, or an aluminum film is formed and then subjected to oxidation treatment. Examples of the oxidation treatment include oxygen plasma treatment, oxygen doping treatment, and the like.

Next, a conductive film is formed. As a film formation method, a sputtering method or the like can be used. Heat treatment may be performed after the conductive film is formed or the conductive layer 403 is formed. For example, the heat treatment may be performed at 650° C. for one minute to five minutes with a GRTA apparatus which performs heat treatment using a high-temperature gas. Note that a rare gas such as argon or an inert gas such as nitrogen is used as the high-temperature gas in the GRTA. Alternatively, the heat treatment may be performed with an electric furnace at 500° C. for 30 minutes to 1 hour.

Next, the conductive film is partly removed. For example, a mask is formed over the conductive film by a photolithography method and the conductive film is partly etched, so that the conductive film is partly removed. As a result, the conductive layer 403 is formed.

Next, the insulating layer 407 is formed. As a film formation method, a plasma CVD method, a sputtering method, a coating method, or the like can be used.

Next, an opening 411 is formed in the insulating layer 407 and the insulating layer 402. For example, a mask is formed over the insulating layer 407 by a photolithography method and the insulating layer 407 and the insulating layer 402 are partly etched, so that the opening 411 is formed.

Next, a conductive film is formed. As a film formation method, a sputtering method or the like can be used.

Next, the conductive film is partly removed. For example, a mask is formed over the conductive film by a photolithography method and the conductive film is partly etched, so that the conductive film is partly removed. As a result, the conductive layer 408 is formed.

The structure of the transistor of one embodiment of the present invention is not limited to the above-described structure. FIGS. 29A to 29D illustrate modified structural examples of the transistor of one embodiment of the present invention as a transistor 420 and a transistor 430. The transistor 420 and the transistor 430 having the structures illustrated in FIGS. 29A to 29D are also one embodiment of the present invention.

Figure 29A:
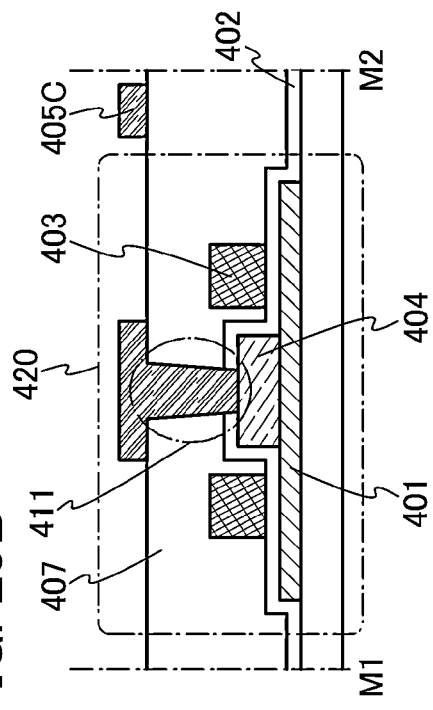
FIGS. 29A to 29D are top views and cross-sectional views illustrating embodiments of a semiconductor device.
Figure 29B:
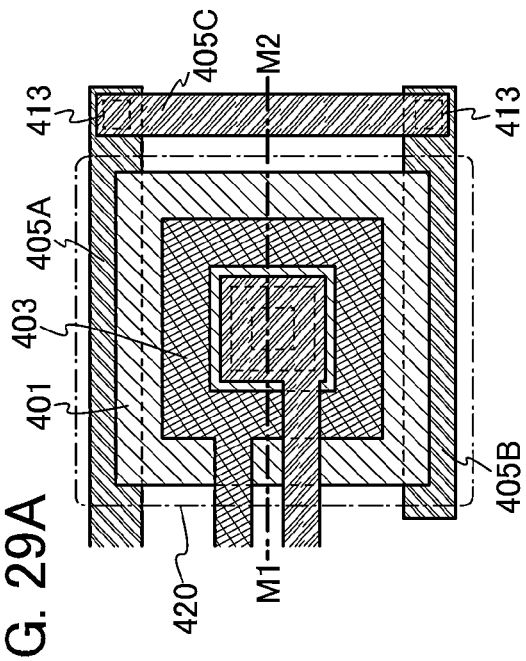
Figure 29C:
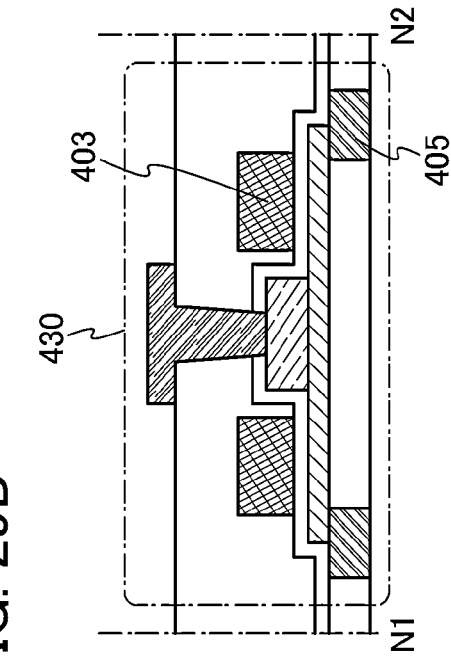

FIG. 29A is a top view of the transistor 420 and FIG. 29B is a cross-sectional view taken along line M1-M2 in FIG. 29A. FIG. 29C is a top view of the transistor 430 and FIG. 29D is a cross-sectional view taken along line N1-N2 in FIG. 29C.

The transistor 420 illustrated in FIGS. 29A and 29B has a structure in which the conductive layer 405 (the other of the source and the drain) included in the transistor 410 in FIGS. 26A to 26C is replaced with conductive portions 405A and 405B and a connection portion 405C. Note that the conductive portions 405A and 405B are conductive layers which are in contact with the oxide semiconductor layer 401, and the connection portion 405C is a conductive layer which is in contact with the conductive portions 405A and 405B through an opening 413 provided in the insulating layer 402 and the insulating layer 407. In the transistor 420 illustrated in FIGS. 29A and 29B, as compared to the case of the transistor 410 illustrated in FIGS. 26A to 26C, a parasitic capacitance generated between the other of the source and the drain and the gate (the conductive layer 403) or between the other of the source and the drain and one of the source and the drain (the conductive layer 404) can be reduced. On the other hand, in the transistor 410 illustrated in FIGS. 26A to 26C, as compared to the case of the transistor 420 illustrated in FIGS. 29A and 29B, the current drive capability can be high (on current can be increased). Specifically, in the transistor 410 illustrated in FIGS. 26A to 26C, as compared to the case of the transistor 420 illustrated in FIGS. 29A and 29B, a contact area between the oxide semiconductor layer 401 and the conductive layer 405 is large. Therefore, in the transistor 410 illustrated in FIGS. 26A to 26C, as compared to the case of the transistor 420 illustrated in FIGS. 29A and 29B, the current drive capability in the case where the conductive layer 405 becomes the source can be high.

Note that a transistor in which part of the structure of the transistor 420 illustrated in FIGS. 29A and 29B is changed is a transistor of one embodiment of the present invention. For example, a transistor including three or more conductive portions which are in contact with the oxide semiconductor layer 401 and electrically connected to each other to serve as the other of the source and the drain is a transistor of one embodiment of the present invention.

Figure 29D:
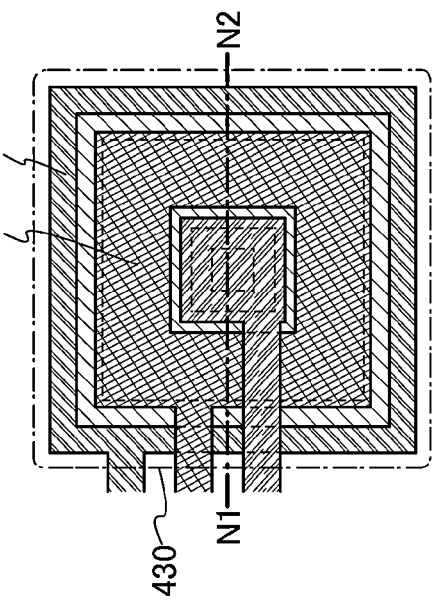

The transistor 430 illustrated in FIGS. 29C and 29D is different from the transistor 410 illustrated in FIGS. 26A to 26C in that part of the conductive layer 403 overlaps with part of the conductive layer 405. In the transistor 430 illustrated in FIGS. 29C and 29D, as compared to the case of the transistor 410 illustrated in FIGS. 26A to 26C, the current drive capability can be high. Specifically, in the transistor 410 illustrated in FIGS. 26A to 26C, a region in the oxide semiconductor layer 401, which does not overlap with the conductive layer 403 (the gate), may become a high-resistant region. In contrast, in the transistor 430 illustrated in FIGS. 29C and 29D, as compared to the case of the transistor 410 illustrated in FIGS. 26A to 26C, there is few region which does not overlap with the conductive layer 403 (the gate). Therefore, in the transistor 420 illustrated in FIGS. 29A and 29B, as compared to the case of the transistor 410 illustrated in FIGS. 26A to 26C, the current drive capability can be high. On the other hand, in the transistor 410 illustrated in FIGS. 26A to 26C, as compared to the case of the transistor 430 illustrated in FIGS. 29A and 29B, a parasitic capacitance generated between the conductive layer 403 and the conductive layer 405 can be reduced.

The manufacturing process of the transistor of one embodiment of the present invention is not limited to the above process. For example, a manufacturing process of a transistor described below is also one embodiment of the present invention.

After the step illustrated in FIGS. 27C1 and 27C2 and before the step illustrated in FIGS. 28A1 and 28A2, in order to remove impurities attached to the surface of the oxide semiconductor layer 401, the cleaning treatment (the treatment for removing impurities) described in the above-described embodiment may be performed. By the cleaning treatment, reduction in resistance of a region in the vicinity of the surface of the oxide semiconductor layer 401 due to the impurities can be suppressed.

Figure 30A:
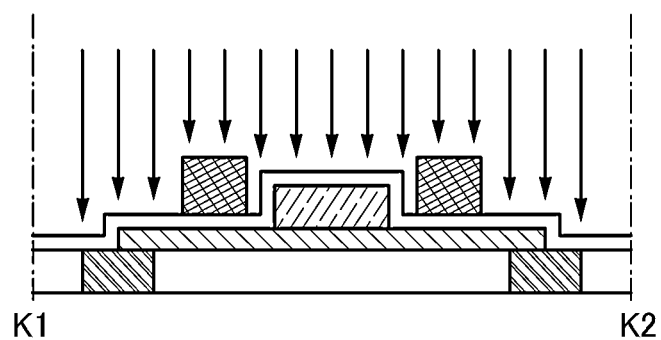
FIGS. 30A and 30B are cross-sectional views illustrating steps for manufacturing a semiconductor device.
Figure 30B:
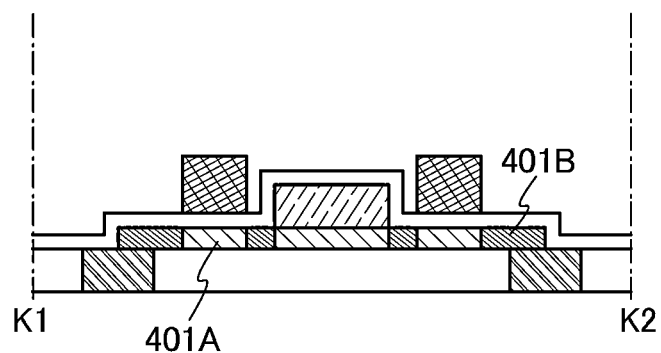

FIGS. 30A and 30B illustrate a modification example of manufacturing process of the transistor of one embodiment of the present invention. Note that here, a manufacturing process in which a step of forming a low-resistant region in the oxide semiconductor layer 401 is added to the manufacturing process of the transistor described with reference to FIGS. 27A1 to 27C2 and FIGS. 28A1 to 28C2 is described with reference to FIGS. 30A and 30B.

After the step illustrated in FIGS. 28A1 and 28A2 and before the step illustrated in FIGS. 28B1 and 28B2, in order to reduce resistance of the oxide semiconductor layer 401, impurities may be implanted. At this time, the conductive layer 403 and the conductive layer 404 serve as masks. As the impurity, one or more of helium, boron, nitrogen, fluorine, neon, aluminum, phosphorus, argon, arsenic, krypton, indium, tin, antimony, and xenon may be added. As the method, an ion implantation method or an ion doping method can be used. In particular, an ion implantation method is preferably used.

The resistance of the region to which the impurity is added is reduced. As a result, in the oxide semiconductor layer 401, a region 401A and a region 401B whose resistance is lower than that of the region 401A are formed.

The step illustrated in FIGS. 30A and 30B is added to the manufacturing process of the transistor illustrated in FIGS. 27A1 to 27C2 and FIGS. 28A1 to 28C2, whereby the current drive capability of a transistor which is to be formed can be high. On the other hand, in the case where the step illustrated in FIGS. 30A and 30B is not performed, the number of manufacturing steps of the transistor can be reduced.

Note that a transistor including the oxide semiconductor layer 401 in which the low-resistant regions are provided as illustrated in FIG. 30B is a transistor of one embodiment of the present invention.

This embodiment can be implemented in appropriate combination with the structures described in the other embodiments.

Embodiment 7

In this embodiment, an example of a semiconductor device which includes the transistor described in this specification, which can hold stored data even when not powered, and which does not have a limitation on the number of write cycles, is described with reference to drawings.

Figure 31A:
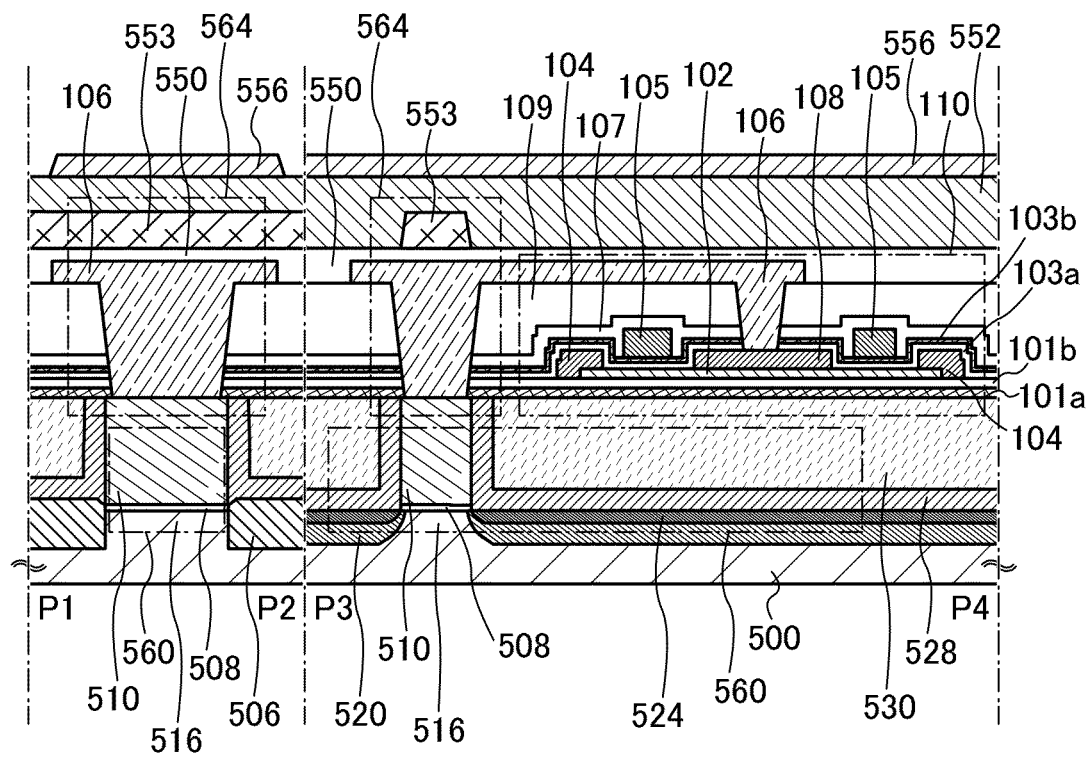
FIGS. 31A to 31C are a cross-sectional view, a top view, and a circuit diagram, illustrating one embodiment of a semiconductor device.
Figure 31B:
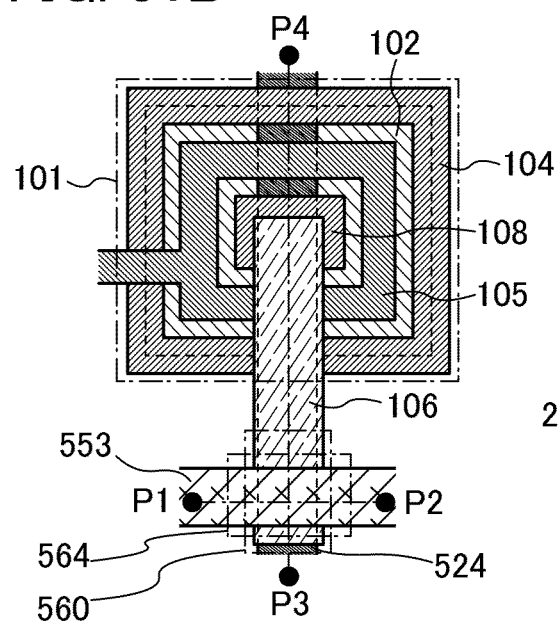
Figure 31C:
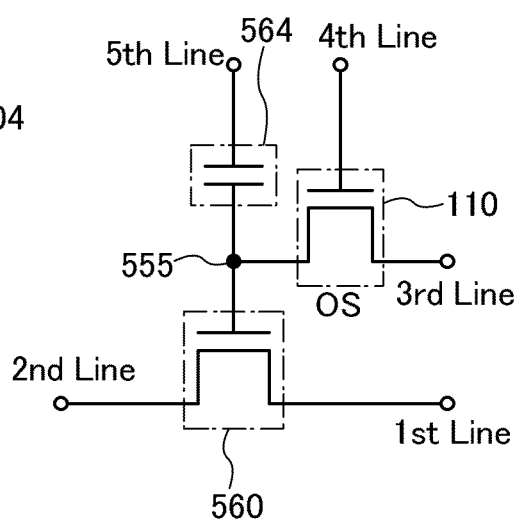

FIGS. 31A to 31C illustrate an example of a structure of a semiconductor device. FIG. 31A is a cross-sectional view of the semiconductor device, FIG. 31B is a top view of the semiconductor device, and FIG. 31C is a circuit diagram of the semiconductor device. Here, FIG. 31A corresponds to a cross section taken along lines P1-P2 and P3-P4 of FIG. 31B.

The semiconductor device illustrated in FIGS. 31A and 31B includes a transistor 560 including a first semiconductor material in a lower portion, and the transistor 110 including a second semiconductor material in an upper portion. The transistor 110 illustrated in FIGS. 31A to 31C is described in Embodiment 1. Note that a transistor having a structure which is different from that of the transistor 110 may be used instead of the transistor 110.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can be used. Besides that the transistor exemplified in this specification is used, specific structures such as the material and the structure of the memory device are not limited to those described in this specification and the like.

The transistor 560 in FIG. 31A includes a channel formation region 516 provided in a substrate 500 including a semiconductor material (e.g., silicon), impurity regions 520 provided such that the channel formation region 516 is sandwiched therebetween, intermetallic compound regions 524 in contact with the impurity regions 520, a gate insulating layer 508 provided over the channel formation region 516, and a gate electrode 510 provided over the gate insulating layer 508. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 506 is provided over the substrate 500 so as to surround the transistor 560, and an insulating layer 528 and an insulating layer 530 are provided to cover the transistor 560. Note that in the transistor 560, a sidewall insulating layer may be formed on side surfaces of the gate electrode 510, and the impurity regions 520 may each include regions having different concentrations of impurities. The element isolation insulating layer 506 can be formed by an element isolation technique such as local oxidation of silicon (LOCOS) and shallow trench isolation (STI).

The transistor 560 formed using a single crystal semiconductor substrate can operate at high speed. Thus, when the transistor is used as a reading transistor, data can be read at a high speed. The insulating layer 528 and the insulating layer 530 are formed to cover the transistor 560. As treatment prior to formation of the transistor 110 and a capacitor 564, CMP treatment is performed on the insulating layer 528 and the insulating layer 530. By performing CMP treatment, the planarity of a surface where the transistor 110 is to be formed later can be improved, and at the same time, a top surface of the gate electrode 510 is exposed.

As the insulating layers 528 and 530, typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating layer 528 and the insulating layer 530 can be formed by a plasma CVD method, a sputtering method, or the like.

Alternatively, an organic material such as polyimide, an acrylic resin, or a benzocyclobutene-based resin can be used. Other than such organic materials, it is also possible to use a low-dielectric constant material (a low-k material) or the like. In the case of using an organic material, the insulating layer 528 and the insulating layer 530 may be formed by a wet method such as a spin coating method or a printing method.

Note that in this embodiment, a silicon nitride film is used as the insulating layer 528, and a silicon oxide film is used as the insulating layer 530.

The first base insulating layer 101a and the second base insulating layer 101b are formed between the transistor 560 and the transistor 110. The first base insulating layer 101a has a function of preventing entry of hydrogen, water, or the like from the transistor 560 to the oxide semiconductor layer 102, and also functions as a blocking layer for suppressing release of oxygen from the oxide semiconductor layer 102. The second base insulating layer 101b is an insulating layer containing excess oxygen so as to supply oxygen to the oxide semiconductor layer 102. Oxygen supplied from the second base insulating layer 101b can fill the oxygen vacancies in the oxide semiconductor layer 102 of the transistor 110, which are formed later.

The insulating layer 528, the insulating layer 530, the first base insulating layer 101a, and the second base insulating layer 101b are provided in the structure illustrated in FIGS. 31A to 31C; in the case where the insulating layer 528 functions as a blocking layer, similarly to the first base insulating layer 101a, and the insulating layer 530 has a function of supplying oxygen to the oxide semiconductor layer 102, similarly to the second base insulating layer 101b, a structure without the first base insulating layer 101a and the second base insulating layer 101b may be employed.

The transistor 110 illustrated in FIG. 31A includes an oxide semiconductor in a channel formation region, as described in Embodiment 1. Here, the oxide semiconductor layer 102 included in the transistor 110 is preferably highly purified. By using a highly purified oxide semiconductor, the transistor 110 which has extremely favorable off-state characteristics can be obtained.

Since the off-state current of the transistor 110 is small, stored data can be held for a long time owing to such a transistor. In other words, power consumption can be sufficiently reduced because a semiconductor device in which refresh operation is unnecessary or the frequency of refresh operation is extremely low can be provided.

In this embodiment, the electrode 108 which serves as the other of the source electrode and the drain electrode is electrically connected to the gate electrode 510 of the transistor 560 through the electrode 106. Note that in order to form an opening reaching the gate electrode 510 of the transistor 560, when an opening reaching the electrode 108 is formed by etching the first gate insulating layer 103a, the second gate insulating layer 103b, the first insulating layer 107, and the second insulating layer 109, an opening is formed in a region over the gate electrode 510 of the transistor 560 in the first gate insulating layer 103a, the second gate insulating layer 103b, the first insulating layer 107, and the second insulating layer 109.

Next, a third conductive film to be the electrode 106 is formed over the second insulating layer 109 to be embedded in the opening. Part of the third conductive film is removed by an etching or the like, so that the electrode 106 electrically connected to the electrode 108 and the gate electrode 510 of the transistor 560 may be formed.

The first insulating layer 107, the second insulating layer 109, and an insulating layer 550 each having a single-layer structure or a stacked structure are provided over the transistor 110. In this embodiment, an aluminum oxide film is used as the insulating layer 550. When the aluminum oxide film has high density (the film density is higher than or equal to 3.2 g/cm$^3$, preferably higher than or equal to 3.6 g/cm$^3$), the transistor 110 can have stable electric characteristics.

In addition, a conductive layer 553 is provided in a region overlapping with the electrode 106 with the insulating layer 550 positioned therebetween, and the electrode 106, the insulating layer 550, and the conductive layer 553 form the capacitor 564. The electrode 106 is electrically connected to the electrode 108 which serves as the other of the source electrode and the drain electrode of the transistor 110; accordingly, it can be said that the electrode 108 which serves as the other of the source electrode and the drain electrode of the transistor 110 functions as one electrode of the capacitor 564. Further, the conductive layer 553 functions as the other electrode of the capacitor 564. Note that in the case where a capacitor is not needed, the capacitor 564 may be omitted. Alternatively, the capacitor 564 may be separately provided above the transistor 110. Alternatively, as illustrated in FIGS. 1A to 1D, the capacitor 564 may be provided over the same plane as the transistor 110.

An insulating layer 552 is provided over the transistor 110 and the capacitor 564. In addition, a wiring 556 for connecting the transistor 110 to another transistor is provided over the insulating layer 552. Although not illustrated in FIG. 31A, through an electrode formed in an opening that is formed in the insulating layer 550, the insulating layer 552, and the like, the wiring 556 is electrically connected to the electrode 104, the electrode 108, or the electrode 106 which is electrically connected to the electrode 108. Here, the electrode is preferably provided so as to partly overlap with at least the oxide semiconductor layer 102 of the transistor 110.

In FIGS. 31A and 31B, the transistor 560 and the transistor 110 are provided so as to at least partly overlap with each other. The source region or the drain region of the transistor 560 is preferably provided so as to overlap with part of the oxide semiconductor layer 102. Further, the transistor 110 and the capacitor 564 are provided so as to overlap with at least part of the transistor 560. For example, the conductive layer 553 of the capacitor 564 is provided so as to overlap with at least part of the gate electrode 510 of the transistor 560. With such a planar layout, the area occupied by the semiconductor device can be reduced; thus, higher integration can be achieved.

Note that the electrical connection between the electrode 106 and the wiring 556 may be established by direct contact of the electrode 106 and the wiring 556 with each other or through an electrode provided in an insulating layer lying between the electrode 106 and the wiring 556. Alternatively, the electrical connection may be established through a plurality of electrodes.

Next, an example of a circuit configuration corresponding to FIGS. 31A and 31B is illustrated in FIG. 31C.

In FIG. 31C, a first wiring (1st Line) is electrically connected to a source electrode of the transistor 560, and a second wiring (2nd Line) is electrically connected to a drain electrode of the transistor 560. A third wiring (3rd Line) is electrically connected to one of the source electrode and the drain electrode of the transistor 110, and a fourth wiring (4th Line) is electrically connected to the gate electrode of the transistor 110. A gate electrode of the transistor 560 and the other of the source electrode and the drain electrode of the transistor 110 are electrically connected to one electrode of the capacitor 564. A fifth wiring (5th Line) is electrically connected to the other electrode of the capacitor 564.

The semiconductor device in FIG. 31C utilizes a characteristic in which the potential of the gate electrode of the transistor 560 can be held, and thus enables data writing, holding, and reading as follows.

Writing and holding of data are described. First, the potential of the fourth wiring is set to a potential at which the transistor 110 is turned on, so that the transistor 110 is turned on. Thus, the potential of the third wiring is supplied to a node 555 to which the gate electrode of the transistor 560 and the one electrode of the capacitor 564 are connected. In other words, predetermined charge is given to the node 555 (writing). Here, one of two kinds of charge providing different potentials (hereinafter referred to as a low-level charge and a high-level charge) is given. After that, the potential of the fourth wiring is set to a potential at which the transistor 110 is turned off, so that the transistor 110 is turned off. Thus, the charge given to the gate electrode of the transistor 560 is held (holding).

Since the off-state current of the transistor 110 is extremely small, the charge of the gate electrode of the transistor 560 is held for a long time.

Next, reading of data is described. By supplying an appropriate potential (reading potential) to the fifth wiring while a predetermined potential (constant potential) is supplied to the first wiring, the potential of the second wiring varies depending on the amount of charge held in the node 555. This is because in general, when the transistor 560 is an n-channel transistor, an apparent threshold voltage $V_{th\_H}$ in the case where a high-level charge is given to the gate electrode of the transistor 560 is lower than an apparent threshold voltage $V_{th\_L}$ in the case where a low-level charge is given to the gate electrode of the transistor 560. Here, an apparent threshold voltage refers to the potential of the fifth wiring, which is needed to turn on the transistor 560. Thus, the potential of the fifth wiring is set to a potential $V_0$ that is between $V_{th\_H}$ and $V_{th\_L}$, whereby charge given to the gate electrode of the transistor 560 can be determined. For example, in the case where a high-level charge is given in writing, when the potential of the fifth wiring is set to $V_0$ ($>V_{th\_H}$), the transistor 560 is turned on. In the case where a low-level charge is given in writing, even when the potential of the fifth wiring is set to $V_0$ ($<V_{th\_L}$), the transistor 560 remains in an off state. Therefore, the stored data can be read by the potential of the second wiring.

Note that in the case where memory cells are arrayed to be used, only data of desired memory cells needs to be read. In the case where such reading is not performed, a potential at which the transistor 560 is turned off regardless of the state of the gate electrode of the transistor 560, that is, a potential lower than $V_{th\_H}$ may be supplied to the fifth wiring. Alternatively, a potential at which the transistor 560 is turned on regardless of the state of the gate electrode of the transistor 560, that is, a potential higher than $V_{th\_L}$ may be supplied to the fifth wiring.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, according to this embodiment, a transistor which can suppress generation of a parasitic channel can be obtained.

Further, according to this embodiment, by using the transistor, a semiconductor device having improved operation characteristics can be provided.

The structures, methods, and the like described in this embodiment can be combined as appropriate with any of the structures, methods, and the like described in the other embodiments.

Embodiment 8

In this embodiment, a semiconductor device which includes the transistor described in this specification can hold stored data even when not powered, and does not have a limitation on the number of write cycles, and which has a structure different from the structure described in Embodiment 7 is described.

Figure 32:
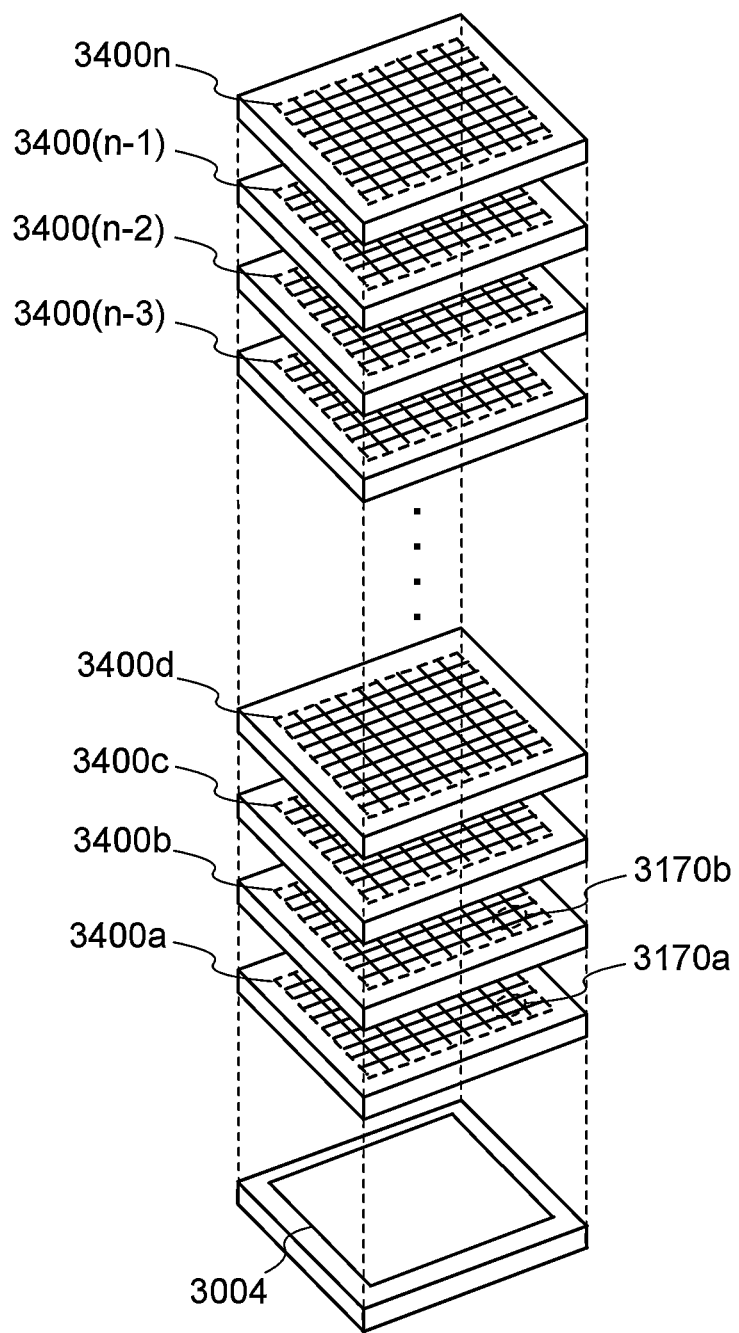
FIG. 32 is a perspective view illustrating one embodiment of a semiconductor device.

FIG. 32 is a perspective view of a semiconductor device. The semiconductor device illustrated in FIG. 32 includes a plurality of layers of memory cell arrays (memory cell arrays 3400a to 3400n (note that n is an integer greater than or equal to 2)) each including a plurality of memory cells as memory circuits in the upper portion, and a logic circuit 3004 in the lower portion which is necessary for operating the memory cell arrays 3400a to 3400n.

Figure 33:
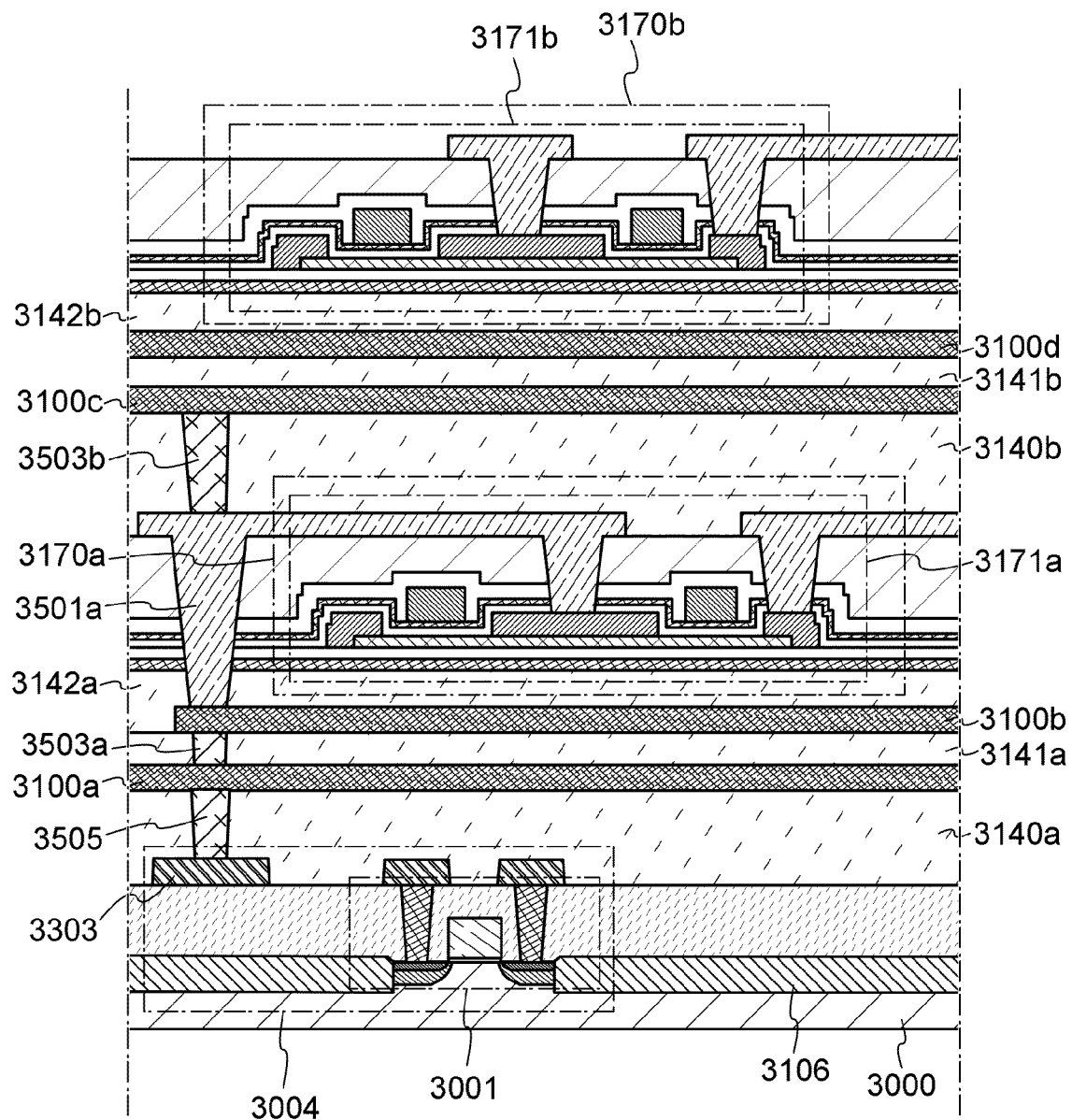
FIG. 33 is a cross-sectional view illustrating one embodiment of a semiconductor device.

FIG. 33 is a partial enlarged view of the semiconductor device illustrated in FIG. 32. FIG. 33 illustrates the logic circuit 3004, the memory cell array 3400a, and the memory cell array 3400b, and illustrates a memory cell 3170a and a memory cell 3170b as typical examples among the plurality of memory cells included in the memory cell array 3400a and the memory cell array 3400b. The memory cell 3170a and the memory cell 3170b can have a configuration similar to the circuit configuration described in Embodiment 7, for example.

Note that a transistor included in the memory cell 3170a is represented as a transistor 3171a. A transistor included in the memory cell 3170b is represented as a transistor 3171b. Each of the transistors 3171a and 3171b includes a channel formation region in an oxide semiconductor layer. The structure of the transistor in which the channel formation region is formed in the oxide semiconductor layer is the same as the structure described in any of the above-described embodiments, and thus the description of the structure is omitted.

Note that in FIG. 33, an example in which the transistor 110 described in Embodiment 1 is used as the transistor 3171a and the transistor 3171b is shown; however, a transistor other than the transistor 110 can be used.

The logic circuit 3004 includes a transistor 3001 in which a semiconductor material other than an oxide semiconductor is used for a channel formation region.

Here, a "semiconductor material other than an oxide semiconductor" is equivalent to a "first semiconductor material" (e.g., silicon) whose band gap differs from that of an oxide semiconductor, a second semiconductor material, as described in the above-described embodiment. A transistor including a first semiconductor material can easily operate at high speed. On the other hand, a transistor including an oxide semiconductor, a second semiconductor material, enables charge to be held for a long time owing to its characteristics.

The transistor 3001 can be a transistor obtained in such a manner that an element isolation insulating layer 3116 is provided on a substrate 3000 including a semiconductor material (e.g., silicon) and a region serving as the channel formation region is formed in a region surrounded by the element isolation insulating layer 3116. Note that the transistor 3001 may be a transistor whose channel formation region is formed in a semiconductor film, such as a silicon film, formed on an insulating surface or in a silicon film of an SOI substrate. A known structure can be used as the structure of the transistor 3001 and thus the description is omitted.

A wiring 3100a and a wiring 3100b are formed between layers in which the transistor 3171a is formed and layers in which the transistor 3001 is formed. An insulating layer 3140a is provided between the wiring 3100a and the layers in which the transistor 3001 is formed. An insulating layer 3141a is provided between the wiring 3100a and the wiring 3100b. An insulating layer 3142a is provided between the wiring 3100b and the layers in which the transistor 3171a is formed.

Similarly, a wiring 3100c and a wiring 3100d are formed between layers in which the transistor 3171b is formed and the layers in which the transistor 3171a is formed. An insulating layer 3140b is provided between the wiring 3100c and the layers in which the transistor 3171a is formed. An insulating layer 3141b is provided between the wiring 3100c and the wiring 3100d. An insulating layer 3142b is provided between the wiring 3100d and the layers in which the transistor 3171b is formed.

The insulating layers 3140a, 3141a, 3142a, 3140b, 3141b, and 3142b each function as an interlayer insulating film whose surface can be planarized.

The wirings 3100a, 3100b, 3100c, and 3100d enable electrical connection between the memory cells, electrical connection between the logic circuit 3004 and the memory cells, and the like.

An electrode 3303 included in the logic circuit 3004 can be electrically connected to a circuit provided in the upper portion.

For example, as illustrated in FIG. 33, the electrode 3303 can be electrically connected to the wiring 3100a via an electrode 3505. The wiring 3100a can be electrically connected to the wiring 3100b via an electrode 3503a. The wiring 3100b can be electrically connected to an electrode 3501a, which is electrically connected to a source electrode and a drain electrode of the transistor 3171a. In this manner, the wiring 3100a and the electrode 3303 can be electrically connected to the source or the drain of the transistor 3171a. The electrode 3501a can be electrically connected to the wiring 3100c via an electrode 3503b.

Although FIG. 33 each illustrate the example in which two memory cells (the memory cell 3170a and the memory cell 3170b) are stacked, the number of memory cells to be stacked is not limited thereto.

FIG. 33 each illustrate an example in which the electrode 3303 and the transistor 3171a are electrically connected to each other through the wiring 3100a; however, one embodiment of the disclosed invention is not limited thereto. The electrode 3303 may be electrically connected to the transistor 3171a through the wiring 3100b, through both the wiring 3100a and the wiring 3100b, or through another electrode without using the wiring 3100a nor the wiring 3100b.

FIG. 33 each illustrate the structure where two wirings, i.e., the wiring 3100a and the wiring 3100b are provided between the layers in which the transistor 3171a is formed and the layers in which the transistor 3001 is formed; however, the number of wirings provided therebetween is not limited to two. One wiring or three or more wirings may be provided between the layers in which the transistor 3171*a* is formed and the layers in which the transistor 3001 is formed.

FIG. 33 each illustrate the structure where two wirings, i.e., the wiring 3100*c* and the wiring 3100*d* are provided between the layers in which the transistor 3171*b* is formed and the layers in which the transistor 3171*a* is formed; however, the number of wirings provided therebetween is not limited to two. One wiring or three or more wirings may be provided between the layers in which the transistor 3171*b* is formed and the layers in which the transistor 3171*a* is formed.

As described in this embodiment, a plurality of transistors formed using an oxide semiconductor layer, which includes the second semiconductor material, is stacked over a transistor including the first semiconductor material whose band gap differs from that of the oxide semiconductor, the second semiconductor material. Channel formation regions of the plurality of transistors are formed in respective regions of the single oxide semiconductor layer. Another plurality of transistors including channel formation regions in respective regions of another single oxide semiconductor layer may be further provided over the plurality of transistors including the channel formations regions in the respective regions of the single oxide semiconductor layer, with an insulating layer provided therebetween. Structures which can be applied to the transistors are described in Embodiments 1 to 3.

As described above, according to this embodiment, a transistor which can suppress generation of a parasitic channel can be obtained.

Further, according to this embodiment, by using the transistor, a semiconductor device having improved operation characteristics can be provided.

The structures, methods, and the like described in this embodiment can be combined as appropriate with any of the structures, methods, and the like described in the other embodiments.

Embodiment 9

In this embodiment, an example of a semiconductor device which includes the transistor described in this specification, which can hold stored data even when not powered, and which does not have a limitation on the number of write cycles, is described with reference to drawings.

Figure 34A:
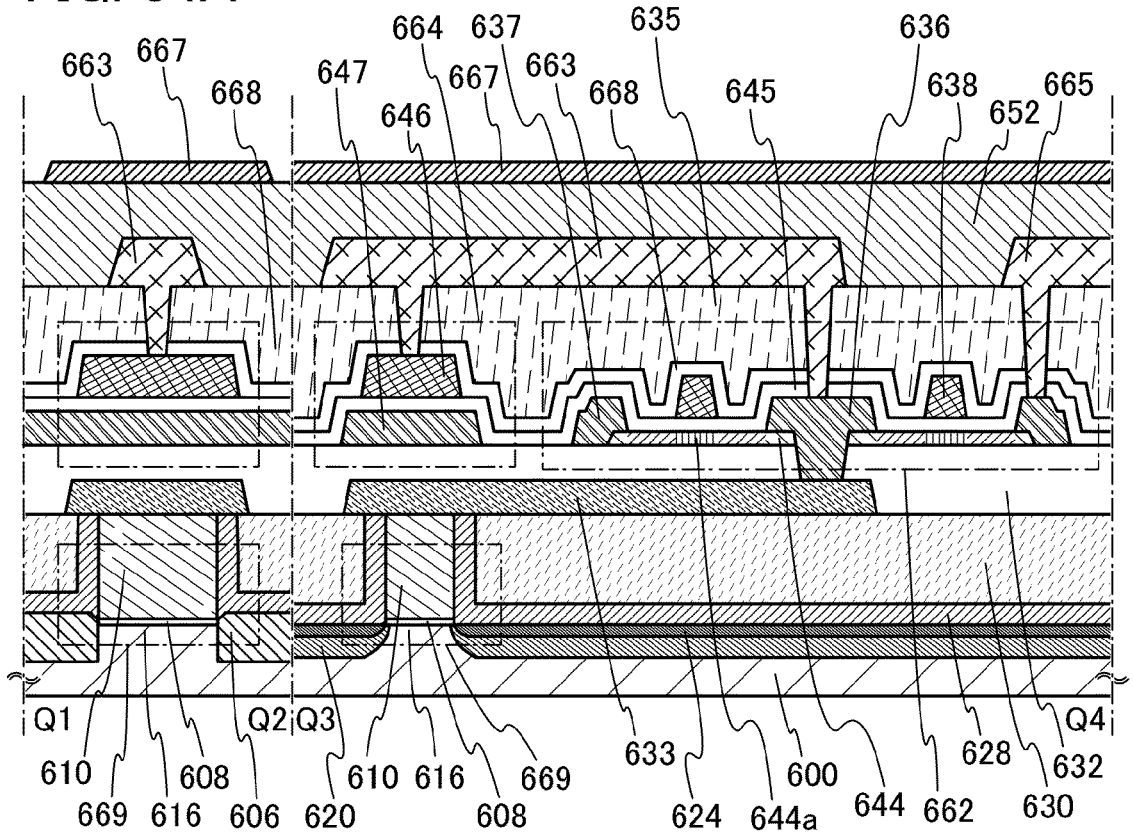
FIGS. 34A to 34C are a cross-sectional view, a top view, and a circuit diagram, illustrating one embodiment of a semiconductor device.
Figure 34B:
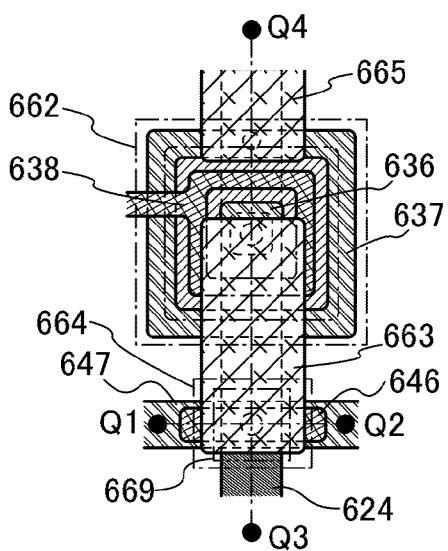
Figure 34C:
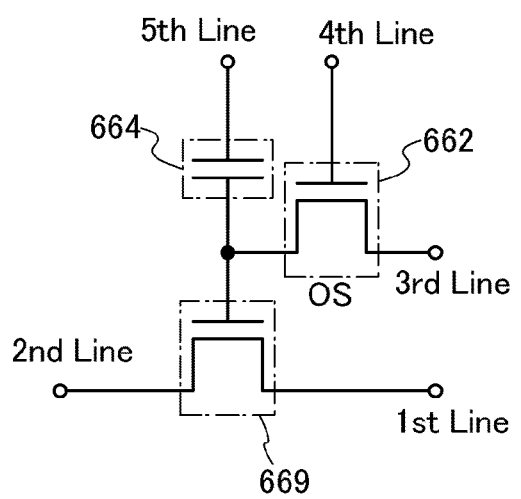

FIGS. 34A to 34C illustrate an example of a structure of a semiconductor device. FIG. 34A is a cross-sectional view of the semiconductor device, FIG. 34B is a top view of the semiconductor device, and FIG. 34C is a circuit diagram of the semiconductor device. Here, FIG. 34A corresponds to a cross section along line Q1-Q2 and line Q3-Q4 in FIG. 34B. Note that in FIG. 34B, some components of the semiconductor device illustrated in FIG. 34A are omitted for clarity.

The semiconductor device illustrated in FIGS. 34A and 34B includes a transistor 669 including a first semiconductor material in a lower portion, and a transistor 662 including a second semiconductor material in an upper portion. In this embodiment, an example in which the transistor 250 disclosed in Embodiment 3 is used as the transistor 662 is shown.

Here, the first semiconductor material and the second semiconductor material are preferably materials having different band gaps. For example, the first semiconductor material may be a semiconductor material (e.g., silicon) other than an oxide semiconductor and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can be used. Besides that the transistor exemplified in this specification is used, specific structures such as the material and the structure of the memory device are not limited to those described in this specification and the like.

The transistor 669 in FIG. 34A includes a channel formation region 616 provided over a substrate 600 including a semiconductor material (e.g., silicon), impurity regions 620 with the channel formation region 616 provided therebetween, intermetallic compound regions 624 in contact with the impurity regions 620, a gate insulating layer 608 provided over the channel formation region 616, and a gate electrode 610 provided over the gate insulating layer 608. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 606 is provided over the substrate 600 to surround the transistor 669. An insulating layer 628 and an insulating layer 630 are provided to cover the transistor 669. Note that, in the transistor 669, the sidewall insulating layer may be formed on side surfaces of the gate electrode 610 and the impurity regions 620 may include a region having a different impurity concentration. Note that the element isolation insulating layer 606 can be formed by an element isolation technique such as LOCOS and STI.

The transistor 669 formed using a single crystal semiconductor substrate can operate at high speed. Thus, when the transistor is used as a reading transistor, data can be read at a high speed. As treatment prior to formation of the transistor 662 and a capacitor 664, CMP treatment is performed on two insulating layers formed to cover the transistor 669, whereby the insulating layer 628 and the insulating layer 630 which are planarized are formed and, at the same time, an upper surface of the gate electrode 610 is exposed.

For the insulating layer 628 and the insulating layer 630, typically, an inorganic insulating material such as silicon oxide, silicon oxynitride, aluminum oxide, aluminum oxynitride, silicon nitride, aluminum nitride, silicon nitride oxide, or aluminum nitride oxide can be used. The insulating layer 628 and the insulating layer 630 can be formed by a plasma CVD method, a sputtering method, or the like.

Alternatively, an organic material such as polyimide, an acrylic resin, or a benzocyclobutene-based resin can be used. Other than such organic materials, it is also possible to use a low-dielectric constant material (a low-k material) or the like. In the case of using an organic material, a wet process such as a spin coating method or a printing method may be used to form the insulating layer 628 and the insulating layer 630.

Note that in this embodiment, silicon nitride film is used as the insulating layer 628, and silicon oxide film is used as the insulating layer 630.

Planarization treatment is preferably performed on a surface of the insulating layer 630 which is to be the formation region of an oxide semiconductor layer 644. In this embodiment, the oxide semiconductor layer 644 is formed over the insulating layer 630 which is sufficiently planarized by polishing treatment such as CMP treatment (the average surface roughness of the surface of the insulating layer 630 is preferably less than or equal to 0.15 nm).

The transistor 662 illustrated in FIG. 34A includes an oxide semiconductor in the channel formation region. The transistor 662 includes an oxide semiconductor layer 644, a ring-like gate electrode 638, a source electrode 636, a ring-like drain electrode 637, and an insulating layer 661 functioning as a gate insulating layer. Here, the oxide semiconductor layer 644 included in the transistor 662 is preferably formed using an i-type or substantially i-type oxide semiconductor for the channel formation region 644a. By using an i-type oxide semiconductor for a channel formation region 644a, the transistor 662 which has extremely favorable off-state characteristics can be obtained.

Since the off-state current of the transistor 662 is small, stored data can be held for a long time owing to such a transistor. In other words, power consumption can be sufficiently reduced because a semiconductor device in which refresh operation is unnecessary or the frequency of refresh operation is extremely low can be provided.

An insulating layer 635 and an insulating layer 668 each of which has a single-layer structure or a stacked structure are provided over the transistor 662. In this embodiment, an aluminum oxide is used as the insulating layer 668. When the aluminum oxide has high density (layer density of 3.2 g/cm$^3$ or more, preferably 3.6 g/cm$^3$ or more), the transistor 662 can have stable electric characteristics.

A wiring 647 formed using the same layer as the drain electrode 637 and an electrode 646 formed using the same layer as the gate electrode 638 overlap with each other with the insulating layer 661 provided therebetween to form the capacitor 664. That is, the transistor 662 and the capacitor can be formed over the same plane. The wiring 647 functions as one electrode of the capacitor 664, and the electrode 646 functions as the other electrode of the capacitor 664. Note that the capacitor 664 may be omitted if a capacitor is not needed.

The wiring 663 and the wiring 665 can be formed over the insulating layer 635 in the same step. Further, the electrode 646 and the source electrode 636 are electrically connected to each other through the wiring 663 provided in an opening formed in the insulating layer 635, the insulating layer 668, and the insulating layer 661. Furthermore, the wiring 665 is electrically connected to the drain electrode 637 through another opening formed in the insulating layer 635, the insulating layer 668, and the insulating layer 661.

An insulating layer 652 is provided over the transistor 662 and the capacitor 664. Further, a wiring 667 may be provided over the insulating layer 652 as necessary. Although not illustrated in FIG. 34A, the wiring 667 may be electrically connected to the wiring 663 through an opening formed in the insulating layer 652. Here, the electrode is preferably provided so as to partly overlap with at least the oxide semiconductor layer 644 of the transistor 662.

Alternatively, the wiring 667 may be electrically connected to the gate electrode 638, the source electrode 636, or the drain electrode 637. The electrical connection between the wiring 667 and the gate electrode 638, the source electrode 636, or the drain electrode 637 may be established by direct contact of the wiring 667 and the gate electrode 638, the source electrode 636, or the drain electrode 637 or through an electrode provided in an insulating layer lying between the wiring 667 and the gate electrode 638, the source electrode 636, or the drain electrode 637. Alternatively, the electrical connection may be established through a plurality of electrodes.

The source electrode 636 included in the transistor 662 is electrically connected to the wiring 633 through an opening formed in the insulating layer 632. Further, the wiring 633 is electrically connected to the gate electrode 610 of the transistor 669. That is, the source electrode 636 is electrically connected to the gate electrode 610. Alternatively, the transistor 669 and the transistor 662 may be overlapped with each other and the source electrode 636 included in the transistor 669 may be directly connected to the gate electrode 610 included in the transistor 662 without using the wiring 633. By overlapping the transistor 669 and the transistor 662 with each other, the area occupied by the semiconductor device can be reduced; thus, higher integration can be achieved.

Next, an example of a circuit configuration corresponding to FIGS. 34A and 34B is illustrated in FIG. 34C.

In FIG. 34C, a first wiring (1st Line) is electrically connected to a source electrode of the transistor 669. A second wiring (2nd Line) is electrically connected to a drain electrode of the transistor 669. A third wiring (3rd Line) and one of a source electrode and a drain electrode of the transistor 662 are electrically connected to each other, and a fourth wiring (4th Line) and a gate electrode of the transistor 662 are electrically connected to each other. A gate electrode of the transistor 669 and the other of the source electrode and the drain electrode of the transistor 662 are electrically connected to one electrode of the capacitor 664. A fifth line (5th Line) and the other electrode of the capacitor 664 are electrically connected to each other.

The semiconductor device in FIG. 34C utilizes a characteristic in which the potential of the gate electrode of the transistor 669 can be held, and thus enables data writing, holding, and reading as follows.

Writing and holding of data will be described. First, the potential of the fourth wiring is set to a potential at which the transistor 662 is turned on, so that the transistor 662 is turned on. Accordingly, the potential of the third wiring is supplied to the gate electrode of the transistor 669 and the capacitor 664. That is, predetermined charge is given to the gate electrode of the transistor 669 (writing). Here, charge for supply of a potential level or charge for supply of a different potential level (hereinafter referred to as Low level charge and High level charge) is given. After that, the potential of the fourth wiring is set to a potential at which the transistor 662 is turned off, so that the transistor 662 is turned off. Thus, the charge given to the gate electrode of the transistor 669 is held (storing).

Since the amount of off-state current of the transistor 662 is extremely small, the charge of the gate electrode of the transistor 669 is held for a long time.

Next, reading data will be described. By supplying an appropriate potential (reading potential) to the fifth wiring while a predetermined potential (constant potential) is supplied to the first wiring, the potential of the second wiring fluctuates depending on the amount of charge held in the gate electrode of the transistor 669. This is because in general, when the transistor 669 is an n-channel transistor, an apparent threshold voltage $V_{th\_H}$ in the case where a high-level charge is given to the gate electrode of the transistor 669 is lower than an apparent threshold voltage $V_{th\_L}$ in the case where a low-level charge is given to the gate electrode of the transistor 669. Here, an apparent threshold voltage refers to the potential of the fifth wiring, which is needed to turn on the transistor 669. Thus, the potential of the fifth wiring is set to a potential $V_0$ which is between $V_{th\_H}$ and $V_{th\_L}$, whereby charge given to the gate electrode of the transistor 669 can be determined. For example, in the case where a high-level charge is given in writing, when the potential of the fifth wiring is set to $V_0$ ($>V_{th\_H}$), the transistor 669 is turned on. In the case where a low level charge is given in writing, even when the potential of the fifth wiring is set to $V_0$ ($<V_{th\_L}$), the transistor 669 remains in an off state. Therefore, the stored data can be read by the potential of the second wiring.

Note that in the case where memory cells are arrayed to be used, only data of desired memory cells needs to be read. In the case where such reading is not performed, a potential at which the transistor 669 is turned off, that is, a potential smaller than $V_{th\_H}$ may be given to the fifth wiring regardless of the state of the gate electrode of the transistor 669. Alternatively, a potential which allows the transistor 360 to be turned on regardless of a state of the gate electrode, that is, a potential higher than $V_{th\_L}$ may be applied to the fifth wiring.

When a transistor having a channel formation region formed using an oxide semiconductor and having extremely small off-state current is employed in the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

In this manner, by using a transistor including an oxide semiconductor, a nonvolatile random access memory can be provided.

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having high electric characteristics can be provided.

This embodiment can be implemented in appropriate combination with the structures described in the other embodiments.

Embodiment 10

In this embodiment, a semiconductor device including the transistor described in the above embodiment, which can hold stored data even when not powered, which does not have a limitation on the number of write cycles and which has a structure different from the structure described in Embodiment 9 is described with reference to FIGS. 35A and 35B and FIGS. 36A and 36B.

Figure 35A:
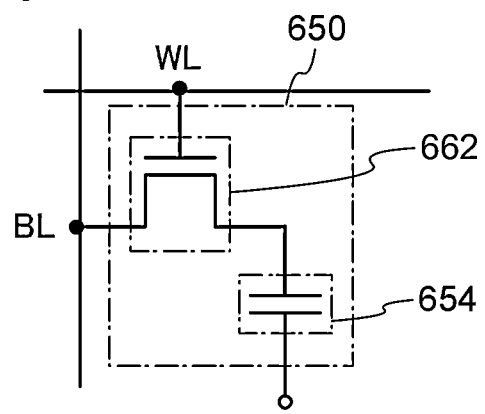
FIGS. 35A and 35B are a circuit diagram and a perspective view illustrating one embodiment of a semiconductor device.
Figure 35B:
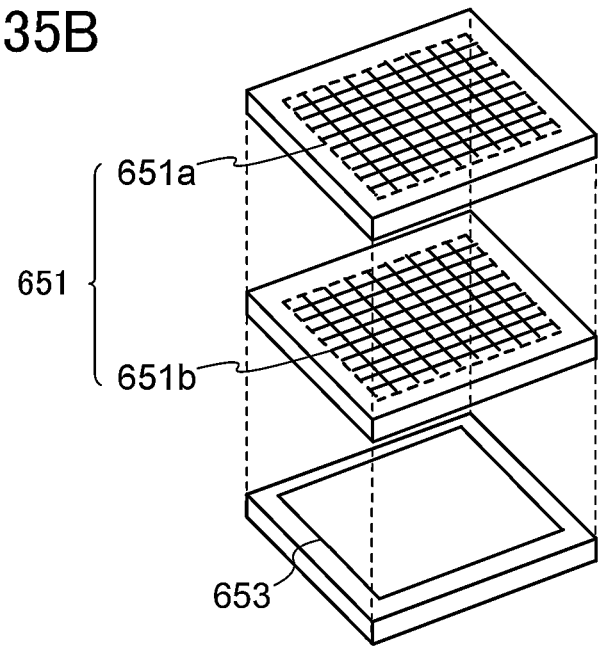

FIG. 35A illustrates an example of a circuit configuration of a semiconductor device, and FIG. 35B is a conceptual diagram illustrating an example of a semiconductor device. First, the semiconductor device illustrated in FIG. 35A will be described, and then, the semiconductor device illustrated in FIG. 35B is described.

In the semiconductor device illustrated in FIG. 35A, a bit line BL is electrically connected to a source electrode or a drain electrode of the transistor 662, a word line WL is electrically connected to the gate electrode of the transistor 662, and the source electrode or the drain electrode of the transistor 662 is electrically connected to a first terminal of a capacitor 654.

Next, writing and holding of data in the semiconductor device (a memory cell 650) illustrated in FIG. 35A will be described.

First, the potential of the word line WL is set to a potential at which the transistor 662 is turned on, and the transistor 662 is turned on. Accordingly, the potential of the bit line BL is supplied to the first terminal of the capacitor 654 (writing). After that, the potential of the word line WL is set to a potential at which the transistor 662 is turned off, so that the transistor 662 is turned off. Thus, the potential at the first terminal of the capacitor 654 is held (holding).

In addition, the amount of off-state current is extremely small in the transistor 662 which uses an oxide semiconductor. For that reason, the potential of the first terminal of the capacitor 654 (or a charge accumulated in the capacitor 654) can be held for an extremely long period by turning off the transistor 662.

Next, reading of data will be described. When the transistor 662 is turned on, the bit line BL which is in a floating state and the capacitor 654 are electrically connected to each other, and the charge is redistributed between the bit line BL and the capacitor 654. As a result, the potential of the bit line BL is changed. The amount of change in potential of the bit line BL varies depending on the potential of the first terminal of the capacitor 654 (or the charge accumulated in the capacitor 654).

For example, the potential of the bit line BL after charge redistribution is $(C_B \times V_{B0} + C \times V)/(C_B + C)$, where V is the potential of the first terminal of the capacitor 654, C is the capacitance of the capacitor 654, $C_B$ is the capacitance of the bit line BL (hereinafter also referred to as bit line capacitance), and $V_{B0}$ is the potential of the bit line BL before the charge redistribution. Therefore, it can be found that assuming that the memory cell 650 is in either of two states in which the potentials of the first terminal of the capacitor 654 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 35A can hold charge that is accumulated in the capacitor 654 for a long time because the off-state current of the transistor 662 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 35B will be described.

The semiconductor device illustrated in FIG. 35B includes a memory cell array 651 (memory cell arrays 651a and 651b) including a plurality of memory cells 650 illustrated in FIG. 35A as memory circuits in the upper portion, and a peripheral circuit 653 in the lower portion, which is necessary for operating the memory cell array 651 (the memory cell arrays 651a and 651b). Note that the peripheral circuit 653 is electrically connected to the memory cell array 651.

In the structure illustrated in FIG. 35B, the peripheral circuit 653 can be provided under the memory cell array 651. Thus, the size of the semiconductor device can be decreased.

It is preferable that a semiconductor material of the transistor provided in the peripheral circuit 653 be different from that of the transistor 662. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 35B illustrates, as an example, the semiconductor device in which two memory cell arrays 651 (the memory cell array 651a and the memory cell array 651b) are stacked; however, the number of stacked memory cell arrays is not limited thereto. Three or more memory cell arrays may be stacked.

Next, a specific structure of the memory cell 650 illustrated in FIG. 35A will be described with reference to FIGS. 36A and 36B.

Figure 36A:
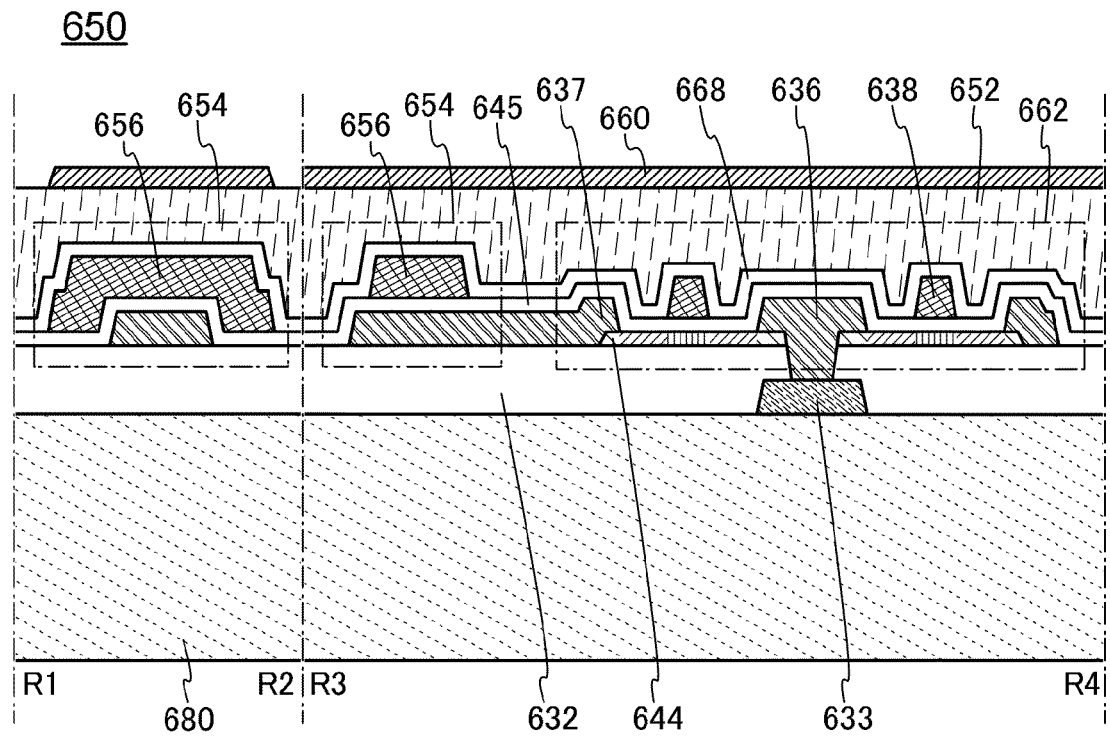
FIGS. 36A and 36B are a cross-sectional view and a top view illustrating one embodiment of a semiconductor device.
Figure 36B:
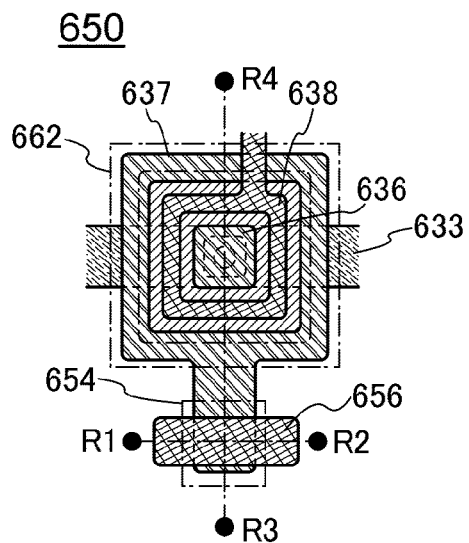

FIGS. 36A and 36B illustrate an example of a structure of the memory cell 650. FIG. 36A is a cross-sectional view of the memory cell 650, and FIG. 36B is a top view of the memory cell 650. Here, FIG. 36A corresponds to a cross section taken along lines R1-R2 and R3-R4 of FIG. 36B. Note that in FIG. 36B, some components are omitted for easy understanding.

The transistor 662 in FIGS. 36A and 36B can have the same structure as the transistor in the above embodiment.

The wiring 633 is formed over an insulating layer 680, and the insulating layer 632 is formed over the wiring 633. The transistor 662 provided over the insulating layer 632 is covered with the insulating layer 668 and the insulating layer 652. Further, the wiring 633 is provided in a region overlapping with the source electrode 636 of the transistor 662 with the insulating layer 632 therebetween. The source electrode 636 and the wiring 633 are electrically connected to each other through an opening formed in the insulating layer 632.

The wiring 656 is provided in a region overlapping with the drain electrode 637 of the transistor 662, with the insulating layer 645 provided therebetween. The drain electrode 637, the insulating layer 645, and the wiring 656 form the capacitor 654. That is, the drain electrode 637 functions as one electrode of the capacitor 654, the wiring 656 functions as the other electrode of the capacitor 654, and the insulating layer 645 functions as a dielectric.

A wiring 660 for connecting the memory cell 650 to an adjacent memory cell 650 is provided over the insulating layer 652 covering the transistor 662 and the capacitor 654. Although not illustrated, the wiring 660 may be electrically connected to the gate electrode 638 through an opening provided in the insulating layer 652 and the insulating layer 668. The wiring 660 may be electrically connected to the source electrode 636 or the drain electrode 637 of the transistor 662 through an opening provided in the insulating layer 652, the insulating layer 668, and the insulating layer 661. Note that the wiring 660 in this embodiment corresponds to the bit line BL in the circuit diagram of FIG. 35A.

In FIGS. 36A and 36B, the wiring 633 may be electrically connected to the source electrode 636 of the transistor included in the adjacent memory cell. With such a planar layout, the area occupied by the semiconductor device can be reduced; thus, higher integration can be achieved.

When the planar layout in FIG. 36B is employed, the area occupied by the semiconductor device can be reduced; thus, the degree of integration can be increased.

Figure 37:
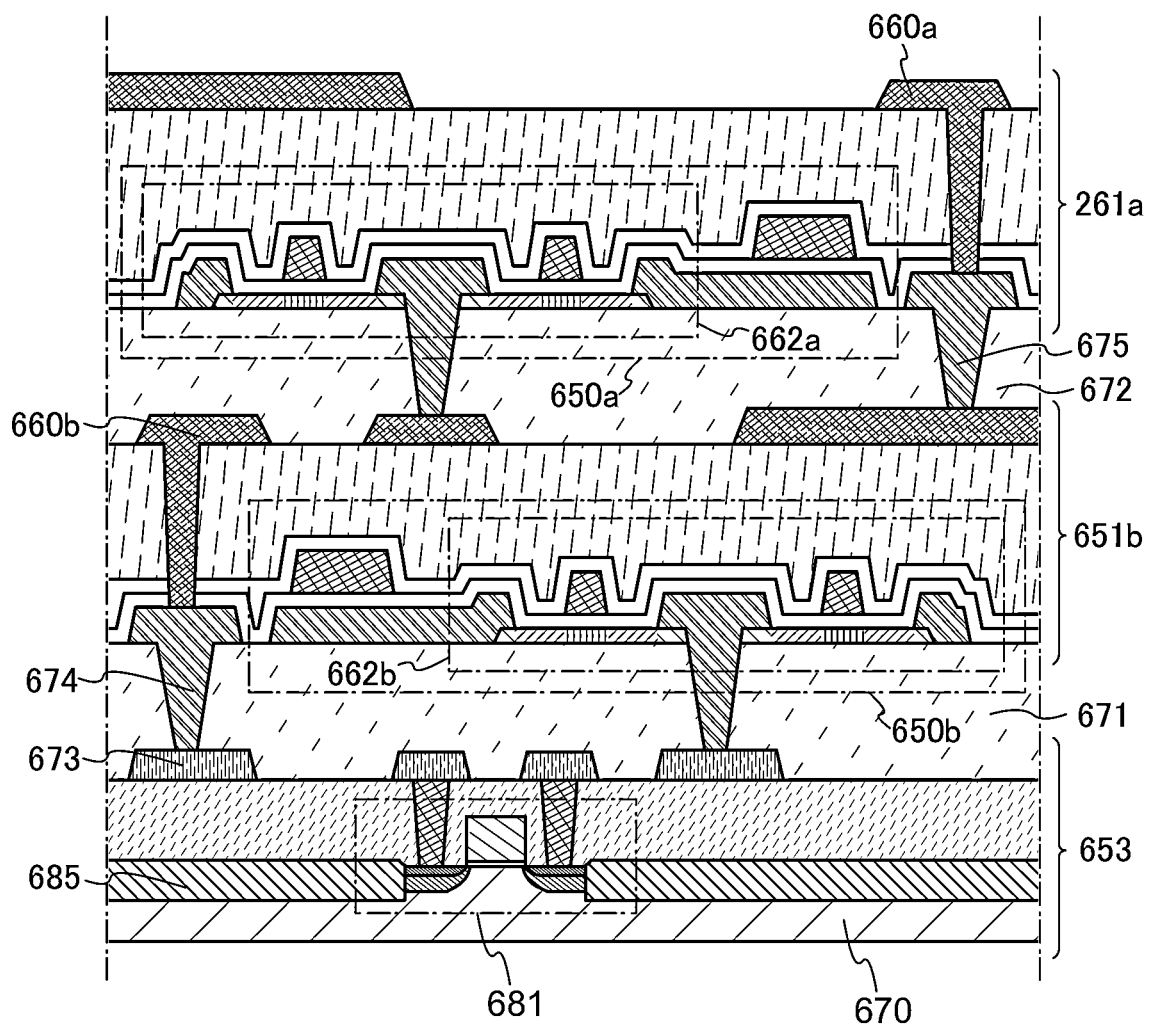
FIG. 37 is a cross-sectional view illustrating one embodiment of a semiconductor device.

FIG. 37 is a cross-sectional view illustrating an example of a stacked structure of the semiconductor device illustrated in FIG. 35B. In FIG. 37, part of a stacked structure of the peripheral circuit 653, the memory cell array 651a, and the memory cell array 651b is illustrated. In FIG. 37, one of a plurality of memory cells 650 of the memory cell array 651a is shown as a memory cell 650a. One of a plurality of memory cells 650 of the memory cell array 651b is shown as a memory cell 650b. The transistor 662 of the memory cell 650a is shown as a transistor 662a, and the transistor 662 of the memory cell 650b is shown as a transistor 662b.

A transistor 681 included in the peripheral circuit 653 is provided in a substrate 670 formed using a material other than an oxide semiconductor (e.g., silicon). The transistor 681 can be a transistor obtained by forming a region to be a channel formation region in a region surrounded by an element isolation insulating layer 685. Note that the transistor 681 may be a transistor whose channel formation region is formed in a semiconductor layer, such as a silicon layer, formed on an insulating surface or in a silicon layer of an SOI substrate. A known structure can be used as the structure of the transistor 681 and thus the description is omitted.

The memory cell array 651b is formed over the peripheral circuit 653 with an insulating layer 671 provided therebetween, and the memory cell array 651a is formed over the memory cell array 651b with an insulating layer 672 provided therebetween. The memory cell array 651a can be electrically connected to another circuit through a wiring 660a.

The insulating layer 671 and the insulating layer 672 each function as an interlayer insulating layer whose surface can be planarized.

The peripheral circuit 653, the memory cell array 651a, and the memory cell array 651b are electrically connected to one another through a wiring 673, a wiring 674, a wiring 675, and a wiring 660b.

The transistor 662a and the transistor 662b are each formed using an oxide semiconductor. Since the amount of off-state current of the transistor including an oxide semiconductor is small, stored data can be held for a long time owing to such a transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose amount of off-state current is sufficiently small). In addition, with a structure where the peripheral circuit and the memory circuit are stacked, the degree of integration of the semiconductor device can be increased.

As described above, a miniaturized and highly-integrated semiconductor device having high electric characteristics and a method for manufacturing the semiconductor device can be provided. Further, a semiconductor device can be provided at low cost and high yield because the semiconductor device can be manufactured by a smaller number of photolithography processes than the conventional one.

This embodiment can be implemented in appropriate combination with the structures described in the other embodiments.

Embodiment 11

In this embodiment, an example of a semiconductor device (memory device) which includes a transistor according to one embodiment of the present invention, which can hold stored data even when not powered, and which has an unlimited number of write cycles will be described with reference to drawings.

Figure 38A:
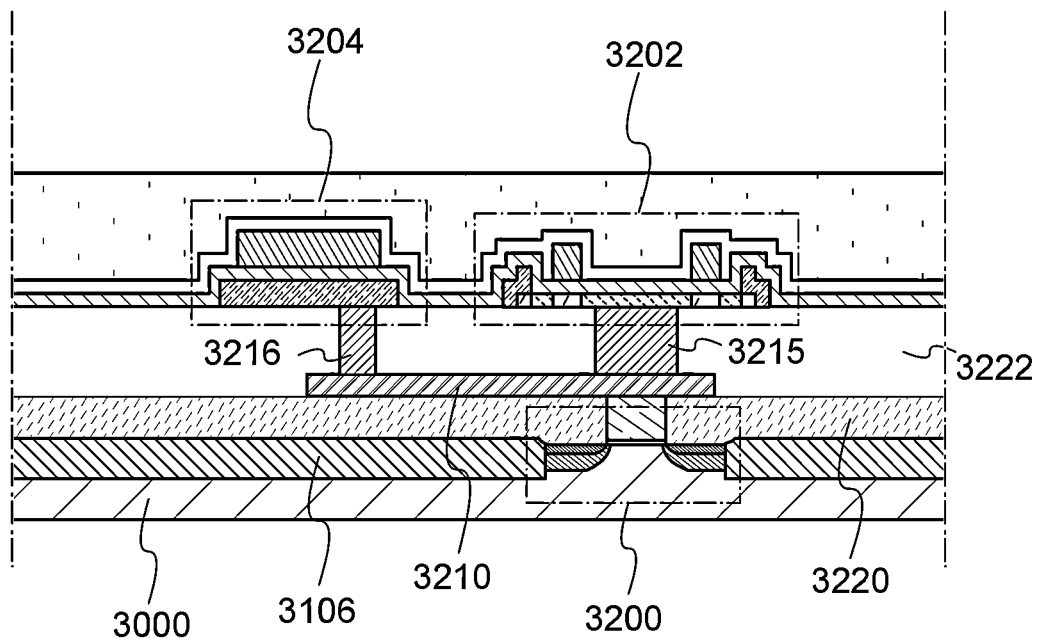
FIGS. 38A and 38B are a cross-sectional view and a circuit diagram illustrating one embodiment of a semiconductor device.
Figure 38B:
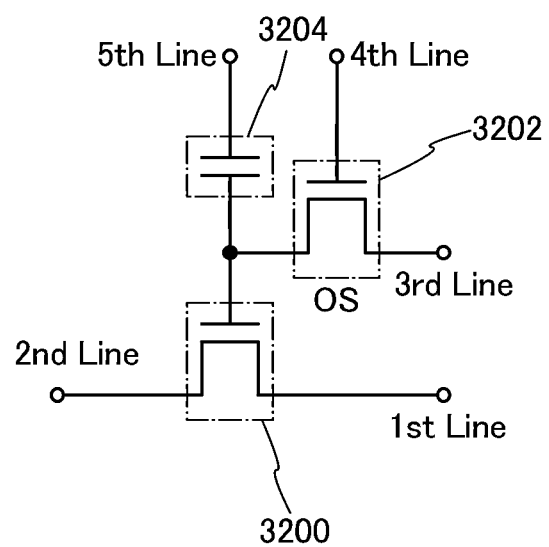

FIGS. 38A and 38B illustrate an example of a configuration of the semiconductor device. FIG. 38A is a cross-sectional view of the semiconductor device, and FIG. 38B is a circuit diagram of the semiconductor device.

The semiconductor device illustrated in FIGS. 38A and 38B includes a transistor 3200 including a first semiconductor material in a lower portion, and a transistor 3202 including a second semiconductor material and a capacitor 3204 in an upper portion.

In this embodiment, an example where the transistor 310 and the capacitor 350 which are disclosed in Embodiment 5 are used as the transistor 3202 and the capacitor 3204 is described.

Here, the first semiconductor material and the second semiconductor material are preferably materials having different band gaps. For example, the first semiconductor material may be a semiconductor material (such as silicon) other than an oxide semiconductor, and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can be used. Besides that the transistor exemplified in this specification is used, specific structures such as the material and the structure of the memory device are not limited to those described in this specification and the like.

The transistor 3200 in FIG. 38A includes a channel formation region provided in a substrate 3000 including a semiconductor material (such as crystalline silicon), impurity regions provided such that the channel formation region is sandwiched therebetween, intermetallic compound regions provided in contact with the impurity regions, a gate insulating layer provided over the channel formation region, and a gate electrode provided over the gate insulating layer. Note that a transistor whose source electrode and drain electrode are not illustrated in a drawing may also be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, in this specification, the term "source electrode" may include a source region.

Further, an element isolation insulating layer 3116 is formed on the substrate 3000 so as to surround the transistor 3200, and an insulating layer 3220 is formed so as to cover the transistor 3200. Note that the element isolation insulating layer 3116 can be formed by an element isolation technique such as LOCOS and STI.

For example, the transistor 3200 formed using a crystalline silicon substrate can operate at high speed. Thus, when the transistor is used as a reading transistor, data can be read at high speed. As treatment prior to formation of the transistor 3202 and the capacitor 3204, CMP treatment is performed on the insulating layer 3220 covering the transistor 3200, whereby the insulating layer 3220 is planarized and, at the same time, an upper surface of the gate electrode of the transistor 3200 is exposed.

A connection wiring 3210 which is electrically connected to a gate electrode of the transistor 3200 and an insulating layer 3222 are provided over the gate electrode.

Further, a plurality of contact holes is formed in the insulating layer 3222, and a contact plug 3215 electrically connected to the transistor 3202 and a contact plug 3216 electrically connected to one electrode of the capacitor 3204 are formed in the contact holes. Note that as described in Embodiment 5, the contact plug 3215 functions as the source electrode of the transistor 3202.

Note that the capacitor may be formed using the connection wiring 3210, the insulating layer 3222, and a conductive layer which can be formed at the same time as the drain electrode of the transistor 3202 (e.g., a layer which is in contact with a contact plug in the capacitor 3204). In that case, the contact plug 3216 is not needed.

The transistor 3202 in FIG. 38A is a bottom-gate transistor in which a channel is formed in an oxide semiconductor layer. Since the off-state current of the transistor 3202 is small, stored data can be held for a long time owing to such a transistor. In other words, refresh operation becomes unnecessary or the frequency of the refresh operation in a semiconductor memory device can be extremely lowered, which leads to a sufficient reduction in power consumption.

As illustrated in FIG. 38A, the transistor 3200 and the transistor 3202 can be formed to overlap with each other; therefore, the area occupied by these transistors can be reduced. Accordingly, the degree of integration of the semiconductor device can be increased.

Next, an example of a circuit configuration corresponding to FIG. 38A is illustrated in FIG. 38B.

In FIG. 38B, a first wiring (1st Line) is electrically connected to a source electrode of the transistor 3200, and a second wiring (2nd Line) is electrically connected to a drain electrode of the transistor 3200. A third wiring (3rd Line) is electrically connected to one of the source electrode and the drain electrode of the transistor 3202, and a fourth wiring (4th Line) is electrically connected to the gate electrode of the transistor 3202. A gate electrode of the transistor 3200 and the other of the source electrode and the drain electrode of the transistor 3202 are electrically connected to one electrode of the capacitor 3204. A fifth wiring (5th Line) is electrically connected to the other electrode of the capacitor 3204.

The semiconductor device in FIG. 38B utilizes a characteristic in which the potential of the gate electrode of the transistor 3200 can be held, and thus enables data writing, holding, and reading as follows.

Writing and holding of data are described. First, the potential of the fourth wiring is set to a potential at which the transistor 3202 is turned on, so that the transistor 3202 is turned on. Thus, the potential of the third wiring is supplied to the gate electrode of the transistor 3200 and the capacitor 3204. In other words, predetermined charge is given to gate electrode of the transistor 3200 (writing). Here, one of two kinds of charge providing different potentials (hereinafter referred to as a low-level charge and a high-level charge) is given. After that, the potential of the fourth wiring is set to a potential at which the transistor 3202 is turned off, so that the transistor 3202 is turned off. Thus, the charge given to the gate electrode of the transistor 3200 is held (holding).

Since the off-state current of the transistor 3202 is extremely small, the charge of the gate electrode of the transistor 3200 is held for a long time.

Next, reading of data is described. By supplying an appropriate potential (reading potential) to the fifth wiring while a predetermined potential (constant potential) is supplied to the first wiring, the potential of the second wiring varies depending on the amount of charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$, in the case where a low-level charge is given to the gate electrode of the transistor 3200. Here, an apparent threshold voltage refers to the potential of the fifth wiring, which is needed to turn on the transistor 3200. Thus, the potential of the fifth wiring is set to a potential $V_0$ that is between $V_{th\_H}$ and $V_{th\_L}$, whereby charge given to the gate electrode of the transistor 3200 can be determined. For example, in the case where a high-level charge is given in writing, when the potential of the fifth wiring is set to $V_0$ ($>V_{th\_H}$), the transistor 3200 is turned on. In the case where a low-level charge is given in writing, even when the potential of the fifth wiring is set to $V_0$ ($<V_{th\_L}$), the transistor 3200 remains in an off state. Therefore, the stored data can be read by the potential of the second wiring.

Note that in the case where memory cells are arrayed to be used, only data of desired memory cells needs to be read. In the case where such reading is not performed, a potential at which the transistor 3200 is turned off regardless of the state of the gate electrode of the transistor 3200, that is, a potential lower than $V_{th\_H}$ may be supplied to the fifth wiring. Alternatively, a potential at which the transistor 3200 is turned on regardless of the state of the gate electrode of the transistor 3200, that is, a potential higher than $V_{th\_L}$ may be supplied to the fifth wiring.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having high electric characteristics and a method for manufacturing the semiconductor device can be provided.

The structures, methods, and the like described in this embodiment can be combined as appropriate with any of the structures, methods, and the like described in the other embodiments.

Embodiment 12

In this embodiment, a semiconductor device including the transistor described in Embodiment 5, which can hold stored data even when not powered, which does not have a limitation on the number of write cycles, and which has a structure different from the structure described in Embodiment 11 will be described.

Figure 39A:
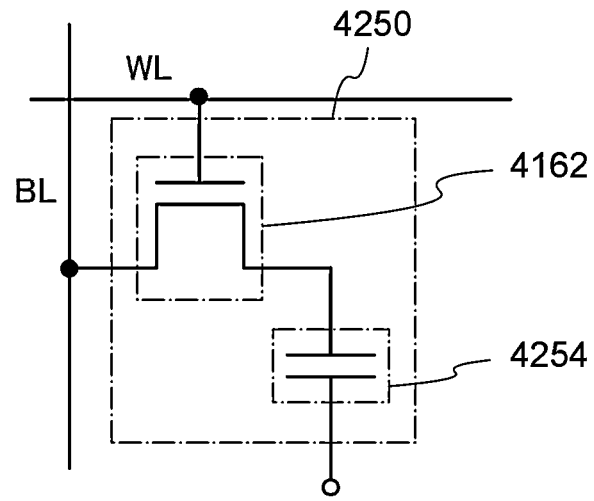
FIGS. 39A and 39B are a circuit diagram and a perspective view illustrating one embodiment of a semiconductor device.
Figure 39B:
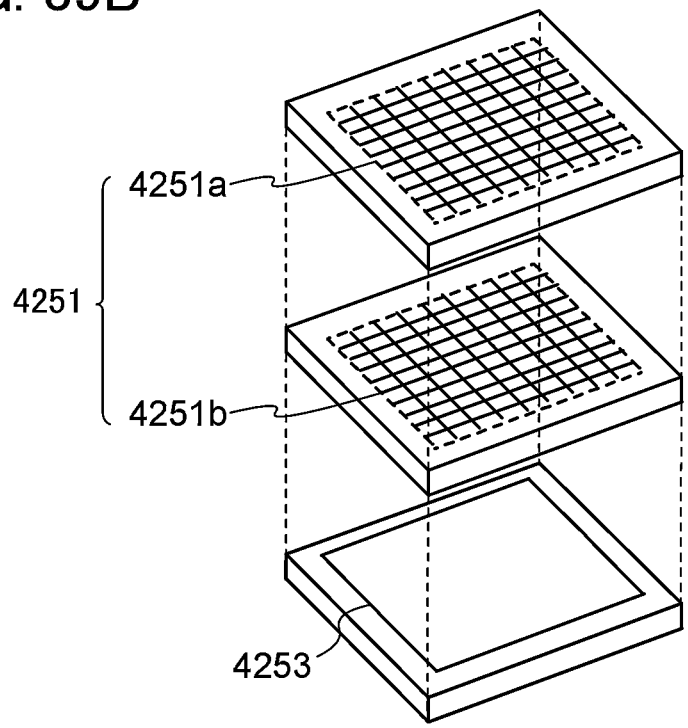

FIG. 39A illustrates an example of a circuit configuration of a semiconductor device, and FIG. 39B is a conceptual diagram illustrating an example of a semiconductor device.

Note that as a transistor 4162 and a capacitor 4254 included in the semiconductor device, the transistor and the capacitor described in Embodiment 5 can be used.

In the semiconductor device illustrated in FIG. 39A, a bit line BL is electrically connected to a source electrode of the transistor 4162, a word line WL is electrically connected to a gate electrode of the transistor 4162, and a drain electrode of the transistor 4162 is electrically connected to one terminal of the capacitor 4254.

Next, writing and holding of data in the semiconductor device (a memory cell 4250) illustrated in FIG. 39A will be described.

First, the potential of the word line WL is set to a potential at which the transistor 4162 is turned on, and the transistor 4162 is turned on. Accordingly, the potential of the bit line BL is supplied to the one terminal of the capacitor 4254 (writing). After that, the potential of the word line WL is set to a potential at which the transistor 4162 is turned off, so that the transistor 4162 is turned off. Thus, the potential at the one terminal of the capacitor 4254 is held (holding).

In addition, the amount of off-state current is extremely small in the transistor 4162 which uses an oxide semiconductor. For that reason, the potential of the first terminal of the capacitor 4254 (or a charge accumulated in the capacitor 4254) can be held for an extremely long period by turning off the transistor 4162.

Next, reading of data will be described. When the transistor 4162 is turned on, the bit line BL which is in a floating state and the capacitor 4254 are electrically connected to each other, and the charge is redistributed between the bit line BL and the capacitor 4254. As a result, the potential of the bit line BL is changed. The amount of change in potential of the bit line BL varies depending on the potential of the first terminal of the capacitor 4254 (or the charge accumulated in the capacitor 4254).

For example, the potential of the bit line BL after charge redistribution is $(C_B \times V_{B0} + C \times V)/(C_B + C)$, where V is the potential of the first terminal of the capacitor 4254, C is the capacitance of the capacitor 4254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 4250 is in either of two states in which the potentials of the first terminal of the capacitor 4254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 39A can hold charge that is accumulated in the capacitor 4254 for a long time because the off-state current of the transistor 4162 is extremely small. In other words, refresh operation becomes unnecessary or the frequency of the refresh operation can be extremely lowered, which leads to a sufficient reduction in power consumption. Moreover, stored data can be held for a long period even when power is not supplied.

Next, the semiconductor device illustrated in FIG. 39B will be described.

The semiconductor device illustrated in FIG. 39B includes a memory cell array 4251 (memory cell arrays 4251a and 4251b) including a plurality of memory cells 4250 illustrated in FIG. 39A as memory circuits in the upper portion, and a peripheral circuit 4253 in the lower portion, which is necessary for operating the memory cell array 4251. Note that the peripheral circuit 4253 is electrically connected to the memory cell array 4251.

In the structure illustrated in FIG. 39B, the peripheral circuit 4253 can be provided under the memory cell array 4251. Thus, the size of the semiconductor device can be decreased.

It is preferable that a semiconductor material of the transistor provided in the peripheral circuit 4253 be different from that of the transistor 4162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 39B illustrates, as an example, the semiconductor device in which the memory cell array 4251 has a stack of the memory cell array 4251a and the memory cell array 4251b; however, the number of stacked memory cell arrays is not limited to two. For the memory cell array 4251, a stack of three or more memory cell arrays may be used, or only one memory cell array may be used.

Next, a specific structure of the memory cell 4250 illustrated in FIG. 39A will be described with reference to FIG. 40.

Figure 40:
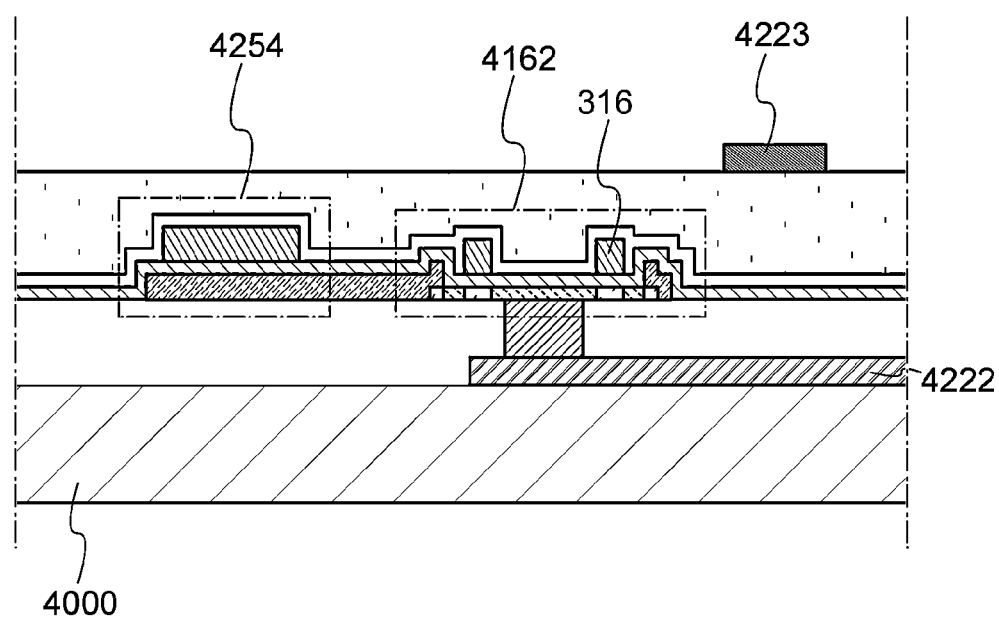
FIG. 40 is a cross-sectional view illustrating one embodiment of a semiconductor device.

FIG. 40 is a cross-sectional view of an example of a structure of the memory cell 4250 formed over a substrate 4000. In FIG. 40, the source electrode of the transistor 4162 is electrically connected to a wiring 4222 (a bit line BL), and the drain electrode of the transistor 4162 is electrically connected to one electrode of the capacitor 4254. Further, the gate electrode of the transistor 4162 (the third electrode 316) is electrically connected to a wiring 4223 (a word line WL) in a region which is not illustrated.

Note that a structure in which the drain electrode of the transistor 4162 and the one electrode of the capacitor 4254 are formed by a continuous layer is described; however, the drain electrode of the transistor 4162 and the one electrode of the capacitor 4254 may be electrically connected to each other through another connection wiring or the like. Further, an example in which the wiring 4222 is used as the bit line BL is shown; however, another wiring which is electrically connected to the wiring 4222 through a contact plug or the like may be used as the bit line BL.

Note that the substrate 4000 is replaced with a substrate including a peripheral circuit for driving the memory cell 4250 and the components of the memory cell 4250 and the peripheral circuit are electrically connected to each other, whereby the semiconductor device illustrated in FIG. 39B can be formed. As described above, the number of stacked memory cell arrays 4251 is not limited as long as the memory cell arrays 4251 are electrically connected to the peripheral circuit so that each memory cell array can be driven.

The transistor 4162 is formed using an oxide semiconductor. Since the amount of off-state current of the transistor including an oxide semiconductor is small, stored data can be held for a long time. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose amount of off-state current is sufficiently small). In addition, with a structure where the peripheral circuit and the memory circuit are stacked, the degree of integration of the semiconductor device can be increased.

As described above, a miniaturized and highly-integrated semiconductor device having high electric characteristics can be provided.

This embodiment can be implemented in appropriate combination with the structures described in the other embodiments.

Embodiment 13

In this embodiment, an example of a semiconductor device (memory device) which includes a transistor according to one embodiment of the present invention, which can hold stored data even when not powered, and which has an unlimited number of write cycles will be described with reference to FIGS. 41A and 41B and FIGS. 42A and 42B.

Figure 41A:
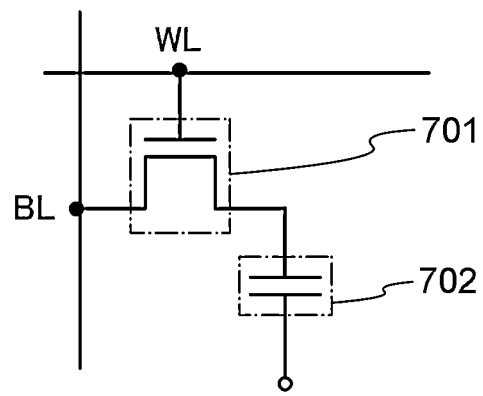
FIGS. 41A and 41B are a circuit diagram and a perspective view illustrating one embodiment of a semiconductor device.
Figure 41B:
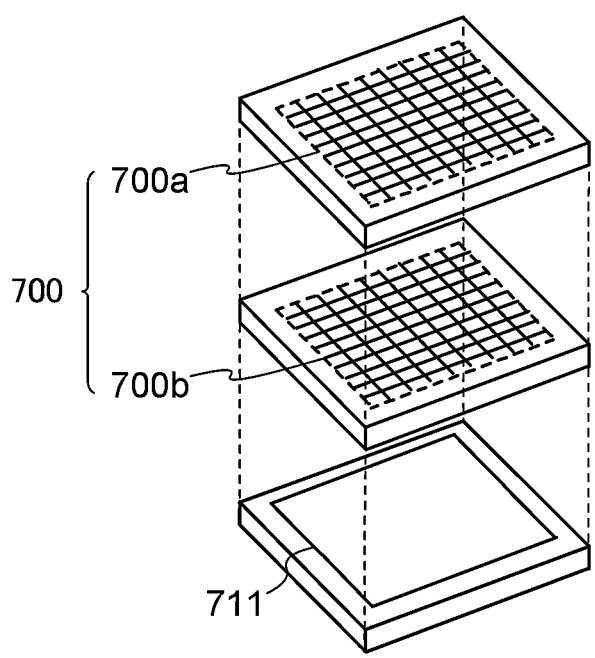

FIG. 41A illustrates an example of a circuit configuration of a memory cell included in a memory device, and FIG. 41B is a conceptual diagram illustrating an example of a memory device. First, the memory cell of the memory device illustrated in FIG. 41A is described, and then, the memory device illustrated in FIG. 41B is described.

In the memory cell illustrated in FIG. 41A, a bit line BL is electrically connected to a source or a drain of the transistor 701, a word line WL is electrically connected to a gate of the transistor 701, and a source or a drain of the transistor 701 is electrically connected to one electrode of the capacitor 702. Note that in the memory device illustrated in FIGS. 41A and 41B, any of the above-described transistors is used as the transistor 701.

Next, writing and holding data in the memory cell illustrated in FIG. 41A will be described.

First, writing of data will be described.

The potential of the word line WL is set to a potential at which the transistor 701 is turned on, and the transistor 701 is turned on. Accordingly, the potential of the bit line BL is supplied to one electrode of the capacitor 702 (writing). After that, the potential of the word line WL is set to a potential at which the transistor 701 is turned off, so that the transistor 701 is turned off. Thus, the potential at the one electrode of the capacitor 702 is held (holding).

In addition, the amount of off-state current is extremely small in the transistor 701 in which a channel is formed in an oxide semiconductor layer. For that reason, the potential of the one electrode of the capacitor 702 (or a charge accumulated in the capacitor 702) can be held for an extremely long period by turning off the transistor 701.

Next, reading of data will be described.

The bit line BL is put in a floating state. Then, the potential of the word line WL is set to a potential at which the transistor 701 is turned on, so that the transistor 701 is turned on. Thus, the bit line BL which is in a floating state and the one electrode of the capacitor 702 are electrically connected to each other, and the charge is redistributed between the bit line BL and the capacitor 702. As a result, the potential of the bit line BL is changed. The amount of change in potential of the bit line BL varies depending on the potential of the one electrode of the capacitor 702 (or the charge accumulated in the capacitor 702).

For example, the potential of the bit line BL after charge redistribution is $(C_B \times V_{B0} + C \times V)/(C_B + C)$, where V is the potential of the one electrode of the capacitor 702, C is the capacitance of the capacitor 702, $C_B$ is the capacitance of the bit line BL (hereinafter also referred to as bit line capacitance), and $V_{B0}$ is the potential of the bit line BL before the charge redistribution. Therefore, it can be found that assuming that the memory cell is in either of two states in which the potentials of the one electrode of the capacitor 702 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the memory device illustrated in FIG. 41A can hold charge that is accumulated in the capacitor 702 for a long time because the off-state current of the transistor 701 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 41B will be described.

The memory device illustrated in FIG. 41B includes a memory cell arrays 700*a* and 700*b* each including the plurality of memory cell arrays illustrated in FIG. 41A in an upper portion, and includes a peripheral circuit 711 which is needed for operating a memory cell array 700 (including the memory cell arrays 700*a* and 700*b*) in a lower portion. Note that the peripheral circuit 711 is electrically connected to the memory cell array 700.

In the structure illustrated in FIG. 41B, the peripheral circuit 711 can be provided under the memory cell array 700. Thus, the size of the memory device can be decreased.

It is preferable that a semiconductor material of the transistor provided in the peripheral circuit 711 be different from that of the transistor 701. For example, silicon, germanium, silicon germanium, silicon carbide, gallium arsenide, or the like can be used, and a single crystal semiconductor is preferably used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 41B illustrates, as an example, the memory device in which two memory cell arrays (the memory cell array 700*a* and the memory cell array 700*b*) are stacked; however, the number of stacked memory cell arrays is not limited thereto. Three or more memory cell arrays may be stacked. It is also possible that the memory device includes a single memory cell array (only the memory cell array 700*a*).

By the way, a magnetic tunnel junction element (an MTJ element) is known as a nonvolatile random access memory. The MTJ element stores data in a low resistance state when the magnetization directions of ferromagnetic films provided above and below an insulating film are parallel, and stores data in a high resistance state when the spin directions are anti-parallel. Thus, its operation principle is quite different from that of a memory including an oxide semiconductor described in this embodiment. Table 1 shows comparison between the MTJ element and the above-described memory device.

TABLE 1

|   |   | Spintronics (magnetic) | Oxide semiconductor/Si |
|---|---|---|---|
| 1) | Heat resistance | Unstable | Extremely stable (up to 150° C.) |
| 2) | Driving method | Current drive | Voltage drive |
| 3) | Principle of writing operation | Change Spin Direction of Magnetic Substance | On/off of FET |
| 4) | Si LSI | Suitable for bipolar LSI (MOS transistor is preferred in high integration circuit (Bipolar transistor is unsuitable for High Integration), W is large) | Suitable for MOS LSI |
| 5) | Power for Overhead | High | Charge and discharge of parasitic capacitance |
|   |   | Joule heat is needed | Smaller by 2 or 3 or more orders of magnitude |
| 6) | Non-volatility | Utilizing Spin | Utilizing small off-state current |
| 7) | Number of times of reading operation | Unlimited | Unlimited |
| 8) | 3D conversion | Difficult (2 layers at most) | Easy (No limitation on the number of layers) |
| 9) | Degree of integration ($F^2$) | $15F^2$ | Depending on the degree of 3D conversion |
| 10) | Material | Magnetic Rare earth (strategic material) | Oxide semiconductor material |
| 11) | Resistance to magnetic field | Low | High |

As shown in Table 1, the memory in which a transistor including an oxide semiconductor and a transistor including silicon are combined is significantly different from the spintronics device in the driving method, the principle of writing operation, the material, and the like.

Further, as shown in Table 1, the memory in which the transistor including an oxide semiconductor and the transistor including silicon are combined has advantages over the spintronics device in many aspects such as the heat resistance, the 3D conversion (stacked-layer structure of three or more layers), and the resistance to a magnetic field. Note that the power for overhead shown in Table 1 is, for example, power for writing data into a memory portion or the like in a processor, which is what is called power consumed for overhead.

As described above, the use of the memory including an oxide semiconductor, which has more advantages than the spintronics device makes it possible to reduce power consumption of a CPU.

Figure 42A:
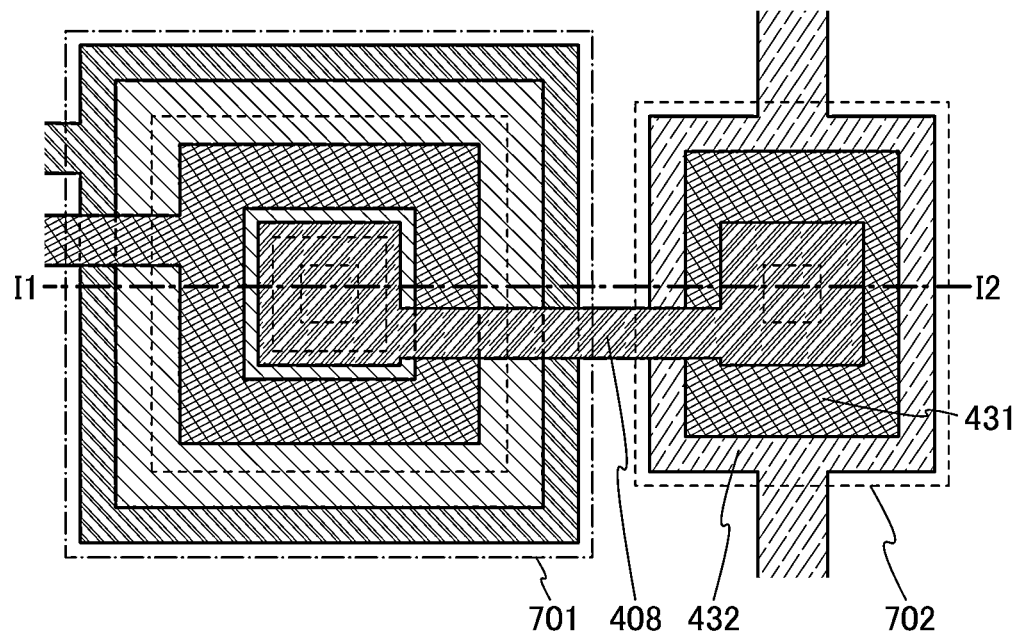
FIGS. 42A and 42B are a top view and a cross-sectional view illustrating one embodiment of a semiconductor device.
Figure 42B:
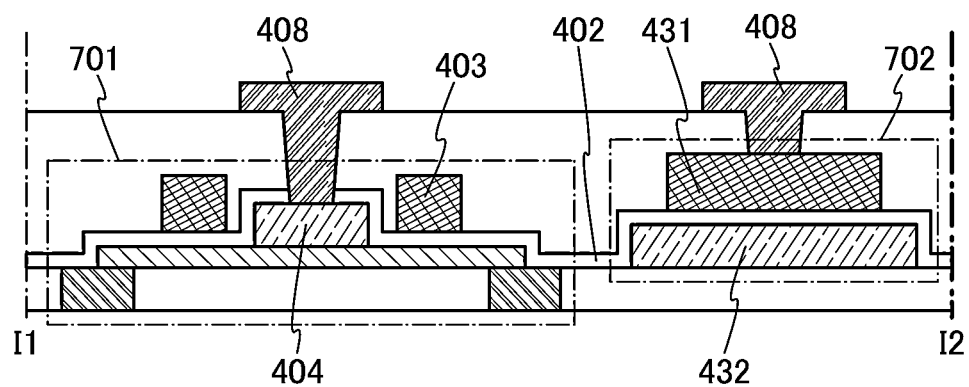

FIGS. 42A and 42B illustrate an example of a structure of the memory cell illustrated in FIGS. 41A and 41B. Specifically, FIG. 42A is a top view of the memory cell and FIG. 42B is a cross-sectional view taken along line 11-12 in FIG. 42A. Note that FIGS. 42A and 42B illustrate the case where the transistor illustrated in FIGS. 1A to 1C is used as the transistor 701.

The memory cell illustrated in FIGS. 42A and 42B includes the transistor 701 having the same structure as the transistor 410 exemplified in FIGS. 26A to 26C and the capacitor 702 which is electrically connected to the conductive layer 404 (one of the source and the drain) through the conductive layer 408. Note that the capacitor 702 includes a conductive layer 431 as one electrode, a conductive layer 432 as the other electrode, and an insulating layer 402 as a dielectric. Here, the conductive layer 431 can be formed in the same step as the conductive layer 403, and the conductive layer 432 can be formed in the same step as the conductive layer 404. That is, the capacitor 702 illustrated in FIGS. 42A and 42B can be manufactured through the same process as the transistor 701 illustrated in FIGS. 1A to 1C. Therefore, the memory cell having the structure illustrated in FIGS. 42A and 42B is preferable in that the number of the manufacturing steps is not increased from that of the manufacturing steps of the transistor alone.

Figure 43A:
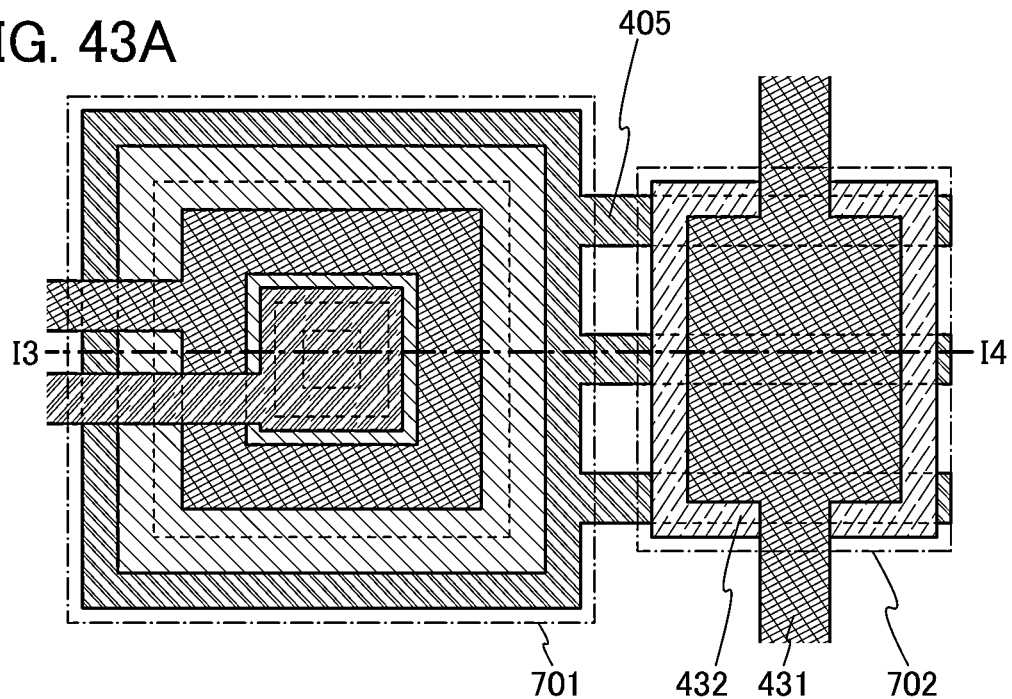
FIGS. 43A and 43B are a top view and a cross-sectional view illustrating one embodiment of a semiconductor device.
Figure 43B:
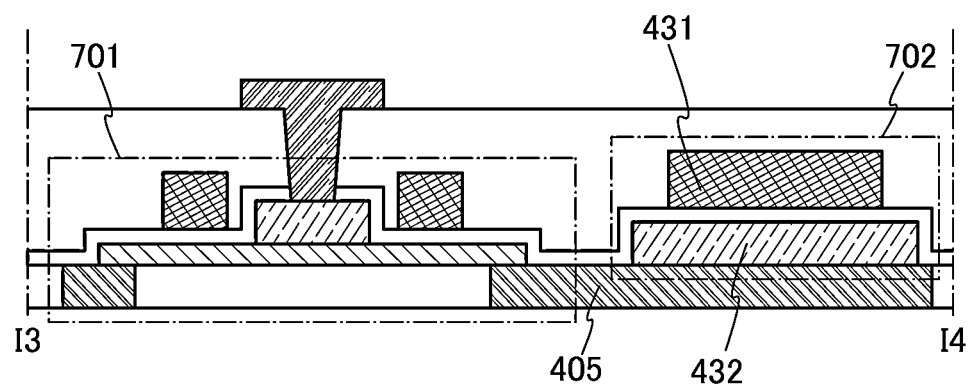

Note that the structure of the memory cell illustrated in FIGS. 41A and 41B is not limited to the structure in FIGS. 42A and 42B. For example, a structure illustrated in FIGS. 43A and 43B can be employed. FIG. 43A is a top view of a memory cell and FIG. 43B is a cross-sectional view taken along line 13-14 in FIG. 43A. Specifically, the memory cell in FIGS. 43A and 43B includes the transistor 701 having the structure illustrated in FIGS. 1A to 1C and the capacitor 702 including the conductive layer 431 as one electrode, the conductive layer 432 as the other electrode, and the insulating layer 402 as a dielectric. Further, the conductive layer 405 of the transistor 701 is in contact with the conductive layer 432 of the capacitor 702.

Embodiment 14

Next, a memory device having a structure which is different from that of the above-described memory device is described with reference to FIG. 44 and FIGS. 45A and 45B. Note that similarly to the above-described memory device, a memory device described below includes the above-described transistor and thus can hold stored data even when not powered, and has an unlimited number of write cycles.

Figure 44:
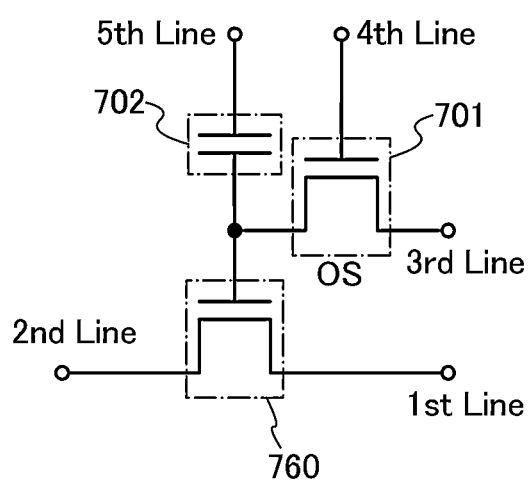
FIG. 44 is a circuit diagram illustrating one embodiment of a semiconductor device.

FIG. 44 illustrates an example of a structure of a memory cell included in the memory device. In FIG. 44, a first wiring (1st Line) is electrically connected to a source of the transistor 760. A second wiring (2nd Line) is electrically connected to a drain of the transistor 760. In addition, a third wiring (3rd Line) and one of the source and drain of the transistor 701 are electrically connected to each other, and a fourth wiring (4th Line) and the gate of the transistor 701 are electrically connected to each other. The gate of the transistor 760 and one of the source and drain of the transistor 701 are electrically connected to one electrode of the capacitor 702. A fifth wiring (5th line) and the other electrode of the capacitor 702 are electrically connected to each other. Note that in the memory cell illustrated in FIG. 44, any of the above-described transistors is used as the transistor 701.

The memory device in FIG. 44 utilizes a characteristic in which the potential of the gate of the transistor 760 can be held, and thus enables data writing, holding, and reading as follows.

Writing and holding of data will be described.

First, the potential of the fourth wiring is set to a potential at which the transistor 701 is turned on, so that the transistor 760 is turned on. Accordingly, the potential of the third wiring is supplied to the gate of the transistor 760 and the capacitor 702. That is, predetermined charge is given to the gate of the transistor 760 (writing). Here, charge for supply of a potential level or charge for supply of a different potential level (hereinafter referred to as Low level charge and High level charge) is given. After that, the potential of the fourth wiring is set to a potential at which the transistor 701 is turned off, so that the transistor 701 is turned off. Thus, the charge given to the gate of the transistor 760 is held (storing).

Since the amount of off-state current of the transistor 701 is extremely small, the charge of the gate of the transistor 760 is held for a long time.

Next, reading data will be described.

By supplying an appropriate potential (reading potential) to the fifth wiring while a predetermined potential (constant potential) is supplied to the first wiring, the potential of the second wiring fluctuates depending on the amount of charge held in the gate of the transistor 760. This is because in general, when the transistor 760 is an n-channel transistor, an apparent threshold voltage $V_{th\_H}$ in the case where a high-level charge is given to the gate electrode of the transistor 760 is lower than an apparent threshold voltage $V_{th\_L}$ in the case where a low-level charge is given to the gate of the transistor 760. Here, an apparent threshold voltage refers to the potential of the fifth wiring, which is needed to turn on the transistor 760. Thus, the potential of the fifth wiring is set to a potential $V_0$ which is between $V_{th\_H}$ and $V_{th\_L}$, whereby charge given to the gate electrode of the transistor 760 can be determined. For example, in the case where a high-level charge is given in writing, when the potential of the fifth wiring is set to $V_0$ ($>V_{th\_H}$), the transistor 760 is turned on. In the case where a low level charge is given in writing, even when the potential of the fifth wiring is set to $V_0$ ($<V_{th\_L}$), the transistor 760 remains in an off state. Therefore, the stored data can be read by the potential of the second wiring.

Note that in the case where memory cells are arrayed to be used, only data of desired memory cells needs to be read. In the case where such reading is not performed, a potential at which the transistor 760 is turned off, that is, a potential smaller than $V_{th\_H}$ may be given to the fifth wiring regardless of the state of the gate of the transistor 760. Alternatively, a potential which allows the transistor 760 to be turned on regardless of a state of the gate, that is, a potential higher than $V_{th\_L}$ may be applied to the fifth wiring.

The memory cell in FIG. 44 can hold stored data for an extremely long time. In other words, refresh operation becomes unnecessary or the frequency of refresh operation can be extremely low. Thus, power consumption can be reduced. Moreover, stored data can be held for a long period even when power is not supplied (note that a potential is preferably fixed).

In this manner, by using a transistor including an oxide semiconductor, a nonvolatile random access memory can be provided.

Further, in the memory cell illustrated in FIG. 44, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

Figure 45A:
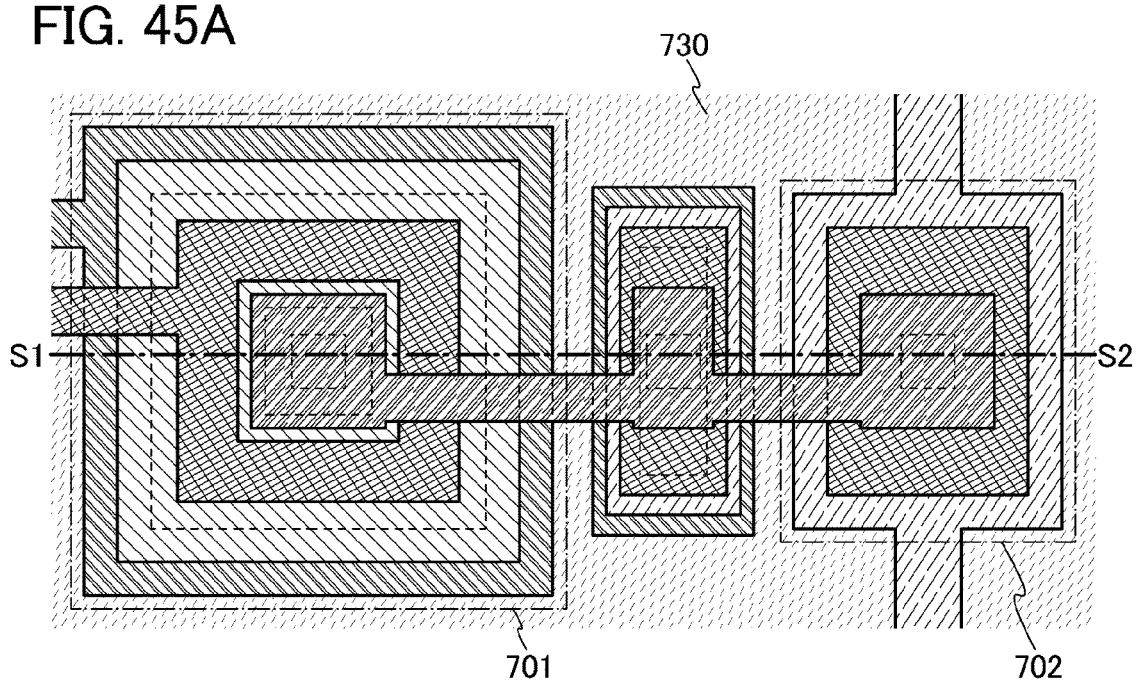
FIGS. 45A and 45B are a top view and a cross-sectional view illustrating one embodiment of a semiconductor device.
Figure 45B:
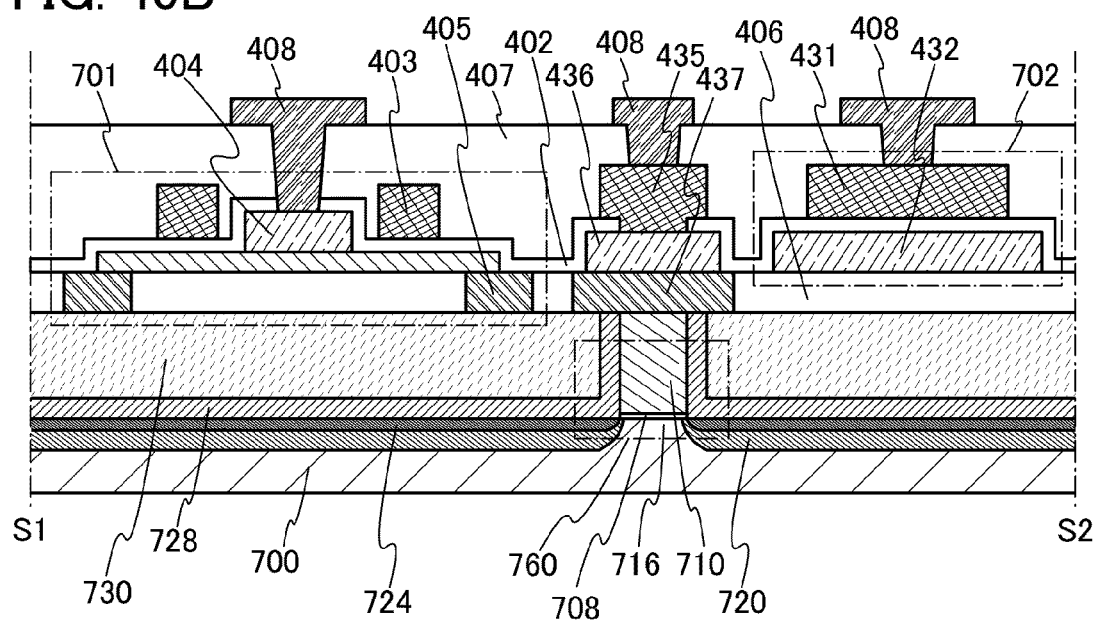

FIGS. 45A and 45B illustrate an example of a structure of the memory cell illustrated in FIG. 44. Specifically, FIG. 45A is a top view of the memory cell and FIG. 45B is a cross-sectional view taken along line S1-S2 in FIG. 45A. Note that FIGS. 45A and 45B illustrate the case where the transistor 701 and the capacitor 702 illustrated in FIGS. 42A and 42B are used as the transistor 701 and the capacitor 702.

The memory cell illustrated in FIGS. 45A and 45B includes a transistor 760 including a first semiconductor material in a lower portion, and a transistor 701 including a second semiconductor material in an upper portion. FIGS. 45A and 45B illustrate the case where the transistor illustrated in FIGS. 1A to 1C are used as the transistor 701.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor can hold charge for a long time owing to its characteristics.

Although all the transistors are n-channel transistors here, it is needless to say that p-channel transistors can be used. Besides that the transistor exemplified in this specification is used, specific structures such as the material and the structure of the memory device are not limited to those described in this specification and the like.

First, a structure of a lower portion is described.

The transistor 760 illustrated in FIG. 45B includes a channel formation region 716 provided in a substrate 700 including a semiconductor material (e.g., silicon); impurity regions 720 provided such that the channel formation region 716 is provided therebetween; intermetallic compound regions 724 in contact with the impurity regions 720; a gate insulating layer 708 provided over the channel formation region 716; and a gate electrode 710 provided over the gate insulating layer 708. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

Insulating layers 728 and 730 are provided over the substrate 700 to cover the transistor 760. Note that, in the transistor 760, the sidewall insulating layer may be formed on side surfaces of the gate electrode 710 and the impurity regions 720 may include a region having a different impurity concentration. It is preferable that the transistor 760 is provided in a region which is surrounded by an element isolation insulating layer. Note that the element isolation insulating layer is formed by an element isolation technique such as LOCOS and STI.

The transistor 760 formed using a single crystal semiconductor substrate can operate at high speed. Thus, when the transistor is used as a reading transistor, data can be read at a high speed. As treatment prior to formation of the transistor 701 and a capacitor 702, CMP treatment is performed on insulating layers 728 and 730 formed to cover the transistor 760, whereby the insulating layers 728 and 730 which are planarized are formed and, at the same time, an upper surface of the gate electrode 710 is exposed.

For the insulating layer 728 and the insulating layer 730, typically, an inorganic insulating material such as silicon oxide, silicon oxynitride, aluminum oxide, aluminum oxynitride, silicon nitride, aluminum nitride, silicon nitride oxide, or aluminum nitride oxide can be used. The insulating layer 728 and the insulating layer 730 can be formed by a plasma CVD method, a sputtering method, or the like.

Alternatively, an organic material such as polyimide, an acrylic resin, or a benzocyclobutene-based resin can be used. Other than such organic materials, it is also possible to use a low-dielectric constant material (a low-k material) or the like. In the case of using an organic material, a wet process such as a spin coating method or a printing method may be used to form the insulating layer 728 and the insulating layer 730.

Next, a structure of an upper portion is described.

The gate electrode 710 of the transistor 760 is electrically connected to one of the source and the drain of the transistor 701 (the conductive layer 404) through the conductive layer 408 and the conductive layer 435, the conductive layer 436, and the conductive layer 437 which are provided in an opening formed in the insulating layer 402, the insulating layer 406, and the insulating layer 407. Here, the conductive layer 435 can be formed in the same step as the conductive layer 403 and the conductive layer 431, the conductive layer 436 can be formed in the same step as the conductive layer 404 and the conductive layer 432, and the conductive layer 437 can be formed in the same step as the conductive layer 405. That is, in the memory device in FIGS. 45A and 45B, as compared to the case of the memory device in FIGS. 42A and 42B, steps for forming the conductive layer 435, the conductive layer 436, and the conductive layer 437 are not added.

Note that the structure of the memory cell illustrated in FIG. 44 is not limited to the structure in FIGS. 45A and 45B. For example, the memory cell illustrated in FIG. 44 can include the transistor 701 and the capacitor 702 which are illustrated in FIGS. 43A and 43B and the transistor 760 whose gate electrode 710 is electrically connected to the conductive layer 405 in FIGS. 43A and 43B.

This embodiment can be implemented in appropriate combination with the structures described in the other embodiments.

Embodiment 15

A central processing unit (CPU) can be formed using the transistor described in the above embodiments for at least part of the CPU.

Figure 46A:
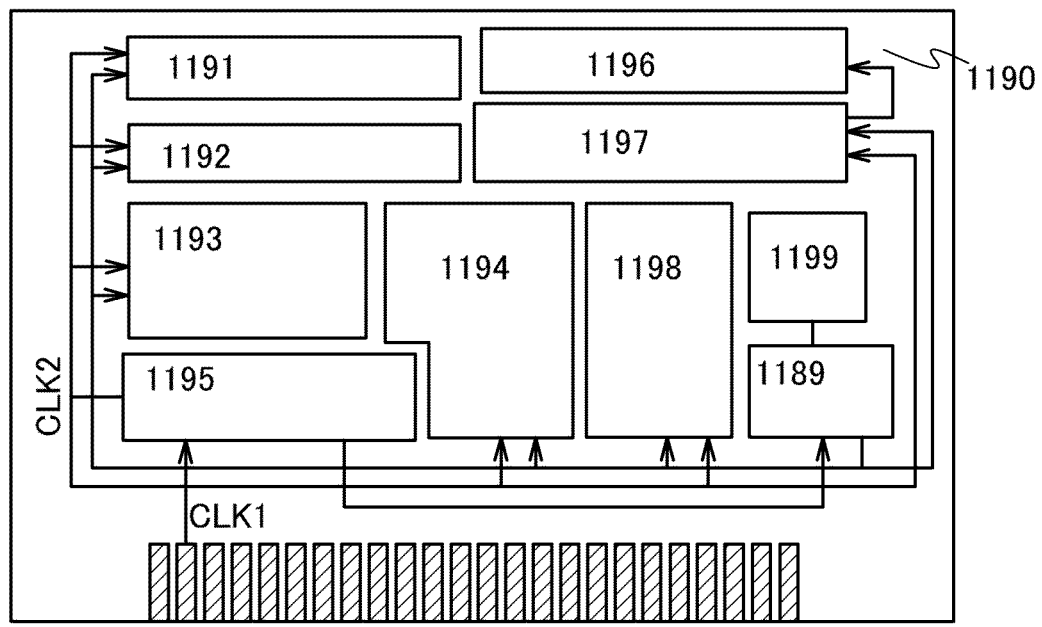
FIGS. 46A to 46C are block diagrams illustrating one embodiment of a semiconductor device.

FIG. 46A is a block diagram illustrating a specific structure of a CPU. The CPU illustrated in FIG. 46A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 46A is only an example in which the structure is simplified, and a variety of structures is applied to an actual CPU depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 46A, a memory cell is provided in the register 1196. As the memory cell in the register 1196, any of memory cells described in the above embodiments can be used.

In the CPU illustrated in FIG. 46A, the register controller 1197 selects operation of holding data in the register 1196 in accordance with an instruction from the ALU 1191. That is, the register controller 1197 determined whether data is held by a logic element reversing the logic (value) or by a capacitor in the memory cell included in the register 1196. When data holding by the phase-inversion element is selected, power supply voltage is supplied to the memory cell in the register 1196. When data holding by the capacitor is selected, the data is rewritten in the capacitor, and supply of power supply voltage to the memory cell in the register 1196 can be stopped.

Figure 46B:
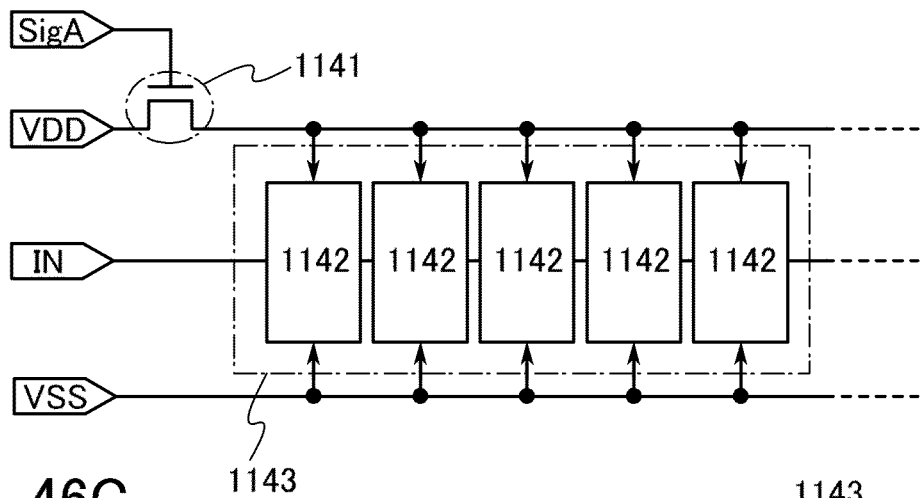
Figure 46C:
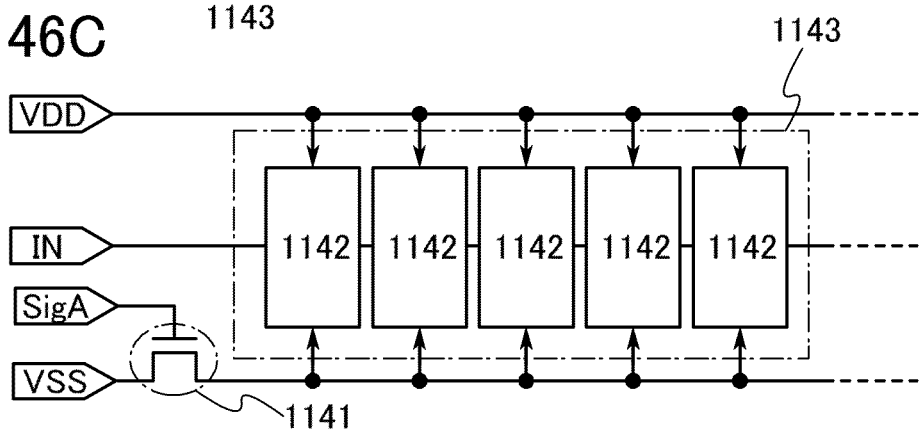

The power supply can be stopped by a switching element provided between a memory cell group and a node to which a power supply potential VDD or a power supply potential VSS is supplied, as illustrated in FIG. 46B or FIG. 46C. Circuits illustrated in FIGS. 46B and 46C are described below.

FIGS. 46B and 46C each illustrate an example of a structure of a memory circuit in which any of the transistors disclosed in the above embodiments is used as a switching element for controlling supply of a power supply potential to a memory cell.

The memory device illustrated in FIG. 46B includes a switching element 1141 and a memory cell group 1143 including a plurality of memory cells 1142. Specifically, as each of the memory cells 1142, the memory cell disclosed in the above embodiments can be used. Each of the memory cells 1142 included in the memory cell group 1143 is supplied with the high-level power supply potential VDD through the switching element 1141. Further, each of the memory cells 1142 included in the memory cell group 1143 is supplied with a potential of a signal IN and the low-level power supply potential VSS.

In FIG. 46B, a transistor disclosed in the above embodiments is used as the switching element 1141, and the switching of the transistor is controlled by a signal SigA supplied to a gate electrode thereof.

FIG. 46B illustrates the structure in which the switching element 1141 includes only one transistor. Note that the structure is not limited and the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 46B, the switching element 1141 may control the supply of the low-level power supply potential VSS.

In FIG. 46C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the consumed power can be reduced.

Although the CPU is given as an example in this embodiment, the transistor disclosed in the above-described embodiments can also be applied to an LSI such as a digital signal processor (DSP), a custom LSI, or a field programmable gate array (FPGA).

This embodiment can be implemented in appropriate combination with the structures described in the other embodiments.

Embodiment 16

In this embodiment, examples of the case where the semiconductor device described in any of the above embodiments is applied to an electrical appliance are described. Specifically, examples of application of the semiconductor device described in any of the above embodiments to portable devices such as a mobile phone, a smartphone, or an e-book reader will be described with reference to FIGS. 47A and 47B, FIG. 48, FIG. 49, and FIG. 50.

In portable electronic devices such as a mobile phone, a smart phone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 47A:
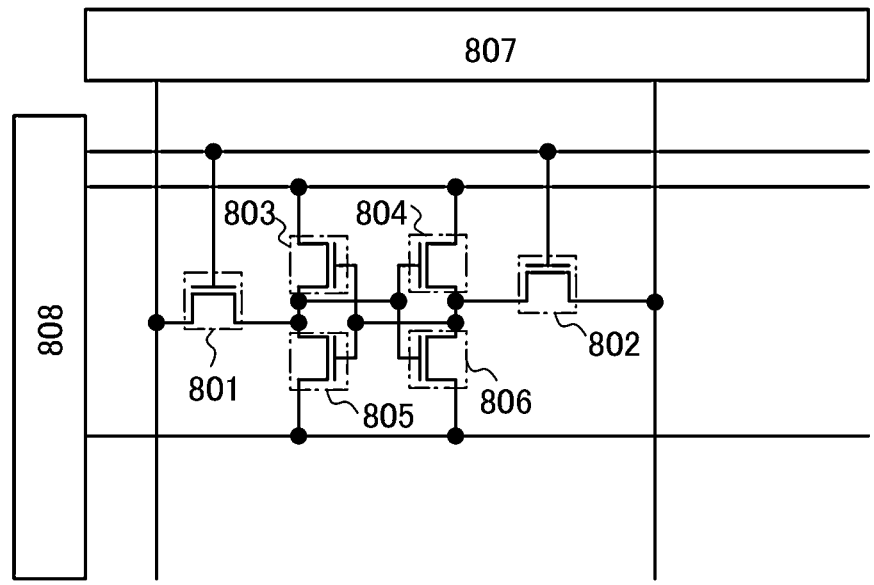
FIGS. 47A and 47B each illustrate one embodiment of a semiconductor device.

In a normal SRAM, as illustrated in FIG. 47A, one memory cell includes six transistors, which are a transistor 801, a transistor 802, a transistor 803, a transistor 804, a transistor 805, and a transistor 806, and they are driven by an X decoder 807 and a Y decoder 808. A pair of transistors 803 and 805 and a pair of the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, the price per bit of an SRAM is the highest among a variety of memory devices.

Figure 47B:
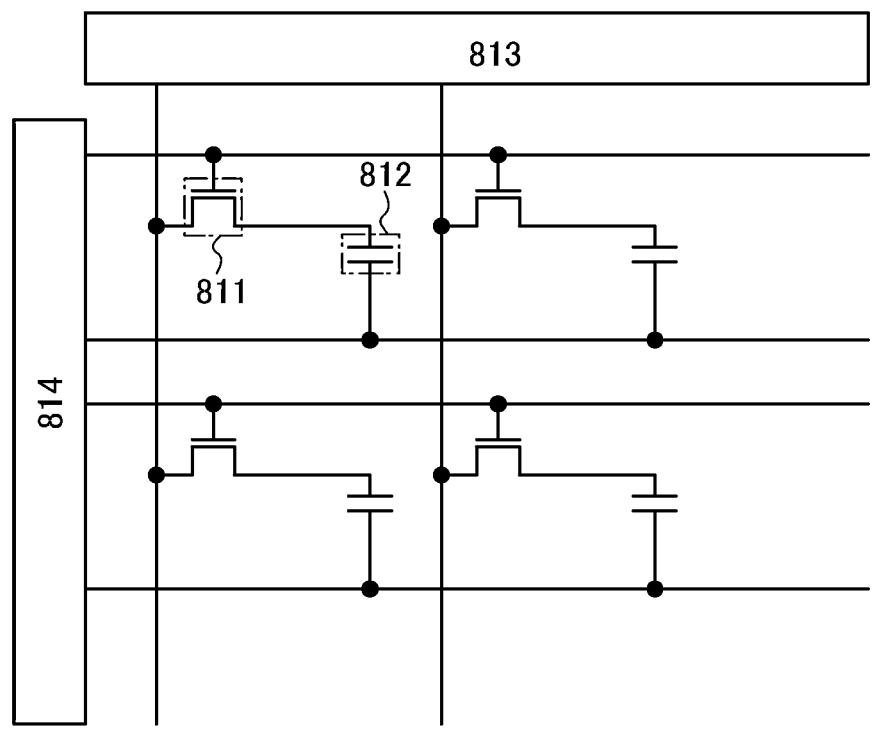

On the other hand, as illustrated in FIG. 47B, a memory cell in a DRAM includes a transistor 811 and a capacitor 812, and is driven by an X decoder 813 and a Y decoder 814. One cell includes one transistor and one capacitor and has a small area. The area of a memory cell in a DRAM is generally less than or equal to 10 $F^2$. Note that the DRAM needs to be refreshed periodically and consumes electric power even when a rewriting operation is not performed.

However, the area of the memory cell of the semiconductor device described the above embodiments is about 10 $F^2$ and frequent refreshing is not needed. Therefore, the area of the memory cell can be reduced, which results in a reduction in power consumption.

Figure 48:
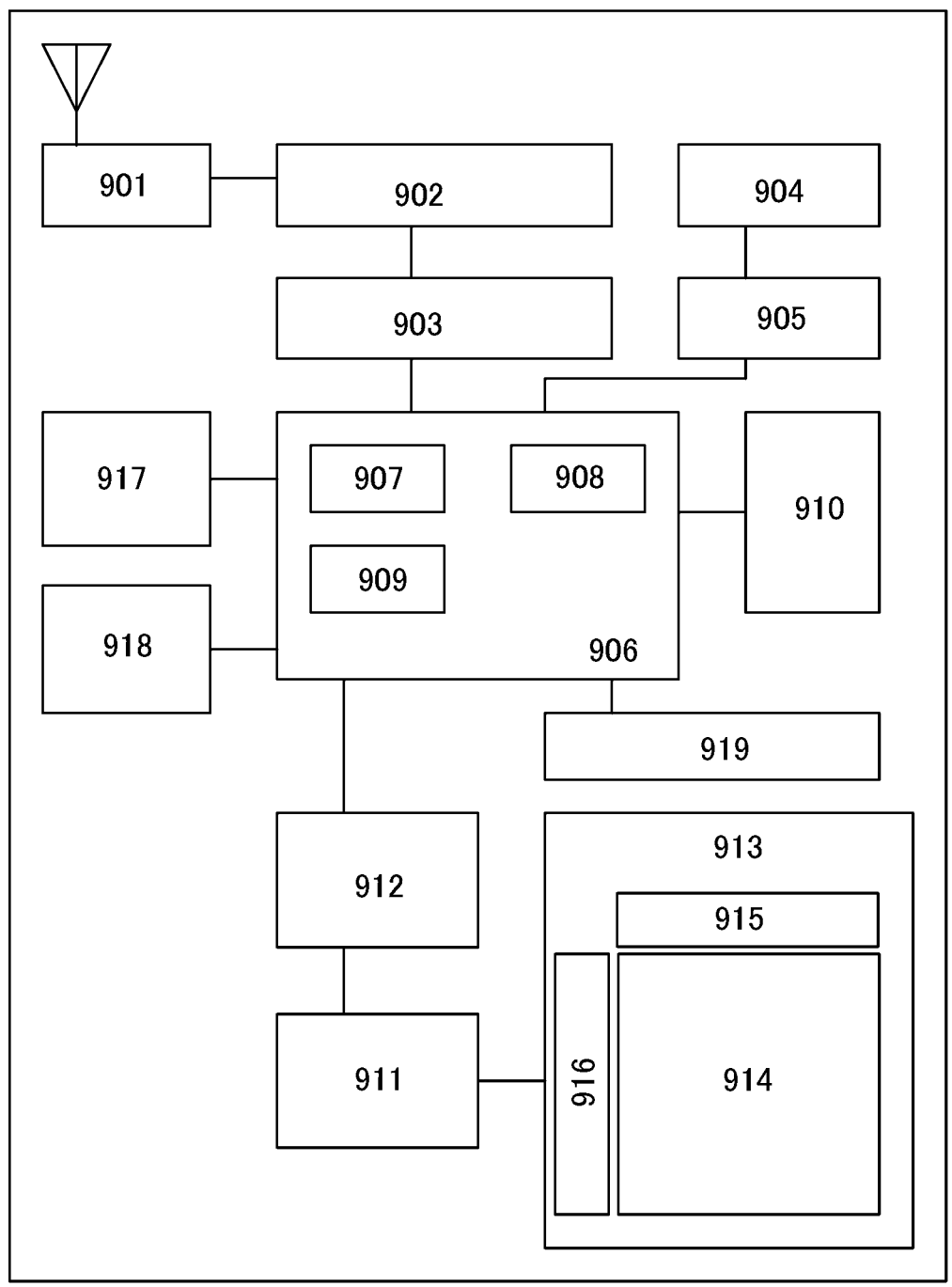
FIG. 48 illustrates one embodiment of a semiconductor device.

FIG. 48 is a block diagram of a portable device. A portable device illustrated in FIG. 48 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909. In general, the memory circuit 912 includes an SRAM or a DRAM; by employing any of the semiconductor devices described in the above embodiments for the memory circuit 912, writing and reading of data can be performed at high speed, data can be held for a long time, and power consumption can be sufficiently reduced.

Figure 49:
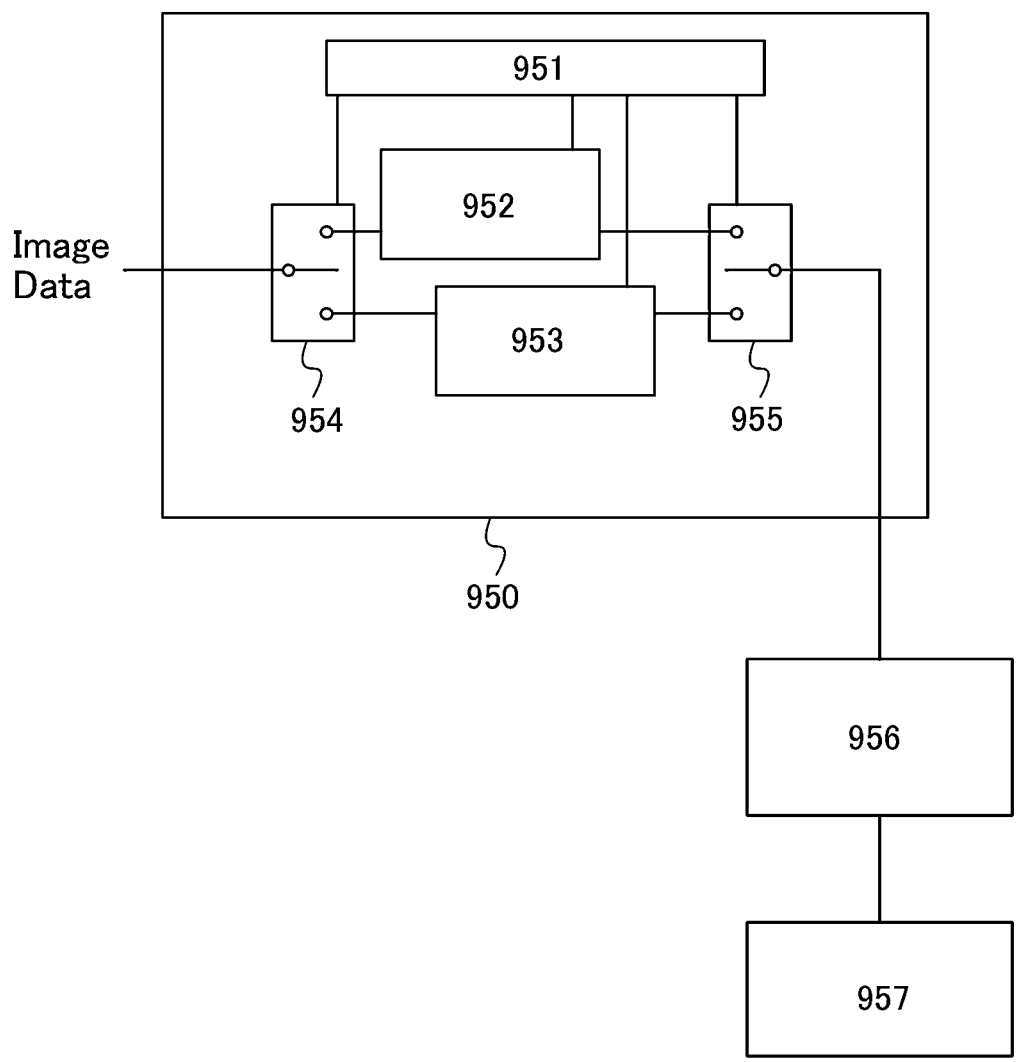
FIG. 49 illustrates one embodiment of a semiconductor device.

FIG. 49 illustrates an example in which any of the semiconductor devices described in the above embodiments is used for a memory circuit 950 in a display. The memory circuit 950 illustrated in FIG. 49 includes a memory 952, a memory 953, a switch 954, a switch 955, and a memory controller 951. Further, the memory circuit 950 is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 though the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another new image data is stored in the memory 952.

By alternately writing and reading image data to and from the memory 952 and the memory 953 as described above, images are displayed on the display 957. Note that the memory 952 and the memory 953 are not necessarily separate memories and a single memory may be divided and used. By employing any of the semiconductor devices described in the above embodiments for the memory 952 and the memory 953, data can be written and read at high speed and held for a long time, and power consumption can be sufficiently reduced.

Figure 50:
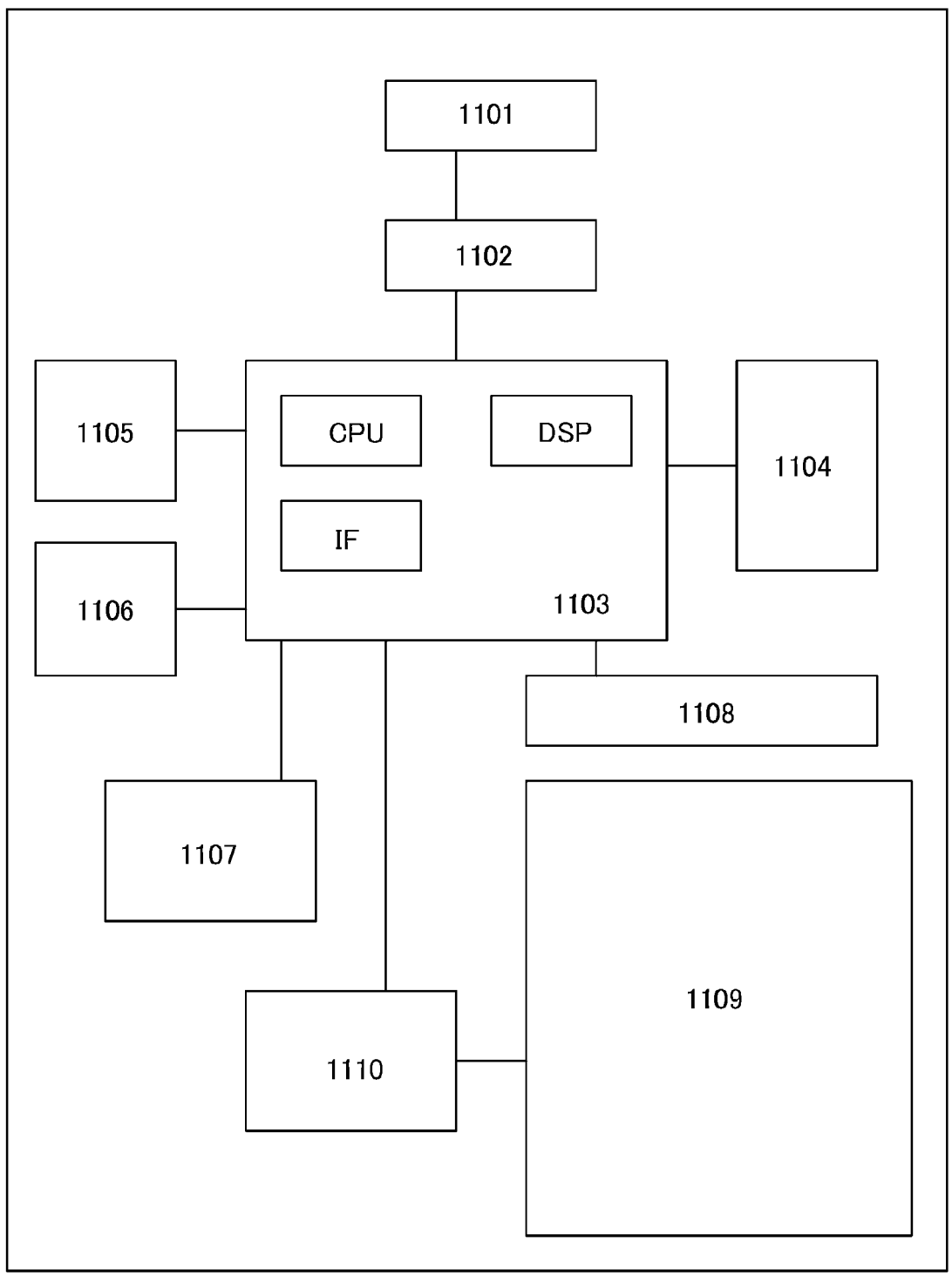
FIG. 50 illustrates one embodiment of a semiconductor device.

FIG. 50 is a block diagram of an e-book reader. FIG. 50 includes a battery 1101, a power supply circuit 1102, a microprocessor 1103, a flash memory 1104, an audio circuit 1105, a keyboard 1106, a memory circuit 1107, a touch panel 1108, a display 1109, and a display controller 1110.

Here, the semiconductor device described in any of the above embodiments can be used for the memory circuit 1107 in FIG. 50. The memory circuit 1107 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to retain that content for a long period, that content may be copied to the flash memory 1104. Even in such a case, by employing the semiconductor device described in any of the above embodiments, writing and reading of data can be performed at high speed, data can be held for a long time, and power consumption can be sufficiently reduced.

As described above, according to this embodiment, a transistor which can suppress generation of a parasitic channel can be obtained.

Further, according to this embodiment, by using the transistor, a semiconductor device having improved operation characteristics can be provided.

As described above, the semiconductor device in any of the above embodiments is mounted on each of the portable devices described in this embodiment. Therefore, it is possible to obtain a portable device having high reliability, which is capable of reading data at high speed, holding data for a long time, and reducing power consumption.

The structures, methods, and the like described in this embodiment can be combined as appropriate with any of the structures, methods, and the like described in the other embodiments.

Embodiment 17

A semiconductor device disclosed in this specification can be applied to a variety of electronic devices (including game machines). Examples of the electronic devices include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are shown in FIGS. 51A to 51C, FIGS. 52A to 52C, and 53A to 53C.

Figure 51A:
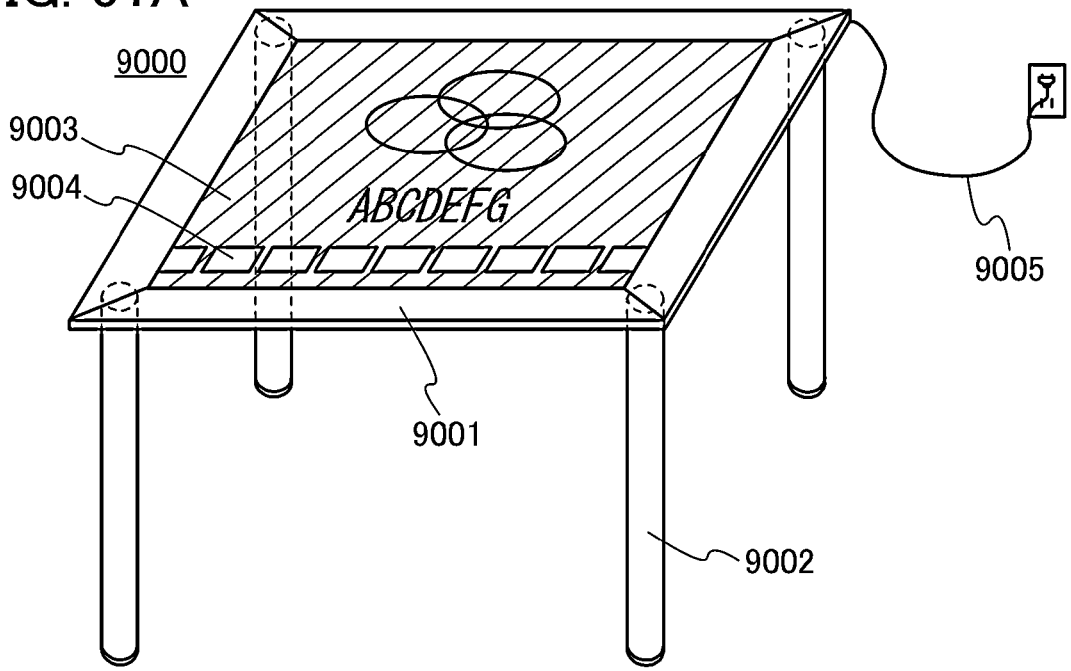
FIGS. 51A to 51C each illustrate an example of an electronic device.

FIG. 51A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The transistor described in the above embodiments can be used for the display portion 9003 so that the electronic devices can have a high reliability The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

Figure 51B:
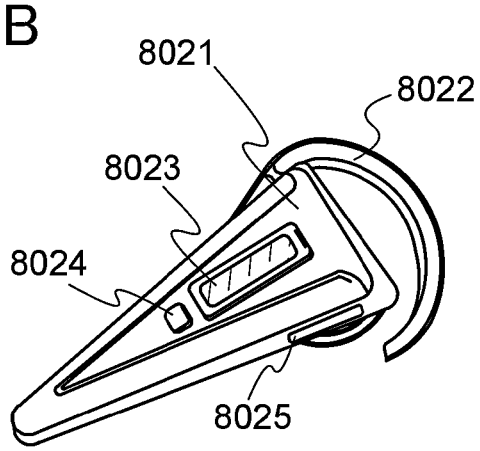

FIG. 51B illustrates a portable music player, which includes, in a main body 8021, a display portion 8023, a fixing portion 8022 with which the main body is worn on the ear, a speaker, an operation button 8024, an external memory slot 8025, and the like. When the transistor or the memory device described in the above embodiments is used in a memory or a CPU incorporated in the main body 8021, power consumption of the portable music player (PDA) can be further reduced.

Furthermore, when the portable music player illustrated in FIG. 51B has an antenna, a microphone function, or a wireless communication function and is used with a mobile phone, a user can talk on the phone wirelessly in a hands-free way while driving a car or the like.

Figure 51C:
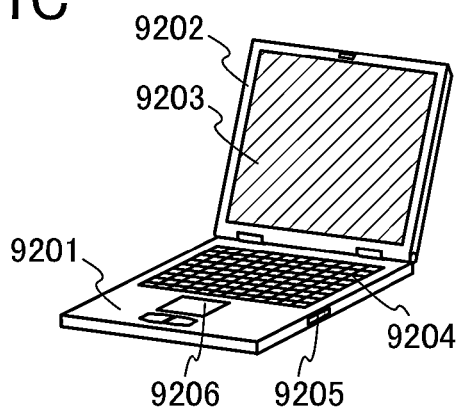

FIG. 51C illustrates a computer which includes a main body 9201 including a CPU, a housing 9202, a display portion 9203, a keyboard 9204, an external connection port 9205, a pointing device 9206, and the like. The computer includes a semiconductor device manufactured according to one embodiment of the present invention for the display portion 9203. When the CPU described in Embodiment 5 is used, power consumption of the computer can be reduced.

Figure 52A:
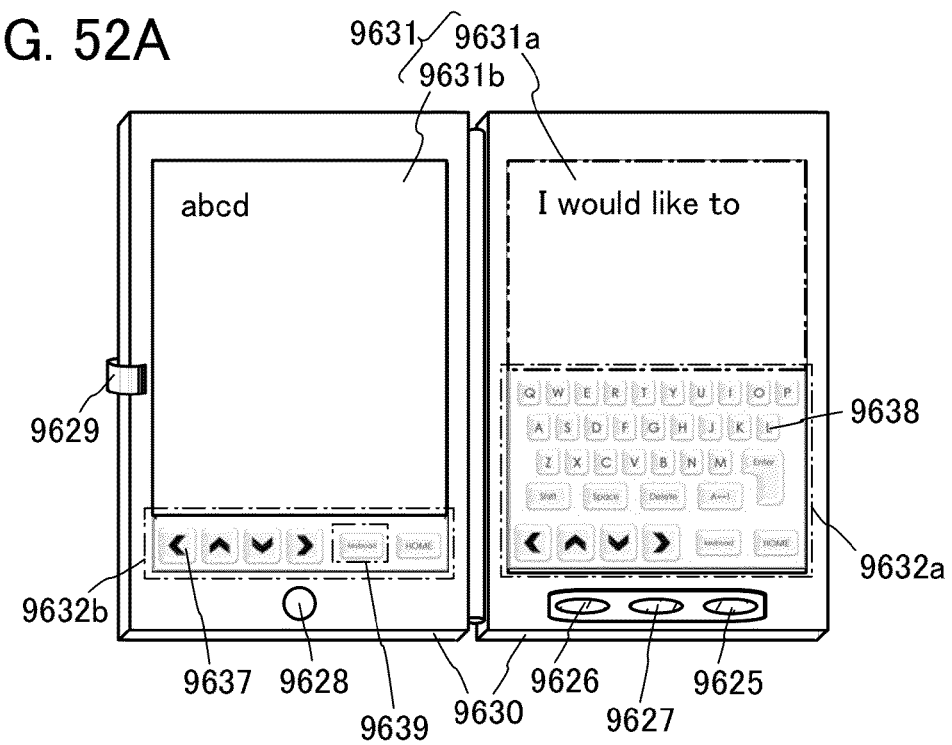
FIGS. 52A to 52C illustrate an example of an electronic device.
Figure 52B:
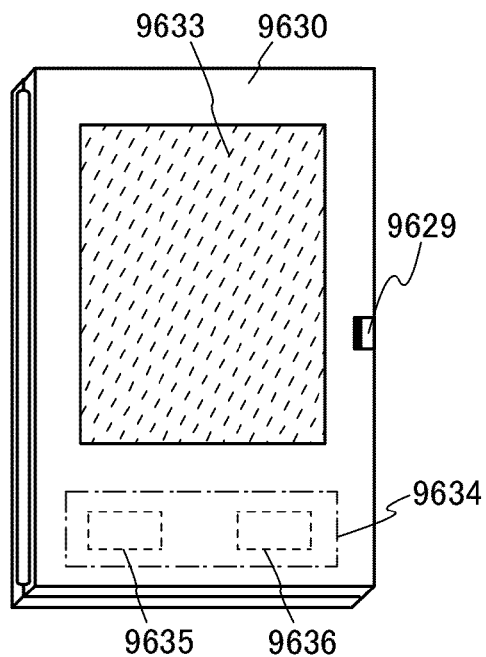

FIGS. 52A and 52B illustrate a tablet terminal that can be folded. In FIG. 52A, the tablet terminal is opened, and includes a housing 9630, a display portion 9631 including a display portion 9631a and a display portion 9631b, a switch 9626 for switching display modes, a power switch 9627, a switch 9625 for switching to power-saving mode, a fastener 9629, and an operation switch 9628.

The transistor described in any of the above embodiments can be used for the display portion 9631a and the display portion 9631b, so that the tablet terminal can have high reliability.

A touch panel region 9632a can be provided in a part of the display portion 9631a, in which data can be input by touching displayed operation keys 9638. Although a structure in which a half region in the display portion 9631a has only a display function and the other half region also has a touch panel function is shown as an example, the display portion 9631a is not limited to the structure. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9626 for switching display modes allows switching between a landscape mode and a portrait mode, color display and black-and-white display, and the like. With the switch 9625 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Note that FIG. 52A shows an example in which the display portion 9631a and the display portion 9631b have the same display area; however, without limitation thereon, one of the display portions may be different from the other display portion in size and display quality. For example, one of them may be a display panel that can display higher-definition images than the other.

The tablet terminal is closed in FIG. 52B. The tablet terminal includes the housing 9630, a solar battery 9633, a charge/discharge control circuit 9634, a battery 9635, and a DCDC converter 9636. Note that FIG. 52B shows an example in which the charge and discharge control circuit 9634 includes the battery 9635 and the DCDC converter 9636.

Since the tablet terminal can be folded, the housing 9630 can be closed when the tablet terminal is not in use. Thus, the display portions 9631a and 9631b can be protected, thereby providing a tablet terminal with high endurance and high reliability for long-term use.

In addition, the tablet terminal illustrated in FIGS. 52A and 52B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently, which is preferable. When a lithium ion battery is used as the battery 9635, there is an advantage of downsizing or the like.

Figure 52C:
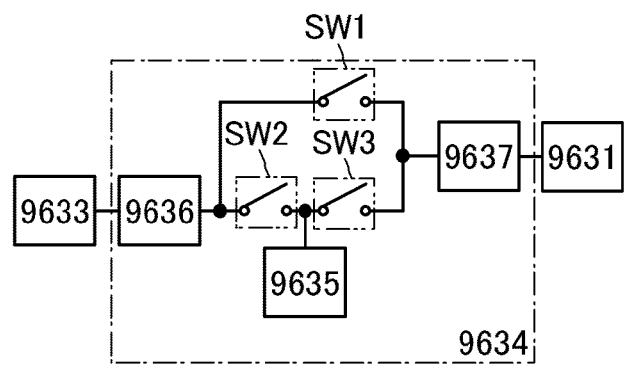

The structure and the operation of the charge/discharge control circuit 9634 illustrated in FIG. 52B are described with reference to a block diagram in FIG. 52C. The solar battery 9633, the battery 9635, the DCDC converter 9636, a converter 9637, switches SW1 to SW3, and the display portion 9631 are shown in FIG. 52C, and the battery 9635, the DCDC converter 9636, the converter 9637, and the switches SW1 to SW3 correspond to the charge/discharge control circuit 9634 in FIG. 52B.

First, an example of operation in the case where power is generated by the solar battery 9633 using external light is described. The voltage of power generated by the solar battery is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

Figure 53A:
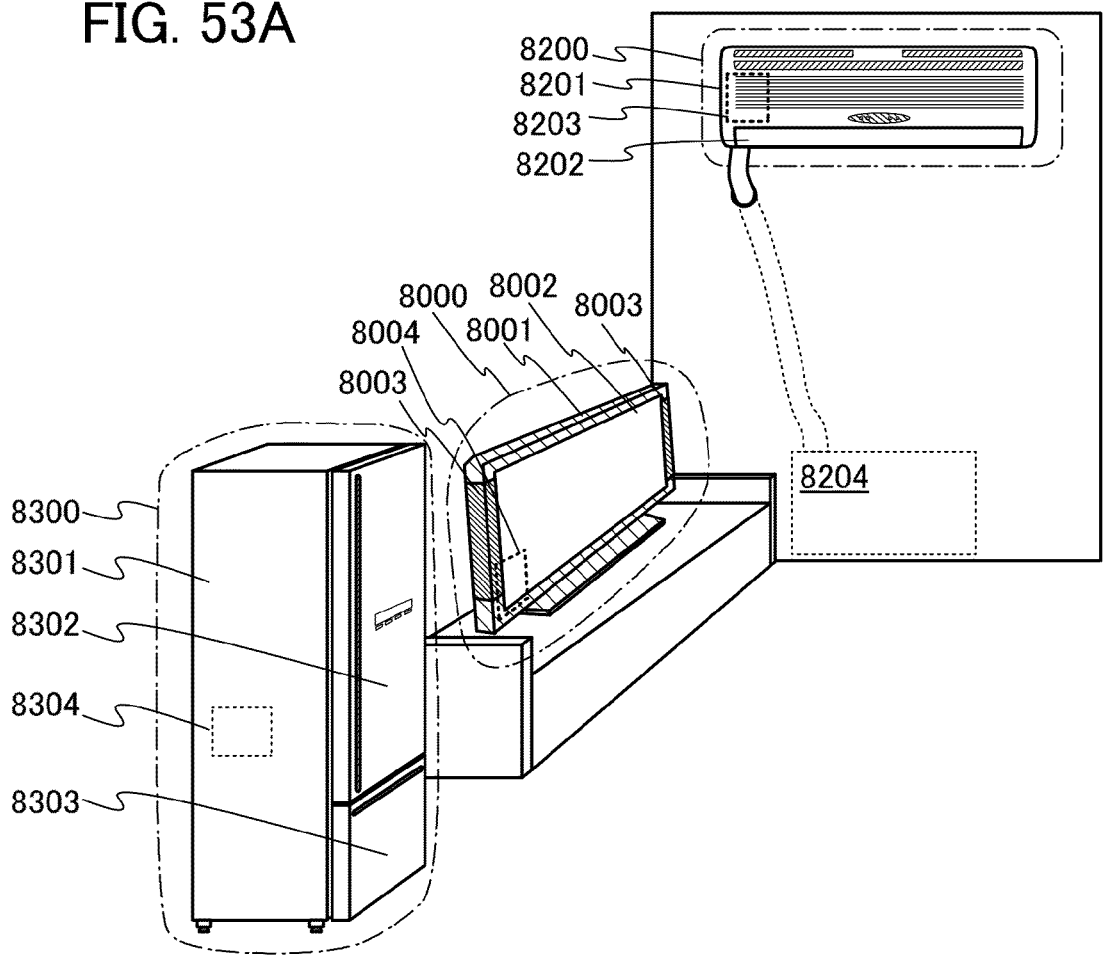
FIGS. 53A to 53C illustrate examples of an electronic device.

In a television set 8000 in FIG. 53A, a display portion 8002 is incorporated in a housing 8001. The display portion 8002 displays an image and a speaker portion 8003 can output sound. The transistor described in the above embodiments can be used for the display portion 8002.

A semiconductor display device such as a liquid crystal display device, a light-emitting device in which a light-emitting element such as an organic EL element is provided in each pixel, an electrophoretic display device, a digital micromirror device (DMD), a plasma display panel (PDP), or a field emission display (FED) can be used for the display portion 8002.

The television set 8000 may be provided with a receiver, a modem, and the like. With the receiver, the television set 8000 can receive a general television broadcast. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. Any of the memories and the CPU described in Embodiments 4 to 6 can be used for the television set 8000.

In FIG. 53A, an air conditioner which includes an indoor unit 8200 and an outdoor unit 8204 is an example of an electric device in which the CPU described in the above embodiment is used. Specifically, the indoor unit 8200 includes a housing 8201, an air outlet 8202, a CPU 8203, and the like. Although the CPU 8203 is provided in the indoor unit 8200 in FIG. 53A, the CPU 8203 may be provided in the outdoor unit 8204. Alternatively, the CPU 8203 may be provided in both the indoor unit 8200 and the outdoor unit 8204. Since the CPU of Embodiment 6 is formed using an oxide semiconductor, an air conditioner which has excellent heat resistance property and high reliability can be provided with the use of the CPU.

In FIG. 53A, an electric refrigerator-freezer 8300 is an example of an electric device which is provided with the CPU formed using an oxide semiconductor. Specifically, the electric refrigerator-freezer 8300 includes a housing 8301, a door for a refrigerator 8302, a door for a freezer 8303, a CPU 8304, and the like. In FIG. 53A, the CPU 8304 is provided in the housing 8301. When the CPU described in Embodiment 6 is used as the CPU 8304 of the electric refrigerator-freezer 8300, power consumption of the electric refrigerator-freezer 8300 can be reduced.

Figure 53B:
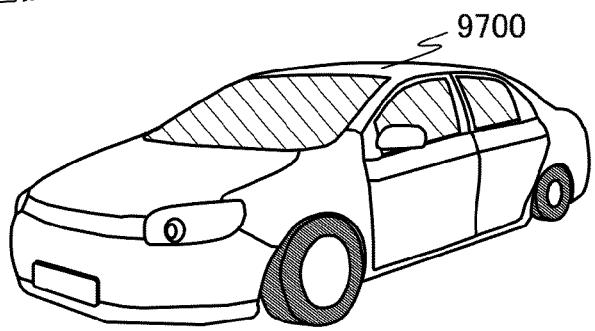
Figure 53C:
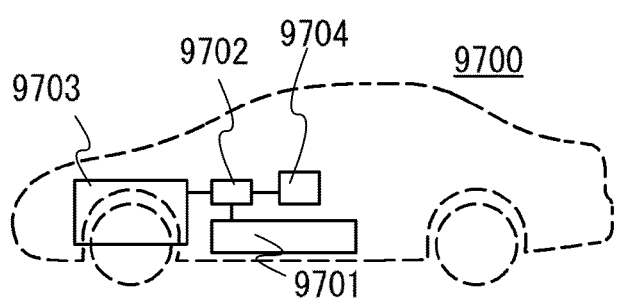
Figure 54A:
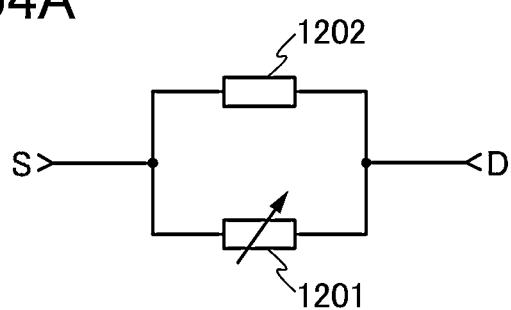
FIGS. 54A and 54B are circuit diagrams each illustrating a connection relation between a source and a drain.
Figure 54B:
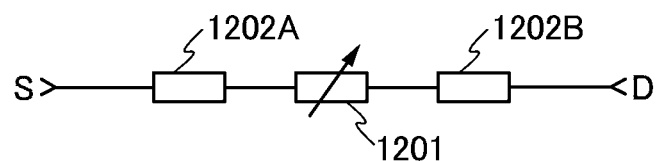

FIGS. 53B and 53C illustrate an example of an electric vehicle which is an example of an electric device. FIG. 53C is a diagram showing the inside of an electric vehicle 9700. The electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the CPU described in Embodiment 6 is used as the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented in appropriate combination with the structures described in the other embodiments.

Reference Example

The matter that oxygen easily desorbs from the side surface of the CAAC-OS film will be described in detail. As an example of the oxide semiconductor film, ease of excessive oxygen (an oxygen atom contained in a proportion higher than that of oxygen in the stoichiometric composition) transfer and ease of oxygen vacancy transfer in an In—Ga—Zn-based oxide (IGZO) which is a three-component metal oxide are described with reference to scientific computation results.

In the computation, a model (see FIGS. 56A to 56C and FIGS. 58A to 58C) in which one excessive oxygen atom or oxygen vacancy exists in an In—O surface of IGZO having atomic ratio of In:Ga:Zn=3:1:2 was formed by structure optimization, and each energy of intermediate structures along a minimum energy path was calculated by a nudged elastic band (NEB) method.

The computation was performed using calculation program software "OpenMX" based on the density functional theory (DFT). Parameters are described below.

As a basis function, a pseudoatom local basis function was used. The basis function is classified as polarization basis sets STO (slater type orbital).

As a functional, generalized-gradient-approximation/Perdew-Burke-Emzerhof (GGA/PBE) was used.

The cut-off energy was 200 Ry.

The sampling k-point was 5×5×3.

In the computation of ease of excessive oxygen transfer, the number of atoms which existed in the computation model was set to 85. In the computation of ease of oxygen vacancy transfer, the number of atoms which existed in the computation model was set to 83.

Ease of excessive oxygen transfer and ease of oxygen vacancy transfer are evaluated by calculation of a height of energy barrier Eb which is required to go over in moving to respective sites. That is, when the height of energy barrier Eb which is gone over in moving is high, excessive oxygen or oxygen vacancy hardly moves, and when the height of the energy barrier Eb is low, excessive oxygen or oxygen vacancy easily moves.

Figure 57:
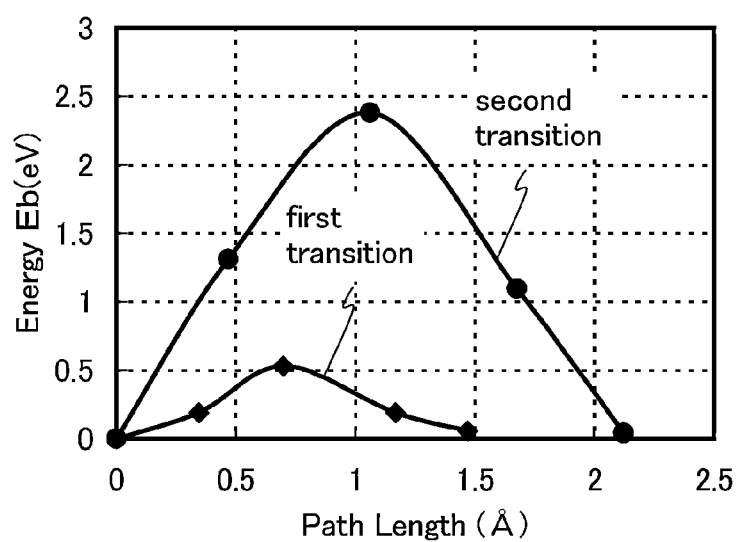
FIG. 57 shows computation results of the models of FIGS. 56A to 56C.

First, excessive oxygen transfer is described. FIGS. 56A to 56C show models used for computation of excessive oxygen transfer. The computations of two transition forms described below were performed. FIG. 57 shows the computations results. In FIG. 57, the horizontal axis indicates a path length (of oxygen vacancy transfer), and the vertical axis indicates energy (required for transfer) with respect to energy in a state of a model A in FIG. 56A.

In the two transition forms of the excessive oxygen transfer, a first transition is a transition from the model A to a model B and a second transition is a transition from the model A to a model C.

In FIGS. 56A to 56C, an oxygen atom denoted by "1" is referred to as a first oxygen atom of the model A; an oxygen atom denoted by "2" is referred to as a second oxygen atom of the model A; and an oxygen atom denoted by "3" is referred to as a third oxygen atom of the model A.

As seen from FIG. 57, the maximum value ($Eb_{max}$) of the height Eb of the energy barrier in the first transition is 0.53 eV, and that of the second transition is 2.38 eV. That is, the maximum value ($Eb_{max}$) of the height Eb of the energy barrier in the first transition is lower than that of the second transition. Therefore, energy required for the first transition is smaller than energy required for the second transition, and the first transition occurs more easily than the second transition.

That is, the first oxygen atom of the model A moves in the direction in which the second oxygen atom of the model A is pushed more easily than in the direction in which the third oxygen atom of the model A is pushed. Therefore, this shows that the oxygen atom moves along the layer of indium atoms more easily than across the layer of indium atoms.

Figure 58A:
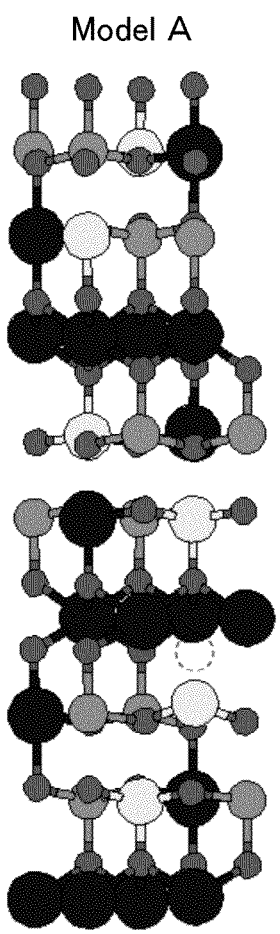
FIGS. 58A to 58C are model diagrams used for calculation of oxygen vacancy transfer.
Figure 58B:
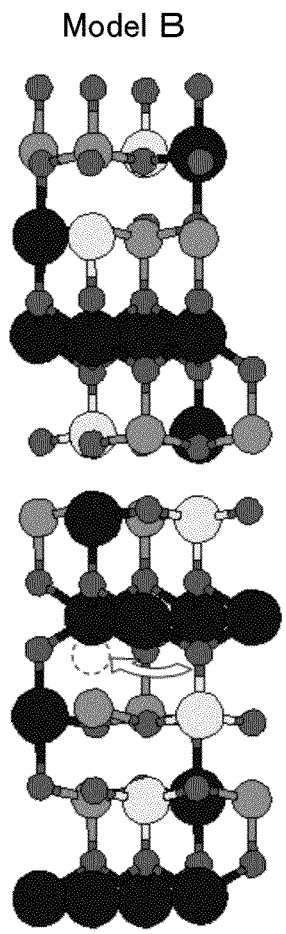
Figure 58C:
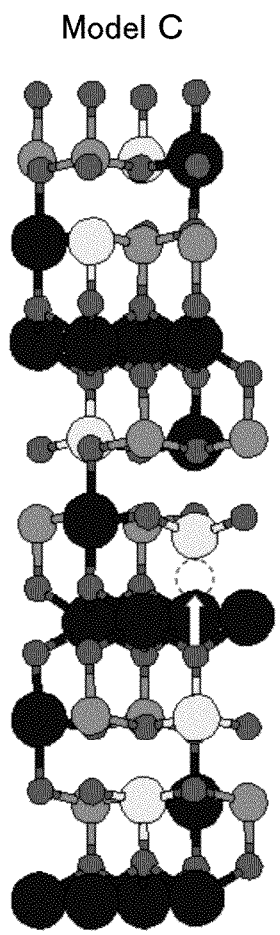
Figure 59:
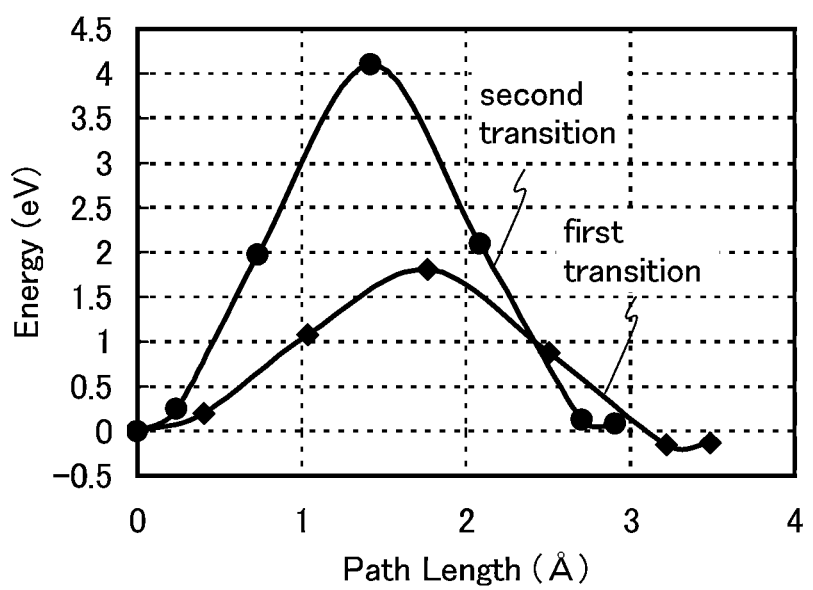
FIG. 59 shows computation results of the models of FIGS. 58A to 58C.

Next, oxygen vacancy transfer is described. FIGS. 58A to 58C show models used for computation of oxygen vacancy transfer. The computations of two transition forms described below were performed. FIG. 59 shows the computations results. In FIG. 59, the horizontal axis indicates a path length (of excessive oxygen transfer), and the vertical axis indicates energy (required for transfer) with respect to energy in a state of a model A in FIG. 58A.

In the two transition forms of the oxygen vacancy transfer, a first transition is a transition from the model A to a model B and a second transition is a transition from the model A to a model C.

Note that dashed circles in FIGS. 58A to 58C represent oxygen vacancy.

As seen from FIG. 59, the maximum value ($Eb_{max}$) of the height Eb of the energy barrier in the first transition is 1.81 eV, and that of the second transition is 4.10 eV. That is, the maximum value ($Eb_{max}$) of the height Eb of the energy barrier in the first transition is lower than that of the second transition. Therefore, energy required for the first transition is smaller than energy required for the second transition, and the first transition occurs more easily than the second transition.

That is, the oxygen vacancy of the model A moves to the position of oxygen vacancy of the model B more easily than to the position of oxygen vacancy of the model C. Therefore, this shows that the oxygen vacancy also moves along the layer of indium atoms more easily than across the layer of indium atoms.

Next, in order to compare probabilities of occurrence of the above-described four transition forms from another side, temperature dependence of these transitions is described. The above-described four transition forms are (1) the first transition of excessive oxygen, (2) the second transition of excessive oxygen, (3) the first transition of oxygen vacancy, and (4) the second transition of oxygen vacancy.

Temperature dependence of these transitions is compared with each other based on movement frequency per unit time. Here, movement frequency Z (per second) at certain temperature T (K) is represented by the following formula (2) when the number of vibrations Zo (per second) of an oxygen atom in the chemically stable position is used.

[FORMULA 2]

$$Z = Zo \cdot \exp\left(-\frac{Eb_{max}}{kT}\right) \quad (2)$$

Note that in the formula (2), $Eb_{max}$ represents a maximum value of a height of an energy barrier of each transition, and k represents a Boltzmann constant. Further, $Zo=1.0\times10^{13}$ (per second) is used for the calculation.

In the case where excessive oxygen or oxygen vacancy moves beyond the maximum value ($Eb_{max}$) of the height of the energy barrier once per one second (in the case of Z=1 (per second)), when the formula (2) is solved for T, the following formulas are obtained.

In the first transition of excessive oxygen of Z=1,
$T=206K(-67°\ C.)$. (1)

In the second transition of excessive oxygen of Z=1,
$T=923K(650°\ C.)$. (2)

In the first transition of oxygen vacancy of Z=1,
$T=701K(428°\ C.)$. (3)

In the second transition of oxygen vacancy of Z=1,
$T=1590K(1317°\ C.)$. (4)

On the other hand, Z in the case of T=300K (27° C.) is represented by the following formulas.

In the first transition of excessive oxygen of T=300K,
$Z=1.2\times10^{4}$(per second). (1)

In the second transition of excessive oxygen of
$T=300K, Z=1.0\times10^{-27}$(per second). (2)

In the first transition of oxygen vacancy of $T=300K$,
$Z=4.3\times10^{-18}$(per second). (3)

In the second transition of oxygen vacancy of
$T=300K$, $Z=1.4\times10^{-56}$(per second). (4)

Further, Z in the case of T=723K (450° C.) is represented by the following formulas.

In the first transition of excessive oxygen of $T=723K$,
$Z=2.0\times10^9$(per second). (1)

In the second transition of excessive oxygen of
$T=723K$, $Z=2.5\times10^{-4}$(per second). (2)

In the first transition of excessive oxygen of $T=723K$,
$Z=2.5$(per second). (3)

In the second transition of excessive oxygen of
$T=723K$, $Z=2.5\times10^{-16}$(per second) (4)

In view of the above-described calculation, excessive oxygen, in the case of either T=300 K or T=723 K, moves along the layer of indium atoms more easily than across the layer of indium atoms. Moreover, oxygen vacancy also, in the case of either T=300 K or T=723 K, moves along the layer of indium atoms more easily than across the layer of indium atoms.

Further, in the case of T=300 K, the movement of excessive oxygen along the layer of indium atoms occurs extremely easily; however, the other transfers do not occur easily. In the case of T=723K, not only the movement of excessive oxygen along the layer of indium atoms but the movement of oxygen vacancy along the layer of indium atoms occurs easily; however, it is difficult for either the excessive oxygen or the oxygen vacancy to move across the layer of indium atoms.

That is, it can be said that in the case where the layer of indium atoms exists over a surface parallel to a surface where an oxide semiconductor layer is formed or a surface of the oxide semiconductor layer (e.g., the case of CAAC-OS film), excessive oxygen and oxygen vacancy easily move in a parallel direction to the surface where the oxide semiconductor layer is formed or the surface of the oxide semiconductor layer.

As described above, in the CAAC-OS film, excessive oxygen easily move along a surface where the CAAC-OS layer is formed or a surface of the CAAC-OS layer. Therefore, there is a problem about release of oxygen from the side surface of the oxide semiconductor layer. When oxygen is released, excessive oxygen is decreased, so that it is difficult to fill oxygen vacancy. If there is oxygen vacancy, the conductivity of the oxide semiconductor film formed of the CAAC-OS film might be high up to a level at which the film is not preferable used for a switching element.

Note that the case where the excessive oxygen or the oxygen vacancy moves across the layer of indium atoms is described above; however, the same applies to metals other than indium which are contained in an oxide semiconductor layer.

Next, results of analyzing oxygen release from an island-shaped CAAC-OS film by using thermal desorption spectroscopy (TDS) are shown.

Four kinds of samples were analyzed. FIGS. 60A to 60D schematically illustrate structures of the samples. FIG. 60A1 is a top view of a sample 7810, and FIG. 60B1 is a cross-sectional view of a portion indicated by the chain line U1-U2 in FIG. 60A1. FIG. 60A2 is a top view of a sample 7820, and FIG. 60B2 is a cross-sectional view of a portion indicated by the chain line U3-U4 in FIG. 60A2. FIG. 60A3 is a top view of a sample 7830, and FIG. 60B3 is a cross-sectional view of a portion indicated by the chain line U5-U6 in FIG. 60A3.

FIG. 60A4 is a top view of a sample 7840, and FIG. 60B4 is a cross-sectional view of a portion indicated by the chain line U7-U8 in FIG. 60A4. For easy understanding, some of the components are not shown in FIGS. 60A1 to 60A4.

The sample 7810 illustrated in FIGS. 60A1 and 60B1 includes a thermal oxidation film with a thickness of 20 nm as a base layer 7802 over a substrate 7801 formed using a silicon wafer and an oxide semiconductor layer 7803 with a thickness of 300 nm over an entire surface of the base layer 7802. The oxide semiconductor layer 7803 is a CAAC-OS film formed by a sputtering method using a metal oxide target having an atomic ratio of In:Ga:Zn=1:1:1.

The sample 7820 illustrated in FIGS. 60A2 and 60B2 has a structure in which the oxide semiconductor layer 7803 of the sample 7810 is processed into island-shaped oxide semiconductor layers 7804 by a photolithography process. One island-shaped oxide semiconductor layer 7804 has a size of 10 μm×10 μm and the plurality of island-shaped oxide semiconductor layers 7804 is arranged in matrix over an entire surface of the substrate 7801 at intervals of 3 μm.

The sample 7830 illustrated in FIGS. 60A3 and 60B3 includes metal layers 7805 overlapping with the island-shaped oxide semiconductor layers 7804 of the sample 7820. Specifically, a tungsten layer with a thickness of 100 nm which is to be the metal layers 7805 is formed over the sample 7810 and the tungsten layer and the oxide semiconductor layer 7803 are etched in the same step by a photolithography process, so that the sample 7830 is formed. Thus, the metal layer 7805 is formed in contact with only an upper surface of the island-shaped oxide semiconductor layer 7804. The stack of the metal layer 7805 and the island-shaped oxide semiconductor layer 7804 has a size of 10 μm×10 μm and the plurality of stacks of the metal layer 7805 and the island-shaped oxide semiconductor layer 7804 is arranged in matrix over an entire surface of the substrate 7801 at intervals of 13 μm.

The sample 7840 illustrated in FIGS. 60A4 and 60B4 has a structure in which a metal layer 7806 is formed to cover an end portion of the island-shaped oxide semiconductor layer 7804 of the sample 7820. Specifically, a tungsten layer with a thickness of 100 nm which is to be the metal layer 7806 is formed over the sample 7820 and the tungsten layer in regions of 8 μm×8 μm which overlap with the upper surfaces of the oxide semiconductor layer 7804 is removed by a photolithography process, so that the sample 7840 is formed.

Figure 61A:
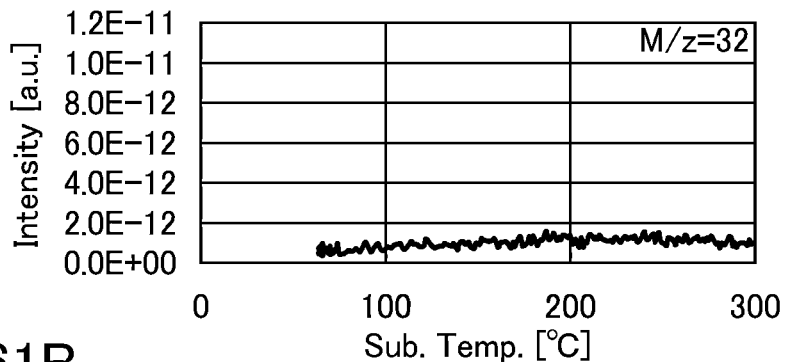
FIGS. 61A to 61D show TDS analysis results.
Figure 61B:
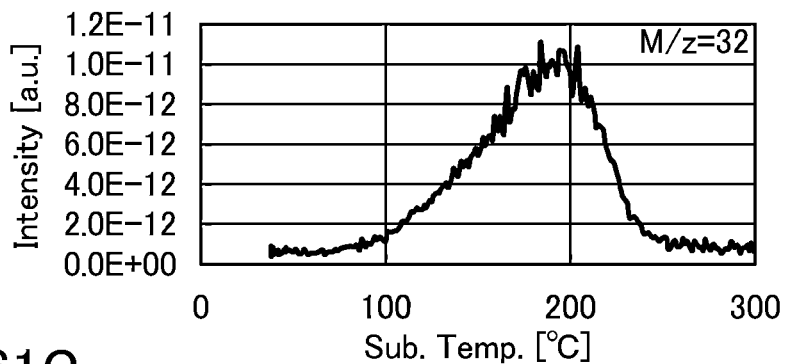
Figure 61C:
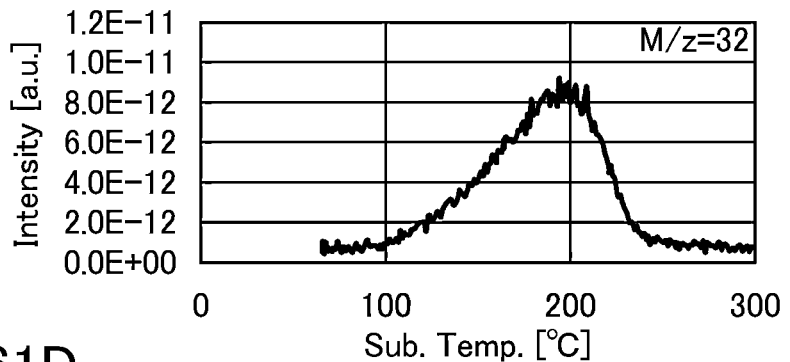
Figure 61D:
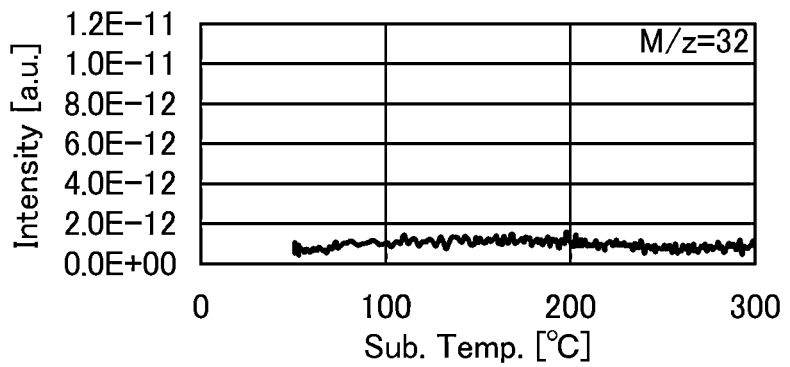

FIGS. 61A to 61D show the TDS analysis results of the samples 7810 to 7840. FIG. 61A shows the TDS analysis result of the sample 7810, FIG. 61B shows the TDS analysis result of the sample 7820, FIG. 61C shows the TDS analysis result of the sample 7830, and FIG. 61D shows the TDS analysis result of the sample 7840. In FIGS. 61A to 61D, the horizontal axis represents substrate temperature and the vertical axis represents the detection intensity of an oxygen molecule. FIGS. 61B and 61C show that in the samples 7820 and 7830 in which the side surface of the island-shaped oxide semiconductor layer 7804 is exposed, more oxygen molecules are detected when the substrate temperature rises, and is a maximum in detection is reached at a substrate temperature of about 200° C. Further, FIGS. 61A and 61D show that in the samples 7810 and 7840, even when the substrate temperature is increased, the detection intensities of an oxygen molecule are hardly changed and remain at noise levels. Since the end surface of the oxide semiconductor layer 7804 of the sample 7840 is covered with the metal layer 7806 and the oxide semiconductor layer 7803 of the sample 7810 is not processed into an island shape, the oxide semiconductor layer does not have a side surface substantially.

According to the above, the release of oxygen from the island-shaped oxide semiconductor layer occurs mainly at the end surface. Further, when the end surface of the island-shaped oxide semiconductor layer is covered with the metal layer, the release of oxygen from the inside of the oxide semiconductor layer can be prevented.

This application is based on Japanese Patent Application serial no. 2012-026357 filed with Japan Patent Office on Feb. 9, 2012, Japanese Patent Application serial no. 2012-026662 filed with Japan Patent Office on Feb. 9, 2012, Japanese Patent Application serial no. 2012-026671 filed with Japan Patent Office on Feb. 9, 2012, and Japanese Patent Application serial no. 2012-026674 filed with Japan Patent Office on Feb. 9, 2012, the entire contents of which are hereby incorporated by reference.

What is claimed is:

1. A semiconductor device comprising:
a first insulating layer over a first wiring;
an island-shaped semiconductor layer over the first insulating layer;
a source electrode and a drain electrode over the island-shaped semiconductor layer, wherein one of the source electrode and the drain electrode is electrically connected to the first wiring through an opening in the island-shaped semiconductor layer and the first insulating layer;
a second insulating layer over the island-shaped semiconductor layer, the source electrode, and the drain electrode; and
a gate electrode over the second insulating layer,
wherein an entire outer edge of one of the source electrode and the drain electrode is surrounded by the gate electrode in planar view, and
wherein an outer edge of the gate electrode is surrounded by the other of the source electrode and the drain electrode in the planar view.

2. The semiconductor device according to claim 1, wherein at least one of the source electrode and the drain electrode covers an end portion of the island-shaped semiconductor layer.

3. The semiconductor device according to claim 1, wherein the gate electrode, the source electrode, or the drain electrode contains copper.

4. A semiconductor device comprising:
a first insulating layer over a first wiring;
an island-shaped semiconductor layer over the first insulating layer;
a source electrode and a drain electrode over the island-shaped semiconductor layer, wherein one of the source electrode and the drain electrode is electrically connected to the first wiring through an opening in the island-shaped semiconductor layer and the first insulating layer;
a second insulating layer over the island-shaped semiconductor layer, the source electrode, and the drain electrode; and
a gate electrode over the second insulating layer,
wherein the island-shaped semiconductor layer comprises a channel formation region in a region overlapping with the gate electrode, and
wherein an entire outer edge of one of the source electrode and the drain electrode is surrounded by the channel formation region in planar view.

5. The semiconductor device according to claim 4, wherein at least one of the source electrode and the drain electrode covers an end portion of the island-shaped semiconductor layer.

6. The semiconductor device according to claim 4, wherein the gate electrode, the source electrode, or the drain electrode contains copper.

7. A semiconductor device comprising:
a first insulating layer over a first wiring;
an island-shaped semiconductor layer over the first insulating layer;
a source electrode and a drain electrode over the island-shaped semiconductor layer, wherein one of the source electrode and the drain electrode is electrically connected to the first wiring through an opening in the island-shaped semiconductor layer and the first insulating layer;
a second insulating layer over the island-shaped semiconductor layer, the source electrode, and the drain electrode; and
a gate electrode over the second insulating layer,
wherein one of the source electrode and the drain electrode is surrounded by the gate electrode in planar view.

8. The semiconductor device according to claim 7, wherein the gate electrode overlaps with at least one of the source electrode and the drain electrode.

9. The semiconductor device according to claim 7, wherein at least one of the source electrode and the drain electrode covers an end portion of the island-shaped semiconductor layer.

10. The semiconductor device according to claim 7, wherein the gate electrode, the source electrode, or the drain electrode contains copper.

11. The semiconductor device according to claim 1, wherein the island-shaped semiconductor layer is an oxide semiconductor layer.

12. The semiconductor device according to claim 4, wherein the island-shaped semiconductor layer is an oxide semiconductor layer.

13. The semiconductor device according to claim 7, wherein the island-shaped semiconductor layer is an oxide semiconductor layer.

14. The semiconductor device according to claim 4, wherein an outer edge of the gate electrode is surrounded by the other of the source electrode and the drain electrode in the planar view.

15. The semiconductor device according to claim 1, wherein the gate electrode has a ring shape.

16. The semiconductor device according to claim 4, wherein the gate electrode has a ring shape.

17. The semiconductor device according to claim 1, wherein the gate electrode overlaps with at least one of the source electrode and the drain electrode.

18. The semiconductor device according to claim 4, wherein the gate electrode overlaps with at least one of the source electrode and the drain electrode.

* * * * *